US006974658B2

(12) United States Patent
Shida et al.

(10) Patent No.: US 6,974,658 B2
(45) Date of Patent: Dec. 13, 2005

(54) HIGH MOLECULAR COMPOUND, MONOMER COMPOUNDS AND PHOTOSENSITIVE COMPOSITION FOR PHOTORESIST, PATTERN FORMING METHOD UTILIZING PHOTOSENSITIVE COMPOSITION, AND METHOD OF MANUFACTURING ELECTRONIC COMPONENTS

(75) Inventors: Naomi Shida, Tokyo (JP); Toru Ushirogouchi, Yokohama (JP); Takuya Naito, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1 day.

(21) Appl. No.: 10/425,848

(22) Filed: Apr. 30, 2003

(65) Prior Publication Data

US 2003/0235781 A1 Dec. 25, 2003

Related U.S. Application Data

(63) Continuation of application No. PCT/JP01/09567, filed on Oct. 31, 2001.

(30) Foreign Application Priority Data

Oct. 31, 2000 (JP) ....................................... 2000-332358
Sep. 26, 2001 (JP) ....................................... 2001-295012

(51) Int. Cl.[7] ............................ G03F 7/004; G03F 7/38

(52) U.S. Cl. .................... 430/270.1; 430/311; 430/330; 430/313; 430/905; 430/907; 430/910; 568/670; 549/504

(58) Field of Search .............................. 430/270.1, 311, 430/330, 313, 905, 907, 910; 568/670; 549/504

(56) References Cited

U.S. PATENT DOCUMENTS

| | | | | |
|---|---|---|---|---|
| 4,080,491 A | | 3/1978 | Kobayashi et al. | |
| 2002/0058198 A1 | * | 5/2002 | Klauck-Jacobs et al. | 430/270.1 |
| 2002/0061464 A1 | * | 5/2002 | Aoai et al. | 430/270.1 |
| 2002/0119391 A1 | * | 8/2002 | Barclay et al. | 430/270.1 |
| 2003/0059710 A1 | * | 3/2003 | Inoue | 430/270.1 |

FOREIGN PATENT DOCUMENTS

| | | |
|---|---|---|
| EP | 0 154 162 | 9/1985 |
| EP | 0 99 474 A1 | 5/2000 |
| JP | 8-304636 | 11/1996 |
| JP | 11-84663 | 3/1999 |
| JP | 2000-38391 | 2/2000 |
| JP | 2001-350265 | 12/2001 |
| WO | WO 00/17712 | 3/2000 |

* cited by examiner

*Primary Examiner*—Yvette C. Thornton
(74) *Attorney, Agent, or Firm*—Oblon, Spivak, McClelland, Maier & Neustadt, P.C.

(57) ABSTRACT

Disclosed is a polymer compound for photoresist characterized in that the polymer compound is formed of a polymer compound having at least one skeleton represented by the following general formula (1), general formula (2A), general formula (2B) or general formula (2C):

(1)

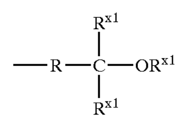

(2A)

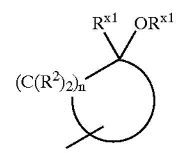

(2B)

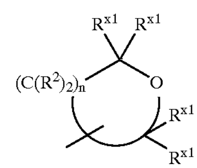

(2C)

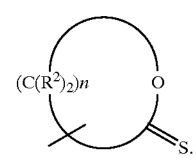

15 Claims, 5 Drawing Sheets

HIGH MOLECULAR COMPOUND, MONOMER COMPOUNDS AND PHOTOSENSITIVE COMPOSITION FOR PHOTORESIST, PATTERN FORMING METHOD UTILIZING PHOTOSENSITIVE COMPOSITION, AND METHOD OF MANUFACTURING ELECTRONIC COMPONENTS

CROSS-REFERENCE TO RELATED APPLICATIONS

This is a Continuation Application of PCT Application No. PCT/JP01/09567, filed Oct. 31, 2001, which was not published under PCT Article 21(2) in English.

This application is based upon and claims the benefit of priority from the prior Japanese Patent Applications No. 2000-332358, filed Oct. 31, 2000; and No. 2001-295012, filed Sep. 26, 2001, the entire contents of both of which are incorporated herein by reference.

BACKGROUND OF THE INVENTION

1. Field of the Invention

This invention relates to a photosensitive composition useful as a resist composition employed in a step of fine working in the process of manufacturing a semiconductor device. In particular, this invention relates to a transparent photosensitive composition especially suited for use in a process where a short wavelength beam of not more than 160 nm in wavelength, such as a fluorine laser beam, electron beam, EUV and X rays, is employed.

2. Description of the Related Art

In the manufacturing process of electronic components including a semiconductor element, it is required to form a fine pattern by a photolithographic technique. This technique necessitates the employment of a resist and can be performed according to the following process. Namely, first of all, a resist composition is coated on the surface of substrate to form a thin film constituting a photoresist film. Then, this photoresist film is subjected to exposure, which is followed by treatments including the development and rinsing thereof to form a resist pattern. Thereafter, by using this resist pattern as an etching resistance mask, an exposed surface of the substrate is selectively etched away so as to form fine lines or openings, thus form a desired pattern. Finally, the resist pattern left remained on the substrate is removed by ashing, thus obtaining a patterned substrate.

As for the exposure apparatus employed on the occasion of forming a pattern by using a resist, there is generally employed a reducing projection type exposure apparatus or so-called stepper. According to this exposure apparatus, since the work of exposure is performed through the projection of an optical image, the resolution is limited by the wavelength of the beam employed. Along with rapid progress in multi-functionalization and densification of electronic components in recent years, there is an increasing demand for enhancing the fineness of circuits. In order to meet this demand, efforts are being made to employ a light source of shorter wavelength in the exposure, thereby making it possible to perform a finer working on the circuit. It would be imperative to employ, in the manufacture of electronic devices in the coming era of gigabit memories an $F_2$ excimer laser having a wavelength of 157 nm as a main light source. Therefore, it is now desired to develop a resist material excellent in transparency and capable of forming a fine pattern by using an $F_2$ excimer laser as an exposure light source.

Incidentally, a dry etching process using plasma can now be employed for finely working a substrate. Therefore, with a view to more effectively performing such a fine working as mentioned above, it is now desired to form a resist pattern by using a resist excellent in dry etching resistance.

A resist comprising an alicyclic compound, which can be employed in place of aromatic compounds has recently attracted attention. For example, Jpn. Pat. Appln. KOKAI Publication No. 4-39665 describes an alkali-developing resist excellent in dry etching resistance and in transparency to a beam of short wavelength. In this publication, there is employed a polymer which is formed of a compound comprising adamantine (or a bridged alicyclic compound) which is copolymerized with another acrylic ester-based compound so as to provide a polymer with alkali-solubility.

Further, there have been developed various resist materials, such as a resist material having a tricyclodecanyl structure as shown in Jpn. Pat. Appln. KOKAI Publication No. 7-199467 as an alicyclic compound having a five-membered ring among bridged alicyclic compounds, a resist material containing an alicyclic group-containing acrylic ester-based resin as a base material, and a resist material containing an anhydrous maleic acid-based resin as a base material. However, these materials are highly capable of absorbing the aforementioned short wavelength beam having a wavelength of 160 nm or less. Therefore, when this short wavelength beam having a wavelength of 160 nm or less is employed as an exposure light source for the etching of a resist film comprising any of these resist materials, it is impossible to enable the exposure beam of such a short wavelength to reach a sufficient depth from the surface of the resist film. Accordingly, there is a problem that it is difficult, even if these conventional resist materials are employed, to obtain a desired fine pattern by using a short wavelength beam having a wavelength of 160 nm or less as an exposure light source.

BRIEF SUMMARY OF THE INVENTION

As explained above, a photosensitive material employed for realizing a fine pattern in the order of nanometers is required not to absorb a short wavelength beam having a wavelength of 160 nm or less, and a resist pattern obtained from this photosensitive material is required to have a sufficient dry etching resistance.

Incidentally, most of the monomers constituting acrylic alicyclic compound-containing polymers useful for forming a resist and have been developed up to date contain a carbonyl group, and the polymers are accompanied with various problems, such as insufficiency in transparency to a beam of 157 nm in wavelength. For example, a resist comprising any of these polymers is highly capable of absorbing such a short wavelength beam, so it is impossible to enable the exposure beam of such a short wavelength to reach a sufficient depth from the surface of the resist film at the exposure. Accordingly, it is impossible, even if the exposure of a resist is performed using these conventional resists comprising an acrylic alicyclic compound and a short wavelength beam of 157 nm or less in wavelength, to obtain a pattern which is excellent in resolution.

Therefore, an object of the present invention is to provide a polymer compound for a photoresist (hereinafter referred to as a polymer compound for photoresist) and excellent in transparency to a short wavelength beam of 160 nm or less, in particular, to a fluorine laser beam.

Another object of the present invention is to provide a monomer compound which can be employed as a raw material for synthesizing the aforementioned polymer compound for photoresist.

A further object of the present invention is to provide a photosensitive resin composition which is excellent in transparency to a short wavelength beam of 160 nm or less, in particular, to a fluorine laser beam, and also excellent in dry etching resistance, and which is capable of forming a resist pattern excellent in adhesion, and resolution in the alkaline development of the resist pattern.

Still more, a further object of the present invention is to provide a method of forming a pattern by using the aforementioned photosensitive resin composition, and to provide a method of manufacturing electronic components by the aforementioned pattern-forming method.

With a view to solve the aforementioned problems, the present invention provides a polymer compound for photoresist, characterized in that the polymer compound is formed of a polymer compound having at least one skeleton represented by the following general formula (1), general formula (2A), general formula (2B) or general formula (2C):

(1)

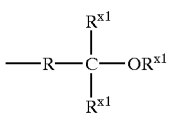

(wherein R is an alicyclic skeleton; and at least one of $R^{x1}$s is an electron-withdrawing group, the residual $R^{x1}$s being the same or different and being individually a hydrogen atom or monovalent organic group; with the proviso that R may contain a heteroatom, and that R and $R^{x1}$ may be combined to form a ring);

(2A)

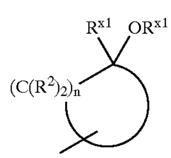

(2B)

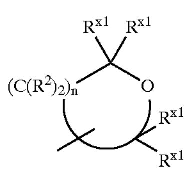

(2C)

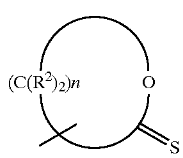

(wherein at least one of $R^{x1}$s is an electron-withdrawing group, the residual $R^{x1}$s being the same or different and being individually a hydrogen atom or monovalent organic group; $R^2$s may be the same or different and are individually a hydrogen atom or monovalent organic group; and n is an integer ranging from 2 to 25; with the proviso that at least two carbon atoms selected from carbon atoms constituting $R^2$ and carbon atoms to which the $R^2$s are connected may be combined to form a condensed ring).

The present invention also provides a polymer compound for photoresist, which is characterized in that the polymer compound is formed of a polymer compound having at least one skeleton represented by the following general formula (3A), general formula (3B), general formula (3C) or general formula (3D):

(3A)

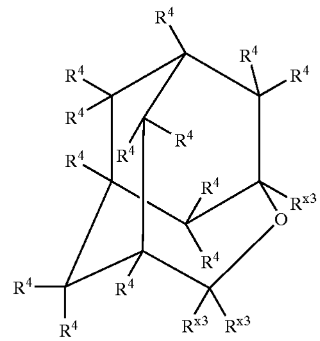

(3B)

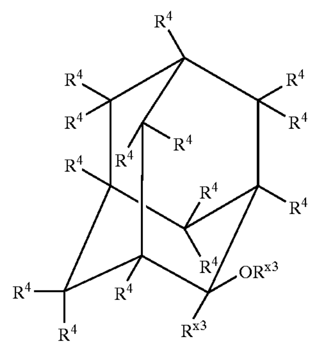

(3C)

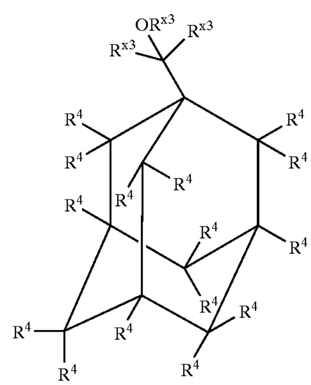

(3D)

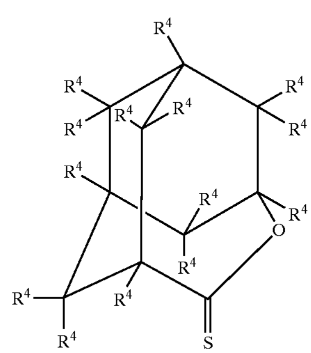

(wherein at least one of $R^{x3}$s is a fluorine atom or monovalent organic group containing a fluorine atom, the residual $R^{x3}$s being the same or different and being individually a hydrogen atom or monovalent organic group; and $R^4$s may be the same or different and are individually a hydrogen atom or monovalent organic group; with the proviso that one or two of the $R^{x3}$ and the $R^4$ are respectively a coupling hand).

The present invention also provides a polymer compound for photoresist, which is characterized in that the polymer compound is formed of a polymer compound having at least one skeleton represented by the following general formulas (4A), (4B), (4C), (4D), (4E), (4F), (4G) and (4H):

(4A)

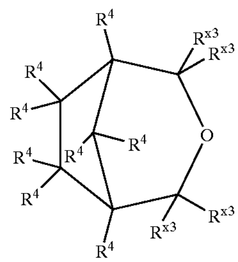

(4B)

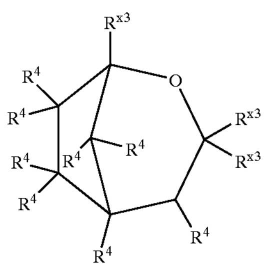

(4C)

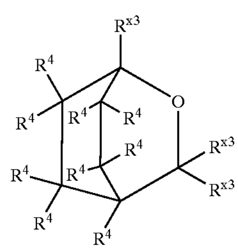

(4D)

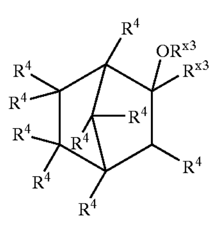

(4E)

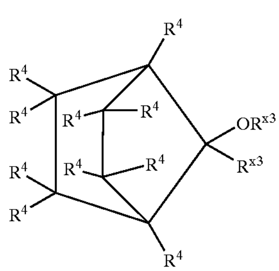

-continued (4F)

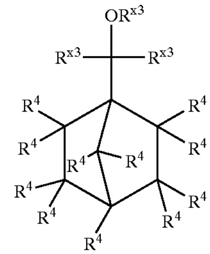

(4G)

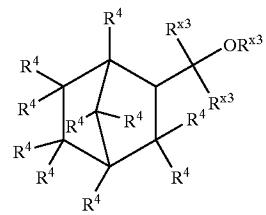

(4H)

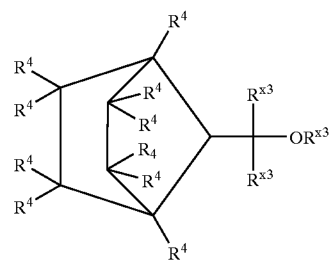

(wherein at least one of $R^{x3}$s is a fluorine atom or monovalent organic group containing fluorine atom, the residual $R^{x3}$s being the same or different and being individually a hydrogen atom or monovalent organic group; and $R^4$s may be the same or different and are individually a hydrogen atom or monovalent organic group; with the proviso that one or two of the $R^{x3}$ and the $R^4$ are respectively a coupling hand).

The present invention also provides a polymer compound for photoresist, which is characterized in that the polymer compound is formed of a polymer compound having a repeating unit represented by the following general formulas (u-1):

(u-1)

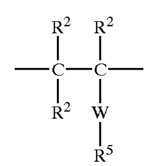

(wherein $R^2$s may be the same or different and are individually a hydrogen atom, halogen atom or monovalent organic group; $R^5$ is a group represented by any one of the following general formulas (5), (2A), (2B) and (2C); and W is a single or a coupling group):

(5)

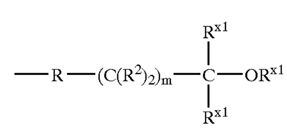

-continued (2A)

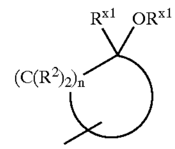

(2B)

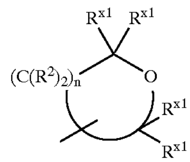

(2C)

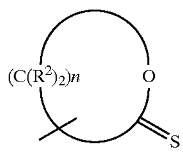

(wherein R is an alicyclic skeleton; at least one of $R^{x1}$s is a halogen atom or monovalent organic group containing a halogen atom, the residual $R^{x1}$s being the same or different and being individually a hydrogen atom or monovalent organic group; $R^2$s may be the same or different and are individually a hydrogen atom or monovalent organic group; n is an integer ranging from 2 to 25; and m is an integer ranging from 0 to 3; with the proviso that R may contain a heteroatom, and that at least two carbon atoms selected from carbon atoms constituting R, $R^2$ and $R^{x1}$, and carbon atoms to which the R, $R^2$ and $R^{x1}$ are connected may be combined to form a condensed ring).

The present invention also provides a polymer compound for a photoresist, which is characterized in that the polymer compound is formed of a polymer compound having at least one repeating unit represented by the following general formulas (u-2a), (u-2b) and (u-2c):

(u-2a)

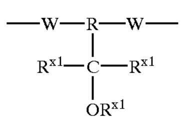

(u-2b)

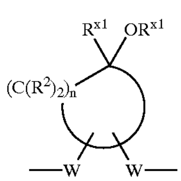

(u-2c)

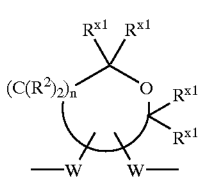

(wherein R is an alicyclic skeleton; at least one of $R^{x1}$s is a halogen atom or monovalent organic group containing a halogen atom, the residual $R^{x1}$s being the same or different and being individually a hydrogen atom or monovalent organic group; $R^2$s may be the same or different and are individually a hydrogen atom or monovalent organic group; Ws may be the same or different and are individually a single bond or a coupling group; and n is an integer ranging from 2 to 25; with the proviso that R may contain a heteroatom, and that at least two carbon atoms selected from carbon atoms constituting R, $R^2$ and $R^{x1}$, and carbon atoms to which the R, $R^2$ and $R^{x1}$ are connected may be combined to form a condensed ring).

The present invention also provides a polymer compound for photoresist, which is characterized in that the polymer compound is formed of a polymer compound having at least one repeating unit represented by the following general formulas (u-3a), (u-3b) and (u-3c)

(u-3a)

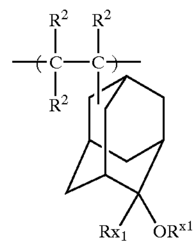

(u-3b)

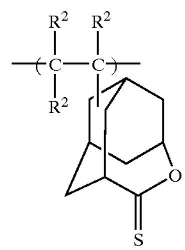

(u-3c)

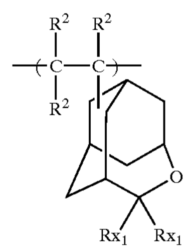

(wherein at least one of $R^{x1}$s is a halogen atom, monovalent organic group containing a halogen atom, hydrogen atom or monovalent organic group; and $R^2$s may be the same or different and are individually a hydrogen atom or monovalent organic group).

The present invention further provides a photo-sensitive resin composition which is characterized in that it comprises a polymer compound for photoresist, and a photo-acid generating agent; wherein the polymer compound is formed of a polymer compound having at least one skeleton represented by the aforementioned general formula (1), general formula (2A), general formula (2B) or general formula (2C).

The present invention further provides a photo-sensitive resin composition which is characterized in that it comprises a polymer compound for photoresist, and a photo-acid generating agent; wherein the polymer compound is formed of a polymer compound having at least one repeating unit represented by the following general formula (u-1), any one of the following general formulas (u-2a), (u-2b) and (u-2c), or any one of the following general formulas (u-3a), (u-3b) and (u-3c):

(u-1)

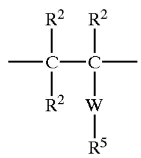

(wherein $R^2$s may be the same or different and are individually a hydrogen atom, halogen atom or monovalent organic group; R is a group represented by any one of the following general formulas (5), (2A), (2B) or (2C); and W is a single bond or a coupling group);

(5)

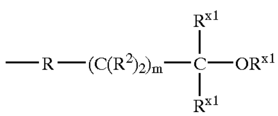

(2A)

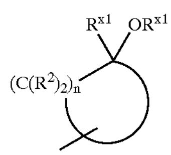

(2B)

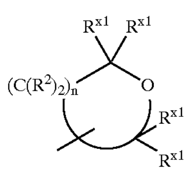

(2C)

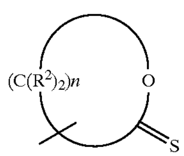

(wherein R is an alicyclic skeleton; at least one of $R^{x1}$s is a halogen atom or monovalent organic group containing a halogen atom, the residual $R^{x1}$s being the same or different and being individually a hydrogen atom or monovalent organic group; $R^2$s may be the same or different and are individually a hydrogen atom or monovalent organic group; n is an integer ranging from 2 to 25; and m is an integer ranging from 0 to 3; with the proviso that R may contain a heteroatom, and that at least two carbon atoms selected from carbon atoms constituting R, $R^2$ and $R^{x1}$, and carbon atoms to which the R, $R^2$ and $R^{x1}$ are connected may be combined to form a condensed ring);

(u-2a)

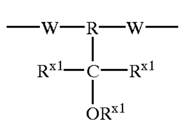

-continued (u-2b)

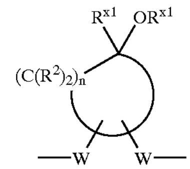

(u-2c)

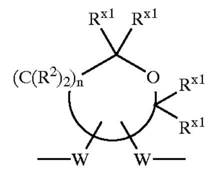

(wherein R is an alicyclic skeleton; at least one of $R^{x1}$s is a halogen atom or monovalent organic group containing a halogen atom, the residual $R^{x1}$s being the same or different and being individually a hydrogen atom or monovalent organic group; $R^2$s may be the same or different and are individually a hydrogen atom or monovalent organic group; Ws may be the same or different and are individually a single bond or a coupling group; and n is an integer ranging from 2 to 25; with the proviso that R may contain a heteroatom, and that at least two carbon atoms selected from carbon atoms constituting R, $R^2$ and $R^{x1}$, and carbon atoms to which the R, $R^2$ and $R^{x1}$ are connected may be combined to form a condensed ring);

(u-3a)

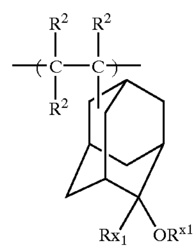

(u-3b)

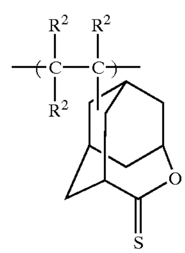

(u-3c)

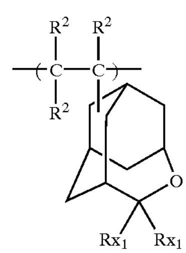

(wherein at least one of $R^{x1}$s is a halogen atom, monovalent organic group containing a halogen atom, hydrogen atom or monovalent organic group; and $R^2$s may be the same or different and are individually a hydrogen atom or monovalent organic group).

Further, the present invention also provides a polymer compound for a photoresist, which is characterized in that the polymer compound is formed of a polymer compound having at least one skeleton, represented by the following general formula (11), general formula (12A) or general formula (12B):

(11)

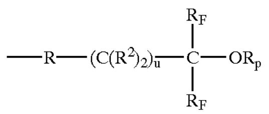

(wherein R is an alicyclic skeleton; at least one of $R_F$s is a fluorine atom, the residual $R_F$s being the same or different and being individually a hydrogen atom or monovalent organic group; $R_P$ is a hydrogen atom or monovalent organic group; $R^2$s may be the same or different and are individually a hydrogen atom or monovalent organic group; and u is 0 or an integer not less than 1; with the proviso that R may contain a heteroatom, and that R, $R_F$ and $R^2$ may be combined with each other to form a ring);

(12A)

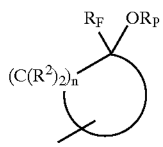

(12B)

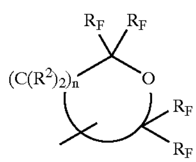

(wherein at least one of $R_F$s is a fluorine atom, the residual $R_F$s being the same or different and being individually a hydrogen atom or monovalent organic group; $R_P$ is a hydrogen atom or monovalent organic group; $R^2$s may be the same or different and are individually a hydrogen atom or monovalent organic group; and n is an integer ranging from 2 to 25; with the proviso that at least two carbon atoms selected from carbon atoms constituting $R^2$ and carbon atoms to which the $R^2$s are connected may be combined to form a condensed ring).

Further, the present invention also provides a monomer compound useful for forming a polymer for a photoresist through a polymerization thereof, which is characterized in that the monomer compound has a skeleton represented by the following general formula (m-1), general formula (m-2a), general formula (m-2b), general formula (m-3a), general formula (m-3b) or general formula (m-3c):

(m-1)

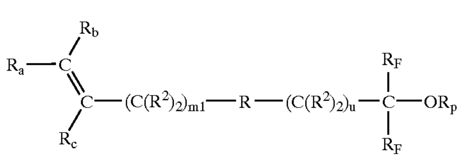

(wherein R is an alicyclic skeleton; at least one of $R_F$s is a fluorine atom, the residual $R_F$s being the same or different and being individually a hydrogen atom or monovalent organic group; $R_P$ is a hydrogen atom or monovalent organic group; $R^2$s may be the same or different and are individually a hydrogen atom or monovalent organic group; $R_a$, $R_b$ and $R_c$ may be the same or different and are individually a hydrogen atom, halogen atom or monovalent organic group; and ml and u are 0 or an integer not less than 1; with the proviso that R may contain a heteroatom, and that some of R, $R_F$, $R_a$, $R_b$, $R_c$ and $R^2$ may be combined with each other to form a ring);

(m-2a)

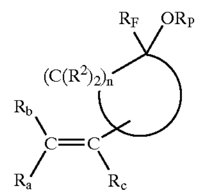

(m-2b)

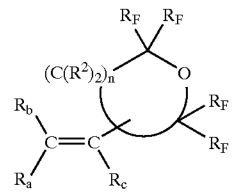

(wherein at least one of $R_F$s is a fluorine atom, the residual $R_F$s being the same or different and being individually a hydrogen atom or monovalent organic group; $R_P$ is a hydrogen atom or monovalent organic group; $R^2$s may be the same or different and are individually a hydrogen atom or monovalent organic group; $R_a$, $R_b$ and $R_c$ may be the same or different and are individually a hydrogen atom, halogen atom or monovalent organic group; and n is an integer ranging from 2 to 25; with the proviso that at least two carbon atoms selected from carbon atoms constituting $R_F$, $R_a$, $R_b$, $R_c$ and $R^2$, and carbon atoms to which $R^2$s are connected may be combined with each other to form a condensed ring);

(m-3a)

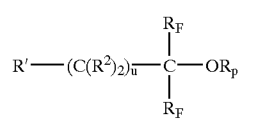

(m-3b)

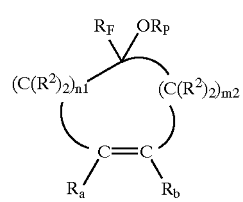

(m-3c)

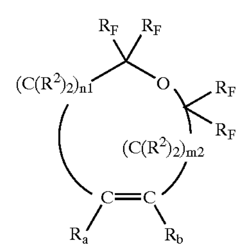

(wherein R' is an alicyclic skeleton having at least one double bond in the structure thereof; at least one of $R_F$s is a fluorine atom, the residual $R_F$s being the same or different and being individually a hydrogen atom or monovalent organic group; $R_P$ is a hydrogen atom or monovalent organic group; $R^2$s may be the same or different and are individually a hydrogen atom or monovalent organic group; $R_a$ and $R_b$ may be the same or different and are individually a hydrogen atom, halogen atom or monovalent organic group; and u is 0 or an integer of not less than 1; m2 and n1 are an integer ranging from 0 to 25; with the proviso that R may contain heteroatom and that at least two carbon atoms selected from carbon atoms constituting R', $R_a$, $R_b$, $R^2$ and $R_F$, and carbon atoms to which R', $R_a$, $R_b$, $R^2$ and $R_F$ are connected may be combined with each other to form a condensed ring).

Further, the present invention also provides a method of forming a pattern, the method comprising:

forming a resin layer comprising the aforementioned photosensitive resin composition on a surface of a substrate;

applying a patterned exposure to a predetermined region of the resin layer by $F_2$ laser;

heat-treating the resin layer that has been subjected to the patterned exposure; and subjecting the heat-treated resin layer to a developing process using an aqueous alkaline solution to selectively dissolve and remove exposure portions or unexposure portions, thereby forming the pattern.

Further, the present invention also provides a method of manufacturing electronic components, the method comprising:

forming a resin layer comprising the aforementioned photosensitive resin composition on a surface of a substrate;

applying a patterned exposure to a predetermined region of the resin layer by $F_2$ laser;

heat-treating the resin layer that has been subjected to the patterned exposure;

subjecting the heat-treated resin layer to a developing process using an aqueous alkaline solution to selectively dissolve and remove exposure portions or unexposure portions, thereby forming a resist pattern; and etching the substrate by using the resist pattern as an etching mask.

Next, the present invention will be further explained in detail.

As for specific examples of the photosensitive resin composition according to the present invention, they include a resin composition (positive resist) comprising a resin whose main chain can be cut off as it is subjected to exposure, or comprising a compound whose solubility can be enhanced as it is subjected to exposure; and a resin composition (negative resist) comprising a resin which can be crosslinked as it is subjected to exposure, or comprising a compound whose solubility can be deteriorated as it is subjected to exposure. It is also useful to employ a chemical amplification type resist which enables a photochemical reaction to be promoted by a thermal reaction after being subjected to exposure.

As for the positive chemical amplification type resist, it is possible to employ a resin composition comprising a compound called a photo-acid generating agent which is capable of generating an acid as it is subjected to exposure, a compound having at least one linkage that can be decomposed by an acid, such as a compound having a solubility-inhibiting group therein, and additionally, if required, an alkali-soluble resin. This positive chemical amplification type resist is designed such that under the condition where it is not yet subjected to exposure, the solubility thereof to an alkaline developing solution is inhibited due to the presence of a solubility-inhibiting agent (or solubility-inhibiting group).

As for the negative chemical amplification type resist, it is possible to employ a resin composition comprising a photo-acid generating agent, an alkali-soluble resin, and a compound which is capable of crosslinking the aforementioned resinous component by the effect of an acid, or a compound whose solubility can be deteriorated by the effect of an acid. This negative chemical amplification type resist is designed such that the alkali-solubility thereof can be deteriorated through the promotion of crosslinking thereof that can be brought about by the generation of an acid at the exposure region, or through the change of polarity.

The photosensitive resin composition according to the present invention is featured in that the resin (a polymer compound for photoresist) constituting a main component is formed of a cyclic structure wherein a halogen atom such as fluorine is introduced into the skeleton thereof. It is now made possible, through this introduction of such a substituent group into an alicyclic structure, to improve the transparency thereof to a beam of 160 nm or less in wavelength, the alkali-solubility thereof, the dry etching resistance thereof, and the adhesiveness thereof to a substrate.

The polymer compounds useful for forming a photoresist according to the present invention are formed of alcohol having a bridged alicyclic skeleton comprising a combination of at least one cyclic structure selected from a five-membered ring structure, a six-membered ring structure and a seven-membered ring structure (hereinafter referred to simply as "a bridged alicyclic skeleton") or have a fluorine atom introduced into the skeleton. Due to the presence of such a bridged alicyclic skeleton that is introduced into the polymer compound, it is now possible to enhance the dry etching resistance of the photoresist.

As for examples of this bridged alicyclic skeleton, they include a cyclo-compound represented by $C_nH_{2n}$ (n is 5 or 6), a bicyclo-compound formed of a combination of the cyclo-compounds, a tricyclo-compound formed of a combination of the cyclo-compounds, and a condensed rings of these cyclic compounds. More specifically, they include norbornyl ring, adamantyl ring, dicyclopentane ring, tricyclodecane ring, tetracyclododecane ring, bornene ring, decahydronaphthalene ring, polyhydroanthracene ring, tricyclene, steroid skeleton such as cholesteric ring, bile acid, digitaloids, camphor ring, iso-camphor ring, sesquiterpene ring, santon ring, diterpene ring, triterpene ring and steroid saponin. These alicyclic skeletons can be introduced as the R into the polymer compound for photoresist, which is represented by the general formula (1) according to the present invention. This alicyclic skeleton R may contain, as a ring-constituting element or as a substituent group, heteroatom such as oxygen atom, nitrogen atom, fluorine atom, chlorine atom, bromine atom, iodine atom, etc. As for the R in the polymer compound for photoresist, which is represented by the general formula (1) according to the present invention, it is preferable to employ, in view of enhancing the dry etching resistance, norbornyl ring, adamantly ring, dicyclopentane ring, decahydronaphthalene ring and tricyclodecane ring.

As for the electron-withdrawing group that can be introduced as the $R^{x1}$ into the polymer compound for photoresist according to the present invention, it is preferable to employ a monovalent organic group containing a halogen atom. As for the monovalent organic group containing a halogen atom, it is possible to employ, for example, trifluoromethyl group, pentafluoroethyl group, heptafluoropropyl group, nonafluorobutyl group, fluoro group, chloro group, bromo group, iodo group, trichloromethyl group, pentachloroethyl group, heptachloropropyl group, nonachlorobutyl group, tribromomethyl group, pentabromoethyl group, heptabromopropyl group, nonabromobutyl group and triiodomethyl group. Incidentally, as for the halogen atom, it is possible to employ a fluorine atom, chlorine atom, bromine atom and iodine atom. It is preferable however, in view of enhancing the alkali-solubility of resist in particular, to employ fluorine atom. Namely, as for the monovalent organic group containing a halogen atom that can be introduced as the $R^{x1}$ into the polymer compound, it is preferable to employ trifluoromethyl group, pentafluoroethyl group, heptafluoropropyl group and nonafluorobutyl group.

Further, as for the monovalent organic group that can be introduced as the $R^{x1}$ into the polymer compound, it is possible to employ, for example, pentyl group, cyclohexyl group, methyl group, ethyl group, propylbutyl group, n-butyl group, isobutyl group, s-butyl group, t-butyl group, cyclohexylmethyl group, isopropyl group, allyl group, propargyl group, cyclohexylmethylethyl group, hydrocarbon group, pentacycloalkyl group, tetracycloalkyl group, decanyl group, cholanyl group, tricycloalkyl group, bicycloalkyl group, heterocycloalkyl group, a group having terpenoid skeleton and cyano group. More specifically, specific examples of the monovalent organic group include, for example, phenyl, naphthyl, methyl, ethyl, propyl, butyl, pentyl, hexyl, heptyl, octyl, nonyl, decanyl, undecanyl, dodecanyl, cyclohexyl, tricycle[3.3.1.1$^{3,7}$]decanyl, cyclopentyl, cycloheptyl, cyclooctyl, cyclononyl, cyclodecanyl, tricyclodecanyl, 2-methyl-tricyclo[3.3.1.1$^{3,7}$]decanyl, androst-4-ene-3,1,1,17-trion-yl, 21-acetoxypregnane-11,20-dion-3-yl, pregnane-11,20-dion-3-yl, cholest-4-en-3-yl, 17,21-dihydroxy-5α-pregnane-11,20-dion-3-yl, 3,17-dihydroxy-5α-pregnane-11,20-dion-21-yl, bicycle[4,4,0]decanyl, etioallocholanyl, 3-hydroxyandrostan-17-yl, hydroxyandrostanyl, 1,1'-oxoethyl-3-methoxy-4-phenyl, benzofuranyl, benzothiazolyl, 3-hydroxyestro-4-en-17-yl, hydroxyestro-4-enyl, 1,4-androstadien-3-on-17-yl, 1,7,7-trimethylbicyclo[2,2,1]heptan-2-yl, 1,7,7-trimethylbicyclo[2,2,1]heptan-2-on-3-yl, 24-R-ergost-5-en-3-yl, 4,7,7-trimethyl-3-oxobicyclo[2,2,1]heptan-2-yl, sebacinyl, cevinyl, crydoniny, 3,7-dihydroxyfuranyl, 3-hydroxycholanyl, 7-hydroxycholanyl, cholanyl, cholestanyl, 3-cholestanyl, cholestralyl, 3,7,12-trihydroxy-5β-cholan-24-yl, stigmasta-7,22-dien-3-yl, chlostevolyl, corticosteronyl, cortisonyl, cortholyl, cortholonyl, cyclohexylcarbinyl, 7-dehydrocholesteryl, 3,7,12-trioxofuran-24-yl, pregn-4-ene-3,11,20-trion-21-yl, 1,3-cyclohexanedion-5-yl, esgostanyl, ergost-7-en-3-yl, pentadecanyl, hexadecanyl, heptadecanyl, octadecanyl, nonadecanyl, oxacyclohexadecan-2-on-3-yl, hydroxycholesterol-3-yl, 4-hydroxy-estro-4-en-3-on-17-yl, exo-1,7,7-trimethylbicyclo[2,2,1]heptan-2-yl, ketoprogesteronyl, lupininyl, novobunolyl, 6-methylpregn-4-ene-3,20-dion-11-yl, (1α,2β,5α)-5-methyl-2-(1-methylethyl)-cyclohexyl, (1α,2β,5α)-5-methyl-2-(1-hydroxy-1-methylethyl)-cyclohexyl, norcholanyl, dihydro-4H-dimethyl-2(3H)-furanon-3-yl, pinen-yl, pregon-6-yl, cyclodecanon-2-yl, 1,2-cyclodecanedion-3-yl, (3β,5α)-stigmastan-3-yl, α-hydroxy-α,α,4-trimethyl-3-cyclohexen-5-yl, solanid-5-en-3-yl, (3β,22E)-stigmasta-5,22-dien-3-yl, taraxasteryl, and taraxeril. These monovalent organic groups can be introduced as the $R^2$ into the general formulas (2A), (2B) and (2C). Further, these monovalent organic groups can be introduced also as the $R^{x3}$ or $R^4$ into the general formulas (3A), (3B) and (3C). As for the monovalent organic group, it is preferable to employ hydrocarbon groups having 1 to 15 carbon atoms, in particular, hydrogen atom, methyl group, ethyl group, isopropyl group, n-butyl group, s-butyl group, t-butyl group, isobutyl group and pentyl group.

As for the halogen atom that can be introduced as the $R^2$, it is possible to employ fluorine atom, chlorine atom, bromine atom and iodine atom.

As for the monovalent organic group containing fluorine atom that can be introduced as the $R^{x3}$, it is possible to employ, for example, trifluoromethyl group, pentafluoroethyl group, pentafluoropropyl group and nonafluorobutyl group. Among them, it is more preferable to employ trifluoromethyl group, pentafluoroethyl group, heptafluoropropyl group and nonafluorobutyl group. Further, fluoro group is also preferable to employ as the $R^{x3}$.

As for the bivalent organic group containing halogen atom that can be introduced as the $R^{x6}$, it is possible to employ, for example, difluoromethylene group, tetrafluoroethylene group, hexafluoropropylene group, octafluorobutylene group, dichloromethylene group, tetrachloroethylene group, hexachloropropylene group, octachlorobutylene group, dibromomethylene group, tetrabromoethylene group, hexabromopropylene group, octabromobutylene group, and diiodometheylene group. Among them, it is more preferable to employ difluoromethylene group, tetrafluoroethylene group, hexafluoropropylene group and octafluorobutylene group.

As for the coupling group that can be introduced as the W into the general formula (u-1) according to the present invention, it is possible to employ, for example, —O—, $—CH_2—$, $—C(CH_3)_2—$, $—C(CH_2CH_2)_2—$, $—C(CH_2CH_2CH_2)_2—$, $—(CH_2CH_2CH_2CH_2)_2—$, —C(=S)—, and —C(=O)—. It is also possible to introduce single bond as the W.

As for the polymer compound having a polymerizable double bond and being useful for forming photoresist, it is possible to employ a compound having the same structure as that of adamantane represented by any of the following general formulas (3A), (3B) and (3C) except that oxygen atom is introduced into a site between some of the C—C bonds constituting the adamantine, or a compound comprising tricyclodeca(mono)diene or tetracyclodeca(mono)diene each having fluorine atom introduced therein.

(3A)

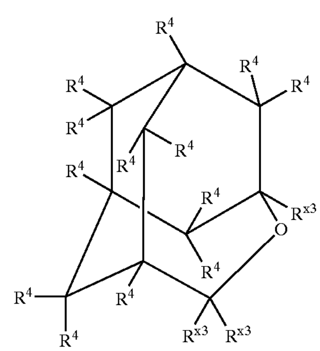

-continued (3B)

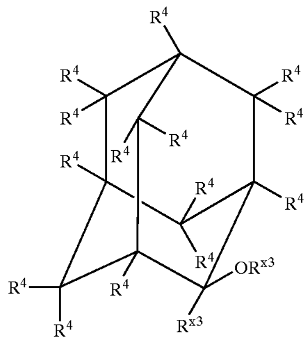

(3C)

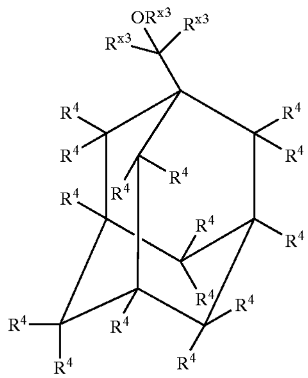

(wherein at least one of $R^{x3}$s is a fluorine atom or monovalent organic group containing a fluorine atom, the residual $R^{x3}$s being the same or different and being individually a hydrogen atom or monovalent organic group; and $R^4$s may be the same or different and are individually a hydrogen atom or monovalent organic group; with the proviso that one or two of the $R^{x3}$ and the $R^4$ are respectively a coupling hand).

In this case, it is more preferable that the polymer compound for photoresist comprises, as a side chain, adamantane, tricyclodecane, tetracyclodecane or hydronaphthalene skeleton.

The polymer compound for photoresist according to the present invention can be synthesized by a process wherein a monomer having a polymerizable double bond in its molecule for example is employed as a monomer having a bridged alicyclic skeleton having fluorine atom introduced therein, and then, the monomer is permitted to polymerize by radical polymerization, anionic polymerization, cationic polymerization or polymerization using Ziegler-Natta catalyst.

Further, when this polymer compound for a photoresist is constructed such that it comprises a repeating unit having a side chain which is constituted by an alicyclic skeleton having fluorine atom introduced therein, it would be preferable in view of enhancing the dry etching resistance and adhesiveness of the resist.

In particular, when this polymer compound is provided, as an alicyclic skeleton, with an adamantine skeleton which is represented by the aforementioned general formula (3A), (3B) or (3C), it would be preferable in view of enhancing the polymerizability thereof and of enabling the polymer compound to be polymerized at any desired ratio of composition.

Generally speaking, a polymerizable double bond, as seen in the case of a polymer where the main chain thereof contains an alicyclic group, can be formed into a polymer of high molecular weight by using Ziegler-Natta catalyst. However, the polymer compound according to the present invention is useful without raising any problems as long as it can be formed into a film even if the molecular weight thereof is low. Therefore, the polymer compound according to the present invention may be polymerized by any convenient procedures such as radical polymerization so as to enable the polymer to be employed under the condition where low molecular weight compounds and high molecular weight compounds are mixed together.

The polymer compound for photoresist according to the present invention can be deemed as being a fluorine-containing alicyclic resin, which can be reacted with a polyhydric alcohol comprising at least two hydroxyl groups and a conjugated polycyclic fused aromatic skeleton to form a polymer compound for photoresist. In this case, the polyhydric alcohol may be formed of a mixture comprising a plurality of compounds.

Incidentally, the photosensitive resin composition according to the present invention may be formulated such that polyfluoro substituent group or polynorbornene bond is concurrently existed therein.

However, in view of the transparency of resist to a short wavelength beam, it is more preferable that the polymer compound for photoresist according to the present invention is formed of one which is copolymerized with a compound which is free from any molecular skeleton which is highly capable of absorbing the light of short wavelength zone such as benzene nucleus. More specifically, it is desirable that the light absorbency of the polymer compound for photo-resist to a light 157 nm in wavelength is 4 or less per 1 μm.

Further, the weight average molecular weight (hereinafter referred to as Mw or "average molecular weight") of the aforementioned polymer compound should preferably be confined within the range of 1,000 to 500,000 (as it is reduced to polystyrene; the same hereinafter), more preferably 1,500 to 50,000. If the average molecular weight of this polymer compound is less than 1,000, it may become disadvantageous in obtaining a resist film having a sufficient mechanical strength. On the other hand, if the average molecular weight of this polymer compound exceeds over 500,000, it may become difficult to form a resist pattern excellent in resolution. The polymer compound for photoresist according to the present invention is generally permitted to co-exist together with other copolymerizable compounds and to be constituted by components having various degrees of molecular weight. The polymer compound according to the present invention is capable of exhibiting desirable effects even the molecular weight thereof is relatively small. For example, the polymer compound according to the present invention may be predominantly constituted by components having an average molecular weight ranging from 1,000 to 2,000. The polymer compound mainly constituted by these low molecular weight components is advantageous in suppressing the non-uniform dissolution. Further, the polymer compound according to the present invention may contain therein a large quantity of residual monomers as long as no problem is raised by the inclusion of these monomers.

It is preferable, in the polymer compound for photoresist according to the present invention, that the components thereof are formulated such a way that the ratio of fluoro-substituent group is 10% by weight or more based on the solid matters of the resist composition. If the ratio of fluoro-substituent group is less than 10% by weight, it may become difficult to form, by alkaline development, a resist pattern which is excellent in resolution and adhesiveness, and still more, the dry etching resistance of the resist pattern to be obtained is likely to be deteriorated.

Although it is possible to obtain the polymer compound of the present invention useful for forming photoresist through the polymerization of monomers having a bridged alicyclic skeleton having fluoro group introduced therein, it is also possible to obtain the polymer compound through the copolymerization of the monomers with various kinds of vinyl compounds. For example, it is possible to employ the following vinyl compounds in this case. Namely, they include vinyl methylcarboxide, vinyl ethylcarboxide, vinyl propylcarboxide, vinyl t-butylcarboxide, vinyl tetrahydropyranylcarboxide, vinyl methoxymethylcarboxide, vinyl ethoxymethylcarboxide, vinyl ethoxyethylcarboxide, isopropenyl methylcarboxide, isopropenyl ethylcarboxide, isopropenyl propylcarboxide, isopropenyl t-butylcarboxide, isopropenyl tetrahydropyranylcarboxide, isopropenyl methoxymethylcarboxide, isopropenyl ethoxymethylcarboxide, isopropenyl ethoxyethylcarboxide, vinyl methylketone, vinyl ethylketone, vinyl propylketone, vinyl t-butylketone, vinyl tetrahydropyranylketone, vinyl methoxymethylketone, vinyl ethoxymethylketone, vinyl ethoxyethylketone, isopropenyl methylketone, isopropenyl ethylketone, isopropenyl propylketone, isopropenyl t-butylketone, isopropenyl tetrahydropyranylketone, isopropenyl methoxymethylketone, isopropenyl ethoxymethylketone, isopropenyl ethoxyethylketone, vinyl methylcarbonate, vinyl ethylcarbonate, vinyl propylcarbonate, vinyl t-butylcarbonate, vinyl tetrahydropyranylcarbonate, vinyl methoxymethylcarbonate, vinyl ethoxymethylcarbonate, vinyl ethoxyethylcarbonate, isopropenyl methylcarbonate, isopropenyl ethylcarbonate, isopropenyl propylcarbonate, isopropenyl t-butylcarbonate, isopropenyl tetrahydropyranylcarbonate, isopropenyl methoxymethylcarbonate, isopropenyl ethoxymethylcarbonate, isopropenyl ethoxyethylcarbonate, vinyl carbonate and isopropenyl carbonate.

It is preferable, in view of adjusting the alkali-solubility of the polymer compound for photoresist and of enhancing the adhesiveness of the resist to a substrate, to copolymerize the polymer compound with the following compounds. Specific examples of such compounds include vinyl carbonate, isopropenyl carbonate, carbonyl ester substitution products of these carbonates, vinyl phenol, vinyl naphthol, naphthol oxymethacrylate, and alkali-soluble compounds such as $SO_2$. The alkali-soluble groups of these alkali-soluble compounds may be copolymerized with a compound protected with an acid-decomposable group having solubility-inhibiting properties.

As for this acid-decomposable group, it is possible to employ esters of carboxylic acid for example. More specifically, it is possible to employ esters of carboxylic acid, ethers of carboxylic acid, acetals of carboxylic acid, ketals of carboxylic acid, cyclic orthoesters of carboxylic acid, silylketene acetals of carboxylic acid, acyclic acetals or acyclic ketals of carboxylic acid, cyclic acetals or cyclic ketals of carboxylic acid, and cyanohydrins of carboxylic acid. Specific examples of acid-decomposable groups include esters such as isopropyl ester, tetrahydropyranyl ester, tetrahydrofuranyl ester, methoxyethoxymethyl ester, 2-trimethylsilylethoxymethyl ester, 3-oxocyclohexyl ester, isobonyl ester, trimethylsilyl ester, triethylsilyl ester, isopropyldimethylsilyl ester, di-t-butylmethylsilyl ester, oxazole, 2-alkyl-1,3-oxazoline, 4-alkyl-5-oxo-1,3-oxazoline, and 5-alkyl-4-oxo-1,3-dioxolane; ethers such as t-buthoxycarbonyl ether, t-buthoxymethyl ether, 4-pentenyloxymethyl ether, tetrahydropyranyl ether, 3-bromotetrahydropyranyl ether, 1-methoxycyclohexyl ether, 4-methoxytetrahydropyranyl ether, 4-methoxytetrahydrothiopyranyl ether, 1,4-dioxan-2-yl ether, tetrahydrofuranyl ether, 2,3,3a,4,5,6,7,7a-octahydro-7,8,8-trimethyl-4,7-methanobenzofuran-2-yl ether, t-butyl ether, trimethylsilyl ether, triethylsilyl ether, triisopropylsilyl ether, dimethylisopropylsilyl ether, diethylisopropylsilyl ether, dimethylthexylsilyl ether, and t-butyldimethylsilyl ether; acetals such as methylene acetal, ethylidene acetal, 2,2,2-trichloroethylidene acetal, 2,2,2-tribromoethylidene acetal and 2,2,2-triiodoethylidene acetal; ketals such as 1-t-butylethylidene ketal, isopropylidene ketal (acetonide), cyclopentylidene ketal, cyclohexylidene ketal and cycloheptylidene ketal; cyclic-orthoesters such as methoxymethylene acetal, ethoxymethylene acetal, dimethoxymethylene orthoester, 1-methoxyethylidene orthoester, 1-ethoxyethylidene orthoester, 1,2-dimethoxyethylidene orthoester, 1-N,N-dimethylaminoethylidene orthoester, and 2-oxacyclopentylidene orthoester; silylketene acetals such as trimethylsilylketene acetal, triethylsilylketene acetal, triisopropylsilylketene acetal and t-butyldimethylsilylketene acetal; silyl ethers such as di-t-butylsilyl ether, 1,3-1',1',3',3'-tetraisopropyldisiloxanylidene ether and tetra-t-buthoxydisiloxane-1,3-diylidene ether; acyclic acetals or acyclic ketals such as dimethyl acetal, dimethyl ketal, bis-2,2,2-trichloroethyl acetal, bis-2,2,2-tribromoethyl acetal, bis-2,2,2-triiodoethyl acetal, bis-2,2,2-trichloroethyl ketal, bis-2,2,2-tribromoethyl ketal, bis-2,2,2-triiodoethyl ketal, diacetyl acetal and diacetyl ketal; cyclic acetals or cyclic ketals such as 1,3-dioxane, 5-methylene-1,3-dioxane, 5,5-dibromo-1,3-dioxane, 1,3-dioxolane, 4-bromomethyl-1,3-dioxolane, 4-3'-butenyl-1,3-dioxolane and 4,5-dimethoxymethyl-1,3-dioxolane; and cyanohydrins such as o-trimethylsilyl cyanohydrin, o-1-ethoxyethyl cyanohydrin and o-tetrahydropyranyl cyanohydrin.

In the present invention, it is more preferable, in viewpoint of the easiness in decomposition by acid, to employ alicyclic compounds having t-butyl group, ethoxyethyl group, 3-carbonylcyclohexyl group, isobornyl group, trimethylsilyl group, tetrahydropyranyl group, azakarbonyl group or a tertiary ester structure among the aforementioned acid-decomposable groups. Specific examples of such alicyclic compounds are, for example, dialkyladamantyl carbonylester, dialkylmonoadamantylmethanol carbonylester, tertiary carbonylester of methanediol, and carbonylester of hydroxypinanone.

Incidentally especially when the $or^{x1}$ of the aforementioned general formulas (1) and (2A) is constituted by OH, these acid decomposable groups may be introduced into the polymer compound.

It is preferable, in view of enhancing the dry etching resistance of resist, that the aforementioned acid decomposable groups themselves are formed of an alicyclic compound. Namely, it is preferable for this purpose to employ, as a copolymer component of the polymer compound, a monomer enables carboxylic acid to be generated through the dissociation thereof from aliphatic ring due to the effect of an acid. As for the examples of such a monomer, it is preferable to employ vinylpyranyl carbonate, isopropenylpyranyl carbonate, alicyclic vinylcarbonyl ester (having a side chain constituted by pyranyl-protected carbonyl group)/isopropenylcarbonyl ester, and tertiary vinylcarbonyl ester of methanediol/isopropenylcarbonyl ester. It is more preferable to employ, as the aforementioned monomer, vinylcarbonyl ester of 2-alkyl-2-adamantanol/isopropenylcarbonyl ester, diadamantylpropanol, vinylcarbonyl ester of dialkylmonoadamantyl methanol/isopropenylcarbonyl ester.

The photosensitive resin composition according to the present invention should preferably be formulated such that these acid-decomposable groups protecting alkali-soluble group are included not only in the polymer compound but also in a portion of the structure of additives (dissolution-inhibiting agents) to be explained hereinafter.

Incidentally, if the aforementioned copolymers are employed as a base resin in the photosensitive resin composition of the present invention, the copolymerization ratio of other components such as a vinyl compound having an acid-decomposable group should preferably be within the range of 10 to 80 mol %, more preferably 15 to 70 mol % based on the quantity of any of these copolymers. Because if this copolymerization ratio is less than 10 mol %, it may become difficult to expect a sufficient dissolution-inhibiting effect. On the other hand, if this copolymerization ratio is increased larger than 80 mol %, it may become difficult to form a resist pattern excellent in resolution.

Next, other polymer compounds for photoresist according to the present invention, as well as the monomer compounds employed as raw materials for the polymer compound, will be explained. It has been discovered by the present inventors that it is possible to raise the acidity of hydroxyl group and to prominently enhance the solubility of the polymer compound to an alkaline developing solution as fluorine atom is introduced into a specific site of the polymer compound comprising an alicyclic skeleton and hydroxyl group. As a result, it is possible to obtain the effect that a structure such as carbonyl exhibits a strong absorbency of the light of short wavelength zone can be eliminated from the polymer compound. Therefore, the transparency of the resist to a short wavelength beam of not more than 160 nm in wavelength can be greatly enhanced.

The polymer compound for photoresist that has been explained above comprises at least one skeleton represented by the following general formula (11), general formula (12A) or general formula (12B):

(11)

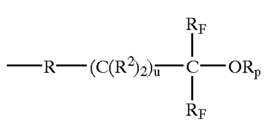

(wherein R is an alicyclic skeleton; at least one of $R_F$s is a fluorine atom, the residual $R_F$s being the same or different and being individually a hydrogen atom or monovalent organic group; $R_P$ is a hydrogen atom or monovalent organic group; $R^2$s may be the same or different and are individually a hydrogen atom or monovalent organic group; and u is 0 or an integer not less than 1; with the proviso that R may contain a heteroatom, and that R, $R_F$ and $R^2$ may be combined with each other to form a ring);

(12A)

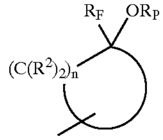

-continued (12B)

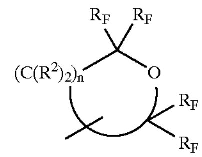

(wherein at least one of $R_F$s is a fluorine atom, the residual $R_F$s being the same or different and being individually a hydrogen atom or monovalent organic group; $R_P$ is a hydrogen atom or monovalent organic group; $R^2$s may be the same or different and are individually a hydrogen atom or monovalent organic group; and n is an integer ranging from 2 to 25; with the proviso that at least two carbon atoms selected from carbon atoms constituting $R^2$ and carbon atoms to which the $R^2$s are connected may be combined to form a condensed ring).

The polymer compound for photoresist, which has a skeleton represented by the aforementioned general formula (11), general formula (12A) or general formula (12B) is featured in that fluorine atom is directly coupled to the α carbon of the alcohol having a bridged alicyclic skeleton consisting of a combination of at least one cyclic structure selected from a five-membered ring structure, a six-membered ring structure and a seven-membered ring structure (hereinafter referred to simply as "a bridged alicyclic skeleton"). Due to the presence of such a bridged alicyclic skeleton that is introduced into the polymer compound, it is now possible to enhance the dry etching resistance of the polymer compound.

The alicyclic skeleton represented by any of the aforementioned general formulas, such as the R in the general formula (11) may be included in either one of the side chain and main chain of a polymer compound.

The repeating unit of the polymer compound where the alicyclic skeleton is included in the side chain thereof can be represented by the following general formula (u-11):

(u-11)

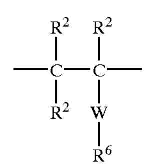

(wherein $R^2$s may be the same or different and are individually a hydrogen atom, halogen atom or monovalent organic group; $R^6$ is a group represented by any one of the following general formulas (5), (2A), (2B) and (2C)); and W is a single bond or a coupling group:

(13)

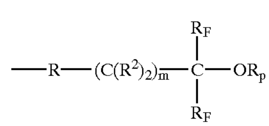

-continued (12A)

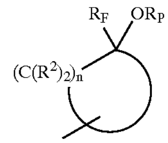

(12B)

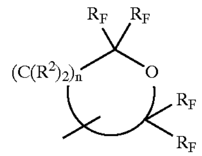

(wherein R is an alicyclic skeleton; at least one of $R_F$s is fluorine atom, the residual $R_F$s being the same or different and being individually a hydrogen atom or monovalent organic group; $R_P$ is a hydrogen atom or monovalent organic group; $R^2$s may be the same or different and are individually a hydrogen atom or monovalent organic group; n is an integer ranging from 2 to 25; and m is an integer ranging from 0 to 3; with the proviso that R may contain a heteroatom, and that at least two carbon atoms selected from carbon atoms constituting R, $R^2$ and $R_F$, and carbon atoms to which the R, $R^2$ and $R_F$ are connected may be combined to form a condensed ring).

On the other hand, the repeating unit of the polymer compound having a alicyclic group on the backbone thereof can be represent by following general formula (u-12a), (u-12b) or (u-12c).

(u-12a)

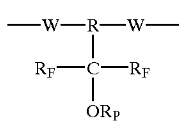

(u-12b)

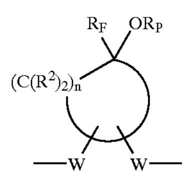

(u-12c)

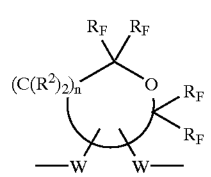

(wherein R is an alicyclic skeleton; at least one of $R_F$s is fluorine atom, the residual $R_F$s being the same or different and being individually a hydrogen atom or monovalent organic group; $R_P$ is a hydrogen atom or monovalent organic group; $R^2$s may be the same or different and are individually a hydrogen atom or monovalent organic group; Ws may be the same or different and are individually a single bond or a coupling group; and n is an integer ranging from 2 to 25; with the proviso that R may contain a heteroatom, and that at least two carbon atoms selected from carbon atoms constituting R, $R^2$ and $R_F$, and carbon atoms to which the R, $R^2$ and $R_F$ are connected may be combined to form a condensed ring).

The polymer compound represented by the aforementioned general formula (11), (12A) or (12B) is featured in that at least one fluorine atom is directly coupled to the carbon to which an active hydroxyl group is directly coupled, or directly coupled to the carbon to which the active hydroxyl group whose active hydrogen is substituted by monovalent organic group is directly coupled. The effects that can be brought about by the coupling of a fluorine atom to such a carbon atom (hereinafter referred to as α carbon) will be explained below in detail with reference to a specific example.

First of all, samples of polymer compounds each having a structure represented by the following chemical formula where fluorine atom is coupled to a predetermined carbon were prepared. Then, the solubility parameter and the polarizability of hydroxyl group of each sample were measured, the results being shown in the graph of FIG. 1.

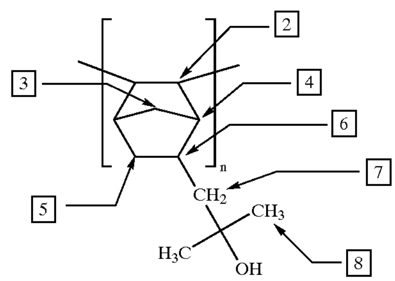

The numbers shown along the abscissa of graph of FIG. 1 denote the position of each of the carbon atoms shown in the above chemical formula. Incidentally, the number 1 of the abscissa of the graph denotes a sample where a fluorine atom is not bonded to any of the carbons of the chemical formula. Whereas the number 9 of the abscissa of the graph denotes a sample where a fluorine atom is directly bonded to an α carbon atom.

As apparent from the graph of FIG. 1, the polarizability of the active hydroxyl group and the solubility parameter of the polymer in the samples where the fluorine atom was introduced into carbon atoms other than the α carbon atom (the numbers 1–8 of the abscissa) were almost the same as those of the sample where the fluorine atom was not introduced into the carbon atom at all (the number 1 of the abscissa). Whereas, in the case of the sample where the fluorine atom was introduced into the α carbon atom (the number 9 of the abscissa), the values with respect to both of the aforementioned polarizability and parameter were greatly varied. More specifically, when one fluorine atom was directly bonded to the α carbon atom, the polarizability of the active hydroxyl group became almost the same as that of phenolic hydroxyl group, and the solubility parameter of the polymer became 11 $(cal \cdot cm^3)^{1/2}$ or so.

Accordingly, it is possible, by enabling one fluorine atom to directly bond to the α carbon atom, to effectively raise the polarizability of the active hydrogen and to enhance the polarizability of the polymer compound.

It is certainly possible to enhance the polarizability of the active hydroxyl group by the introduction of a fluorine atom in the manner as mentioned above. However, there is a possibility that the introduction of a fluorine atom may concurrently deteriorate the hydrophilicity and dry etching resistance of the polymer compound, as well as the adhesiveness thereof to substrate. Since these properties of the polymer compound are depend on the number of fluorine atoms introduced into the polymer compound, it is desirable to confine the number of fluorine atoms to a specific range.

Next, an explanation will be made on the number of fluorine atoms to be introduced into the polymer compound, and the solubility parameter of the polymer.

Herein, a polymer compound having a structure represented by the following chemical formula will be taken into consideration as a specific example. In this polymer compound, $R_{1a}$ and $R_{1b}$ are coupled to an α carbon atom.

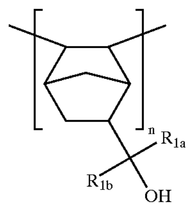

First of all, 10 kinds of polymer were prepared by introducing a hydrogen atom, methyl group, fluorine atom or trifluoromethyl group into these groups $R_{1a}$ and $R_{1b}$. Then, each of these polymers (Polymers 1 to 10) were measured with respect to the solubility parameter and acidity thereof, the results being summarized in the following Table 1.

TABLE 1

| | $R_{1a}$ | $R_{1b}$ | Solubility parameter | Acidity |
|---|---|---|---|---|
| Polymer 1 | H | H | 11.993 | 0.196 |
| Polymer 2 | H | $CH_3$ | 11.326 | 0.195 |
| Polymer 3 | $CH_3$ | $CH_3$ | 10.802 | 0.195 |
| Polymer 4 | H | F | 11.709 | 0.215 |
| Polymer 5 | H | $CF_3$ | 10.839 | 0.214 |
| Polymer 6 | $CH_3$ | F | 11.014 | 0.212 |
| Polymer 7 | $CH_3$ | $CF_3$ | 10.398 | 0.216 |
| Polymer 8 | F | F | 11.266 | 0.232 |
| Polymer 9 | F | $CF_3$ | 10.564 | 0.234 |
| Polymer 10 | $CF_3$ | $CF_3$ | 10.037 | 0.234 |

Further, based on the results shown in Table 1, the relationship between the number of F or $CF_3$ that had been introduced into the polymer compounds and the acidity of the polymer compounds was investigated, the results being shown in the graph of FIG. 2, and at the same time, the relationship between the number of fluorine atoms in the polymer compounds and the solubility parameter of the polymer compounds was investigated, the results being shown in the graph of FIG. 3.

As is apparent from Table 1 and the graph of FIG. 2, the polarizability of the active hydroxyl group in the samples where a fluorine atom was introduced into at least one of these groups $R_{1a}$ and $R_{1b}$ which were bonded to the α carbon atom was almost equivalent to that of the sample where a trifluoromethyl group was introduced into these groups. For example, the polarizability of the active hydroxyl group in the sample where one fluorine atom was introduced into the α carbon atom was almost the same as the polarizability of the phenolic hydroxyl group of the sample where one trifluoromethyl group was introduced into the a carbon atom.

Further, as shown in the graph of FIG. 3, the solubility parameter of the polymer varied in proportion to the number of fluorine atoms that had been introduced into the polymer compound. The solubility parameter of the polymer compound used as a component of a resist for forming a fine pattern should preferably be within the range of 10.1 $(cal \cdot cm^3)^{1/2}$ to 11.5 $(cal \cdot cm^3)^{1/2}$. If this solubility parameter is caused to fall outside this range, there will be raised various problems such as the deterioration of solubility thereof to the ordinary solvents for resist, the phase separation thereof from other components constituting the resist, the generation of cissing due to the deterioration in affinity thereof with a developing solution, and the deterioration in adhesiveness thereof to a substrate.

In the case of the polymer compound having 6 or more fluorine atoms in the repeating unit thereof however, since the hydrophilicity thereof is deteriorated due to the effect of fluorine atoms, the solubility parameter thereof would be caused to fall outside the aforementioned range. A resist film comprising such a polymer compound would be accompanied with the problem that since an alkaline developing solution is likely to be repelled by the resist, it would be impossible to enable the development to proceed uniformly, thereby generating defective development. Additionally, there may be raised another problem that the resist pattern to be formed through the employment of such a polymer compound would be inferior in adhesiveness.

In view of these problems, in the case of the polymer compound for a photoresist, which is represented by the aforementioned general formula (11), (12A) or (12B), it would be preferable to confine the number of fluorine atoms to be included in the repeating unit to not more than 5. Incidentally, in the case of the polymer compound where fluorine atom is not introduced as mentioned above, the polarizability of the active hydroxyl group can be enhanced by introducing a carbonyl structure thereto. However, since the absorbency of this carbonyl structure to light having a wavelength of 157 nm is relatively large, the transparency of the resultant resist would be deteriorated. Therefore, the resist to be subjected to the exposure using a light of a wavelength as short as 157 nm should desirably be formulated such that the polymer compound includes no carbonyl structure.

Incidentally, in the molecular structure where a fluorine atom is not permitted to directly bond to the α carbon atom of the active hydroxyl group, it is desirable that an organic group containing not less than six fluorine atoms is not bonded to the α carbon atom. More specifically, since a fluoromethyl group is desired to be included in the polymer compound, the number of fluorine atoms to be included in the repeating unit should preferably be within the range of 3 to 5.

Further, in the case of the polymer compound where a structure, such as methylene chain for instance, is interposed between the α carbon atom and the bridged alicyclic skeleton, the thermal stability of the polymer compound would be deteriorated and the glass transition point thereof would be decreased. Therefore, the distance between the α carbon atom and the bridged alicyclic skeleton should preferably be as small as possible. In the case of a methylene chain for example, the glass transition point of the polymer compound is caused to lower by about 20 to 30° C. every time the length of the methylene chain is elongated by one unit length thereof. Therefore, it is more preferable that the α carbon atom is directly bonded or coupled to the bridged alicyclic skeleton.

In the aforementioned general formula (11), (12A) or (12B), all of the $R_F$s may be constituted by a fluorine atom. If a fluorine atom is not employed, it is preferable to employ an electron-withdrawing group, in particular, a monovalent organic group comprising a halogen atom. As for this monovalent organic group to be employed in this case, it is possible to introduce therein the groups that can be introduced, as the $R^{x1}$, into the aforementioned general formula (1).

As for the monovalent organic groups comprising no halogen atom that can be introduced as the $R_F$, the same groups as in the case of the $R^{x1}$ can be employed. Namely, it is possible to employ, as already explained above, a pentyl group, cyclohexyl group, methyl group, ethyl group, propylbutyl group, n-butyl group, isobutyl group, s-butyl group, t-butyl group, cyclohexylmethyl group, isopropyl group, allyl group, propargyl group, cyclohexylmethylethyl group, hydrocarbon group, pentacycloalkyl group, tetracycloalkyl group, decanyl group, cholanyl group, tricycloalkyl group, bicycloalkyl group, heterocycloalkyl group, a group having terpenoid skeleton and cyano group.

Incidentally, as for the alicyclic skeleton to be introduced as the R into the aforementioned general formula, the monovalent organic group to be introduced as the $R^2$ or $R_P$, and the coupling group to be introduced as the W, it is possible to employ the same kinds of alicyclic skeleton or groups that have been explained already with reference to the general formula (1).

As for the raw materials for the aforementioned polymer compounds useful for forming a photoresist, it is possible to employ monomer compounds having a polymerizable double bond. For example, it is possible to employ adamantane, tricyclodecane, tetracyclodecane, hydronaphthalene skeleton, a compound having an oxygen atom introduced between some of the C—C bonds constituting the hydronaphthalene skeleton, tricyclodeca(mono)diene, or a compound having fluorine atom introduced into tetracyclodeca(mono)diene.

The polymer compound having a structure represented by the aforementioned general formula (11), (12A) or (12B) can be synthesized by a process wherein a monomer comprising a compound having, in its molecule, the aforementioned bridged alicyclic skeleton having a fluorine atom bonded to the α carbon atom and a polymerizable double bond, for example, is allowed to polymerize by radical polymerization, anionic polymerization, cationic polymerization or polymerization using a Ziegler-Natta catalyst.

As for the monomer (monomer compound) that can be employed in this case, it is possible to employ a compound having a skeleton represented by the following general formula (m-1), (m-2a), (m-2b), (m-3a), (m-3b) or (m-3c):

(m-1)

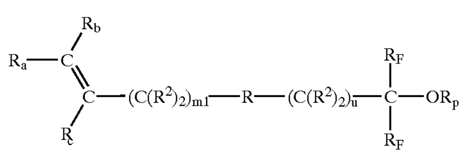

(wherein R is an alicyclic skeleton; at least one of $R_F$s is fluorine atom, the residual $R_F$s being the same or different and being individually a hydrogen atom or monovalent organic group; $R_P$ is a hydrogen atom or monovalent organic group; $R^2$s may be the same or different and are individually a hydrogen atom or monovalent organic group; $R_a$, $R_b$ and $R_c$ may be the same or different and are individually a hydrogen atom, halogen atom or monovalent organic group; and ml and u are 0 or an integer not less than 1; with the proviso that R may contain a heteroatom, and that some of R, $R_F$, $R_a$, $R_b$, $R_c$ and $R^2$ may be combined with each other to form a ring);

(m-2a)

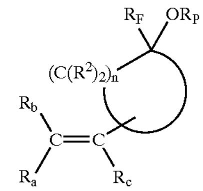

(m-2b)

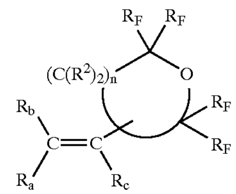

(wherein at least one of $R_F$s is fluorine atom, the residual $R_F$s being the same or different and being individually a hydrogen atom or monovalent organic group; $R_P$ is a hydrogen atom or monovalent organic group; $R^2$s may be the same or different and are individually a hydrogen atom or monovalent organic group; $R_a$, $R_b$ and $R_c$ may be the same or different and are individually a hydrogen atom, halogen atom or monovalent organic group; and n is an integer ranging from 2 to 25; with the proviso that at least two carbon atoms selected from carbon atoms constituting $R_F$, $R_a$, $R_b$, $R_c$ and $R^2$, and carbon atoms to which $F_2$s are connected may be combined with each other to form a condensed ring);

(m-3a)

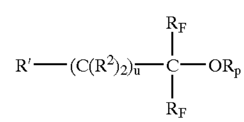

(m-3b)

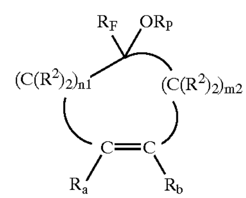

(m-3c)

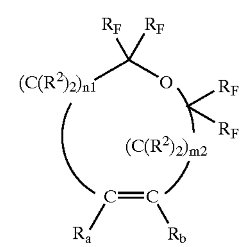

(wherein R' is an alicyclic skeleton having at least one double bond in the structure thereof; at least one of $R_F$s is fluorine atom, the residual $R_F$s being the same or different and being individually a hydrogen atom or monovalent organic group; $R_P$ is a hydrogen atom or monovalent organic group; $R^2$s may be the same or different and are individually a hydrogen atom or monovalent organic group; $R_a$ and $R_b$ may be the same or different and are individually a hydrogen atom, halogen atom or monovalent organic group; and m and n are an integer ranging from 0 to 25; with the proviso that R may contain a heteroatom and that at least two carbon atoms selected from carbon atoms constituting R', $R_a$, $R_b$, $R^2$ and $R_F$, and carbon atoms to which R', $R_a$, $R_b$, $R^2$ and $R_F$ are connected may be combined with each other to form a condensed ring).

As mentioned above with reference to the general formulas (11), (12A) and (12B), any of the aforementioned monomer compound should preferably be constructed in such a manner that the number of fluorine atoms in the compound be within the range of 1 to 5. Further, in order to prevent the glass transition point thereof from being lowered, the skeletons represented by the general formulas (m-1) and (m-3a) should preferably be constructed in such a manner that the u thereof is made zero so as to enable the bridged alicyclic skeleton to be directly bonded to the α carbon atom.

It is possible, through the polymerization of a monomer compound represented by the general formula (m-1), (m-2a) or (m-2b) out of the aforementioned monomer compounds, to obtain a polymer compound for a photoresist, which comprises a repeating unit provided, on its side chain, with an alicyclic skeleton having a fluorine atom introduced therein. The polymer compounds produced in this manner are excellent in dry etching resistance and in adhesiveness.

On the other hand, it is possible, through the polymerization of a monomer compound represented by the general formula (m-3a), (m-3b) or (m-3c), to obtain a polymer having an alicyclic skeleton in its main chain. When a Ziegler-Natta catalyst is employed in this case, a polymer having a higher molecular weight can be synthesized. Incidentally, the polymer compounds to be produced herein may be of a low molecular weight as long as they are capable of forming a film. Accordingly, these monomer compounds may be polymerized by any convenient procedure, such as radical polymerization, to obtain and use a polymer compound wherein compounds of low molecular weight and compounds of high molecular weight are mixed together.

As explained above, the polymer compounds useful for forming a photoresist, as well as the monomer compounds to be employed as raw materials for the aforementioned polymer compounds according to the present invention, may be the to be fluorine-containing alicyclic resins or raw materials for these resins, wherein these resins or raw materials may include polyhydric alcohols having at least two hydroxyl groups and a conjugated polycyclic fused aromatic skeleton. In this case, it is possible to employ plural kinds of compounds as a mixture as long as a fluorine atom is directly bonded to at least one of the α carbon atoms of the polyhydric alcohols.

Incidentally, the photosensitive resin compositions according to the present invention may be formulated such that a polyfluoro substituent group or polynorbornene bond concurrently exists therein.

Because of the reasons to secure a sufficient transparency of resist to a short wavelength beam as explained above, it is desirable that the light absorbency of the polymer compounds according to the present invention to a light 157 nm in wavelength should be confined to 4 or less per 1 μm. Namely, it is desirable that the polymer compound is formed of one which is copolymerized with a compound free from any molecular skeleton highly capable of absorbing the light of short wavelength zone such as a benzene nucleus.

Further, as described above, in order to provide the polymer compounds with excellent mechanical strength as well as excellent resolution, the weight average molecular weight of the aforementioned polymer compound should preferably be within the range of 1,000 to 500,000 (as it is reduced to polystyrene), more preferably 1,500 to 50,000. The polymer compound for a photoresist according to the present invention is generally permitted to co-exist together with other copolymerizable compounds and to be constituted by components having various molecular weights. The polymer compound according to the present invention is capable of exhibiting desirable effects even if the molecular weight thereof is relatively low. For example, the polymer compound according to the present invention may be predominantly constituted by components having an average molecular weight ranging from 1,000 to 2,000. The polymer compound mainly constituted by these low molecular weight components is advantageous in suppressing the non-uniform dissolution. Further, the polymer compound according to the present invention may contain a large quantity of residual monomers as long as no problem is raised by the inclusion of these monomers.

The polymer compound having a structure represented by the aforementioned general formula (11), (12A) or (12B) can be synthesized by the polymerization of a monomer compound represented by the aforementioned general formula (m-1), (m-2a), (m-2b), (m-3a), (m-3b) or (3-c). The polymer to be obtained may be a homopolymer that can be obtained through the homopolymerization of any of these monomer compounds, or may be a copolymer that can be obtained through the copolymerization thereof with various vinyl compounds. As for specific examples of the vinyl compounds to be employed in this case, it is possible to employ, in addition to those which have been already explained above, maleic anhydride, norbornene and norbornene carboxylic acid. Among these vinyl compounds, acids may be in the form of ester compounds thereof, and the hydrogen atom bonded to the vinyl bond of these vinyl compounds may be substituted by other kinds of atom or substituent groups.

As for the skeleton especially desirable as a component to be copolymerized with the aforementioned monomer having an alicyclic skeleton having fluorine atom introduced therein, it is preferable, in view of enabling the ordinary radical polymerization to proceed, to employ an acrylate compound provided, at the α-position thereof, with an electron-withdrawing substituent group, such as halogen atom, cyano group, alkyl halide group, sulfonyl group, etc. Further, in view of enhancing the hydrophobicity of the resist, it would be more preferable that the acrylate compound is provided, at the α-position thereof, with a halogen atom. Further, if the resist is to be photo-sensitized with a light of 157 nm in wavelength, it is preferable, in view of enhancing the transparency of the resist, that the aforementioned skeleton includes a fluorine atom bonded to the α-position thereof.

It is preferable, in view of enhancing the dry etching resistance, that the aforementioned monomer is provided, at the side chain thereof, with an alicyclic skeleton. Specific examples of such a monomer include the compounds represented by the following general formula (C1).

(C1)

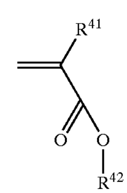

wherein $R^{41}$ is a halogen atom, cyano group, alkyl halide group or sulfonyl group; and $R^{42}$ is a hydrogen atom, alkyl group or an alicyclic skeleton.

When the $R^{41}$ is a halogen atom, the resultant monomer would preferably be improved in terms of polymerizability, hydrophilicity and transparency. In particular, when the exposure wavelength to be employed is 157 nm or so, the employment of fluorine atom as the $R^{41}$ is desirable in improving the transparency of the polymer compound to be obtained. Further, the employment of a tertiary ester structure as a skeleton that will be introduced into the $R^{42}$ would be preferable because the $R^{42}$ would become the group that can be decomposed by an acid. The inclusion of OH group, oxo (=O) group or COOR (wherein R is a hydrogen atom or alkyl group) group in the alicyclic skeleton, or the replacement of one of the rings constituting the alicyclic skeleton by lactone would be preferable because the specific hyrophobicity, which is inherent to the alicyclic skeleton, can be alleviated. Further, in terms of the transparency of the polymer to be obtained, the employment of an OH group is most preferable.

More specifically, the aforementioned monomers can be selected from the compounds represented the following general formulas (C2), (C3) and (C4).

(C2)

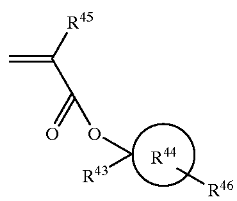

(C3)

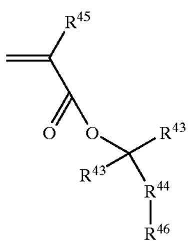

(C4)

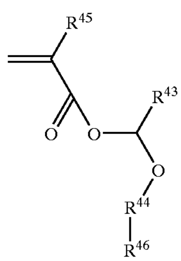

wherein $R^{45}$ is a halogen atom or alkyl group which is halogenated; $R^{43}$ is an alkyl group; $R^{44}$ is an alicyclic skeleton or alicyclic skeleton having an oxygen atom in the ring thereof; and $R^{46}$ is a halogen atom, OH group, fluorine atom, a substituent group comprising a fluoroalcohol, COOR (wherein R is an alkyl group) or oxo group (=O).

It is preferable that the $R^{45}$ is constituted by a chlorine atom or fluorine atom, and the $R^{46}$ is constituted by a hydrogen atom or OH group.

The compounds represented by the aforementioned general formulas (C2) and (C3) can be easily synthesized by the following procedures. First of all, an acid chloride of a corresponding α-substituted acryl is synthesized. Further, a corresponding alicyclic alcohol is synthesized. Thereafter, these compounds are allowed to react with other in the presence of a basic catalyst, such as trimethyl amine, to obtain a compound represented by the general formulas (C2) and (C3). As for the α-substituted acryl employed as a starting material in this case, it is possible to employ, for example, those where the a position is substituted by a fluorine atom (Florin Co., Ltd.), by a chlorine atom (Lancaster Co., Ltd.) or by $CF_3$ (Apollo Scientific Co., Ltd.). Then, a large quantity of thionyl chloride is added to this α-substituted acryl and refluxed to remove a superfluous quantity of thionyl chloride, thereby obtaining a corresponding acid chloride compound.

The corresponding alicyclic alcohol can be synthesized by the following procedures, for example.

(D2)

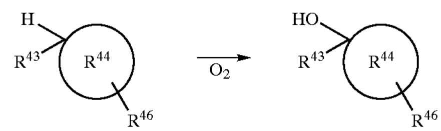

(D3)

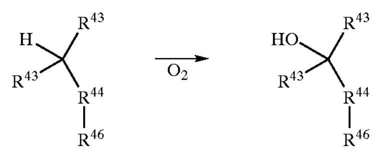

A compound having a hydrogen atom-substituted or methyl-substituted alicyclic skeleton is prepared as a starting material. To this starting material are added catalytic quantities of N-hydroxyphthalic imide and a rare earth catalyst, such as acetyl acetonate of cobalt, manganese or samarium, to oxidize the starting material in the presence of oxygen, thus enabling OH group to be selectively introduced into the tertiary position of the compound. The same procedures as described above can be employed for the introduction of a substituent group into the $R^{45}$. For example, by using the same procedures as described above, the $R^{45}$ can be relatively easily converted into an OH group. Further, this OH group can be oxidized so as to convert it into an oxo group (=O). It is possible, through a further progress of this oxidation, to insert an oxygen atom into a site between the oxo-substituted carbon and the carbon adjacent thereto, thereby converting it into lactone.

The compound represented by the general formula (C4) can be easily obtained by a process wherein a corresponding α-substituted acryl is permitted to addition-react with a corresponding alicyclic vinyl ether in the presence of an acid catalyst, such as hydrochloric acid. The aforementioned alicyclic vinyl ether can be obtained by a process as shown in the following reaction formulas, wherein an ester of vinyl alcohol is added to a corresponding alicyclic alcohol in the presence of a catalyst, to obtain an adduct, which is then subjected to the ester hydrolysis thereof, which is followed by dehydration.

(D4)

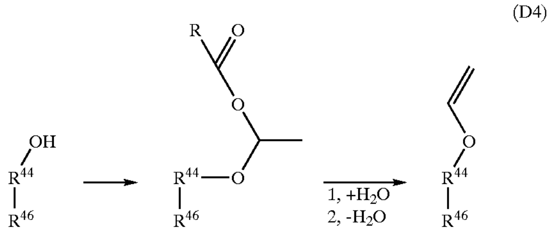

In view of adjusting the alkali-solubility of the polymer compound for a photoresist and improving the adhesiveness thereof to the substrate of resist, the aforementioned monomers may be copolymerized with the following compounds. Examples of such compounds include acrylic acids where the α site thereof is substituted by hydrogen atom, or an electron-withdrawing group such as methyl group, halogen atom, cyano group, alkyl halide group or sulfonyl group; isopropenylcarboxylic acids and ester-substitution products thereof; vinylphenol or vinylphenol having a halogen atom introduced into the aromatic ring thereof; vinyl compounds having an aliphatic OH group in the side chain thereof; vinyl compounds having a lactone skeleton in the side chain thereof; and vinyl compounds comprising a low pKa alcohol group having an electron-withdrawing group introduced into an adjacent carbon atom, such as $SO_2$ or fluoroalcohols. Further, the aforementioned alkali-soluble compounds may be constructed such that they are copolymerized with a compound having an alkali-soluble group protected by an acid-decomposable group having a dissolution-inhibiting capability.

As for the acid-decomposable group, it is possible to employ the esters of carboxylic acids or the esters of a low pKa alcohol having an electron-withdrawing group introduced into an adjacent carbon atom, as explained above. More specifically, it is possible to employ the esters, ether, acetal, ketal, cyclic orthoester, silylketene acetal, silyl ether, acyclic acetals or ketals, cyclic acetals or ketals, and cyanohydrins of carboxylic acid or fluoroalcohol. It is preferable in particular, in view of easy decomposability by using an acid as explained above, to employ a t-butyl group, ethoxyethyl group, 3-carbonylcyclohexyl group, isobornonyl group, trimethylsilyl group, tetrahydropyranyl group, azacarbonyl group, and an alicyclic compound having a tertiary ester structure.

Incidentally, the $OR_P$ in the aforementioned general formulas (11) and (12A) should preferably be constituted by any of the aforementioned acid decomposable groups.

In view of enhancing the dry etching resistance as already explained, the acid decomposable groups mentioned above themselves should preferably be respectively formed of an alicyclic compound. Namely, it is preferable to employ, as a copolymer component of the polymer compound, a monomer which enables carboxylic acid to be generated through the dissociation thereof from an aliphatic ring due to the effect of an acid. As for examples of such a monomer, it is preferable to employ vinylpyranyl carbonate, isopropenylpyranyl carbonate, alicyclic vinylcarbonyl ester (having a side chain constituted of a pyranyl-protected carbonyl group)/isopropenylcarbonyl ester, and a tertiary vinylcarbonyl ester of methanediol/isopropenylcarbonyl ester. It is more preferable to employ, as the aforementioned monomer, vinylcarbonyl ester of 2-alkyl-2-adamantanol/isopropenylcarbonyl ester, diadamantylpropanol, vinylcarbonyl ester of dialkylmonoadamantyl methanol/isopropenylcarbonyl ester.

If the aforementioned monomers are to be copolymerized, the copolymerization ratio of these monomers will be determined depending on the hydrophilicity of each of these monomers, thus it is difficult to determine it definitely. Generally, the solubility parameter of the polymer should preferably be within the range of 9.5 $(cal\cdot cm^3)^{1/2}$ to 12 $(cal\cdot cm^3)^{1/2}$, more preferably within the range of 10.1 $(cal\cdot cm^3)^{1/2}$ to 11.5 $(cal\cdot cm^3)^{1/2}$. The copolymers falling within this range are constructed such that the composition ratio of the monomer having an alicyclic skeleton with a fluoro group introduced therein is within the range of 10 to 50 mol %, and that the ratio of the acrylate compound provided, at the α site thereof, with an electron-withdrawing substituent group is within the range of 10 to 80 mol %.

Not only the polymer compound but also a portion of the structure of an additive (dissolution-inhibiting agent) to be explained hereinafter may be provided with any of the aforementioned acid-decomposable groups protecting the alkali-soluble group.

Incidentally, if the aforementioned copolymers are to be employed as a base resin in the photosensitive resin composition of the present invention, the copolymerization ratio of other components, such as a vinyl compound having an acid-decomposable group, should preferably be within the range of 10 to 80 mol %, more preferably 15 to 70 mol %, based on the quantity of any of these copolymers. Because, if this copolymerization ratio is less than 10 mol %, it may become difficult to attain a sufficient dissolution-inhibiting effect. On the other hand, if this copolymerization ratio is made larger than 80 mol %, it may become difficult to form a resist pattern which is excellent in resolution.

The photosensitive resin composition according to the present invention comprises the aforementioned polymer compound for photoresist, and a photo-acid generating agent. The photosensitive resin composition according to the present invention may also comprise a so-called dissolution inhibiting compound whose solubility to an alkaline solution can be increased by the irradiation of radiation, or an aminic additive.

As for the dissolution inhibiting agent, it is possible to employ, for example, an acid decomposable compound which has a sufficient dissolution-inhibiting capability to an alkaline solution and is capable of enabling a product that can be obtained through the decomposition thereof to generate —O— in the alkaline solution.

Specific examples of the acid decomposable compound include the compounds obtained through the modification of phenolic compounds into the compounds such as t-buthoxycarbonyl ether, tetrahydropyranyl ether, 3-bromotetrahydropyranyl ether, 1-methoxycyclohexyl ether, 4-methoxytetrahydropyranyl ether, 1,4-dioxan-2-yl ether, tetrahydrofuranyl ether, 2,3,3a,4,5,6,7,7a-octahydro-7,8,8-trimethyl-4,7-methanobenzofuran-2-yl ether, t-butyl ether, trimethylsilyl ether, triethylsilyl ether, triisopropylsilyl ether, dimethylisopropylsilyl ether, diethylisopropylsilyl ether, dimethylthexylsilyl ether, and t-butyldimethylsilyl ether. It is also possible to employ Meldrum's acid derivatives as the acid decomposable compound. Preferable examples of the acid decomposable compound out of these compounds are compounds where the hydroxyl group of the phenolic compound is protected by t-buthoxycarbonyl group, t-buthoxycarbonylmethyl group, trimethylsilyl group, t-butyldimethylsilyl or tetrahydrofuranyl group; a compound comprising naphthaldehyde to which Meldrum's acid is added; and a compound comprising aldehyde formed of an alicyclic structure to which Meldrum's acid is added.

The dissolution-inhibitinte agent to be employed in the present invention may be a polyvalent carboxylic acid of a fused polycyclic (alicyclic or aromatic ring) structure which is modified into the derivatives thereof such as an isopropylcarbonyl ester, tetrahydropyranylcarbonyl ester, tetrahydrofuranylcarbonyl ester, methoxyethoxymethylcarbonyl ester, 2-trimethylsilylethoxymethylcarbonyl ester, t-butylcarbonyl ester, trimethylsilylcarbonyl ester, triethylsilylcarbonyl ester, t-butyldimethylsilylcarbonyl ester, isopropyldimethylsilylcarbonyl ester, di-t-butylmethylsilylcarbonyl ester, oxazole, 2-alkyl-1,3-oxazoline, 4-alkyl-5-oxo-1,3-oxazoline and 5-alkyl-4-oxo-1,3-dioxolane. It is also possible to employ the following compounds.

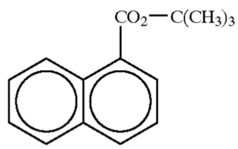
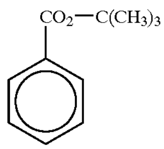
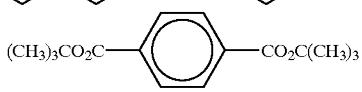
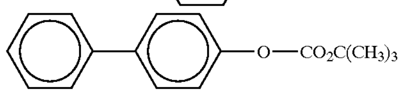
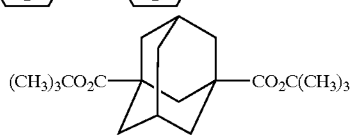
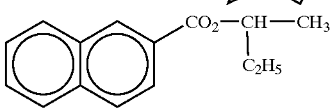
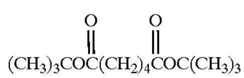
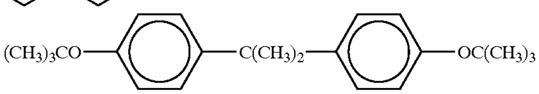
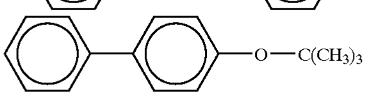
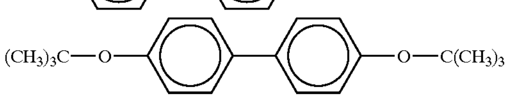
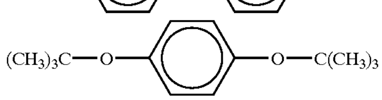
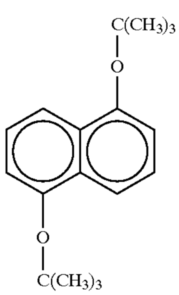
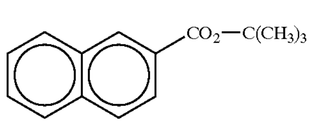
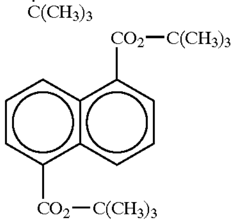
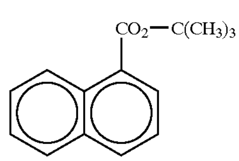

-continued

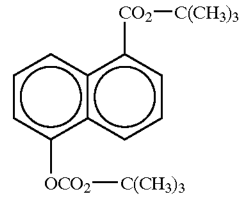
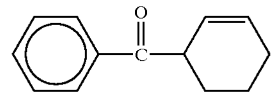
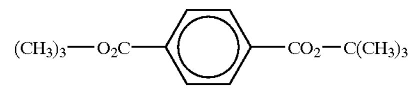
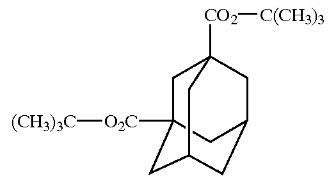
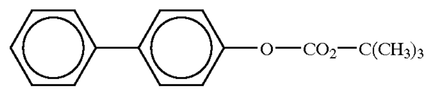
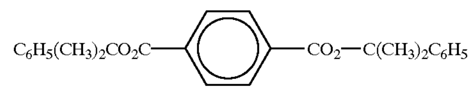
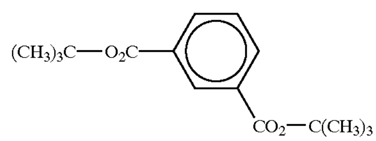
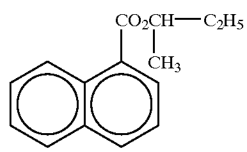
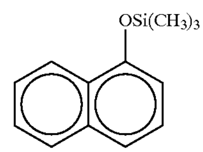
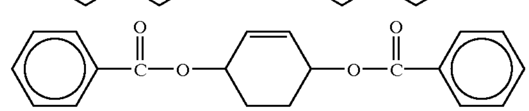
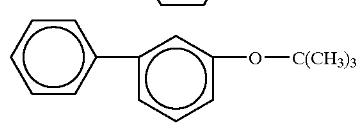
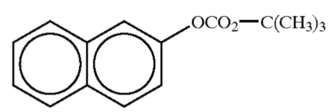
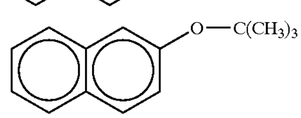
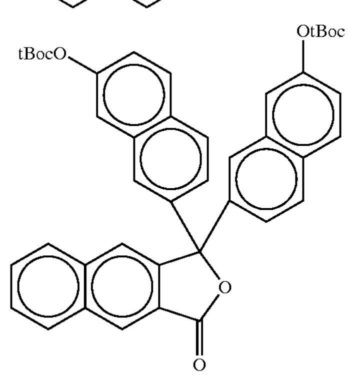

-continued
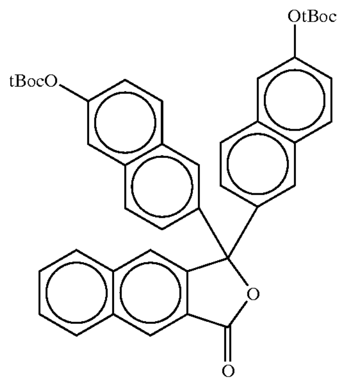
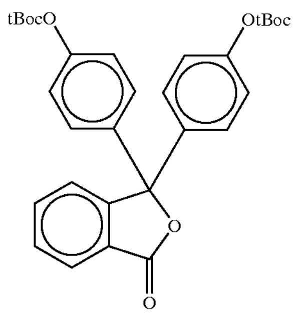
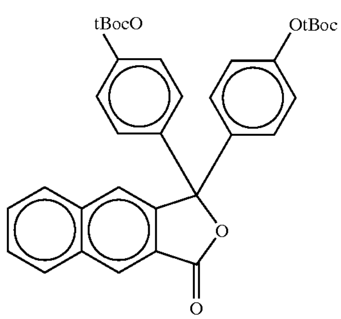
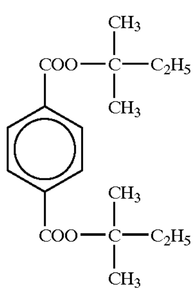
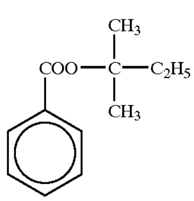
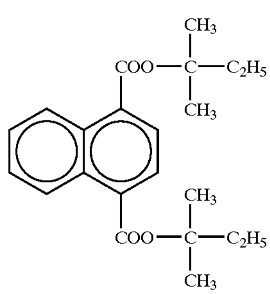
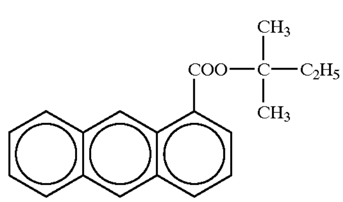
-continued
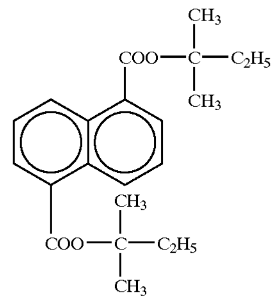
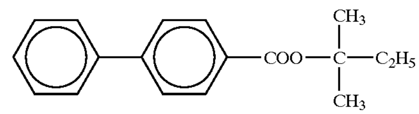
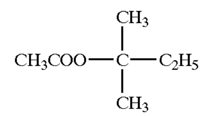
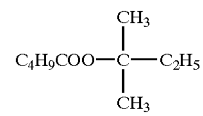
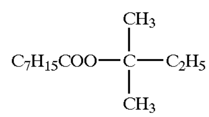
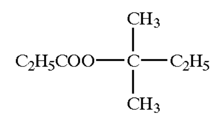
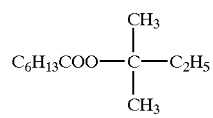
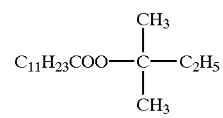
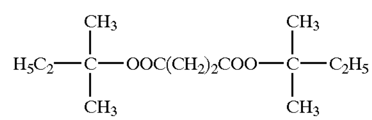
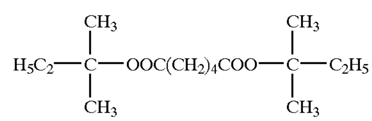
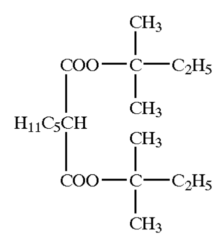
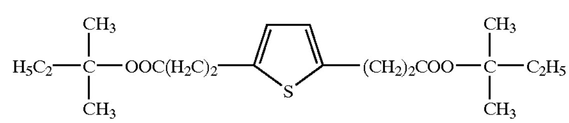
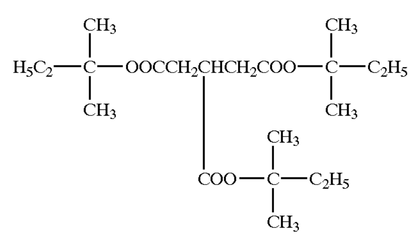
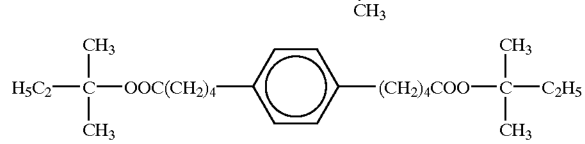

-continued

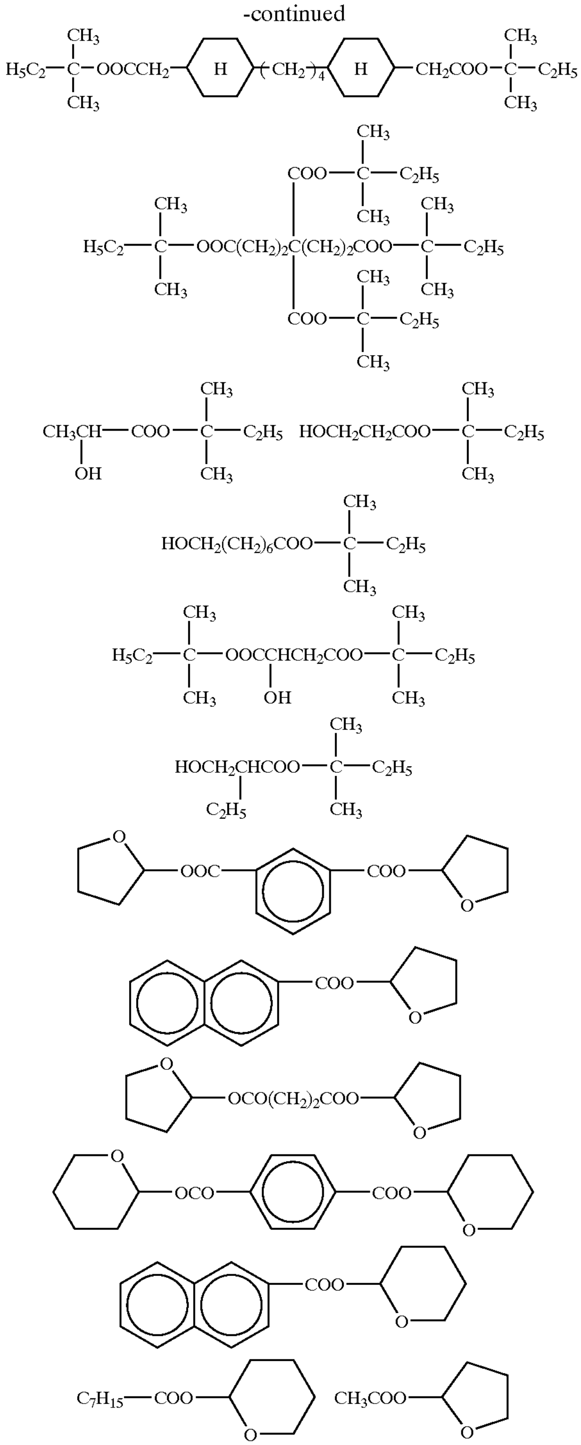

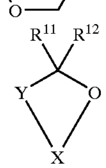

(wherein $R^{11}$ and $R^{12}$ may be the same or different and are individually a hydrogen atom, halogen atom, cyano group, nitro group, silyl group and monovalent organic group, wherein $R^{11}$ and $R^{12}$ may be combined with each other to form a ring; X is >C or —$SO_2$—; and Y is a bivalent organic group; with the proviso that at least one selected from $R^{11}$, $R^{12}$ and Y is a substituent group or functional group that can be decomposed by an acid)

As for the monovalent organic group which can be introduced into these compounds, it is possible to employ an alkyl group such as methyl, propyl, isopropyl, n-butyl, s-butyl or t-butyl; or substituted or unsubstituted alicyclic group or heterocyclic group such as cyclohexyl, piperidyl and pyranyl group.

As for the bivalent organic group Y, it is possible to employ, for example, an unsaturated aliphatic group such as ethylene, propylene and butylene; or substituted or unsubstituted alicyclic group or heterocyclic group, such as cyclohexane, piperidine, pyrane and morpholane.

Among these dissolution-inhibiting agents, the employment of conjugated polycyclic aromatic compounds is preferable in the present invention because of excellent transparency of these aromatic compounds to short wavelength beams. The term "conjugated polycyclic aromatic compound" means a non-fused polycyclic or fused polycyclic compound having a skeleton where every other bond is an unsaturated bond, thereby rendering a plurality of aromatic rings to be linked plane-wise. Since the conjugation of π electron is stabilized in this compound, the photoabsorption band thereof is shifted toward the low wavelength zone. Since a conjugated polycyclic aromatic compound is especially employed as a dissolution-inihibiting agent in the present invention, it is now possible to obtain a photosensitive resin composition excellent in transparency to a short wavelength beam and also satisfactory in heat resistance.

More specifically, it is possible to employ, as the conjugated polycyclic aromatic compound, compounds having a naphthalene ring, anthracene ring, phenanthrene ring, pyrene ring, naphtacene ring, chrysene ring, 3,4-benzophenanthrene ring, perylene ring, pentacene ring, picene ring, pyrrol ring, benzofuran ring, benzothiophene ring, indole ring, benzooxazole ring, benzothiazole ring, indazole ring, cromene ring, quinolinezinoline ring, phthalazine ring, quinazoline ring, dibenzofuran ring, carbazole ring, acridine ring, phenanthridine ring, phenanthroline ring, phenazine ring, thiatolene ring, indolizine ring, naphthylidine ring, purine ring, pteridine ring or fluorene ring. Among these compounds, the fused polycyclic compounds having a naphthalene ring, anthracene ring or phenanthrene ring are more preferable in terms of the transparency to the light having a wavelength of 157 nm. Therefore, it is especially preferable to employ, as a dissolution-inhibiting agent, a polyhydroxyl compound having the aforementioned fused aromatic structure where the hydroxyl group thereof is protected by a t-butylcarbonate group, t-butyl ester group, tetrahydropyranyl ether group, acetal group or trimethylsilyl ether group, etc.; or a fused compound consisting of an aldehyde compound having any of these fused aromatic ring structure, and Meldrum's acid.

It is preferable, according to the present invention, to co-use, other than the aforementioned acid-decomposable compounds a naphthol novolac compound having a molecular weight ranging from about 200 to 2,000. Further, in the case where the alkali-soluble group of a base resin is protected by an acid-decomposable group provided with a dissolution-inhibiting capability to an alkaline solution, this naphthol novolac compound can be incorporated singly as a dissolution-inhibiting agent. This naphthol novolac compound can be easily produced through the condensation of naphthol, or a derivative thereof, with a carbonyl compound.

The mixing ratio of the dissolution-inhibiting agent in the photosensitive resin composition according to the present invention should preferably be set in the range of 3 to 40 mole % more preferably 10 to 30 mole % based on the mole number of the corresponding monomer of the base resin. If the mixing ratio of the dissolution-inhibiting agent is less than 3 mole %, it would become difficult to form a resist pattern excellent in resolution. On the other hand, if the mixing ratio of the dissolution-inhibiting agent exceeds 40 mole %, the mechanical strength of the resist film to be formed may be deteriorated, and at the same time, the dissolution rate of the portions of the resist film that have been subjected to exposure would be likely to be greatly deteriorated when the aforementioned portions of resist film are dissolved and removed by using an alkaline solution.

Further, as for the photo-acid generating agent to be incorporated into the photosensitive resin composition according to the present invention, it is possible to employ, for example, an aryl onium salt, a naphthoquinone diazide compound, a diazonium salt, a sulfonate compound, a sulfonium compound, a sulfamide compound, an iodonium compound and a sulfonyl diazomethane compound. As specific examples of the aforementioned compounds, the following compounds can be employed. Namely, they include triphenylsulfonium triflate, diphenyliodonium triflate, 2,3,4,4-tetrahydroxybenzophenone-4-naphthoquinone diazide sulfonate, 4-N-phenylamino-2-methoxyphenyl diazide sulfate, 4-N-phenylamino-2-methoxyphenyldiazonium-p-ethylphenyl sulfate, 4-N-phenylamino-2-methoxyphenyldiazonium-2-naphtyl sulfate, 4-N-phenylamino-2-methoxyphenyldiazoniumphenyl sulfate, 2,5-diethoxy-4-N-4'-methoxyphenylcarbonylphenyldiazonium-3-carboxy-4-hydroxyphenyl sulfate, 2-methoxy-4-N-phenylphenyldiazonium-3-carboxy-4-hydroxyphenyl sulfate, diphenylsulfonyl methane, diphenylsulfonyl diazomethane, diphenyl disulfone, α-methylbenzoin tosylate, pyrogallol trimesylate, benzoin tosylate, MPI-103 (CAS. NO. [87709-41-9]; Midori Kagaku Co., Ltd.), BDS-105 (CAS. NO. [145612-66-4]; Midori Kagaku Co., Ltd.), NDS-103 (CAS. NO. [110098-97-0]; Midori Kagaku Co., Ltd.), MDS-203 (CAS. NO. [127855-15-5]; Midori Kagaku Co., Ltd.), Pyrogallo tritosylate (CAS. NO. [20032-64-8]; Midori Kagaku Co., Ltd.), DTS-102 (CAS. NO. [75482-18-7]; Midori Kagaku Co., Ltd.), DTS-103 (CAS. NO. [71449-78-0]; Midori Kagaku Co., Ltd.), MDS-103 (CAS. NO. [127279-74-7]; Midori Kagaku Co., Ltd.), MDS-105 (CAS. NO. [116808-67-4]; Midori Kagaku Co., Ltd.), MDS-205 (CAS. NO. [81416-37-7]; Midori Kagaku Co., Ltd.), BMS-105 (CAS. NO. [149934-68-9]; Midori Kagaku Co., Ltd.), TMS-105 (CAS. NO. [127820-38-6]; Midori Kagaku Co., Ltd.), NB-101 (CAS. NO. [20444-09-1]; Midori Kagaku Co., Ltd.), NB-201 (CAS. NO. [4450-68-4]; Midori Kagaku Co., Ltd.), DNB-101 (CAS. NO. [114719-51-6]; Midori Kagaku Co., Ltd.), DNB-102 (CAS. NO. [131509-55-2]; Midori Kagaku Co., Ltd.), DNB-103 (CAS. NO. [132898-35-2]; Midori Kagaku Co., Ltd.), DNB-104 (CAS. NO. [132898-36-3]; Midori Kagaku Co., Ltd.), DNB-105 (CAS. NO. [132898-37-4]; Midori Kagaku Co., Ltd.), DAM-101 (CAS. NO. [1886-74-4]; Midori Kagaku Co., Ltd.), DAM-102 (CAS. NO. [28343-24-0]; Midori Kagaku Co., Ltd.), DAM-103 (CAS. NO. [14159-45-6]; Midori Kagaku Co., Ltd.), DAM-104 (CAS. NO. [130290-80-1] and CAS.NO. [130290-82-3]; Midori Kagaku Co., Ltd.), DAM-201 (CAS. NO. [28322-50-1]; Midori Kagaku Co., Ltd.), CMS-105 (Midori Kagaku Co., Ltd.), DAM-301 (CAS. NO. [138529-81-4]; Midori Kagaku Co., Ltd.), SI-105 (CAS. NO. [34694-40-7]; Midori Kagaku Co., Ltd.), NDI-105 (CAS. NO. [133710-62-0]; Midori Kagaku Co., Ltd.) and EPI-105 (CAS. NO. [135133-12-9]; Midori Kagaku Co., Ltd.). The following compounds can be also employed in this case.

FDS-105

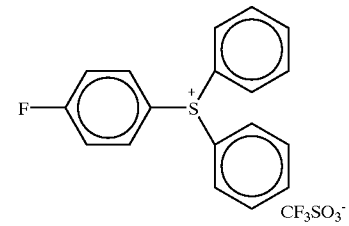

MDS-305

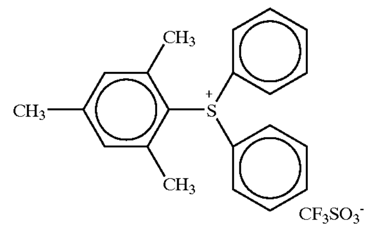

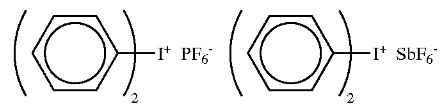

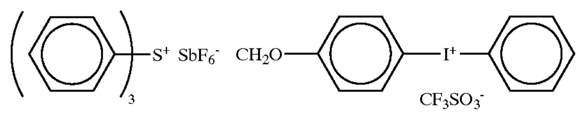

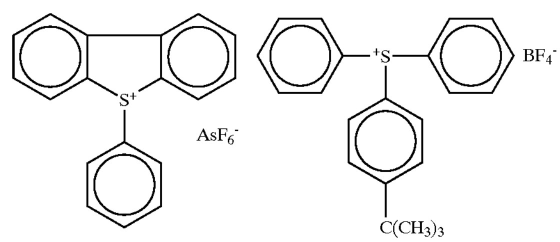

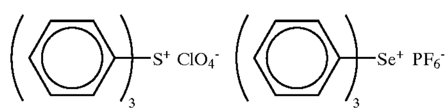

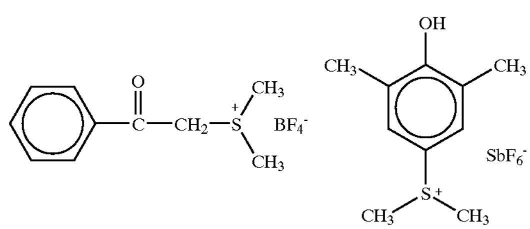

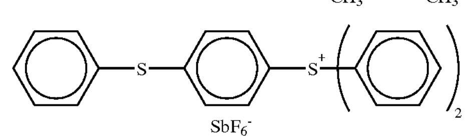

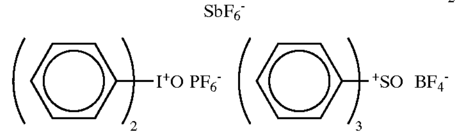

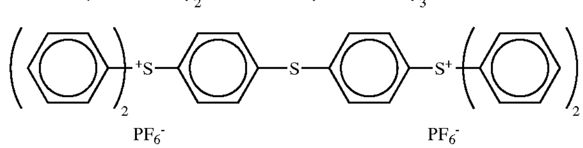

-continued
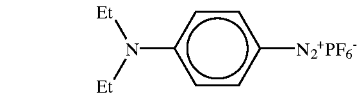
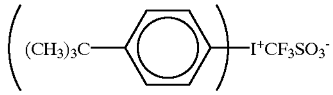
$[C_6H_5Fe^+C_6H_5]PF_6^-$
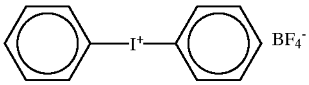
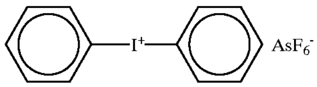
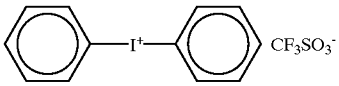
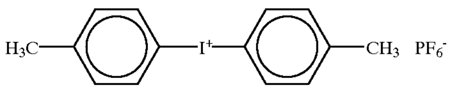
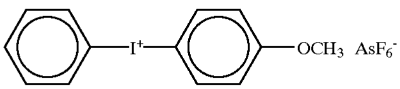
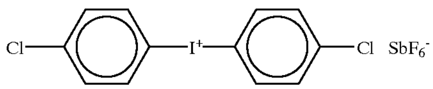
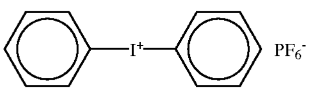
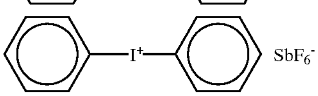
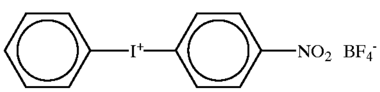
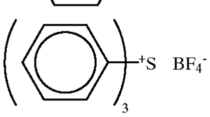
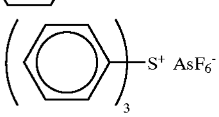
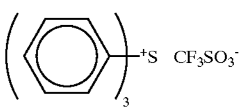
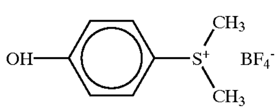
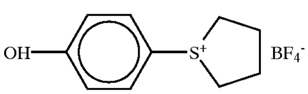
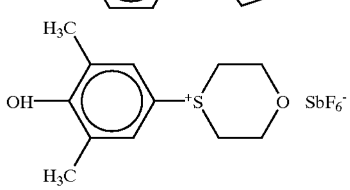
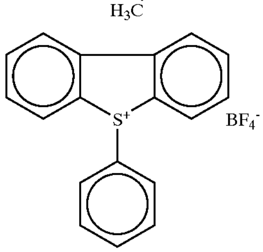
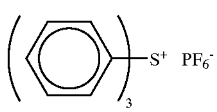
-continued
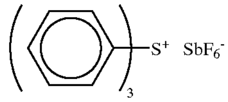
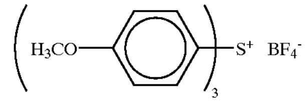
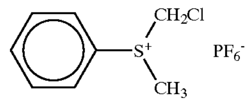
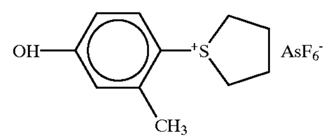
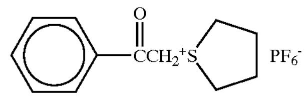
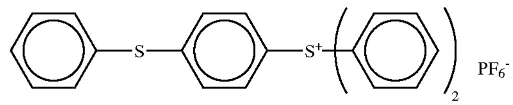
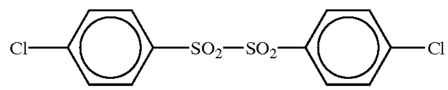
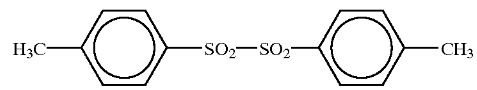
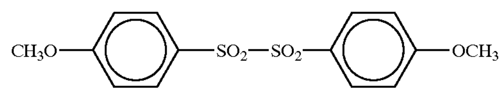
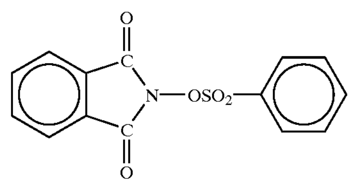
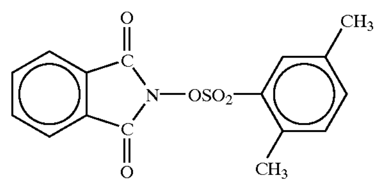
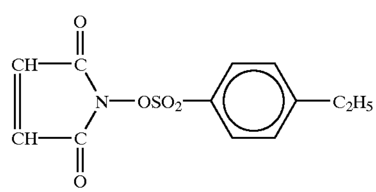
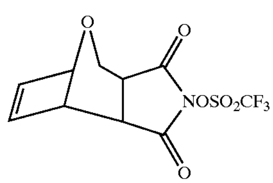
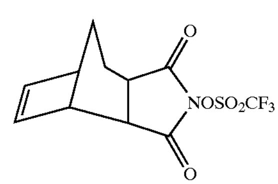
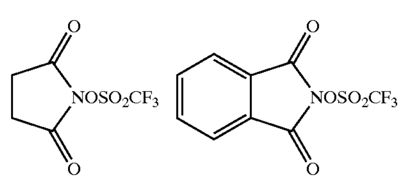

-continued

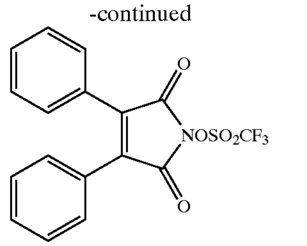

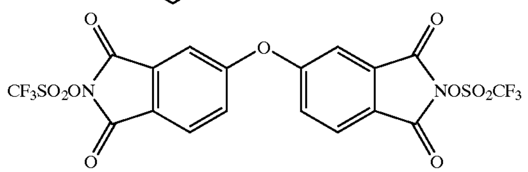

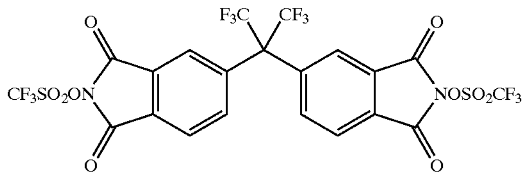

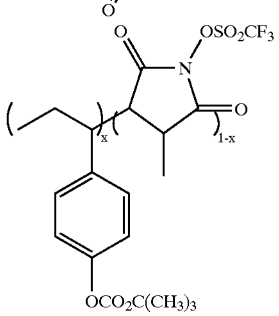

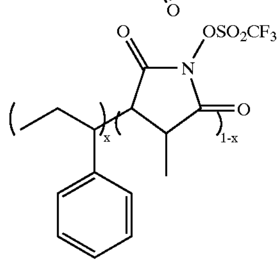

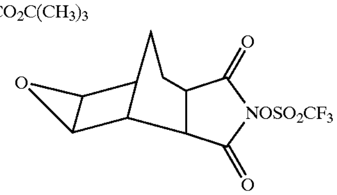

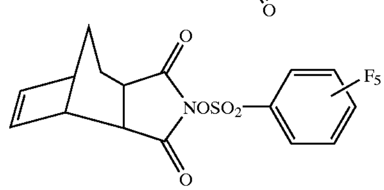

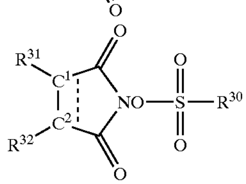

(wherein $C^1$ and $C^2$ are bonded with each other through a single bond or a double bond; $R^{30}$ is a hydrogen atom, fluorine atom, or alkyl group or aryl group both of which may be provided with substituted fluorine atom; and $R^{31}$ and $R^{32}$ may be the same or different and are individually a monovalent organic group with the proviso that these $R^{31}$ and $R^{32}$ may be combined to form a ring structure).

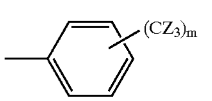

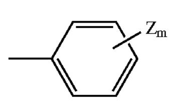

m = 1 to 5

(wherein m is an integer ranging from 1 to 5; and Z is alkyl group)

With regard to the aforementioned photo-acid generating agents, it is also possible to employ, as a photo-acid generating agent for use with, short wavelength beam, a conjugated polycyclic aromatic compound, such as an aryl onium salt, having a naphthalene skeleton or a dibenzothiophene skeleton; a sulfonate compound having a naphthalene skeleton or a dibenzothiophene skeleton; a sulfonyl compound having a naphthalene skeleton or a dibenzothiophene skeleton; and a sulfamide compound having a naphthalene skeleton or a dibenzothiophene skeleton. Specific examples of such aromatic compounds include sulfonyl compounds or sulfonate compounds provided respectively with a hydroxyl group, and having a naphthalene ring, pentalene ring, indene ring, azulene ring, heptalene ring, biphenylene ring, as-indacene ring, s-indacene ring, acenaphthylene ring, fluolene ring, phenalene ring, phenanthrene ring, anthracene ring, fluoranthene ring, acephenanthrylene ring, aceanthrylene ring, triphenylene ring, pyrene ring, chrysene ring, naphthacene ring, pleiadene ring, picene ring, perylene ring, pentaphene ring, pentacene ring, tetraphenylene ring, hexaphene ring, hexacene ring, bubicene ring, coronene ring, trinaphthylene ring, heptaphene ring, heptacene ring, pyranthrene ring, ovalene ring, dibenzophenanthrene ring, benz[a]anthracene ring, dibenzo[a,j]anthracene ring, indeno[1,2-a]indene ring, anthra[2,1-a]naphthacene ring or 1H-benzo[a]cyclopenth[j]anthracene ring; 4-quinondiazide compounds having naphthalene ring, pentalene ring, indene ring, azulene ring, heptalene ring, biphenylene ring, as-indacene ring, s-indacene ring, acenaphthylene ring, fluolene ring, phenalene ring, phenanthrene ring, anthracene ring, fluoranthene ring, acephenanthrylene ring, aceanthrylene ring, triphenylene ring, pyrene ring, chrysene ring, naphthacene ring, pleiadene ring, picene ring, perylene ring, pentaphene ring, pentacene ring, tetraphenylene ring, hexaphene ring, hexacene ring, bubicene ring, coronene ring, trinaphthylene ring, heptaphene ring, heptacene ring, pyranthrene ring, ovalene ring, dibenzophenanthrene ring, benz[a]anthracene ring, dibenzo[a,j]anthracene ring, indeno[1,2-a]indene ring, anthra[2,1-a]naphthacene ring or 1H-benzo[a]cyclopenth[j]anthracene ring; and triflate salts of sulfonium or iodonium having, on the side chain thereof, naphthalene ring, pentalene ring, indene ring, azulene ring, heptalene ring, biphenylene ring, as-indacene ring, s-indacene ring, acenaphthylene ring, fluolene ring, phenalene ring, phenanthrene ring, anthracene ring, fluoranthene ring, phenanthrylene ring, aceanthrylene ring, triphenylene ring, pyrene ring, chrysene ring, naphthacene ring, pleiadene ring, picene ring, perylene ring, pentaphene ring, pentacene ring, tetraphenylene ring, hexaphene ring, hexacene ring, bubicene ring, coronene ring, trinaphthylene ring, heptaphene ring, heptacene ring, pyranthrene ring, ovalene ring, dibenzophenanthrene ring, benz[a]anthracene ring, dibenzo[a,j]anthracene ring, indeno[1,2-a]indene ring, anthrax[2,1-a]naphthacene ring or 1H-benzo[a]cyclopenth[j]anthracene ring. It is preferable to employ, in particular, sulfonyl compounds or sulfonate compounds having naphthalene ring or anthracene ring; 4-quinondiazide compounds having naphthalene ring or anthracene ring each having hydroxyl group introduced therein; or triflate salts of sulfonium or iodonium having, on the side chain thereof, naphthalene ring or anthracene ring.

Among these photo-acid generating agents, preferable examples according to the present invention are triphenylsulfonium triflate, diphenyliodonium triflate, trinaphthylsulfonium triflate, dinaphthyliodonium triflate, dinaphthylsulfonyl methane, NAT-105 (CAS. NO. [137867-61-9]; Midori Kagaku Co., Ltd.), NAT-103 (CAS. NO. [131582-00-8]; Midori Kagaku Co., Ltd.), NAI-105 (CAS. NO. [85342-62-7]; Midori Kagaku Co., Ltd.), TAZ-106 (CAS. NO. [69432-40-2]; Midori Kagaku Co., Ltd.), NDS-105 (Midori Kagaku Co., Ltd.), PI-105 (CAS. NO. [41580-58-9]; Midori Kagaku Co., Ltd.), s-alkylated dibenzothiophene triflate and s-fluoroalkylated dibenzothiophene triflate (DAIKIN Co., Ltd.). Among these photo-acid generating agents, most preferable examples are triphenylsulfonium triflate, trinaphthylsulfonium triflate, dinaphthyliodonium triflate, dinaphthylsulfonyl methane, NAT-105 (CAS. NO. [137867-61-9]; Midori Kagaku Co., Ltd.), NDI-105 (CAS. NO. [133710-62-0]; Midori Kagaku Co., Ltd.) and NAI-105 (CAS. NO. [85342-62-7]; Midori Kagaku Co., Ltd.).

The mixing ratio of the photo-acid generating agent in the photosensitive resin composition according to the present invention should preferably be with the range of 0.001 to 50 mole %, more preferably 0.01 to 40 mole %, most preferably 0.1 to 20 mole %. Namely, if the mixing ratio of the photo-acid generating agent is less than 0.001 mole %, it would be impossible to enable an acid to sufficiently generate, thereby making it difficult to enable the catalytic reaction by the effect of the generated acid to proceed, thus failing to provide the photosensitive resin composition with a sufficient photosensitivity. As a result, it would become difficult to form a resist pattern by using a high-sensitivity expected of the photosensitive resin composition. On the other hand, if the mixing ratio of the photo-acid generating agent exceeds 50 mole %, the glass transition temperature or film-forming property of the photosensitive composition would be deteriorated, thus possibly rendering the resist film formed inferior in heat resistance as well as in mechanical strength. Further, residues may be left behind after the development of a pattern or after the etching of the film.

Moreover, if the mixing ratio of the photo-acid generating agent in the photosensitive resin composition is excessive, as some of the photosensitive agents are capable of exhibiting a high absorbency to a beam of a wavelength employed in resist-exposuring, especially, on the occasion of performing the exposure by using $F_2$ excimer laser beam having a wavelength of 157 nm, the transmissivity of the photosensitive resin composition would be greatly deteriorated. As a result, it would become difficult to perform a uniform exposure.

The photosensitive resin composition according to the present invention is usually prepared as a varnish through a process wherein one of the aforementioned compounds, a dissolution-inhibiting agent, a photo-acid generating agent, and, under some circumstances, an alkali-soluble resin of other kinds are dissolved in an organic solvent and filtered to obtain the varnish. However, the photosensitive resin composition according to the present invention may optionally includes, other than these components, other kinds of polymer such as epoxy resin, polymethylmethacrylate, polymethylacrylate, polymethylmethacrylate, propylene oxide-ethylene oxide copolymer, and polystyrene; an amine compound to be employed for enhancing the environmental resistance; a basic compound such as pyridine derivatives; a surfactant for modifying a coated film; and a dye to be employed as an anti-reflection agent.

As for the organic solvents to be employed in this case, there is no particular limitation as long as they are capable of being usually employed as a solvent for a photosensitive resin composition of this kind. For example, it is possible to employ a ketone-based solvent such as cyclohexanone, acetone, methylethyl ketone, methylisobutyl ketone, etc.; a cellosolve-based solvent such as methyl cellosolve, methyl cellosolve acetate, ethyl cellosolve acetate, butyl cellosolve acetate, etc.; an ester-based solvent such as ethyl acetate, butyl acetate, isoamyl acetate, γ-butylolactone, etc.; glycol-based solvent such as propyleneglycol monomethylether acetate, etc.; a nitrogen compound-based solvent such as dimethyl sulfoxide, hexamethylphosphoric triamide dimethylformamide, N-methylpyrrolidone, etc.; and a mixed solvent comprising any of the aforementioned solvents to which dimethyl sulfoxide, dimethylformaldehyde or N-methylpyrrolidinone is added for improving the solubility of the aforementioned photosensitive resin composition. Further, it is also possible to preferably employ, as an organic solvent, propionic acid derivatives such as methyl methylpropionate, lactates such as ethyl lactate, or PGMEA (propyleneglycolmonoethyl acetate), since they are low in toxicity. Incidentally, in the present invention, these solvents may be employed singly or as a mixture comprising two or more kinds thereof.

Further, these mixed solvents may also contain a suitable amount of other kinds of solvents, such as an aromatic hydrocarbon such as xylene, toluene, etc.; an aliphatic alcohol such as ethanol, isopropyl alcohol (2-propanol), ethyl alcohol, methyl alcohol, butyl alcohol, n-butyl alcohol, s-butyl alcohol, t-butyl alcohol, isobutyl alcohol, etc.; and a solvent formed of the derivatives thereof.

Next, the method of forming a pattern by using the photosensitive resin composition according to the present invention will be explained, with reference to the drawings. In this method, a positive resist will be explained as one example.

FIGS. 4A through 4D illustrate a cross-sectional views for explaining the method of forming a fine pattern according to the present invention, wherein a photosensitive resin composition comprising a photo-acid generating agent was employed.

First of all, a varnish of resist where the resist was dissolved in any of the aforementioned organic solvent was coated on the surface of a substrate 21 as shown in FIG. 4A by a spin coating method or dipping method. The film thickness coated on this occasion should preferably be within the range of 0.01 to 5 μm, more preferably 0.02 to 1.0 μm, most preferably 0.05 to 0.3 μm. Then, the coated film was dried at a temperature of 150° C., more preferably a temperature ranging from 70 to 120° C., to form a resist film 22.

As for the substrate employed in this case, it is possible to employ, for example, a silicon wafer; a silicon wafer which is provided, on the surface thereof, with an insulating film of various kinds, electrodes, wirings, etc.; a blank mask, a III–V Group compound semiconductor wafer such as GaAs, AlGaAs, etc.; a II–VI Group compound semiconductor wafer; a piezoelectric wafer such as rock crystal, quartz lithium tantalate, etc.; a chromium- or a chromium oxide-vapor deposition mask; an aluminium-vapor deposition mask; an IBPSG coat substrate; a PSG coat substrate; an SOG coat substrate; a carbon film-sputtered substrate, etc. However, the substrate employed in the present invention is not confined to the substrates explained above.

Then, as shown in FIG. 4B, actinic radiation was irradiated, through a mask 23 having a predetermined pattern, onto a resist layer 22, thereby permitting a specific region 24 to be selectively subjected to exposure, thus performing a patterning exposure. Alternatively, the exposure of the resist film may be performed by directly scanning actinic radiation onto the surface of the resist film.

As described above, since the photosensitive resin composition according to the present invention is excellent in transparency to beams of a wide range of wavelengths including the beam of a short wavelength, it is possible to employ, as an actinic radiation in the present invention, an ultraviolet ray, X-ray, i-ray, h-ray and g-ray of a low-pressure mercury-vapor lamp, the light of a xenon lamp, excimer laser of KrF or ArF, deep UV ray such as $F_2$ excimer laser, synchrotron orbital radiation (SOR), electron beam (EB), γ ray, ion beam, etc. Further, it is possible, through the scanning of electron beam or ion beam, to draw a pattern directly onto the surface of the resist film without using a mask. Especially, when an $F_2$ excimer laser is employed as an exposure light source, the effects of the present invention will be most prominently manifested.

Thereafter, the resist film is subjected, by the heating over a hot plate or inside an oven, or the irradiation of infrared rays, to a post-exposure baking at a temperature ranging from 70 to 160° C., more preferably from 90 to 140° C. for a period ranging from 30 seconds to 10 minutes. As a result, as shown in FIG. 4C, a latent image 26 is formed in the exposure region 24 of the resist film. On this occasion, since the dissolution-inhibiting group (solubility-inhibiting agent) is decomposed due to an acid catalytic reaction, the alkali-solubility of the exposure region is promoted, thereby enabling the exposure portions of the resist film to be dissolved by an aqueous alkaline solution.

Subsequently, the resist film 22 that has been subjected to the post-exposure baking is proceeded to the developing treatment by dipping method or spray method. As a result, while unexposure portions of the resist film 22 are permitted to leave on the surface of substrate as the unexposure portions are low in solubility to the aqueous alkaline solution, the exposure portions 14 of the resist are allowed to dissolve in a developing solution. As for specific examples of the aqueous alkaline solution, it is possible to employ an organic aqueous alkaline solution such as an aqueous solution of tetramethylammonium hydroxide and an aqueous solution of choline; an inorganic aqueous alkaline solution such as an aqueous solution of potassium hydroxide, an aqueous solution of sodium hydroxide, etc.; a solution comprising any of the aforementioned alkaline solutions to which alcohol or a surfactant is added. Incidentally, the concentration of the alkaline solutions mentioned above should preferably be confined to at most 15% by weight in view of making prominent a difference in dissolution rate between the exposure portions and the unexposure portions.

Then, the substrate is washed with pure water so as to remove the developing solution remaining thereon and dried to form a desired resist pattern 27 as shown in FIG. 4D.

The resist pattern formed in this manner by using the photosensitive resin composition of the present invention is excellent in resolution as well as in adhesiveness. Therefore, this resist pattern can be employed as an etching mask, for instance, to precisely transcribe a super fine pattern of the order of submicrons onto an exposed surface of a substrate, by using dry etching. Further, the resist pattern obtained in this manner is also excellent in dry etching resistance. Incidentally, this resist pattern may be subjected processing steps in addition to the aforementioned processing steps. For example, this resist pattern may be subjected to a step of forming a flattened layer to be employed as an underlying layer of a resist film, to a step of pretreatment for enhancing the adhesion between a resist film and an underlying layer, to a rinsing step for removing a developing solution with water after the developing step of a resist film, or to a step of re-irradiating ultraviolet rays before the dry etching of the resist film.

In the foregoing description, although a positive chemical amplification type resist is explained, it is also possible, even if a negative resist is employed, to obtain almost the same effects as obtainable by the employment of the positive resist, as the acid that has been generated through an acid proliferation effect is enabled, even if a negative resist is employed, to take part in the reaction between an alkali-soluble resin and a crosslinking agent, or in the reaction to alkali-insolubilize a substituent group through the changes in structure of the substituent group.

DETAILED DESCRIPTION OF THE INVENTION

Figure 1:
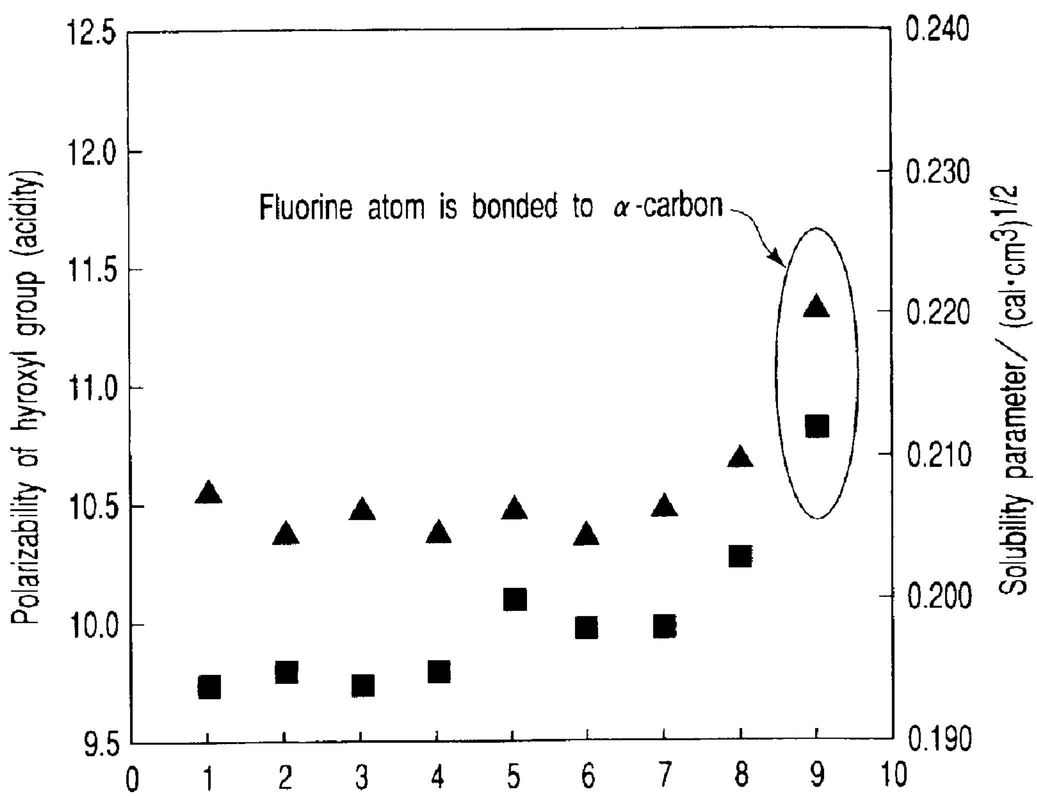
FIG. 1 is a graph illustrating the relationships between the site into which a fluorine atom is introduced and the solubility parameter, and between the site into which a fluorine atom is introduced and the polarizability of the hydroxyl group.
Figure 2:
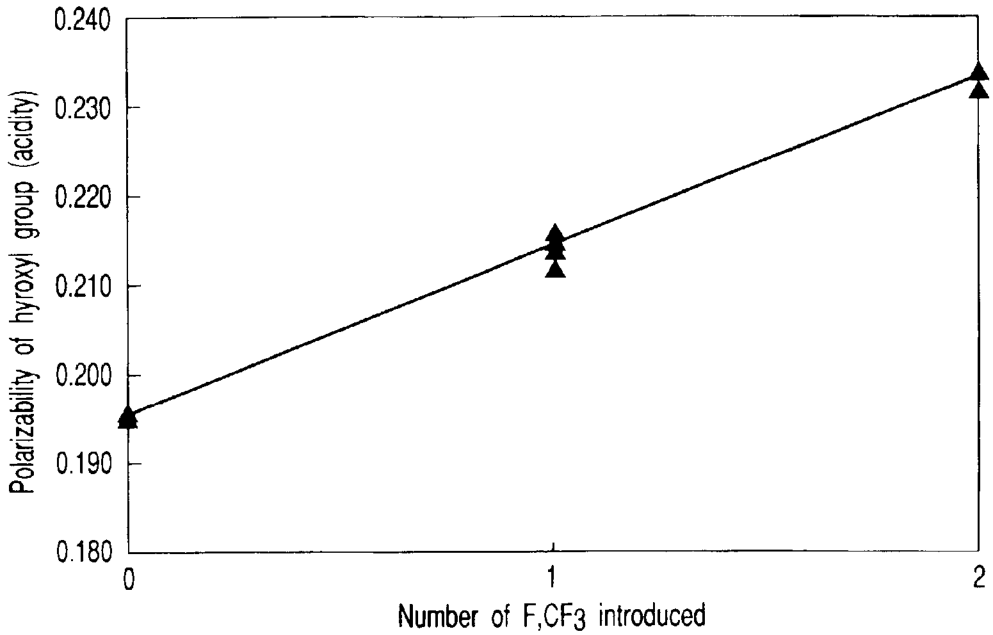
FIG. 2 shows a graph illustrating the relationship between the number of F or $CF_3$ that has been introduced into a polymer and the acidity of the polymer.
Figure 3:
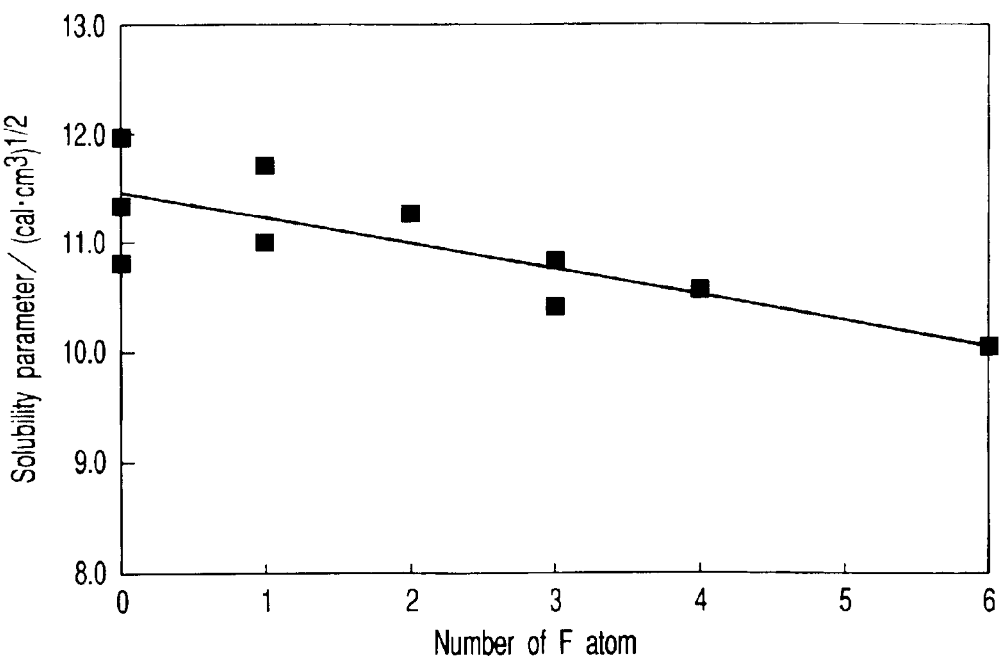
FIG. 3 shows a graph illustrating the relationship between the number of fluorine atoms introduced into a polymer and the solubility parameter of the polymer.
Figure 4A:
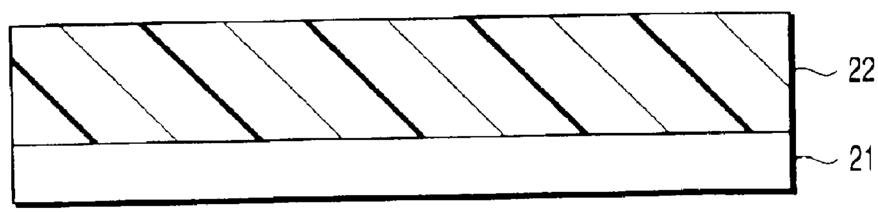
FIGS. 4A to 4D respectively show a cross-sectional view illustrating in step-wise the process of forming a pattern by using a photosensitive resin composition according to the present invention.
Figure 4B:
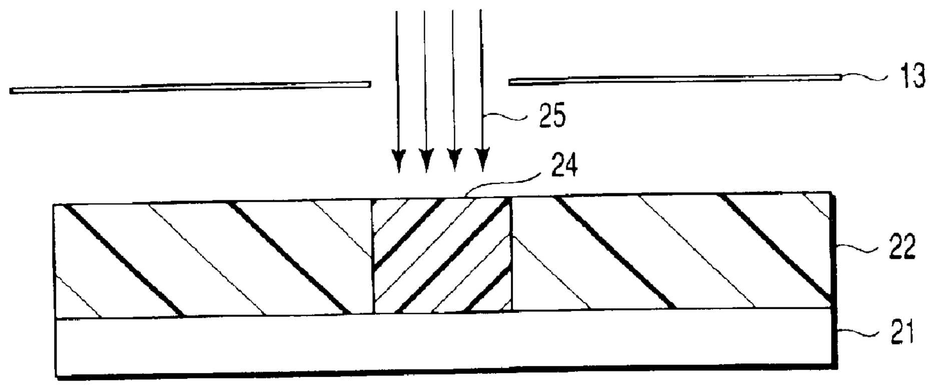
Figure 4C:
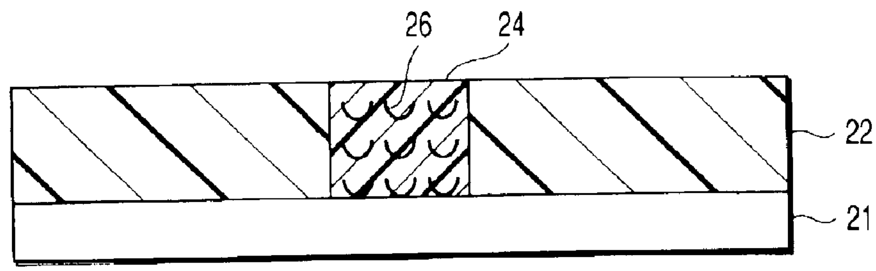
Figure 4D:
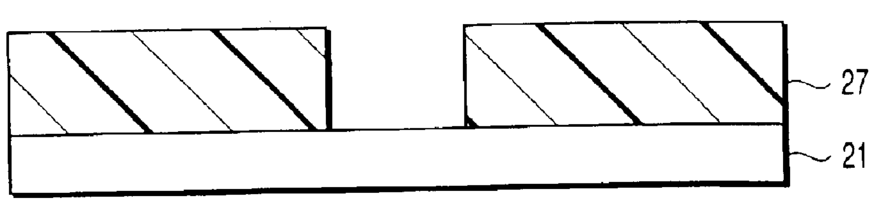

Next, the present invention will be further explained in detail with reference to the following examples.

(Synthesis of Monomers)

SYNTHESIZING EXAMPLE 1

0.04 mol of 4-oxovinyladamantane (A), 0.05 mol of tetramethylsilyl trifluoromethane, and 0.05 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (Af) of the compound (A).

0.02 mol of the compound (Af), 0.03 mol of dihydropyran, and 0.001 mol of tosylic acid were dissolved in 100 g of dichloromethane and mixed together to obtain a solution, which was then neutralized and separated. After this separation, the resultant liquid was concentrated to obtain a tetrahydropyranyl-substituted product (B) of the compound (Af).

SYNTHESIZING EXAMPLE 2

0.04 mol of 4-oxovinyladamantane (A), 0.06 mol of tetramethylsilyl pentafluoroethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a pentafluoroethylated product (Af) of the compound (A).

0.02 mol of the compound (Af), 0.03 mol of butylvinyl ether, and 0.002 mol of tosylic acid were dissolved in 100 g of dichloromethane and mixed together to obtain a solution, which was then neutralized and separated. After this separation, the resultant liquid was concentrated to obtain a butoxyethyl-substituted product (C) of the compound (Af).

SYNTHESIZING EXAMPLE 3

0.04 mol of 4-oxovinyladamantane (A), 0.06 mol of tetramethylsilyl heptafluoropropane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a heptafluoropropylated product (Af) of the compound (A).

0.02 mol of the compound (At), 0.03 mol of propylvinyl ether, and 0.004 mol of tosylic acid were dissolved in 100 g of dichloromethane and mixed together to obtain a solution, which was then neutralized and separated. After this separation, the resultant liquid was concentrated to obtain a propoxyethyl-substituted product (D) of the compound (Af).

SYNTHESIZING EXAMPLE 4

0.04 mol of 4-oxovinyladamantane (A), 0.06 mol of tetramethylsilyl nonafluorobutane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a nonafluorobutylated product (Af) of the compound (A).

0.02 mol of the compound (Af), 0.03 mol of ethylvinyl ether, and 0.005 mol of tosylic acid were dissolved in 100 g of dichloromethane and mixed together to obtain a solution, which was then neutralized and separated. After this separation, the resultant liquid was concentrated to obtain an ethoxyethyl-substituted product (E) of the compound (Af).

SYNTHESIZING EXAMPLE 5

0.04 mol of 4-oxovinyladamantane (A), 0.06 mol of tetramethylsilyl undecatafluoropentane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain an undecafluoropentylated product (Af) of the compound (A).

0.02 mol of the compound (Af), 0.03 mol of methylvinyl ether, and 0.004 mol of tosylic acid were dissolved in 100 g of dichloromethane and mixed together to obtain a solution, which was then neutralized and separated. After this separation, the resultant liquid was concentrated to obtain a methoxyethyl-substituted product (F) of the compound (Af).

SYNTHESIZING EXAMPLE 6

0.04 mol of 4-oxoisopropenyladamantane (A'), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (A'f) of the compound (A').

0.02 mol of the compound (A'f), 0.03 mol of dihydropyran, and 0.004 mol of tosylic acid were dissolved in 100 g of dichloromethane and mixed together to obtain a solution, which was then neutralized and separated. After this separation, the resultant liquid was concentrated to obtain a tetrahydropyranyl-substituted product (B') of the compound (A'f).

SYNTHESIZING EXAMPLE 7

0.04 mol of 4-oxoisopropenyladamantane (A'), 0.06 mol of tetramethylsilyl undecafluoropentane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain an undecafluoropentylated product (A'f) of the compound (A').

0.02 mol of the compound (A'f), 0.03 mol of butylvinyl ether, and 0.004 mol of tosylic acid were dissolved in 100 g of dichloromethane and mixed together to obtain a solution, which was then neutralized and separated. After this separation, the resultant liquid was concentrated to obtain a butoxyethyl-substituted product (C') of the compound (A'f).

SYNTHESIZING EXAMPLE 8

The same procedures as employed in Synthesizing Example 7, excepting that propylvinyl ether was substituted for the butylvinyl ether employed therein, were repeated to obtain a propoxyethyl-substituted product (D') of the compound (A'f).

SYNTHESIZING EXAMPLE 9

The same procedures as employed in Synthesizing Example 7, excepting that ethylvinyl ether was substituted for the butylvinyl ether employed therein, were repeated to obtain an ethoxyethyl-substituted product (E') of the compound (A'f).

SYNTHESIZING EXAMPLE 10

The same procedures as employed in Synthesizing Example 7, excepting that methylvinyl ether was substituted for the butylvinyl ether employed therein, were repeated to obtain a methoxyethyl-substituted product (F') of the compound (A'f).

SYNTHESIZING EXAMPLE 11

0.04 mol of vinyladamantyl trifluoromethyl ketone (A"), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (A"f) of the compound (A").

0.02 mol of the compound (A"f), 0.03 mol of dihydropyran, and 0.004 mol of tosylic acid were dissolved in 100 g of dichloromethane and mixed together to obtain a solution, which was then neutralized and separated. After this separation, the resultant liquid was concentrated to obtain a tetrahydropyranyl-substituted product (B") of the compound (A"f).

SYNTHESIZING EXAMPLE 12

0.04 mol of vinyladamantyl pentafluoroethyl (A"), 0.05 mol of tetramethylsilyl trifluoromethane, and 0.05 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a pentafluoroethylated product (A"f) of the compound (A").

0.02 mol of the compound (A"f), 0.03 mol of butylvinyl ether, and 0.002 mol of tosylic acid were dissolved in 100 g of dichloromethane and mixed together to obtain a solution, which was then neutralized and separated. After this separation, the resultant liquid was concentrated to obtain a butoxyethyl-substituted product (C") of the compound (A"f).

SYNTHESIZING EXAMPLE 13

0.04 mol of vinyladamantyl trifluoromethyl ketone (A"), 0.06 mol of tetramethylsilyl nonafluorobutane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a nonafluorobutylated product (A"f) of the compound (A")

0.02 mol of the compound (A"f), 0.03 mol of propylvinyl ether, and 0.001 mol of tosylic acid were dissolved in 100 g of dichloromethane and mixed together to obtain a solution, which was then neutralized and separated. After this separation, the resultant liquid was concentrated to obtain a propoxyethyl-substituted product (D") of the compound (A"f).

SYNTHESIZING EXAMPLE 14

0.04 mol of vinyladamantyl trifluoromethyl ketone (A"), 0.06 mol of tetramethylsilyl undecafluoropentane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain an undecafluoropentylated product (A"f) of the compound (A")

0.02 mol of the compound (A"f), 0.03 mol of ethylvinyl ether, and 0.002 mol of tosylic acid were dissolved in 100 g of dichloromethane and mixed together to obtain a solution, which was then neutralized and separated. After this separation, the resultant liquid was concentrated to obtain an ethoxyethyl-substituted product (E") of the compound (A"f).

SYNTHESIZING EXAMPLE 15

0.02 mol of vinyladamantyl undecafluoropentyl (A"), 0.04 mol of tetramethylsilyl undecafluoropentane, and 0.04 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain an undecafluoropentylated product (A"f) of the compound (A").

0.02 mol of the compound (A"f), 0.03 mol of methylvinyl ether, and 0.002 mol of tosylic acid were dissolved in 100 g of dichloromethane and mixed together to obtain a solution, which was then neutralized and separated. After this separation, the resultant liquid was concentrated to obtain a methoxyethyl-substituted product (E") of the compound (A"f).

SYNTHESIZING EXAMPLE 16

0.04 mol of isopropenyladamantyl trifluoromethyl ketone (A"'), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (A"'f) of the compound (A"').

0.02 mol of the compound (A"'f), 0.03 mol of dihydropyran, and 0.001 mol of tosylic acid were dissolved in 100 g of dichloromethane and mixed together to obtain a solution, which was then neutralized and separated. After this separation, the resultant liquid was concentrated to obtain a tetrahydropyranyl-substituted product (B"') of the compound (A"'f).

SYNTHESIZING EXAMPLE 17

0.04 mol of isopropenyladamantyl nonafluorobutyl ketone (A"'), 0.05 mol of tetramethylsilyl nanofluorobutane, and 0.05 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a nanofluorobutylated product (A"'f) of the compound (A"').

0.02 mol of the compound (A"'f), 0.03 mol of butylvinyl ether, and 0.002 mol of tosylic acid were dissolved in 100 g of dichloromethane and mixed together to obtain a solution, which was then neutralized and separated. After this separation, the resultant liquid was concentrated to obtain a butoxyethyl-substituted product (C"') of the compound (A"'f).

SYNTHESIZING EXAMPLE 18

The same procedures as employed in Synthesizing Example 17, excepting that propylvinyl ether was substituted for the butylvinyl ether employed therein, were repeated to obtain a propoxyethyl-substituted product (D"') of the compound (A"'f).

SYNTHESIZING EXAMPLE 19

The same procedures as employed in Synthesizing Example 17, excepting that ethylvinyl ether was substituted for the butylvinyl ether employed therein, were repeated to obtain an ethoxyethyl-substituted product (E"') of the compound (A"'f).

SYNTHESIZING EXAMPLE 20

The same procedures as employed in Synthesizing Example 17, excepting that methylvinyl ether was substituted for the butylvinyl ether employed therein, were repeated to obtain a methoxyethyl-substituted product (F"') of the compound (A"'f).

SYNTHESIZING EXAMPLE 21

0.04 mol of vinyl-4-oxahomoadamantanone (M) and 0.1 mol of diethylaminosulfur trifluoride were dissolved in 140 g of tetrahydrofuran and mixed together to precipitate a salt, which was then filtered out, and the filtrate was neutralized. After the separation of the filtrate, the resultant liquid was concentrated to obtain a difluoro product (Mf) of the compound (M).

SYNTHESIZING EXAMPLE 22

0.04 mol of isopenyl-4-oxahomoadamantanone (N) and 0.1 mol of diethylaminosulfur trifluoride were dissolved in 140 g of tetrahydrofuran and mixed together to precipitate a salt, which was then filtered out, and the filtrate was neutralized. After the separation of the filtrate, the resultant liquid was concentrated to obtain a difluoro product (Nf) of the compound (N).

SYNTHESIZING EXAMPLE 23

0.04 mol of vinyl-methyl-5-oxahomonorbornanone (O) and 0.1 mol of diethylaminosulfur trifluoride were dissolved in 140 g of tetrahydrofuran and mixed together to precipitate a salt, which was then filtered out, and the filtrate was neutralized. After the separation of the filtrate, the resultant liquid was concentrated to obtain a difluoro product (Of) of the compound (O).

SYNTHESIZING EXAMPLE 24

0.04 mol of isopropenyl-methyl-5-oxahomonorbornanone (P) and 0.1 mol of diethylaminosulfur trifluoride were dissolved in 140 g of tetrahydrofuran and mixed together to precipitate a salt, which was then filtered out, and the filtrate was neutralized. After the separation of the filtrate, the resultant liquid was concentrated to obtain a difluoro product (Pf) of the compound (P).

SYNTHESIZING EXAMPLE 25

0.04 mol of vinylcyclohexanone (AA), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (AAf) of the compound (AA).

0.02 mol of the compound (AAf), 0.03 mol of dihydropyran, and 0.001 mol of tosylic acid were dissolved in 100 g of dichloromethane and mixed together to obtain a solution, which was then neutralized and separated. After this separation, the resultant liquid was concentrated to obtain a tetrahydropyranyl-substituted product (BB) of the compound (AAf).

SYNTHESIZING EXAMPLE 26

The same procedures as employed in Synthesizing Example 25, excepting that butylvinyl ether was substituted for the dihydropyran employed therein, were repeated to obtain a butoxyethyl-substituted product (CC) of the compound (AAf).

SYNTHESIZING EXAMPLE 27

The same procedures as employed in Synthesizing Example 25, excepting that propylvinyl ether was substituted for the dihydropyran employed therein, were repeated to obtain a propoxyethyl-substituted product (DD) of the compound (AAf).

SYNTHESIZING EXAMPLE 28

The same procedures as employed in Synthesizing Example 25, excepting that ethylvinyl ether was substituted for the dihydropyran employed therein, were repeated to obtain a ethoxyethyl-substituted product (EE) of the compound (AAf).

SYNTHESIZING EXAMPLE 29

The same procedures as employed in Synthesizing Example 25, excepting that methylvinyl ether was substituted for the dihydropyran employed therein, were repeated to obtain a methoxyethyl-substituted product (FF) of the compound (AAf).

SYNTHESIZING EXAMPLE 30

0.04 mol of vinylcyclopentanone (AA'), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (AA'f) of the compound (AA').

0.02 mol of the compound (AA'f), 0.03 mol of dihydropyran, and 0.002 mol of tosylic acid were dissolved in 100 g of dichloromethane and mixed together to obtain a solution, which was then neutralized and separated. After this separation, the resultant liquid was concentrated to obtain a tetrahydropyranyl-substituted product (BB') of the compound (AA'f).

SYNTHESIZING EXAMPLE 31

The same procedures as employed in Synthesizing Example 30, excepting that butylvinyl ether was substituted for the dihydropyran employed therein, were repeated to obtain a butoxyethyl-substituted product (CC') of the compound (AA'f).

SYNTHESIZING EXAMPLE 32

The same procedures as employed in Synthesizing Example 30, excepting that propylvinyl ether was substituted for the dihydropyran employed therein, were repeated to obtain a propoxyethyl-substituted product (DD') of the compound (AA'f).

SYNTHESIZING EXAMPLE 33

The same procedures as employed in Synthesizing Example 30, excepting that ethylvinyl ether was substituted for the dihydropyran employed therein, were repeated to obtain a ethoxyethyl-substituted product (EE') of the compound (AA'f).

SYNTHESIZING EXAMPLE 34

The same procedures as employed in Synthesizing Example 30, excepting that methylvinyl ether was substituted for the dihydropyran employed therein, were repeated to obtain a methoxyethyl-substituted product (FF') of the compound (AA'f).

SYNTHESIZING EXAMPLE 35

0.04 mol of isopropenylcyclohexanone (AA"), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (AA"f) of the compound (AA")

0.02 mol of the compound (AA"f), 0.03 mol of dihydropyran, and 0.004 mol of tosylic acid were dissolved in 100 g of dichloromethane and mixed together to obtain a solution, which was then neutralized and separated. After this separation, the resultant liquid was concentrated to obtain a tetrahydropyranyl-substituted product (BB") of the compound (AA"f).

SYNTHESIZING EXAMPLE 36

The same procedures as employed in Synthesizing Example 35, excepting that butylvinyl ether was substituted for the dihydropyran employed therein, were repeated to obtain a butoxyethyl-substituted product (CC") of the compound (AA"f).

SYNTHESIZING EXAMPLE 37

The same procedures as employed in Synthesizing Example 35, excepting that propylvinyl ether was substituted for the dihydropyran employed therein, were repeated to obtain a propoxyethyl-substituted product (DD") of the compound (AA"f).

SYNTHESIZING EXAMPLE 38

The same procedures as employed in Synthesizing Example 35, excepting that ethylvinyl ether was substituted for the dihydropyran employed therein, were repeated to obtain a ethoxyethyl-substituted product (EE") of the compound (AA"f).

SYNTHESIZING EXAMPLE 39

The same procedures as employed in Synthesizing Example 35, excepting that methylvinyl ether was substituted for the dihydropyran employed therein, were repeated to obtain a methoxyethyl-substituted product (FF") of the compound (AA"f).

SYNTHESIZING EXAMPLE 40

0.04 mol of isopropenylcyclohexanone (AA"'), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (AA"'f) of the compound (AA"').

0.02 mol of the compound (AA"'f), 0.03 mol of dihydropyran, and 0.003 mol of tosylic acid were dissolved in 100 g of dichloromethane and mixed together to obtain a solution, which was then neutralized and separated. After this separation, the resultant liquid was concentrated to obtain a tetrahydropyranyl-substituted product (BB"') of the compound (AA"'f).

SYNTHESIZING EXAMPLE 41

The same procedures as employed in Synthesizing Example 40, excepting that butylvinyl ether was substituted for the dihydropyran employed therein, were repeated to obtain a butoxyethyl-substituted product (CC"') of the compound (AA"'f).

SYNTHESIZING EXAMPLE 42

The same procedures as employed in Synthesizing Example 40, excepting that propylvinyl ether was substituted for the dihydropyran employed therein, were repeated to obtain a propoxyethyl-substituted product (DD"') of the compound (AA"'f).

SYNTHESIZING EXAMPLE 43

The same procedures as employed in Synthesizing Example 40, excepting that ethylvinyl ether was substituted for the dihydropyran employed therein, were repeated to obtain a ethoxyethyl-substituted product (EE"') of the compound (AA"'f).

SYNTHESIZING EXAMPLE 44

The same procedures as employed in Synthesizing Example 40, excepting that methylvinyl ether was substituted for the dihydropyran employed therein, were repeated to obtain a methoxyethyl-substituted product (FF"') of the compound (AA"'f).

SYNTHESIZING EXAMPLE 45

0.04 mol of vinylcyclohexyl trifluoromethyl ketone (G), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (Gf) of the compound (G).

0.02 mol of the compound (Gf), 0.03 mol of dihydropyran, and 0.003 mol of tosylic acid were dissolved in 100 g of dichloromethane and mixed together to obtain a solution, which was then neutralized and separated. After this separation, the resultant liquid was concentrated to obtain a tetrahydropyranyl-substituted product (H) of the compound (Gf).

SYNTHESIZING EXAMPLE 46

The same procedures as employed in Synthesizing Example 45, excepting that butylvinyl ether was substituted for the dihydropyran employed therein, were repeated to obtain a butoxyethyl-substituted product (I) of the compound (Gf).

SYNTHESIZING EXAMPLE 47

The same procedures as employed in Synthesizing Example 45, excepting that propylvinyl ether was substituted for the dihydropyran employed therein, were repeated to obtain a propoxyethyl-substituted product (J) of the compound (Gf).

SYNTHESIZING EXAMPLE 48

The same procedures as employed in Synthesizing Example 45, excepting that ethylvinyl ether was substituted for the dihydropyran employed therein, were repeated to obtain a ethoxyethyl-substituted product (K) of the compound (Gf).

SYNTHESIZING EXAMPLE 49

The same procedures as employed in Synthesizing Example 45, excepting that methylvinyl ether was substituted for the dihydropyran employed therein, were repeated to obtain a methoxyethyl-substituted product (L) of the compound (Gf).

SYNTHESIZING EXAMPLE 50

0.04 mol of vinylcyclopentyl trifluoromethyl ketone (G'), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (G'f) of the compound (G').

0.02 mol of the compound (G'f), 0.03 mol of dihydropyran, and 0.004 mol of tosylic acid were dissolved in 100 g of dichloromethane and mixed together to obtain a solution, which was then neutralized and separated. After this separation, the resultant liquid was concentrated to obtain a tetrahydropyranyl-substituted product (H') of the compound (G'f).

SYNTHESIZING EXAMPLE 51

The same procedures as employed in Synthesizing Example 50, excepting that butylvinyl ether was substituted for the dihydropyran employed therein, were repeated to obtain a butoxyethyl-substituted product (I') of the compound (G'f).

SYNTHESIZING EXAMPLE 52

The same procedures as employed in Synthesizing Example 50, excepting that propylvinyl ether was substituted for the dihydropyran employed therein, were repeated to obtain a propoxyethyl-substituted product (J') of the compound (G'f).

SYNTHESIZING EXAMPLE 53

The same procedures as employed in Synthesizing Example 50, excepting that ethylvinyl ether was substituted for the dihydropyran employed therein, were repeated to obtain a ethoxyethyl-substituted product (K') of the compound (G'f).

SYNTHESIZING EXAMPLE 54

The same procedures as employed in Synthesizing Example 50, excepting that methylvinyl ether was substituted for the dihydropyran employed therein, were repeated to obtain a methoxyethyl-substituted product (L') of the compound (G'f).

SYNTHESIZING EXAMPLE 55

0.04 mol of isopropenylcyclohexyl trifluoromethyl ketone (G"), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (G"f) of the compound (G").

0.02 mol of the compound (G"f), 0.03 mol of dihydropyran, and 0.03 mol of tosylic acid were dissolved in 100 g of dichloromethane and mixed together to obtain a solution, which was then neutralized and separated. After this separation, the resultant liquid was concentrated to obtain a tetrahydropyranyl-substituted product (H") of the compound (G"f).

SYNTHESIZING EXAMPLE 56

The same procedures as employed in Synthesizing Example 55, excepting that butylvinyl ether was substituted for the dihydropyran employed therein, were repeated to obtain a butoxyethyl-substituted product (I") of the compound (G"f).

SYNTHESIZING EXAMPLE 57

The same procedures as employed in Synthesizing Example 55, excepting that propylvinyl ether was substituted for the dihydropyran employed therein, were repeated to obtain a propoxyethyl-substituted product (J") of the compound (G"f).

SYNTHESIZING EXAMPLE 58

The same procedures as employed in Synthesizing Example 55, excepting that ethylvinyl ether was substituted for the dihydropyran employed therein, were repeated to obtain a ethoxyethyl-substituted product (K") of the compound (G"f).

SYNTHESIZING EXAMPLE 59

The same procedures as employed in Synthesizing Example 55, excepting that methylvinyl ether was substituted for the dihydropyran employed therein, were repeated to obtain a methoxyethyl-substituted product (L") of the compound (G"f).

SYNTHESIZING EXAMPLE 60

0.04 mol of isopropenylcyclopentyl trifluoromethyl ketone (G"'), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (G"'f) of the compound (G"').

0.02 mol of the compound (G"'f), 0.03 mol of dihydropyran, and 0.004 mol of tosylic acid were dissolved in 100 g of dichloromethane and mixed together to obtain a solution, which was then neutralized and separated. After this separation, the resultant liquid was concentrated to obtain a tetrahydropyranyl-substituted product (H"') of the compound (G"'f).

SYNTHESIZING EXAMPLE 61

The same procedures as employed in Synthesizing Example 60, excepting that butylvinyl ether was substituted for the dihydropyran employed therein, were repeated to obtain a butoxyethyl-substituted product (I"') of the compound (G"'f).

SYNTHESIZING EXAMPLE 62

The same procedures as employed in Synthesizing Example 60, excepting that propylvinyl ether was substituted for the dihydropyran employed therein, were repeated to obtain a propoxyethyl-substituted product (J"') of the compound (G"'f).

SYNTHESIZING EXAMPLE 63

The same procedures as employed in Synthesizing Example 60, excepting that ethylvinyl ether was substituted for the dihydropyran employed therein, were repeated to obtain a ethoxyethyl-substituted product (K"') of the compound (G"'f).

SYNTHESIZING EXAMPLE 64

The same procedures as employed in Synthesizing Example 60, excepting that methylvinyl ether was substituted for the dihydropyran employed therein, were repeated to obtain a methoxyethyl-substituted product (L''') of the compound (G'''f).

SYNTHESIZING EXAMPLE 65

0.04 mol of vinyl-4,4-dimethylbutenolide (MM) and 0.1 mol of diethylaminosulfur trifluoride were dissolved in 140 g of tetrahydrofuran and mixed together to precipitate a salt, which was then filtered out, and the filtrate was neutralized. After the separation of the filtrate, the resultant liquid was concentrated to obtain a difluoro product (MMf) of the compound (MM).

SYNTHESIZING EXAMPLE 66

0.04 mol of vinyl-5,5-dimethylpentanolide (NN) and 0.1 mol of diethylaminosulfur trifluoride were dissolved in 140 g of tetrahydrofuran and mixed together to precipitate a salt, which was then filtered out, and the filtrate was neutralized. After the separation of the filtrate, the resultant liquid was concentrated to obtain a difluoro product (NNf) of the compound (NN).

SYNTHESIZING EXAMPLE 67

0.04 mol of isopropenyl-4,4-dimethylbutenolide (O) and 0.1 mol of diethylaminosulfur trifluoride were dissolved in 140 g of tetrahydrofuran and mixed together to precipitate a salt, which was then filtered out, and the filtrate was neutralized. After the separation of the filtrate, the resultant liquid was concentrated to obtain a difluoro product (OOf) of the compound (OO).

SYNTHESIZING EXAMPLE 68

0.04 mol of isopropenyl-5,5-dimethylpentanolide (PP) and 0.1 mol of diethylaminosulfur trifluoride were dissolved in 140 g of tetrahydrofuran and mixed together to precipitate a salt, which was then filtered out, and the filtrate was neutralized. After the separation of the filtrate, the resultant liquid was concentrated to obtain a difluoro product (PPf) of the compound (PP).

SYNTHESIZING EXAMPLE 69

0.04 mol of vinyl-methyl-5-oxahomonorbornanone (PY22) and 0.1 mol of diethylaminosulfur triethylpentadecafluoride were dissolved in 140 g of tetrahydrofuran and mixed together to precipitate a salt, which was then filtered out, and the filtrate was neutralized. After the separation of the filtrate, the resultant liquid was concentrated to obtain a diethyldecafluoro product (Y22) of the compound (PY22).

SYNTHESIZING EXAMPLE 70

0.04 mol of isopropenyl-3-methyl-oxahomoadamantanone (NY24) and 0.1 mol of diethylaminosulfur trimethylnonafluoride were dissolved in 140 g of tetrahydrofuran and mixed together to precipitate a salt, which was then filtered out, and the filtrate was neutralized. After the separation of the filtrate, the resultant liquid was concentrated to obtain a dimethylhexafluoro product (Y24) of the compound (NY24).

SYNTHESIZING EXAMPLE 71

0.04 mol of isopropenyl-5-oxahomonorbornanone(PX25) and 0.06 mol of diethylaminosulfur trifluoride were dissolved in 140 g of tetrahydrofuran and mixed together to precipitate a salt, which was then filtered out, and the filtrate was neutralized. After the separation of the filtrate, the resultant liquid was concentrated to obtain a difluoro product (X25) of the compound (PX25).

SYNTHESIZING EXAMPLE 72

0.04 mol of 2-vinyl-5,5-dimethylpentanolide (Ny47) and 0.1 mol of diethylaminosulfur trifluoride were dissolved in 140 g of tetrahydrofuran and mixed together to precipitate a salt, which was then filtered out, and the filtrate was neutralized. After the separation of the filtrate, the resultant liquid was concentrated to obtain a difluoro product (Y47) of the compound (Ny47).

SYNTHESIZING EXAMPLE 73

0.04 mol of 3-isopropenyl-2,2-dimethylpyran (Nx50) and 0.1 mol of diethylaminosulfur trimethylnonafluoride were dissolved in 140 g of tetrahydrofuran and mixed together to precipitate a salt, which was then filtered out, and the filtrate was neutralized. After the separation of the filtrate, the resultant liquid was concentrated to obtain a dimethylhexafluoro product (x50) of the compound (Nx50).

SYNTHESIZING EXAMPLE 74

0.04 mol of 4-vinylcyclohexanone (Ax52), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (Afx52) of the compound (Ax52).

0.02 mol of the compound (Afx52), 0.03 mol of butylvinyl ether, and 0.005 mol of tosylic acid were dissolved in 100 g of dichloromethane and mixed together to obtain a solution, which was then neutralized and separated. After this separation, the resultant liquid was concentrated to obtain a butoxyethyl-substituted product (x52) of the compound (Afx52).

SYNTHESIZING EXAMPLE 75

0.04 mol of 4-vinylcyclohexanone (Ax52), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (Afx52) of the compound (Ax52).

0.02 mol of the compound (Afx52), 0.03 mol of propylvinyl ether, and 0.006 mol of tosylic acid were dissolved in 100 g of dichloromethane and mixed together to obtain a solution, which was then neutralized and separated. After this separation, the resultant liquid was concentrated to obtain a propoxyethyl-substituted product (x53) of the compound (Afx52).

SYNTHESIZING EXAMPLE 76

0.04 mol of 4-vinylcyclohexanone (Ax52), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (Afx52) of the compound (Ax52).

0.02 mol of the compound (Afx52), 0.03 mol of ethylvinyl ether, and 0.005 mol of tosylic acid were dissolved in 100 g of dichloromethane and mixed together to obtain a solution, which was then neutralized and separated. After this separation, the resultant liquid was concentrated to obtain an ethoxyethyl-substituted product (x54) of the compound (Afx52).

SYNTHESIZING EXAMPLE 77

0.04 mol of 4-vinylcyclohexanone (Ax52), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (Afx52) of the compound (Ax52).

0.02 mol of the compound (Afx52), 0.03 mol of methylvinyl ether, and 0.006 mol of tosylic acid were dissolved in 100 g of dichloromethane and mixed together to obtain a solution, which was then neutralized and separated. After this separation, the resultant liquid was concentrated to obtain a methoxyethyl-substituted product (x55) of the compound (Afx52).

SYNTHESIZING EXAMPLE 78

0.04 mol of 2-isopropenylcyclohexanone (A"x61), 0.06 mol of tetramethylsilyl pentafluoroethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a pentafluoroethylated product (A"fx61) of the compound (A"x61).

0.02 mol of the compound (A"fx61), 0.03 mol of dihydropyran, and 0.005 mol of tosylic acid were dissolved in 100 g of dichloromethane and mixed together to obtain a solution, which was then neutralized and separated. After this separation, the resultant liquid was concentrated to obtain a tetrahydropyranyl-substituted product (x61) of the compound (A"fx61).

SYNTHESIZING EXAMPLE 79

0.04 mol of 2-isopropenylcyclohexanone (A"x61), 0.06 mol of tetramethylsilyl pentafluoroethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a pentafluoroethylated product (A"fx61) of the compound (A"x61).

0.02 mol of the compound (A"fx61), 0.03 mol of butylvinyl ether, and 0.004 mol of tosylic acid were dissolved in 100 g of dichloromethane and mixed together to obtain a solution, which was then neutralized and separated. After this separation, the resultant liquid was concentrated to obtain a butoxyethyl-substituted product (x62) of the compound (A"fx61).

SYNTHESIZING EXAMPLE 80

0.04 mol of 2-isopropenylcyclohexanone (A"x61), 0.06 mol of tetramethylsilyl pentafluoroethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a pentafluoroethylated product (A"fx61) of the compound (A"x61).

0.02 mol of the compound (A"fx61), 0.03 mol of propylvinyl ether, and 0.004 mol of tosylic acid were dissolved in 100 g of dichloromethane and mixed together to obtain a solution, which was then neutralized and separated. After this separation, the resultant liquid was concentrated to obtain a propoxyethyl-substituted product (x63) of the compound (A"fx61).

SYNTHESIZING EXAMPLE 81

0.04 mol of 2-isopropenylcyclohexanone (A"x61), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (A"fx64) of the compound (A"x61).

0.02 mol of the compound (A"fx61), 0.03 mol of ethylvinyl ether, and 0.003 mol of tosylic acid were dissolved in 100 g of dichloromethane and mixed together to obtain a solution, which was then neutralized and separated. After this separation, the resultant liquid was concentrated to obtain an ethoxyethyl-substituted product (x64) of the compound (A"fx61).

SYNTHESIZING EXAMPLE 82

0.04 mol of 2-isopropenylcyclohexanone (A"x61), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (A"fx64) of the compound (A"x61).

0.02 mol of the compound (A"fx61), 0.03 mol of methylvinyl ether, and 0.003 mol of tosylic acid were dissolved in 100 g of dichloromethane and mixed together to obtain a solution, which was then neutralized and separated. After this separation, the resultant liquid was concentrated to obtain a methoxyethyl-substituted product (x65) of the compound (A"fx61).

SYNTHESIZING EXAMPLE 83

0.04 mol of 2-isopropenylcyclopentanone (A"x66), 0.06 mol of tetramethylsilyl pentafluoroethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a pentafluoroethylated product (A"fx66) of the compound (A"x66).

0.02 mol of the compound (A"fx66), 0.03 mol of dihydropyran, and 0.005 mol of tosylic acid were dissolved in 100 g of dichloromethane and mixed together to obtain a solution, which was then neutralized and separated. After this separation, the resultant liquid was concentrated to obtain a tetrahydropyranyl-substituted product (x66) of the compound (A"fx66).

SYNTHESIZING EXAMPLE 84

0.04 mol of 2-isopropenylcyclopentanone (A"x66), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized.

After the separation of the filtrate, the resultant liquid was concentrated to obtain a trifluoromethylated product (A"fx67) of the compound (A"x67).

0.02 mol of the compound (A"fx67), 0.03 mol of butylvinyl ether, and 0.006 mol of tosylic acid were dissolved in 100 g of dichloromethane and mixed together to obtain a solution, which was then neutralized and separated. After this separation, the resultant liquid was concentrated to obtain a butoxyethyl-substituted product (x67) of the compound (A"fx67).

SYNTHESIZING EXAMPLE 85

0.04 mol of 2-isopropenylcyclopentanone (A"x66), 0.06 mol of tetramethylsilyl pentafluoroethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a pentafluoroethylated product (A"fx66) of the compound (A"x66).

0.02 mol of the compound (A"fx66), 0.03 mol of propylvinyl ether, and 0.01 mol of tosylic acid were dissolved in 100 g of dichloromethane and mixed together to obtain a solution, which was then neutralized and separated. After this separation, the resultant liquid was concentrated to obtain a propoxyethyl-substituted product (x68) of the compound (A"fx66).

SYNTHESIZING EXAMPLE 86

0.04 mol of 2-isopropenylcyclopentanone (A"x66), 0.06 mol of tetramethylsilyl nonafluorobutane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a nonafluorobutylated product (A"fx69) of the compound (A"x66).

0.02 mol of the compound (A"fx69), 0.03 mol of ethylvinyl ether, and 0.01 mol of tosylic acid were dissolved in 100 g of dichloromethane and mixed together to obtain a solution, which was then neutralized and separated. After this separation, the resultant liquid was concentrated to obtain an ethoxyethyl-substituted product (x69) of the compound (A"fx69).

SYNTHESIZING EXAMPLE 87

0.04 mol of 2-isopropenylcyclopentanone (A"x66), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (A"fx67) of the compound (A"x67).

0.02 mol of the compound (A"fx67), 0.03 mol of methylvinyl ether, and 0.008 mol of tosylic acid were dissolved in 100 g of dichloromethane and mixed together to obtain a solution, which was then neutralized and separated. After this separation, the resultant liquid was concentrated to obtain a methoxyethyl-substituted product (x70) of the compound (A"fx67).

SYNTHESIZING EXAMPLE 88

0.04 mol of 2-oxoisopropenyladamantane (Ax71), 0.06 mol of tetramethylsilyl pentafluoroethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a pentafluoroethylated product (Afx71) of the compound (Ax71).

0.02 mol of the compound (Afx71), 0.03 mol of dihydrofuran, and 0.008 mol of tosylic acid were dissolved in 100 g of dichloromethane and mixed together to obtain a solution, which was then neutralized and separated. After this separation, the resultant liquid was concentrated to obtain a tetrahydrofuranyl-substituted product (x71) of the compound (Afx71).

SYNTHESIZING EXAMPLE 89

0.04 mol of 1-vinyl-3-trifluoromethyl-4-oxahomoadamantane(NY24x72) and 0.1 mol of diethylaminosulfur diethylmethyl tridecafluoride were dissolved in 140 g of tetrahydrofuran and mixed together to precipitate a salt, which was then filtered out, and the filtrate was neutralized. After the separation of the filtrate, the resultant liquid was concentrated to obtain an ethylmethyloctafluoro product (x72) of the compound (NY24x72).

SYNTHESIZING EXAMPLE 90

0.04 mol of 2-isopropenyl-3-trifluoromethyl-3-methyl-4-oxahomonorbornanone(NY24x72x73) and 0.1 mol of diethylaminosulfur trimethyl nonafluoride were dissolved in 140 g of tetrahydrofuran and mixed together to precipitate a salt, which was then filtered out, and the filtrate was neutralized. After the separation of the filtrate, the resultant liquid was concentrated to obtain a dimethylhexafluoro product (x73) of the compound (NY24x72x73).

SYNTHESIZING EXAMPLE 91

0.04 mol of ϵ-methyl-ϵ-hexanolactone(PX25x74) and 0.1 mol of diethylaminosulfur trimethyl nonafluoride were dissolved in 140 g of tetrahydrofuran and mixed together to precipitate a salt, which was then filtered out, and the filtrate was neutralized. After the separation of the filtrate, the resultant liquid was concentrated to obtain a dimethylhexafluoro product (x74) of the compound (PX25x74).

SYNTHESIZING EXAMPLE 92

0.04 mol of ϵ-trifluoromethyl-ϵ-hexanolactone (PX25x74x75) and 0.1 mol of diethylaminosulfur trimethyl nonafluoride were dissolved in 140 g of tetrahydrofuran and mixed together to precipitate a salt, which was then filtered out, and the filtrate was neutralized. After the separation of the filtrate, the resultant liquid was concentrated to obtain a dimethylhexafluoro product (x75) of the compound (PX25x74x75).

SYNTHESIZING EXAMPLE 93

0.04 mol of 1-isopropenyl-2-vinyl-3-methyl-4-oxahomoadamantanone(PX25x74x76) and 0.1 mol of diethylaminosulfur tripropyl henicosafluoride were dissolved in 140 g of tetrahydrofuran and mixed together to precipitate a salt, which was then filtered out, and the filtrate was neutralized. After the separation of the filtrate, the resultant liquid was concentrated to obtain a dipropyldecafluoro product (x76) of the compound (PX25x74x76).

SYNTHESIZING EXAMPLE 94

0.04 mol of δ-methyl-δ-pentanolactone(PX25x74x77) and 0.1 mol of diethylaminosulfur trimethyl nonafluoride were dissolved in 140 g of tetrahydrofuran and mixed together to precipitate a salt, which was then filtered out, and the filtrate was neutralized. After the separation of the filtrate, the resultant liquid was concentrated to obtain a dimethylhexafluoro product (x77) of the compound (PX25x74x77).

SYNTHESIZING EXAMPLE 95

0.04 mol of δ-trifluoromethyl-δ-pentanolactone (PX25x74x78) and 0.1 mol of diethylaminosulfur trimethyl nonafluoride were dissolved in 140 g of tetrahydrofuran and mixed together to precipitate a salt, which was then filtered out, and the filtrate was neutralized. After the separation of the filtrate, the resultant liquid was concentrated to obtain a dimethylhexafluoro product (x78) of the compound (PX25x74x78).

SYNTHESIZING EXAMPLE 96

0.04 mol of 3-oxo-2-isopropenyl norbornane(Ax71x79), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (Afx71x79) of the compound (Ax71x79).

0.02 mol of the compound (Afx71x79), 0.03 mol of dihydropyran, and 0.004 mol of tosylic acid were dissolved in 100 g of dichloromethane and mixed together to obtain a solution, which was then neutralized and separated. After this separation, the resultant liquid was concentrated to obtain a tetrahydropyranyl-substituted product (x79) of the compound (Afx71x79).

SYNTHESIZING EXAMPLE 97

0.04 mol of 3-oxo-2-isopropenyl norbornane(Ax71x79), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (Afx71x79) of the compound (Ax71x79).

0.02 mol of the compound (Afx71x79), 0.03 mol of propylvinyl ether, and 0.05 mol of tosylic acid were dissolved in 100 g of dichloromethane and mixed together to obtain a solution, which was then neutralized and separated. After this separation, the resultant liquid was concentrated to obtain a propoxyetyl-substituted product (x80) of the compound (Afx71x79).

SYNTHESIZING EXAMPLE 98

0.04 mol of 1-oxo-2-vinyl norbornane(Ax71x81), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (Afx71x81) of the compound (Ax71).

0.02 mol of the compound (Afx71x81), 0.03 mol of butylvinyl ether, and 0.004 mol of tosylic acid were dissolved in 100 g of dichloromethane and mixed together to obtain a solution, which was then neutralized and separated. After this separation, the resultant liquid was concentrated to obtain a butoxyethyl-substituted product (x81) of the compound (Afx71x81).

SYNTHESIZING EXAMPLE 99

0.04 mol of 1-oxo-2-isopropenyl norbornane(Ax71x82), 0.06 mol of tetramethylsilyl pentafluoroethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a pentafluoroethylated product (Afx71x82) of the compound (Ax71x82).

0.02 mol of the compound (Afx71x82), 0.03 mol of butylvinyl ether, and 0.004 mol of tosylic acid were dissolved in 100 g of dichloromethane and mixed together to obtain a solution, which was then neutralized and separated. After this separation, the resultant liquid was concentrated to obtain a butoxyethyl-substituted product (x82) of the compound (Afx71x82).

SYNTHESIZING EXAMPLE 100

0.04 mol of 2-vinylnorbornyl-1-trifluoromethyl ketone (A"x83), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (A"fx83) of the compound (A"x83).

0.02 mol of the compound (A"fx83), 0.03 mol of dihydropyran, and 0.005 mol of tosylic acid were dissolved in 100 g of dichloromethane and mixed together to obtain a solution, which was then neutralized and separated. After this separation, the resultant liquid was concentrated to obtain a tetrahydropyranyl-substituted product (x83) of the compound (A"fx83).

SYNTHESIZING EXAMPLE 101

0.04 mol of 8,8-dimethyl-6-oxo-7-oxahomonorbornyl-3-ene(PX25x74x84) and 0.1 mol of diethylaminosulfur trimethyl nonafluoride were dissolved in 140 g of tetrahydrofuran and mixed together to precipitate a salt, which was then filtered out, and the filtrate was neutralized. After the separation of the filtrate, the resultant liquid was concentrated to obtain a dimethylhexafluoro product (x84) of the compound (PX25x74x84).

SYNTHESIZING EXAMPLE 102

0.04 mol of 8-methyl-8-trifluoromethyl-6-oxo-7-oxahomonorbornyl-3-ene(PX25x74x84x85) and 0.1 mol of diethylaminosulfur trimethyl nonafluoride were dissolved in 140 g of tetrahydrofuran and mixed together to precipitate a salt, which was then filtered out, and the filtrate was neutralized. After the separation of the filtrate, the resultant liquid was concentrated to obtain a dimethylhexafluoro product (x85) of the compound (PX25x74x84x85).

SYNTHESIZING EXAMPLE 103

0.04 mol of 5-methyl-7-oxo-6-oxahomonorbornyl-3-ene (PX25x74x84x86) and 0.1 mol of diethylaminosulfur trimethyl nonafluoride were dissolved in 140 g of tetrahydrofuran and mixed together to precipitate a salt, which was then filtered out, and the filtrate was neutralized. After the separation of the filtrate, the resultant liquid was concentrated to obtain a dimethylhexafluoro product (x86) of the compound (PX25x74x84x86)

SYNTHESIZING EXAMPLE 104

0.04 mol of norbornyl-3-enyl-7-trifluoromethyl ketone (A"x83x87), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (A"fx83x87) of the compound (A"x83x87).

0.02 mol of the compound (A"fx83x87), 0.03 mol of dihydropyran, and 0.006 mol of tosylic acid were dissolved in 100 g of dichloromethane and mixed together to obtain a solution, which was then neutralized and separated. After this separation, the resultant liquid was concentrated to obtain a tetrahydropyranyl-substituted product (x87) of the compound (A"fx83x87).

SYNTHESIZING EXAMPLE 105

0.04 mol of 5-trifluoromethyl-6-oxa-7-oxohomonorbornyl-3-ene(PX25x74x84x88) and 0.1 mol of diethylaminosulfur trimethyl nonafluoride were dissolved in 140 g of tetrahydrofuran and mixed together to precipitate a salt, which was then filtered out, and the filtrate was neutralized. After the separation of the filtrate, the resultant liquid was concentrated to obtain a dimethylhexafluoro product (x88) of the compound (PX25x74x84x88).

SYNTHESIZING EXAMPLE 106

0.04 mol of 5-methyl-7-oxo-6-oxahomonorbornyl-3-ene (PX25x74x84x89) and 0.1 mol of diethylaminosulfur trimethyl nonafluoride were dissolved in 140 g of tetrahydrofuran and mixed together to precipitate a salt, which was then filtered out, and the filtrate was neutralized. After the separation of the filtrate, the resultant liquid was concentrated to obtain a dimethylhexafluoro product (x89) of the compound (PX25x74x84x89).

SYNTHESIZING EXAMPLE 107

0.04 mol of 2-trifluoromethyl-6-oxo-7-oxahomonorbornyl-3-ene(PX25x74x84x90) and 0.1 mol of diethylaminosulfur trimethyl nonafluoride were dissolved in 140 g of tetrahydrofuran and mixed together to precipitate a salt, which was then filtered out, and the filtrate was neutralized. After the separation of the filtrate, the resultant liquid was concentrated to obtain a dimethylhexafluoro product (x90) of the compound (PX25x74x84x90).

SYNTHESIZING EXAMPLE 108

0.04 mol of 6-oxo-norbornyl-3-ene (Ax71x82x91), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (Afx71x82x91) of the compound (Ax71x82x91).

0.02 mol of the compound (Afx71x82x91), 0.03 mol of dihydropyran, and 0.008 mol of tosylic acid were dissolved in 100 g of dichloromethane and mixed together to obtain a solution, which was then neutralized and separated. After this separation, the resultant liquid was concentrated to obtain a tetrahydropyranyl-substituted product (x91) of the compound (Afx71x82x91).

SYNTHESIZING EXAMPLE 109

0.04 mol of 6-oxo-norbornyl-3-ene (Ax71x82x91), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (Afx71x82x91) of the compound (Ax71x82x91).

0.02 mol of the compound (Afx71x82x91), 0.03 mol of methoxyethoxymethyl chloride, and 0.1 mol of triethyl amine were dissolved in 100 g of dichloromethane and mixed together to obtain a solution, which was then neutralized and separated. After this separation, the resultant liquid was concentrated to obtain a methoxyethoxymethyl-substituted product (x92) of the compound (Afx71x82x91).

SYNTHESIZING EXAMPLE 110

0.04 mol of 1-oxo-norbornyl-3-ene (Ax71x82x91x91), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (Afx71x82x91x93) of the compound (Ax71x82x91x93).

0.02 mol of the compound (Afx71x82x91x93), 0.03 mol of dihydropyran, and 0.1 mol of tosylic acid were dissolved in 100 g of dichloromethane and mixed together to obtain a solution, which was then neutralized and separated. After this separation, the resultant liquid was concentrated to obtain a tetrahydropyranyl-substituted product (x93) of the compound (Afx71x82x91x93).

SYNTHESIZING EXAMPLE 111

0.04 mol of norbornyl-3-enyl-2-trifluoromethyl ketone (A"x83x87x94), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (A"fx83x87x94) of the compound (A"fx83x87x94).

0.02 mol of the compound (A"fx83x87x94), 0.03 mol of methoxyethoxymethyl chloride, and 0.1 mol of triethyl amine were dissolved in 100 g of dichloromethane and mixed together to obtain a solution, which was then neutralized and separated. After this separation, the resultant liquid was concentrated to obtain a methoxyethoxymethyl-substituted product (x94) of the compound (A"fx83x87x94).

SYNTHESIZING EXAMPLE 112

0.04 mol of norbornyl-3-enyl-2-trifluoromethyl ketone (A"x83x87x95), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (A"fx83x87x95) of the compound (A"x83x87x95).

0.02 mol of the compound (A"fx83x87x95), 0.03 mol of butylvinyl ether, and 0.005 mol of tosylic acid were dissolved in 100 g of dichloromethane and mixed together to obtain a solution, which was then neutralized and separated. After this separation, the resultant liquid was concentrated to obtain a butoxyethyl-substituted product (x95) of the compound (A"fx83x87x95).

SYNTHESIZING EXAMPLE 113

0.04 mol of norbornyl-3-enyl-6-trifluoromethyl ketone (A"fx83x87x96), 0.06 mol of tetramethylsilyl pentafluoroethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (A"fx83x87x96) of the compound (A"fx83x87x96).

0.02 mol of the compound (A"fx83x87x96), 0.03 mol of methoxyethoxymethyl chloride, and 0.1 mol of triethyl amine were dissolved in 100 g of dichloromethane and mixed together to obtain a solution, which was then neutralized and separated. After this separation, the resultant liquid was concentrated to obtain a methoxyethoxymethyl-substituted product (x96) of the compound (A"fx83x87x96).

SYNTHESIZING EXAMPLE 114

0.04 mol of norbornyl-3-enyl-6-pentafluoroethyl ketone (A"x83x87x97), 0.06 mol of tetramethylsilyl pentafluoroethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a pentafluoroethylated product (A"fx83x87x97) of the compound (A"x83x87x97).

0.02 mol of the compound (A"fx83x87x97), 0.03 mol of dihydropyran, and 0.2 mol of triethyl amine were dissolved in 100 g of dichloromethane and mixed together to obtain a solution, which was then neutralized and separated. After this separation, the resultant liquid was concentrated to obtain a tetrahydropyranyl-substituted product (x97) of the compound (A"fx83x87x97).

SYNTHESIZING EXAMPLE 115

0.04 mol of 3-enylnorbornanone (Ax71x82x98), 0.06 mol of tetramethylsilyl nonafluorobutane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a nonafluorobutylated product (Afx71x82x98) of the compound (Ax71x82x98).

0.02 mol of the compound (Afx71x82x98), 0.03 mol of methoxyethoxymethyl chloride, and 0.2 mol of triethyl amine were dissolved in 100 g of dichloromethane and mixed together to obtain a solution, which was then neutralized and separated. After this separation, the resultant liquid was concentrated to obtain a methoxyethoxymethyl-substituted product (x98) of the compound (Afx71x82x98).

SYNTHESIZING EXAMPLE 116

0.04 mol of 3-enylnorbornanone (Ax71x82x98), 0.06 mol of tetramethylsilyl heptafluoropropane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a heptafluoropropylated product (Afx71x82x98x99) of the compound (Ax71x82x98).

0.02 mol of the compound (Afx71x82x98x99), 0.03 mol of dihydropyran, and 0.005 mol of tosylic acid were dissolved in 100 g of dichloromethane and mixed together to obtain a solution, which was then neutralized and separated. After this separation, the resultant liquid was concentrated to obtain a tetrahydropyranyl-substituted product (x99) of the compound (Afx71x82x98x99).

SYNTHESIZING EXAMPLE 117

0.04 mol of 6,8-dioxo-7-oxahomonorbornyl-3-ene (PX25x74x84x100) and 0.16 mol of diethylaminosulfur trimethyl nonachloride were dissolved in 140 g of tetrahydrofuran and mixed together to precipitate a salt, which was then filtered out, and the filtrate was neutralized. After the separation of the filtrate, the resultant liquid was concentrated to obtain a tetramethyldodecachlorinated product (x100) of the compound (PX25x74x84x100).

SYNTHESIZING EXAMPLE 118

0.04 mol of 6-methyl-6-trichloromethyl-8-oxo-7-oxahomonorbornyl-3-ene(PX25x74x84x100x101) and 0.1 mol of diethylaminosulfur trimethyl nonachloride were dissolved in 140 g of tetrahydrofuran and mixed together to precipitate a salt, which was then filtered out, and the filtrate was neutralized. After the separation of the filtrate, the resultant liquid was concentrated to obtain a dimethylhexachlorinated product (x101) of the compound (PX25x74x84x100x101).

SYNTHESIZING EXAMPLE 119

0.04 mol of 5-methyl-7-oxo-6-oxahomonorbornyl-3-ene (PX25x74x84x100x102) and 0.1 mol of diethylaminosulfur trimethyl nonachloride were dissolved in 140 g of tetrahydrofuran and mixed together to precipitate a salt, which was then filtered out, and the filtrate was neutralized. After the separation of the filtrate, the resultant liquid was concentrated to obtain a dimethylhexachlorinated product (x102) of the compound (PX25x74x84x100x102).

SYNTHESIZING EXAMPLE 120

0.04 mol of norbornyl-3-enyl-6-trichloromethyl ketone (A"x83x87x103), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (A"fx83x87x103) of the compound (A"x83x87x103).

0.02 mol of the compound (A"fx83x87x103), 0.03 mol of dihydropyran, and 0.08 mol of tosylic acid were dissolved in 100 g of dichloromethane and mixed together to obtain a solution, which was then neutralized and separated. After this separation, the resultant liquid was concentrated to obtain a tetrahydropyranyl-substituted product (x103) of the compound (A"fx83x87x103).

SYNTHESIZING EXAMPLE 121

0.04 mol of 6,8-dioxo-7-oxahomonorbornyl-3-ene (PX25x74x84x100) and 0.16 mol of diethylaminosulfur trimethyl nonabromide were dissolved in 140 g of tetrahydrofuran and mixed together to precipitate a salt, which was then filtered out, and the filtrate was neutralized. After the separation of the filtrate, the resultant liquid was concentrated to obtain a tetramethyldodecabromo product (x104) of the compound (PX25x74x84x100).

SYNTHESIZING EXAMPLE 122

0.04 mol of 3-enylnorbornanone (Ax71x82x98), 0.06 mol of tetramethylsilyl tribromomethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a tribromomethylated product (Afx71x82x98x99x105) of the compound (Ax71x82x98).

0.02 mol of the compound (Afx71x82x98x99x105), 0.03 mol of dihydropyran, and 0.004 mol of tosylic acid were dissolved in 100 g of dichloromethane and mixed together to obtain a solution, which was then neutralized and separated. After this separation, the resultant liquid was concentrated to obtain a tetrahydropyranyl-substituted product (x105) of the compound (Afx71x82x98x99x105).

SYNTHESIZING EXAMPLE 123

0.04 mol of 5-methyl-7-oxo-6-oxahomonorbornyl-3-ene (PX25x74x84x100x102) and 0.1 mol of diethylaminosulfur trimethyl nonabromide were dissolved in 140 g of tetrahydrofuran and mixed together to precipitate a salt, which was then filtered out, and the filtrate was neutralized. After the separation of the filtrate, the resultant liquid was concentrated to obtain a dimethylhexabromo product (x106) of the compound (PX25x74x84x100x102).

SYNTHESIZING EXAMPLE 124

0.04 mol of norbornyl-3-enyl-6-tribromomethyl ketone (A"x83x87x103x107), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a tribromomethylated product (A"fx83x87x103x107) of the compound (A"x83x87x103x107).

0.02 mol of the compound (A"fx83x87x103x107), 0.03 mol of dihydropyran, and 0.005 mol of tosylic acid were dissolved in 100 g of dichloromethane and mixed together to obtain a solution, which was then neutralized and separated. After this separation, the resultant liquid was concentrated to obtain a butyl-substituted product (x107) of the compound (A"fx83x87x103x107).

SYNTHESIZING EXAMPLE 125

0.04 mol of norbornyl-3-enyl-6-tribromomethyl ketone (A"x83x87x103x107), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a tribromomethylated product (A"fx83x87x103x107) of the compound (A"x83x87x103x107).

0.02 mol of the compound (A"fx83x87x103x107), 0.03 mol of methoxyethoxymethyl bromide, and 0.2 mol of triethyl amine were dissolved in 100 g of dichloromethane and mixed together to obtain a solution, which was then neutralized and separated. After this separation, the resultant liquid was concentrated to obtain a methoxyethoxymethyl-substituted product (x108) of the compound (A"fx83x87x103x107x108).

SYNTHESIZING EXAMPLE 126

0.04 mol of norbornyl-3-enyl-6-tribromomethyl ketone (A"x83x87x103x107), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a tribromomethylated product (A"fx83x87x103x107) of the compound (A"x83x87x103x107).

0.02 mol of the compound (A"fx83x87x103x107), 0.03 mol of dihydropyran, and 0.008 mol of tosylic acid were dissolved in 100 g of dichloromethane and mixed together to obtain a solution, which was then neutralized and separated. After this separation, the resultant liquid was concentrated to obtain a tetrahydropyranyl-substituted product (x109) of the compound (A"fx83x87x103x107).

SYNTHESIZING EXAMPLE 127

0.04 mol of 3-enylnorbornanone (Ax71x82x98), 0.06 mol of tetramethylsilyl nonachlorobutane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a nonachlorobutylated product (Afx71x82x98x99x105x110) of the compound (Ax71x82x98).

0.02 mol of the compound (Afx71x82x98x99x105x110), 0.03 mol of methoxyethoxymethyl chloride, and 0.2 mol of triethyl amine were dissolved in 100 g of dichloromethane and mixed together to obtain a solution, which was then neutralized and separated. After this separation, the resultant liquid was concentrated to obtain a nonachlorobutyl-substituted product (x110) of the compound (Afx71x82x98x99x105x110).

SYNTHESIZING EXAMPLE 128

0.04 mol of 2-vinylnorbornyl-5-trifluoromethyl ketone (A"y51), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (y51) of the compound (A"y51).

SYNTHESIZING EXAMPLE 129

0.04 mol of 2-vinylnorbornyl-4-trifluoromethyl ketone (A"y52), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (y52) of the compound (A"y52).

SYNTHESIZING EXAMPLE 130

0.04 mol of 2-vinylnorbornyl-3-trifluoromethyl ketone (A"y53), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (y53) of the compound (A"y53).

SYNTHESIZING EXAMPLE 131

0.04 mol of 3-vinylnorbornyl-2-trifluoromethyl ketone (A"y54), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (y54) of the compound (A"y54).

SYNTHESIZING EXAMPLE 132

0.04 mol of 2-vinylnorbornyl-6-trifluoromethyl ketone (A"y55), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (y55) of the compound (A"y55).

SYNTHESIZING EXAMPLE 133

0.04 mol of 2-vinylnorbornyl-5-pentafluoroethyl ketone (A"y56), 0.06 mol of tetramethylsilyl pentafluoroethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a pentafluoroethylated product (y56) of the compound (A"y56).

SYNTHESIZING EXAMPLE 134

0.04 mol of 2-vinylnorbornyl-4-pentafluoroethyl ketone (A"y56y57), 0.06 mol of tetramethylsilyl pentafluoroethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a pentafluoroethylated product (y57) of the compound (A"y57).

SYNTHESIZING EXAMPLE 135

0.04 mol of 2-vinylnorbornyl-3-pentafluoroethyl ketone (A"y56y58), 0.06 mol of tetramethylsilyl pentafluoroethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a pentafluoroethylated product (y58) of the compound (A"y56y58).

SYNTHESIZING EXAMPLE 136

0.04 mol of 3-vinylnorbornyl-2-pentafluoroethyl ketone (A"y56y59), 0.06 mol of tetramethylsilyl pentafluoroethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a pentafluoroethylated product (y59) of the compound (A"y56y59).

SYNTHESIZING EXAMPLE 137

0.04 mol of 4-vinylnorbornyl-6-pentafluoroethyl ketone (A"y56y60), 0.06 mol of tetramethylsilyl pentafluoroethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a pentafluoroethylated product (y60) of the compound (A"y56y60).

SYNTHESIZING EXAMPLE 138

0.04 mol of 2-vinylnorbornyl-3-heptafluoropropyl ketone (A"y51y61), 0.06 mol of tetramethylsilyl heptafluoropropane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a heptafluoropropylated product (y61) of the compound (A"y51y61).

SYNTHESIZING EXAMPLE 139

0.04 mol of 2-isopropenylnorbornyl-4-heptafluoropropyl ketone (A"y51y61y62), 0.06 mol of tetramethylsilyl heptafluoropropane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a heptafluoropropylated product (A"fy62) of the compound (A"y51y61y62).

0.02 mol of the compound (A"fy62), 0.03 mol of propylvinyl ether, and 0.005 mol of tosylic acid were dissolved in 100 g of dichloromethane and mixed together to obtain a solution, which was then neutralized and separated. After this separation, the resultant liquid was concentrated to obtain a propoxyethyl-substituted product (y62) of the compound (A"fy62).

SYNTHESIZING EXAMPLE 140

0.04 mol of 2-isopropenylnorbornyl-5-heptafluoropropyl ketone (A"y51y61y62y63), 0.06 mol of tetramethylsilyl heptafluoropropane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a heptafluoropropylated product (A"fy62y63) of the compound (A"y51y61y62y63).

0.02 mol of the compound (A"fy62y63), 0.03 mol of butylvinyl ether, and 0.008 mol of tosylic acid were dissolved in 100 g of dichloromethane and mixed together to obtain a solution, which was then neutralized and separated. After this separation, the resultant liquid was concentrated to obtain a butoxyethyl-substituted product (y63) of the compound (A"fy62y63).

SYNTHESIZING EXAMPLE 141

0.04 mol of 3-isopropenylnorbornyl-2-nonafluorobutyl ketone (A"y51y61y62y64), 0.06 mol of tetramethylsilyl heptafluoropropane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a heptafluoropropylated product (A"fy62y64) of the compound (A"y51y61y62).

0.02 mol of the compound (A"fy62y64), 0.03 mol of ethylvinyl ether, and 0.007 mol of tosylic acid were dissolved in 100 g of dichloromethane and mixed together to obtain a solution, which was then neutralized and separated. After this separation, the resultant liquid was concentrated to obtain an ethoxyethyl-substituted product (y64) of the compound (A"fy62y64).

SYNTHESIZING EXAMPLE 142

0.04 mol of 4-isopropenylnorbornyl-6-nonafluorobutyl ketone (A"y51y61y62y65), 0.06 mol of tetramethylsilyl heptafluoropropane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a heptafluoropropylated product (A"fy62y65) of the compound (A"y51y61y62y65).

0.02 mol of the compound (A"fy62y65), 0.03 mol of dihydropyran, and 0.004 mol of tosylic acid were dissolved in 100 g of dichloromethane and mixed together to obtain a solution, which was then neutralized and separated. After this separation, the resultant liquid was concentrated to obtain a tetrahydropyranyl-substituted product (y65) of the compound (A"fy62y65).

SYNTHESIZING EXAMPLE 143

0.04 mol of 2-isopropenylnorbornyl-3-pentafluoroethyl ketone (A"y51y61y62), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (A"fy62y66) of the compound (A"y51y61y62y66).

0.02 mol of the compound (A"fy62y66), 0.03 mol of propylvinyl ether, and 0.006 mol of tosylic acid were dissolved in 100 g of dichloromethane and mixed together to obtain a solution, which was then neutralized and separated. After this separation, the resultant liquid was concentrated to obtain a propoxyethyl-substituted product (y66) of the compound (A"fy62y66).

SYNTHESIZING EXAMPLE 144

0.04 mol of 2-isopropenylnorbornyl-4-nonafluorobutyl ketone (A"y51y61y62y67), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (A"fy62y66y67) of the compound (A"y51y61y62y66y67).

0.02 mol of the compound (A"fy62y66y67), 0.03 mol of propylvinyl ether, and 0.006 mol of tosylic acid were dissolved in 100 g of dichloromethane and mixed together to obtain a solution, which was then neutralized and separated. After this separation, the resultant liquid was concentrated to obtain a propoxyethyl-substituted product (y67) of the compound (A"fy62y66y67).

SYNTHESIZING EXAMPLE 145

0.04 mol of 2-isopropenylnorbornyl-5-trichloromethyl ketone (A"y51y61y62y68), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (A"fy62y66y68) of the compound (A"y51y61y62y66y68).

0.02 mol of the compound (A"fy62y66y68), 0.03 mol of dihydrofuran, and 0.005 mol of tosylic acid were dissolved in 100 g of dichloromethane and mixed together to obtain a solution, which was then neutralized and separated. After this separation, the resultant liquid was concentrated to obtain a tetrahydrofuranyl-substituted product (y68) of the compound (A"fy62y66y68).

SYNTHESIZING EXAMPLE 146

0.04 mol of 3-isopropenylnorbornyl-2-trifluoromethyl ketone (A"y51y61y62y69), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (A"fy62y66y69) of the compound (A"y51y61y62y66y69).

0.02 mol of the compound (A"fy62y66y69), 0.03 mol of dihydrofuran, and 0.008 mol of tosylic acid were dissolved in 100 g of dichloromethane and mixed together to obtain a solution, which was then neutralized and separated. After this separation, the resultant liquid was concentrated to obtain a dihydrofuranyl-substituted product (y69) of the compound (A"fy62y66y69).

SYNTHESIZING EXAMPLE 147

0.04 mol of 4-isopropenylnorbornyl-6-pentafluoroethyl ketone (A"y51y61y62y70), 0.06 mol of tetramethylsilyl pentafluoroethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a pentafluoroethylated product (A"fy62y66y70) of the compound (A"y51y61y62y66y70).

0.02 mol of the compound (A"fy62y66y70), 0.03 mol of propylvinyl ether, and 0.008 mol of tosylic acid were dissolved in 100 g of dichloromethane and mixed together to obtain a solution, which was then neutralized and separated. After this separation, the resultant liquid was concentrated to obtain a propoxyethyl-substituted product (y70) of the compound (A"fy62y66y70).

SYNTHESIZING EXAMPLE 148

0.04 mol of tetrahydropyranyl methacrylate (PX25x74y71) and 0.1 mol of diethylaminosulfur trimethyl nonafluoride were dissolved in 140 g of tetrahydrofuran and mixed together to precipitate a salt, which was then filtered out, and the filtrate was neutralized. After the separation of the filtrate, the resultant liquid was concentrated to obtain a dimethylhexafluoro product (y71) of the compound (PX25x74y71).

SYNTHESIZING EXAMPLE 149

0.04 mol of 2-vinyladamantyl-7-pentafluoroethyl ketone (A"y51y61y62y72), 0.06 mol of tetramethylsilyl pentafluoroethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a pentafluoroethylated product (A"fy62y72) of the compound (A"y51y61y62y72).

0.02 mol of the compound (A"fy62y72), 0.03 mol of propylvinyl ether, and 0.008 mol of tosylic acid were dissolved in 100 g of dichloromethane and mixed together to obtain a solution, which was then neutralized and separated. After this separation, the resultant liquid was concentrated to obtain a propoxyethyl-substituted product (y72) of the compound (A"fy62y72).

SYNTHESIZING EXAMPLE 150

0.04 mol of 2-vinyl-3-heptafluoropropyl-3-methyl-4-oxahomonorbornanone(NY24x72x73y73) and 0.1 mol of diethylaminosulfur triethyl nonapentadecafluoride were dissolved in 140 g of tetrahydrofuran and mixed together to precipitate a salt, which was then filtered out, and the filtrate was neutralized. After the separation of the filtrate, the resultant liquid was concentrated to obtain a diethyldecafluoro product (y73) of the compound (NY24x72x73y73).

SYNTHESIZING EXAMPLE 151

0.04 mol of 1-vinyladamantyl-3-trifluoromethyl ketone (A"y51y61y62y72y74), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (A"fy62y72y74) of the compound (A"y51y61y62y72y74).

0.02 mol of the compound (A"fy62y72y74), 0.03 mol of propylvinyl ether, and 0.008 mol of tosylic acid were dissolved in 100 g of dichloromethane and mixed together to obtain a solution, which was then neutralized and separated. After this separation, the resultant liquid was concentrated to obtain a butyl-substituted product (y74) of the compound (A"fy62y72y74).

SYNTHESIZING EXAMPLE 152

0.04 mol of 1-vinyladamantyl-3-heptafluoropropyl ketone (A"y51y61y62y72y74y75), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (A"fy62y72y74y75) of the compound (A"y51y61y62y72y74y75).

0.02 mol of the compound (A"fy62y72y74y75), 0.03 mol of dihydropyran, and 0.008 mol of tosylic acid were dissolved in 100 g of dichloromethane and mixed together to obtain a solution, which was then neutralized and separated. After this separation, the resultant liquid was concentrated to obtain a tetrahydropyranyl-substituted product (y75) of the compound (A"fy62y72y74y75).

SYNTHESIZING EXAMPLE 153

0.04 mol of 1-vinyladamantyl-3-trifluoromethyl ketone (A"y51y61y62y72y74), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (A"fy62y72y74) of the compound (A"y51y61y62y72y74).

0.02 mol of the compound (A"fy62y72y74), 0.03 mol of dihydropyran, and 0.005 mol of tosylic acid were dissolved in 100 g of dichloromethane and mixed together to obtain a solution, which was then neutralized and separated. After this separation, the resultant liquid was concentrated to obtain a tetrahydropyranyl-substituted product (y76) of the compound (A"fy62y72y74).

SYNTHESIZING EXAMPLE 154

0.04 mol of 2-isopropenyl-1-oxahomonorbornyl-5-trifluoromethyl ketone (A"y51y61y62y77), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (A"fy62y77) of the compound (A"y51y61y62y77).

0.02 mol of the compound (A"fy62y77), 0.03 mol of dihydropyran, and 0.008 mol of tosylic acid were dissolved in 100 g of dichloromethane and mixed together to obtain a solution, which was then neutralized and separated. After this separation, the resultant liquid was concentrated to obtain a tetrahydropyranyl-substituted product (y77) of the compound (A"fy62y77).

SYNTHESIZING EXAMPLE 155

0.04 mol of 2-vinyl-1-oxahomonorbornyl-5-trifluoromethyl ketone (A"y51y61y62y77y78), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (A"fy62y77y78) of the compound (A"y51y61y62y77y78).

0.02 mol of the compound (A"fy62y77y78), 0.03 mol of butylvinyl ether, and 0.008 mol of tosylic acid were dissolved in 100 g of dichloromethane and mixed together to obtain a solution, which was then neutralized and separated. After this separation, the resultant liquid was concentrated to obtain a butoxyethyl-substituted product (y78) of the compound (A"fy62y77y78).

SYNTHESIZING EXAMPLE 156

0.04 mol of 2-vinylnorbornyl-5-trifluoromethyl ketone (A"y51y61y62y77y79), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (A"fy62y77y79) of the compound (A"y51y61y62y77y79).

0.02 mol of the compound (A"fy62y77y79), 0.03 mol of propylvinyl ether, and 0.005 mol of tosylic acid were dissolved in 100 g of dichloromethane and mixed together to obtain a solution, which was then neutralized and separated. After this separation, the resultant liquid was concentrated to obtain a propoxyethyl-substituted product (y79) of the compound. (A"fy62y77y79).

SYNTHESIZING EXAMPLE 157

0.04 mol of 2-vinylnorbornyl-4-pentafluoroethyl ketone (A"y51y61y62y77y80), 0.06 mol of tetramethylsilyl pentafluoroethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a pentafluoroethylated product (A"fy62y77y80) of the compound (A"y51y61y62y77y80).

0.02 mol of the compound (A"fy62y77y80), 0.03 mol of ethylvinyl ether, and 0.008 mol of tosylic acid were dissolved in 100 g of dichloromethane and mixed together to obtain a solution, which was then neutralized and separated. After this separation, the resultant liquid was concentrated to obtain an ethoxyethyl-substituted product (y80) of the compound (A"fy62y77y80).

SYNTHESIZING EXAMPLE 158

0.04 mol of 2-vinylnorbornyl-5-trifluoromethyl ketone (A"y51y61y62y77y82), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (A"fy62y77y82) of the compound (A"y51y61y62y77y82).

0.02 mol of the compound (A"fy62y77y82), 0.03 mol of methylvinyl ether, and 0.007 mol of tosylic acid were dissolved in 100 g of dichloromethane and mixed together to obtain a solution, which was then neutralized and separated. After this separation, the resultant liquid was concentrated to obtain a methoxyethyl-substituted product (y82) of the compound (A"fy62y77y82).

SYNTHESIZING EXAMPLE 159

0.04 mol of 2-isopropenylnorbornyl-1-trifluoromethyl ketone (A"y51y83), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (y83) of the compound (A"y51y83).

SYNTHESIZING EXAMPLE 160

0.04 mol of 2-isopropenyl-4,4-dimethyl butenolide (PX25x74y71y84), and 0.1 mol of diethylaminosulfur trimethylnonafluoride were dissolved in 140 g of tetrahydrofuran and mixed together to precipitate a salt, which was then filtered out, and the filtrate was neutralized. After the separation of the filtrate, the resultant liquid was concentrated to obtain a dimethylhexafluoro product (y84) of the compound (PX25x74y71y84).

SYNTHESIZING EXAMPLE 161

0.04 mol of 3-isopropenyl-1,1-dimethyl-5-oxa-6-oxonorbornane (PX25x74y71y84y85), and 0.1 mol of diethylaminosulfur trimethylnonafluoride were dissolved in 140 g of tetrahydrofuran and mixed together to precipitate a salt, which was then filtered out, and the filtrate was neutralized. After the separation of the filtrate, the resultant liquid was concentrated to obtain a dimethylhexafluoro product (y85) of the compound (PX25x74y71y84y85).

SYNTHESIZING EXAMPLE 162

The same procedures as employed in Synthesizing Example 161, excepting that 2-vinyl-3,3-dimethylbutenolide (PX25x74y71y84y86) was substituted for the compound (PX25x74y71y84y85) employed therein, were repeated to obtain a dimethylhexafluoro product (y86) of the compound (PX25x74y71y84y86).

SYNTHESIZING EXAMPLE 163

The same procedures as employed in Synthesizing Example 161, excepting that 3-isopropenyl-5-oxa-6-oxonorbornane (PX25x74y71y84y85y87) was substituted for the compound (PX25x74y71y84y85) employed therein, were repeated to obtain a dimethylhexafluoro product (y87) of the compound (PX25x74y71y84y85y87).

SYNTHESIZING EXAMPLE 164

The same procedures as employed in Synthesizing Example 161, excepting that 4-1'-adamantylethyl-2-vinylbutenolide (PX25x74y71y84y88) was substituted for the compound (PX25x74y71y84y85) employed therein, were repeated to obtain a dimethylhexafluoro product (y88) of the compound (PX25x74y71y84y88).

SYNTHESIZING EXAMPLE 165

The same procedures as employed in Synthesizing Example 161, excepting that 2-vinyl-4,4-2',2'-adamantenylspirobutenolide (PX25x74y71y84y89) was substituted for the compound (PX25x74y71y84y85) employed therein, were repeated to obtain a dimethylhexafluoro product (y89) of the compound (PX25x74y71y84y89).

SYNTHESIZING EXAMPLE 166

The same procedures as employed in Synthesizing Example 161, excepting that 2-isopropenyl-4,4-dimethylbutenolide (PX25x74y71y90) was substituted for the compound (PX25x74y71y84y85) employed therein, were repeated to obtain a dimethylhexafluoro product (y90) of the compound (PX25x74y71y90).

SYNTHESIZING EXAMPLE 167

0.04 mol of 1-isopropenyladamantyl-3-trifluoromethyl ketone (A"y51y61y62y72y74y91), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (A"fy62y72y74y91) of the compound (A"y51y61y62y72y74y91).

0.02 mol of the compound (A"fy62y72y74y91), 0.03 mol of propylvinyl ether, and 0.008 mol of tosylic acid were dissolved in 100 g of dichloromethane and mixed together to obtain a solution, which was then neutralized and separated. After this separation, the resultant liquid was concentrated to obtain a butyl-substituted product (y91) of the compound (A"fy62y72y74y91).

SYNTHESIZING EXAMPLE 168

0.02 mol of 3-vinyl-1-adamantanol (A"fy62y72y74y91y96), 0.03 mol of methoxyethoxymethyl chloride and 0.2 mol of triethyl amine were dissolved in 100 g of dichloromethane and mixed together to obtain a solution, which was then neutralized and separated. After this separation, the resultant liquid was concentrated to obtain a methoxyethoxymethyl-substituted product (y96) of the compound (A"fy62y72y74y91y96)

SYNTHESIZING EXAMPLE 169

0.02 mol of 3-isopropenyl-1-adamantanol (A"fy62y72y74y91y96), 0.03 mol of methoxymethyl chloride and 0.2 mol of triethyl amine were dissolved in 100 g of dichloromethane and mixed together to obtain a solution, which was then neutralized and separated. After this separation, the resultant liquid was concentrated to obtain a methoxymethyl-substituted product (y97) of the compound (A"fy62y72y74y91y96).

SYNTHESIZING EXAMPLE 170

0.04 mol of 6-isopropenyl-1-hydroxydecalin-2-one (PX25x74y71y90y100), 0.06 mol of methoxyethoxymethyl chloride, and 0.4 mol of triethyl amine were dissolved in 100 g of dichloromethane and mixed together to obtain a solution, which was then neutralized and separated. After this separation, the resultant liquid was concentrated to obtain a methoxyethoxymethyl-substituted product (Y100') of the compound (PX25x74y71y90y100).

0.02 mol of the compound (Y100') and 0.05 mol of diethylaminosulfur trimethylnonafluoride were dissolved in 140 g of tetrahydrofuran and mixed together to precipitate a salt, which was then filtered out, and the filtrate was neutralized. After the separation of the filtrate, the resultant liquid was concentrated to obtain a dimethylhexafluoro product (y100) of the compound (Y100').

SYNTHESIZING EXAMPLE 171

0.04 mol of 2-isopropenyl-2-hydroxynordecalin-3-one (PX25x74y71y90Y100y101), 0.06 mol of methoxyethoxymethyl chloride, and 0.4 mol of triethyl amine were dissolved in 100 g of dichloromethane and mixed together to obtain a solution, which was then neutralized and separated. After this separation, the resultant liquid was concentrated to obtain a methoxyethoxymethyl-substituted product (Y101') of the compound (PX25x74y71y90Y100y101).

0.02 mol of the compound (Y101') and 0.05 mol of diethylaminosulfur trimethylnonafluoride were dissolved in 140 g of tetrahydrofuran and mixed together to precipitate a salt, which was then filtered out, and the filtrate was neutralized. After the separation of the filtrate, the resultant liquid was concentrated to obtain a dimethylhexafluoro product (y101) of the compound (Y101').

SYNTHESIZING EXAMPLE 172

0.04 mol of 2-vinyl-5-hydroxy-norbornan-4,6-dione (PX25x74y71y90y100Y102), 0.06 mol of methoxyethoxymethyl chloride, and 0.4 mol of triethyl amine were dissolved in 100 g of dichloromethane and mixed together to obtain a solution, which was then neutralized and separated. After this separation, the resultant liquid was concentrated to obtain a methoxyethoxymethyl-substituted product (Y102') of the compound (PX25x74y71y90y100Y102).

0.02 mol of the compound (Y102') and 0.1 mol of diethylaminosulfur trifluoride were dissolved in 140 g of tetrahydrofuran and mixed together to precipitate a salt, which was then filtered out, and the filtrate was neutralized. After the separation of the filtrate, the resultant liquid was concentrated to obtain a tetrafluoro product (y102) of the compound (Y101').

SYNTHESIZING EXAMPLE 173

0.04 mol of 1-vinyl-3-hydroxy-adamantan-2,4-dione (PX25x74y71y90y100Y102y103), 0.06 mol of methoxyethoxymethyl chloride, and 0.4 mol of triethyl amine were dissolved in 100 g of dichloromethane and mixed together to obtain a solution, which was then neutralized and separated. After this separation, the resultant liquid was concentrated to obtain a methoxyethoxymethyl-substituted product (Y103') of the compound (PX25x74y71y90y100Y102y103).

0.02 mol of the compound (Y103') and 0.1 mol of diethylaminosulfur trifluoride were dissolved in 140 g of tetrahydrofuran and mixed together to precipitate a salt, which was then filtered out, and the filtrate was neutralized. After the separation of the filtrate, the resultant liquid was concentrated to obtain a tetrafluoro product (y103) of the compound (Y103').

SYNTHESIZING EXAMPLE 174

0.04 mol of 6-isopropenyl-4,4-dimethyl-2-oxacycloheptanone (PX25x74y71y90Y100y101y104) and 0.1 mol of diethylaminosulfur trimethylnonafluoride were dissolved in 140 g of tetrahydrofuran and mixed together to precipitate a salt, which was then filtered out, and the filtrate was neutralized. After the separation of the filtrate, the resultant liquid was concentrated to obtain a dimethylhexafluoro product (y104) of the compound (PX25x74y71y90Y100y101y104).

SYNTHESIZING EXAMPLE 175

0.04 mol of maleic anhydride and 0.1 mol of diethylaminosulfur trifluoride were dissolved in 140 g of tetrahydrofuran and mixed together to precipitate a salt, which was then filtered out, and the filtrate was neutralized. After the separation of the filtrate, the resultant liquid was concentrated to obtain a tetrafluoro product (z85) of maleic anhydride.

SYNTHESIZING EXAMPLE 176

The same procedures as employed in Synthesizing Example 175, excepting that diethylaminosulfur trimethylnonafluoride was substituted for the diethylaminosulfur trifluoride employed therein, were repeated to obtain a tetramethyldodecafluoro product (z86) of maleic anhydride.

SYNTHESIZING EXAMPLE 177

The same procedures as employed in Synthesizing Example 175, excepting that diethylaminosulfur triethylpentadecafluoride was substituted for the diethylaminosulfur trifluoride employed therein, were repeated to obtain a tetraethylicosafluoro product (z94) of maleic anhydride.

SYNTHESIZING EXAMPLE 178

0.04 mol of maleic anhydride, 0.1 mol of diethylaminosulfur trifluoride and 0.12 mol of diethylaminosulfur nonafluoride were dissolved in 140 g of tetrahydrofuran and mixed together to precipitate a salt, which was then filtered out, and the filtrate was neutralized. After the separation of the filtrate, the resultant liquid was concentrated to obtain a difluorodimethylhexafluoro product (z95) of maleic anhydride.

SYNTHESIZING EXAMPLE 179

The same procedures as employed in Synthesizing Example 175, excepting that diethylaminosulfur tributylheptacosafluoride was substituted for the diethylaminosulfur trifluoride employed therein, were repeated to obtain a tetrabutylhexatriacontafluoro product (z96) of maleic anhydride.

SYNTHESIZING EXAMPLE 180

The same procedures as employed in Synthesizing Example 175, excepting that diethylaminosulfur trichloride was substituted for the diethylaminosulfur trifluoride employed therein, were repeated to obtain a tetrachlorinated product (z102) of maleic anhydride.

SYNTHESIZING EXAMPLE 181

The same procedures as employed in Synthesizing Example 175, excepting that diethylaminosulfur trimethylnonachloride was substituted for the diethylaminosulfur trifluoride employed therein, were repeated to obtain a tetramethyldodecachlorinated product (z103) of maleic anhydride.

SYNTHESIZING EXAMPLE 182

The same procedures as employed in Synthesizing Example 175, excepting that diethylaminosulfur trimethlnonabromide was substituted for the diethylaminosulfur trifluoride employed therein, were repeated to obtain a tetramethyldodecabromo product (z108) of maleic anhydride.

SYNTHESIZING EXAMPLE 183

The same procedures as employed in Synthesizing Example 175, excepting that diethylaminosulfur tribromide was substituted for the diethylaminosulfur trifluoride employed therein, were repeated to obtain a tetrabromo product (z109) of maleic anhydride.

SYNTHESIZING EXAMPLE 184

0.04 mol of 3'-norbornen-6'-ylmethanoic acid (A"x83x87x95x111), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (A"fx83x87x95x111) of the compound (A"x83x87x95x111).

0.02 mol of the compound (A"fx83x87x95x111), 0.03 mol of ethoxymethyl bromide, and 0.2 mol of triethyl amine were dissolved in 100 g of dichloromethane and mixed together to obtain a solution, which was then neutralized and separated. After this separation, the resultant liquid was concentrated to obtain an ethoxymethyl-substituted product (x111) of the compound (A"fx83x87x95x111).

SYNTHESIZING EXAMPLE 185

0.04 mol of 4-oxoadamantylvinyl ether (Ax112), 0.05 mol of tetramethylsilyl trifluoromethane, and 0.05 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (Afx112) of the compound (Ax112).

0.02 mol of the compound (Afx112), 0.03 mol of dihydropyran, and 0.001 mol of tosylic acid were dissolved in 100 g of dichloromethane and mixed together to obtain a solution, which was then neutralized and separated. After this separation, the resultant liquid was concentrated to obtain a tetrahydropyranyl-substituted product (x112) of the compound (Afx112).

SYNTHESIZING EXAMPLE 186

0.04 mol of 4-oxochlorovinyladamantane (Ax113), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a pentafluoroethylated product (Afx113) of the compound (Ax113).

0.02 mol of the compound (Afx113), 0.03 mol of butylvinyl ether, and 0.002 mol of tosylic acid were dissolved in 100 g of dichloromethane and mixed together to obtain a solution, which was then neutralized and separated. After this separation, the resultant liquid was concentrated to obtain a butoxyethyl-substituted product (x113) of the compound (Afx113).

SYNTHESIZING EXAMPLE 187

0.04 mol of 4-oxocyanovinyladamantane (Ax114), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a nonafluorobutylated product (Afx114) of the compound (Ax114).

0.02 mol of the compound (Afx114), 0.03 mol of ethylvinyl ether, and 0.005 mol of tosylic acid were dissolved in 100 g of dichloromethane and mixed together to obtain a solution, which was then neutralized and separated. After this separation, the resultant liquid was concentrated to obtain an ethoxyethyl-substituted product (x114) of the compound (Afx114).

SYNTHESIZING EXAMPLE 188

0.04 mol of vinyloxyadamantyl trifluoromethyl ketone (A"x115), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (A"fx115) of the compound (A"x115).

0.02 mol of the compound (A"fx115), 0.03 mol of dihydropyran, and 0.004 mol of tosylic acid were dissolved in 100 g of dichloromethane and mixed together to obtain a solution, which was then neutralized and separated. After this separation, the resultant liquid was concentrated to obtain a tetrahydropyranyl-substituted product (x115) of the compound (A"fx115).

SYNTHESIZING EXAMPLE 189

0.04 mol of vinyloxy-methyl-5-oxahomonorbornonane (Ox116) and 0.1 mol of diethylaminosulfur trifluoride were dissolved in 140 g of tetrahydrofuran and mixed together to precipitate a salt, which was then filtered out, and the filtrate was neutralized. After the separation of the filtrate, the resultant liquid was concentrated to obtain a difluoro product (x116) of the compound (Ox116).

SYNTHESIZING EXAMPLE 190

0.04 mol of isopropenyloxy-3-methyl-4-oxahomoadamantanone (NY24x117) and 0.1 mol of diethylaminosulfur trimethylnonafluoride were dissolved in 140 g of tetrahydrofuran and mixed together to precipitate a salt, which was then filtered out, and the filtrate was neutralized. After the separation of the filtrate, the resultant liquid was concentrated to obtain a dimethylhexafluoro product (x117) of the compound (NY24x117).

SYNTHESIZING EXAMPLE 191

0.04 mol of bromoisopropenyloxyadamantyl trifluoromethyl ketone (A"'x118), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (A"'fx118) of the compound (A"'x118).

0.02 mol of the compound (A"'fx118), 0.03 mol of dihydropyran, and 0.001 mol of tosylic acid were dissolved in 100 g of dichloromethane and mixed together to obtain a solution, which was then neutralized and separated. After this separation, the resultant liquid was concentrated to obtain a tetrahydropyranyl-substituted product (x118) of the compound (A"'fx118).

SYNTHESIZING EXAMPLE 192

0.04 mol of adamantyl-1-vinyl-3-trifluoromethyl ketone (A"x83x87x103x107x119), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (A"fx83x87x103x107x119) of the compound (A"x83x87x103x107x119).

0.02 mol of the compound (A"fx83x87x103x107x119), 0.03 mol of ethoxymethyl bromide, and 0.2 mol of triethyl amine were dissolved in 100 g of dichloromethane and mixed together to obtain a solution, which was then neutralized and separated. After this separation, the resultant liquid was concentrated to obtain an ethoxyethyl-substituted product (Fx119) of the compound (A"fx83x87x103x107x119).

2 mmol of the compound (Fx119) thus obtained was dissolved in 60 mL of dichloromethane and ice-cooled. To the resultant solution was added 2 mmol of methachlorobenzoic acid to obtain a mixed solution, which was then stirred for 12 hours at room temperature. To the resultant reaction solution were added saturated $Na_2S_2O_3$ and saturated $NaHCO_3$ to obtain a reaction mixture, which was then subjected to extraction by using dichloromethane. Thereafter, an organic phase thus obtained was washed with a saturated brine and, after being dried, subjected to vacuum concentration. The resultant crude product was refined by columnchromatography to obtain epoxide (x119).

SYNTHESIZING EXAMPLE 193

0.04 mol of norbornyl-2-vinyl-5-trifluoromethyl ketone (A"x83x87x103x107x119x120), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (A"fx83x87x103x107x119x120) of the compound (A"x83x87x103x107x119x120).

0.02 mol of the compound (A"fx83x87x103x107x119x120), 0.03 mol of isobutene, and 0.2 mol of triethyl amine were dissolved in 100 g of dichloromethane and mixed together to obtain a solution, which was then neutralized and separated. After this separation, the resultant liquid was concentrated to obtain a butyl-substituted product (Fx120) of the compound (A"fx83x87x103x107x119x120).

2 mmol of the compound (Fx120) thus obtained was dissolved in 60 mL of dichloromethane and ice-cooled. To the resultant solution was added 2 mmol of methachlorobenzoic acid to obtain a mixed solution, which was then stirred for 12 hours at room temperature. To the resultant reaction solution were added saturated $Na_2S_2O_3$ and saturated $NaHCO_3$ to obtain a reaction mixture, which was then subjected to extraction by using dichloromethane. Thereafter, an organic phase thus obtained was washed with a saturated brine and, after being dried, subjected to vacuum concentration. The resultant crude product was refined by columnchromatography to obtain epoxide (x120).

SYNTHESIZING EXAMPLE 194

0.04 mol of adamantyl-1-chloroisopropenyl-3-trifluoromethyl ketone (A"x83x87x103x107x119x121), 0.06 mol of tetramethylsilyl trifluoromethane, and 0.06 mol of tetrabutylammonium fluoride were dissolved in 140 g of tetrahydrofuran and mixed together to precipitate a salt, which was then filtered out, and the filtrate was neutralized. After the separation of the filtrate, the resultant liquid was concentrated to obtain a trifluoromethylated product (A"fx83x87x103x107x119x121) of the compound (A"x83x87x103x107x119x121).

0.02 mol of the compound (A"fx83x87x103x107x119x121), 0.03 mol of methylvinyl ether, and 0.004 mol of tosylic acid were dissolved in 100 g of dichloromethane and mixed together to obtain a solution, which was then neutralized and separated. After this separation, the resultant liquid was concentrated to obtain a methoxyethyl-substituted product (Fx121) of the compound (A"fx83x87x103x107x119x121).

2 mmol of the compound (Fx121) thus obtained was dissolved in 60 mL of dichloromethane and ice-cooled. To the resultant solution was added 2 mmol of methachlorobenzoic acid to obtain a mixed solution, which was then stirred for 12 hours at room temperature. To the resultant reaction solution were added saturated $Na_2S_2O_3$ and saturated $NaHCO_3$ to obtain a reaction mixture, which was then subjected to extraction by using dichloromethane. Thereafter, an organic phase thus obtained was washed with a saturated brine and, after being dried, subjected to vacuum concentration. The resultant crude product was refined by columnchromatography to obtain epoxide (x121).

EXAMPLES I

The Synthesis of Polymer Compounds for a Photoresist, Which are Formed of a Copolymer Example I-1

0.06 mol of the compound (B) and 0.04 mol of acrylonitrile were mixed with 20 g of toluene to obtain a solution, to which 0.2 g of methylarmoxane and a toluene solution of ethylene bisindium zirconium dichloride were added, and reacted for 45 minutes. Thereafter, ethanol was added to the reaction mixture to terminate the polymerization reaction thereof. The reaction mixture was then stirred in an acidic aqueous solution of hydrochloric acid, and, after residual catalyst in the solution was removed therefrom, solid matter was taken out and heated to dry, thus obtaining a copolymer 1 having a repeating unit represented by the following chemical formula. The average molecular weight of this copolymer 1 was about 4000.

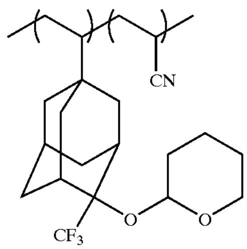

Example I-2

A copolymer 2 having a repeating unit represented by the following chemical formula was obtained by repeating the same procedures as described in Example I-1 except that the compound (C) was substituted for the compound (B) employed therein. The average molecular weight of this copolymer 2 was about 7000.

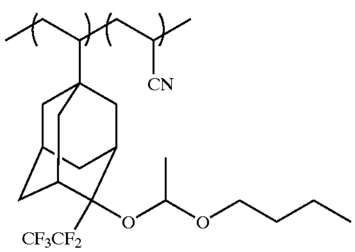

Example I-3

A copolymer 3 having a repeating unit represented by the following chemical formula was obtained by repeating the same procedures as described in Example I-1 except that the compound (D) was substituted for the compound (B) employed therein. The average molecular weight of this copolymer 3 was about 7000.

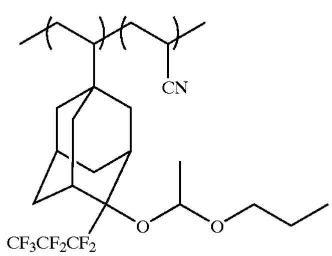

Example I-4

A copolymer 4 having a repeating unit represented by the following chemical formula was obtained by repeating the same procedures as described in Example I-1 except that the compound (E) was substituted for the compound (B) employed therein. The average molecular weight of this copolymer 4 was about 7000.

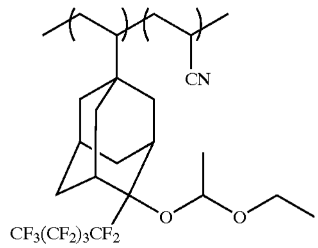

Example I-5

A copolymer 5 having a repeating unit represented by the following chemical formula was obtained by repeating the same procedures as described in Example I-1 except that the compound (F) was substituted for the compound (B) employed therein. The average molecular weight of this copolymer 5 was about 7000.

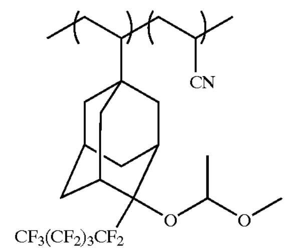

Example I-6

0.06 mol of the compound (B') and 0.04 mol of acrylonitrile were mixed with 20 g of toluene to obtain a solution, to which 0.3 g of methylarmoxane and a toluene solution of ethylene bisindium zirconium dichloride were added, and reacted for 60 minutes. Thereafter, ethanol was added to the reaction mixture to terminate the polymerization reaction thereof. The reaction mixture was then stirred in an acidic aqueous solution of hydrochloric acid, and, after residual catalyst in the solution was removed therefrom, solid matter was taken out and heated to dry, thus obtaining a copolymer 6 having a repeating unit represented by the following chemical formula. The average molecular weight of this copolymer 6 was about 6000.

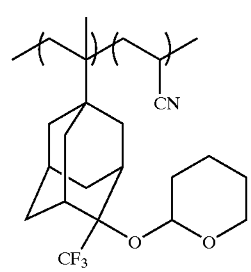

Example I-7

A copolymer 7 having a repeating unit represented by the following chemical formula was obtained by repeating the same procedures as described in Example I-6 except that the compound (C') was substituted for the compound (B')

employed therein. The average molecular weight of this copolymer 7 was about 6000.

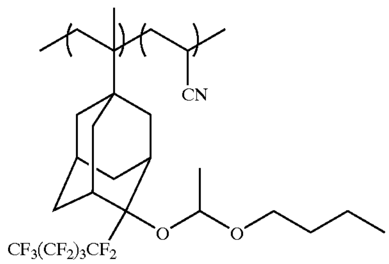

Example I-8

A copolymer 8 having a repeating unit represented by the following chemical formula was obtained by repeating the same procedures as described in Example I-6 except that the compound (D') was substituted for the compound (B') employed therein. The average molecular weight of this copolymer 8 was about 6000.

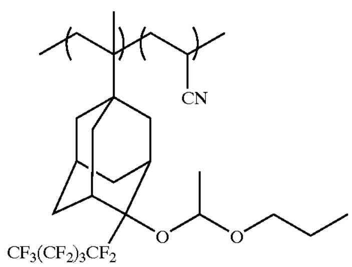

Example I-9

A copolymer 9 having a repeating unit represented by the following chemical formula was obtained by repeating the same procedures as described in Example I-6 except that the compound (E') was substituted for the compound (B') employed therein. The average molecular weight of this copolymer 9 was about 6000.

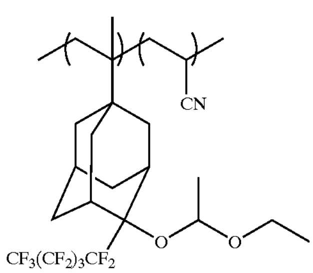

Example I-10

A copolymer 10 having a repeating unit represented by the following chemical formula was obtained by repeating the same procedures as described in Example I-6 except that the compound (F') was substituted for the compound (B') employed therein. The average molecular weight of this copolymer 10 was about 6000.

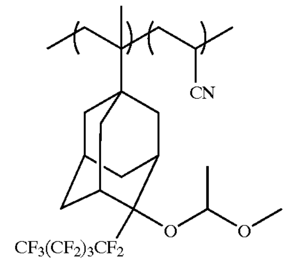

Example I-11

0.06 mol of the compound (B") and 0.04 mol of acrylonitrile were mixed with 20 g of toluene to obtain a solution, to which 0.3 g of methylarmoxane and a toluene solution of ethylene bisindium zirconium dichloride were added, and reacted for 45 minutes. Thereafter, ethanol was added to the reaction mixture to terminate the polymerization reaction thereof. The reaction mixture was then stirred in an acidic aqueous solution of hydrochloric acid, and, after residual catalyst in the solution was removed therefrom, solid matter was taken out and heated to dry, thus obtaining a copolymer 11 having a repeating unit represented by the following chemical formula. The average molecular weight of this copolymer 11 was about 7000.

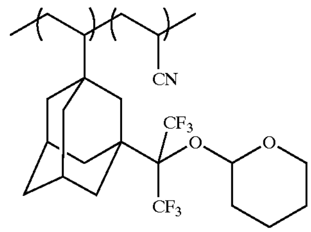

Example I-12

A copolymer 12 having a repeating unit represented by the following chemical formula was obtained by repeating the same procedures as described in Example I-11 except that the compound (C") was substituted for the compound (B") employed therein. The average molecular weight of this copolymer 12 was about 7000.

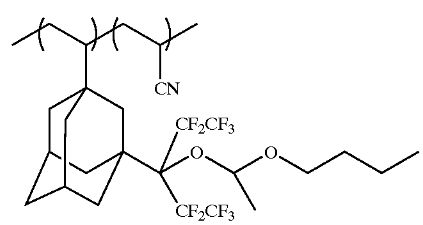

Example I-13

A copolymer 13 having a repeating unit represented by the following chemical formula was obtained by repeating the same procedures as described in Example I-11 except that the compound (D") was substituted for the compound (B") employed therein. The average molecular weight of this copolymer 13 was about 7000.

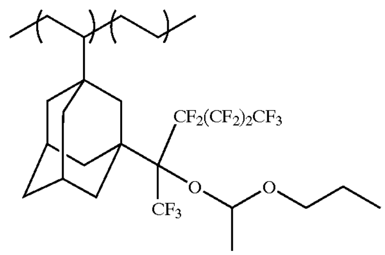

Example I-14

A copolymer 14 having a repeating unit represented by the following chemical formula was obtained by repeating the same procedures as described in Example I-11 except that the compound (E") was substituted for the compound (B") employed therein. The average molecular weight of this copolymer 14 was about 7000.

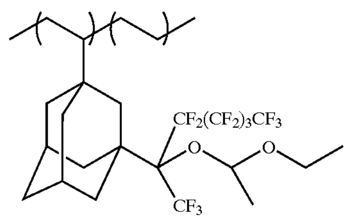

Example I-15

A copolymer 15 having a repeating unit represented by the following chemical formula was obtained by repeating the same procedures as described in Example I-11 except that the compound (F") was substituted for the compound (B") employed therein. The average molecular weight of this copolymer 15 was about 7000.

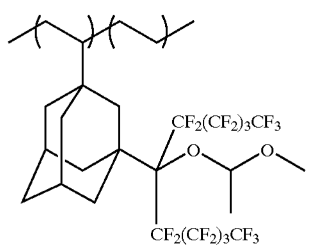

Example I-16

0.06 mol of the compound (B"') and 0.04 mol of acrylonitrile were mixed with 60 g of toluene to obtain a solution, to which 0.5 mmol of titanium trichloride and 4 mmol of diethyl aluminum chloride were added, and reacted for two hours. Thereafter, isopropyl alcohol was added to the reaction mixture to terminate the polymerization reaction thereof. The sediment produced therein was recovered through the filteration thereof in a nitrogen gas atmosphere, washed several times with isopropyl alcohol, and dried in vacuo, thus obtaining a copolymer 16 having a repeating unit represented by the following chemical formula. The average molecular weight of this copolymer 16 was about 6000.

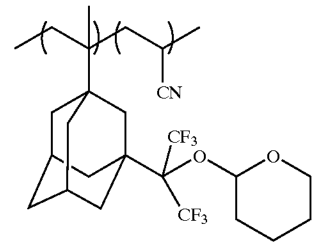

Example I-17

A copolymer 17 having a repeating unit represented by the following chemical formula was obtained by repeating the same procedures as described in Example I-16 except that the compound (C"') was substituted for the compound (B"') employed therein. The average molecular weight of this copolymer 17 was about 6000.

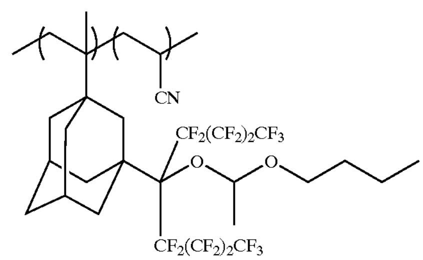

Example I-18

A copolymer 18 having a repeating unit represented by the following chemical formula was obtained by repeating the same procedures as described in Example I-16 except that the compound (D"') was substituted for the compound (B"') employed therein. The average molecular weight of this copolymer 18 was about 6000.

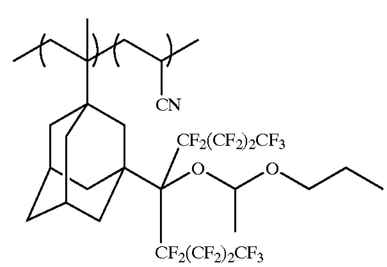

Example I-19

A copolymer 19 having a repeating unit represented by the following chemical formula was obtained by repeating the same procedures as described in Example I-16 except that the compound (E"') was substituted for the compound (B"') employed therein. The average molecular weight of this copolymer 19 was about 6000.

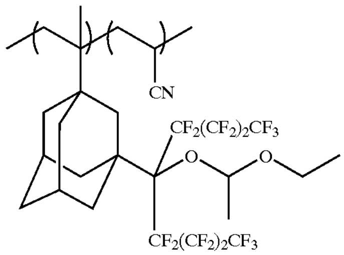

Example I-20

A copolymer 20 having a repeating unit represented by the following chemical formula was obtained by repeating the same procedures as described in Example I-16 except that the compound (F''') was substituted for the compound (B''') employed therein. The average molecular weight of this copolymer 20 was about 6000.

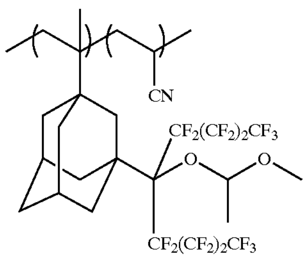

Example I-21

0.06 mol of the compound (Mf) and 0.04 mol of the compound (B'') were mixed with 60 g of toluene to obtain a solution, to which 0.5 mmol of titanium trichloride and 4 mmol of diethyl aluminum chloride were added, and reacted for two hours. Thereafter, isopropyl alcohol was added to the reaction mixture to terminate the polymerization reaction thereof. The sediment produced therein was recovered through the filteration thereof in a nitrogen gas atmosphere, washed several times with isopropyl alcohol, and dried in vacuo, thus obtaining a copolymer 21 having a repeating unit represented by the following chemical formula. The average molecular weight of this copolymer 21 was about 7000.

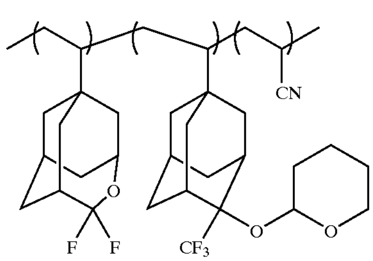

Example I-22

0.06 mol of the compound (Nf), 0.04 mol of vinylmethyldecafluorodiethyl oxahomonorbornane and 0.03 mol of acrylonitrile were mixed with 60 g of toluene to obtain a solution, to which 0.3 g of methylarmoxane and a toluene solution of ethyl bisindium zirconium dichloride were added, and reacted for one hour at a temperature of 30° C. Thereafter, ethyl alcohol was added to the reaction mixture to terminate the polymerization reaction thereof. The sediment produced therein was recovered through the filteration thereof in a nitrogen gas atmosphere, washed several times with ethyl alcohol, and dried in vacuo, thus obtaining a copolymer 22 having a repeating unit represented by the following chemical formula. The average molecular weight of this copolymer 22 was about 7000.

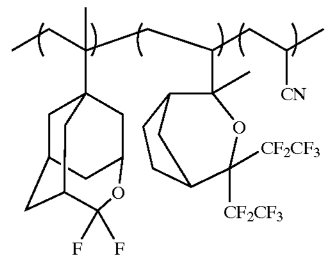

Example I-23

0.06 mol of the compound (Of) and 0.04 mol of acrylonitrile were mixed with 60 g of toluene to obtain a solution, to which 0.2 g of methylarmoxane and a toluene solution of ethyl bisindium zirconium dichloride were added, and reacted for one hour at a temperature of 30° C. Thereafter, ethyl alcohol was added to the reaction mixture to terminate the polymerization reaction thereof. The sediment produced therein was recovered through the filteration thereof in a nitrogen gas atmosphere, washed several times with ethyl alcohol, and dried in vacuo, thus obtaining a copolymer 23 having a repeating unit represented by the following chemical formula. The average molecular weight of this copolymer 23 was about 7000.

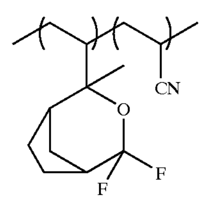

Example I-24

0.04 mol of the compound (Pf), 0.04 mol of isopropenylhexafluoromethyl oxahomoadamantane and 0.03 mol of acrylonitrile were mixed with 60 g of toluene to obtain a solution, to which 0.3 g of methylarmoxane and a toluene solution of ethyl bisindium zirconium dichloride were added, and reacted for 45 minutes at a temperature of 30° C. Thereafter, ethyl alcohol was added to the reaction mixture to terminate the polymerization reaction thereof. The sediment produced therein was recovered through the filteration thereof in a nitrogen gas atmosphere, washed several times with ethyl alcohol, and dried in vacuo, thus obtaining a copolymer 24 having a repeating unit represented by the following chemical formula. The average molecular weight of this copolymer 24 was about 7000.

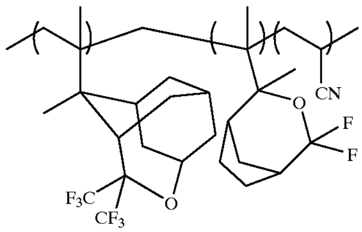

Example I-25

0.04 mol of the compound (Pf), 0.04 mol of vinylmethyldecafluorodiethyl oxahomonorbornene and 0.03 mol of acrylonitrile were mixed with 60 g of toluene to obtain a solution, to which 0.4 g of methylarmoxane and a toluene solution of ethyl bisindium zirconium dichloride were added, and reacted for one hour at a temperature of 30° C. Thereafter, ethyl alcohol was added to the reaction mixture to terminate the polymerization reaction thereof. The sediment produced therein was recovered through the filteration thereof in a nitrogen gas atmosphere, washed several times with ethyl alcohol, and dried in vacuo, thus obtaining a copolymer 25 having a repeating unit represented by the following chemical formula. The average molecular weight of this copolymer 25 was about 7000.

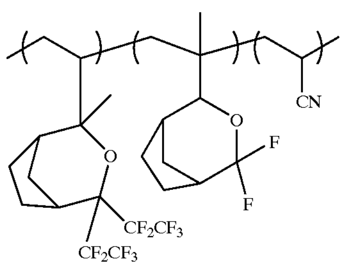

Example I-26

0.06 mol of the compound (BB) and 0.04 mol of acrylonitrile were mixed with 60 g of toluene to obtain a solution, to which 0.3 g of methylarmoxane and a toluene solution of ethyl bisindium zirconium dichloride were added, and reacted for 30 minutes at a temperature of 30° C. Thereafter, ethyl alcohol was added to the reaction mixture to terminate the polymerization reaction thereof. The sediment produced therein was recovered through the filteration thereof in a nitrogen gas atmosphere, washed several times with ethyl alcohol, and dried in vacuo, thus obtaining a copolymer 26 having a repeating unit represented by the following chemical formula. The average molecular weight of this copolymer 26 was about 7000.

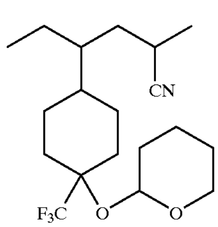

Example I-27

A copolymer 27 having a repeating unit represented by the following chemical formula was obtained by repeating the same procedures as described in Example I-26 except that the compound (CC) was substituted for the compound (BB) employed therein. The average molecular weight of this copolymer 27 was about 7000.

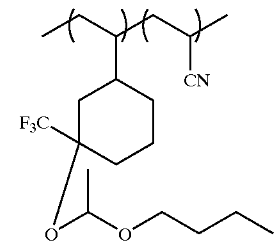

Example I-28

A copolymer 28 having a repeating unit represented by the following chemical formula was obtained by repeating the same procedures as described in Example I-26 except that the compound (DD) was substituted for the compound (BB) employed therein. The average molecular weight of this copolymer 28 was about 7000.

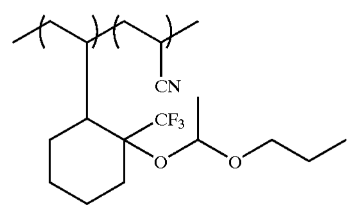

Example I-29

A copolymer 29 having a repeating unit represented by the following chemical formula was obtained by repeating the same procedures as described in Example I-26 except that the compound (EE) was substituted for the compound (BB) employed therein. The average molecular weight of this copolymer 29 was about 7000.

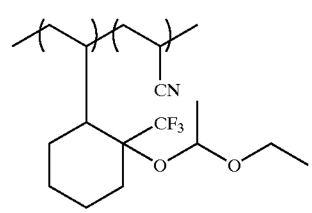

Example I-30

A copolymer 30 having a repeating unit represented by the following chemical formula was obtained by repeating the same procedures as described in Example I-26 except that the compound (FF) was substituted for the compound (BB) employed therein. The average molecular weight of this copolymer 30 was about 7000.

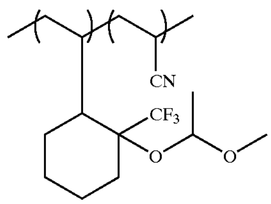

Example I-31

A copolymer 31 having a repeating unit represented by the following chemical formula was obtained by repeating the same procedures as described in Example I-26 except that the compound (BB') was substituted for the compound (BB) employed therein. The average molecular weight of this copolymer 31 was about 6000.

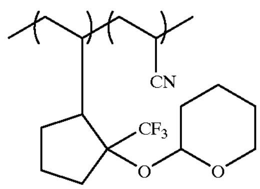

Example I-32

A copolymer 32 having a repeating unit represented by the following chemical formula was obtained by repeating the same procedures as described in Example I-26 except that the compound (CC') was substituted for the compound (BB) employed therein. The average molecular weight of this copolymer 32 was about 6000.

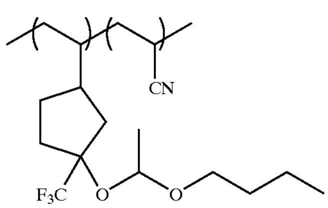

Example I-33

A copolymer 33 having a repeating unit represented by the following chemical formula was obtained by repeating the same procedures as described in Example I-26 except that the compound (DD') was substituted for the compound (BB) employed therein. The average molecular weight of this copolymer 33 was about 6000.

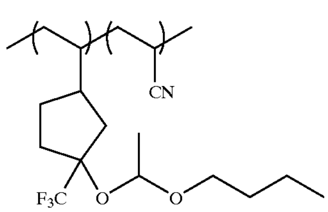

Example I-34

A copolymer 34 having a repeating unit represented by the following chemical formula was obtained by repeating the same procedures as described in Example I-26 except that the compound (EE') was substituted for the compound (BB) employed therein. The average molecular weight of this copolymer 34 was about 6000.

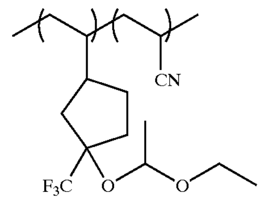

Example I-35

A copolymer 35 having a repeating unit represented by the following chemical formula was obtained by repeating the same procedures as described in Example I-26 except that the compound (FF') was substituted for the compound (BB) employed therein. The average molecular weight of this copolymer 35 was about 6000.

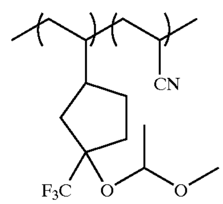

Example I-36

0.06 mol of the compound (BB") and 0.04 mol of acrylonitrile were mixed with 60 g of toluene to obtain a solution, to which 0.3 g of methylarmoxane and a toluene solution of ethyl bisindium zirconium dichloride were added, and reacted for one hour at a temperature of 30° C. Thereafter, ethyl alcohol was added to the reaction mixture to terminate the polymerization reaction thereof. The sediment produced therein was recovered through the filteration thereof in a nitrogen gas atmosphere, washed several times with ethyl alcohol, and dried in vacuo, thus obtaining a copolymer 36 having a repeating unit represented by the following chemical formula. The average molecular weight of this copolymer 36 was about 7000.

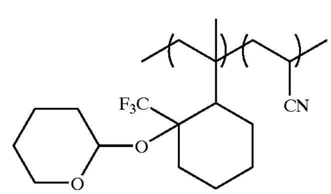

Example I-37

A copolymer 37 having a repeating unit represented by the following chemical formula was obtained by repeating the same procedures as described in Example I-36 except that the compound (CC") was substituted for the compound (BB") employed therein. The average molecular weight of this copolymer 37 was about 7000.

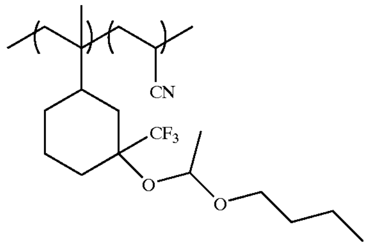

Example I-38

A copolymer 38 having a repeating unit represented by the following chemical formula was obtained by repeating the same procedures as described in Example I-36 except that the compound (DD") was substituted for the compound (BB") employed therein. The average molecular weight of this copolymer 38 was about 7000.

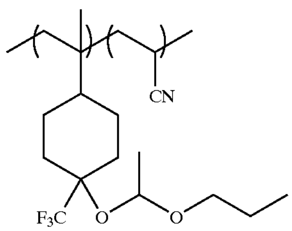

Example I-39

A copolymer 39 having a repeating unit represented by the following chemical formula was obtained by repeating the same procedures as described in Example I-36 except that the compound (EE") was substituted for the compound (BB") employed therein. The average molecular weight of this copolymer 39 was about 7000.

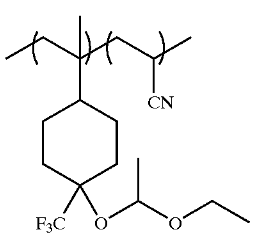

Example I-40

A copolymer 40 having a repeating unit represented by the following chemical formula was obtained by repeating the same procedures as described in Example I-36 except that the compound (FF") was substituted for the compound (BB") employed therein. The average molecular weight of this copolymer 40 was about 7000.

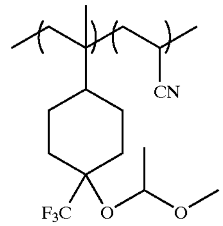

Example I-41

A copolymer 41 having a repeating unit represented by the following chemical formula was obtained by repeating the same procedures as described in Example I-26 except that the compound (BB"') was substituted for the compound (BB) employed therein. The average molecular weight of this copolymer 41 was about 6000.

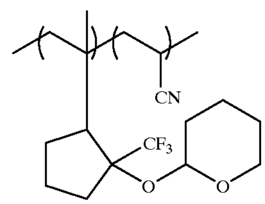

Example I-42

A copolymer 42 having a repeating unit represented by the following chemical formula was obtained by repeating the same procedures as described in Example I-26 except that the compound (CC"') was substituted for the compound (BB) employed therein. The average molecular weight of this copolymer 42 was about 6000.

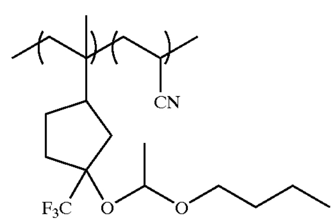

Example I-43

A copolymer 43 having a repeating unit represented by the following chemical formula was obtained by repeating the same procedures as described in Example I-26 except that the compound (DD"') was substituted for the compound (BB) employed therein. The average molecular weight of this copolymer 43 was about 6000.

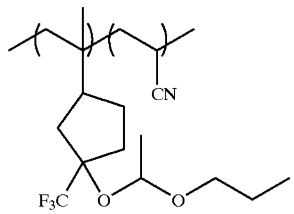

Example I-44

A copolymer 44 having a repeating unit represented by the following chemical formula was obtained by repeating the same procedures as described in Example I-26 except that the compound (EE''') was substituted for the compound (BB) employed therein. The average molecular weight of this copolymer 44 was about 6000.

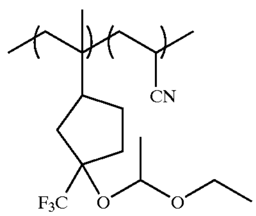

Example I-45

A copolymer 45 having a repeating unit represented by the following chemical formula was obtained by repeating the same procedures as described in Example I-26 except that the compound (FF''') was substituted for the compound (BB) employed therein. The average molecular weight of this copolymer 45 was about 6000.

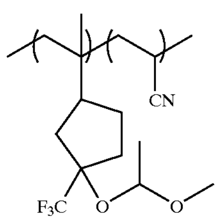

Example I-46

0.06 mol of the compound (MMf) and 0.04 mol of acrylonitrile were mixed with 60 g of toluene to obtain a solution, to which 0.3 g of methylarmoxane and a toluene solution of ethyl bisindium zirconium dichloride were added, and reacted for one hour at a temperature of 30° C. Thereafter, ethyl alcohol was added to the reaction mixture to terminate the polymerization reaction thereof. The sediment produced therein was recovered through the filteration thereof in a nitrogen gas atmosphere, washed several times with ethyl alcohol, and dried in vacuo, thus obtaining a copolymer 46 having a repeating unit represented by the following chemical formula. The average molecular weight of this copolymer 46 was about 7000.

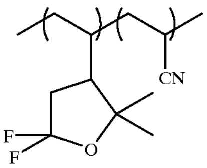

Example I-47

0.03 mol of the compound (NNf), 0.03 mol of a compound represented by the following chemical formula (y47) and 0.04 mol of acrylonitrile were mixed with 60 g of toluene to obtain a solution.

(y47)

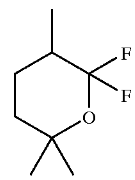

To this solution, 0.3 g of methylarmoxane and a toluene solution of ethyl bisindium zirconium dichloride were added, and reacted for one hour at a temperature of 30° C. Thereafter, ethyl alcohol was added to the reaction mixture to terminate the polymerization reaction thereof. The sediment produced therein was recovered through the filteration thereof in a nitrogen gas atmosphere, washed several times with ethyl alcohol, and dried in vacuo, thus obtaining a copolymer 47 having a repeating unit represented by the following chemical formula. The average molecular weight of this copolymer 47 was about 7000.

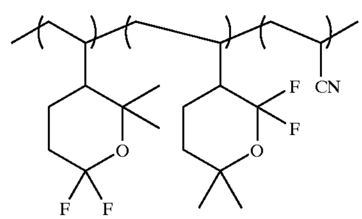

Example I-48

0.06 mol of the compound (OOf) and 0.04 mol of acrylonitrile were mixed with 60 g of toluene to obtain a solution, to which 0.3 g of methylarmoxane and a toluene solution of ethyl bisindium zirconium dichloride were added, and reacted for one hour at a temperature of 30° C. Thereafter, ethyl alcohol was added to the reaction mixture to terminate the polymerization reaction thereof. The sediment produced therein was recovered through the filteration thereof in a nitrogen gas atmosphere, washed several times with ethyl alcohol, and dried in vacuo, thus obtaining a copolymer 48 having a repeating unit represented by the following chemical formula. The average molecular weight of this copolymer 48 was about 7000.

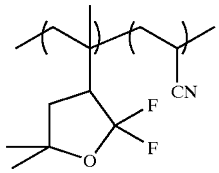

Example I-49

0.06 mol of the compound (PPf) and 0.04 mol of acrylonitrile were mixed with 60 g of toluene to obtain a solution, to which 0.2 g of methylarmoxane and a toluene solution of ethyl bisindium zirconium dichloride were added, and reacted for one hour at a temperature of 30° C. Thereafter, ethyl alcohol was added to the reaction mixture to terminate the polymerization reaction thereof. The sediment produced therein was recovered through the filteration thereof in a nitrogen gas atmosphere, washed several times with ethyl alcohol, and dried in vacuo, thus obtaining a copolymer 49 having a repeating unit represented by the following chemical formula. The average molecular weight of this copolymer 49 was about 7000.

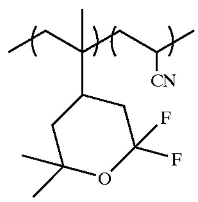

Example I-50

0.06 mol of a compound (x50) represented by the following chemical formula and 0.05 mol of acrylonitrile were mixed with 60 g of toluene to obtain a solution, to which 0.3 g of methylarmoxane and a toluene solution of ethyl bisindium zirconium dichloride were added, and reacted for one hour at a temperature of 30° C. Thereafter, ethyl alcohol was added to the reaction mixture to terminate the polymerization reaction thereof. The sediment produced therein was recovered through the filteration thereof in a nitrogen gas atmosphere, washed several times with ethyl alcohol, and dried in vacuo, thus obtaining a copolymer 50 having a repeating unit represented by the following chemical formula. The average molecular weight of this copolymer 50 was about 7000.

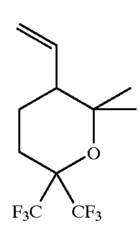

(x50)

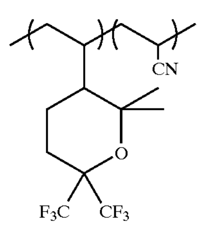

Example I-51

0.05 mol of the compound (BB) and 0.05 mol of a compound represented by the following chemical formula (y51) were mixed with 50 g of toluene to obtain a solution.

(y51)

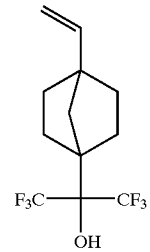

To this solution, 0.3 g of methylarmoxane and a toluene solution of ethyl bisindium zirconium dichloride were added, and reacted for one hour at a temperature of 30° C. Thereafter, ethyl alcohol was added to the reaction mixture to terminate the polymerization reaction thereof. The sediment produced therein was recovered through the filteration thereof in a nitrogen gas atmosphere, washed several times with ethyl alcohol, and dried in vacuo, thus obtaining an oligomer 51 having a repeating unit represented by the following chemical formula. The average molecular weight of this copolymer 51 was about 4000.

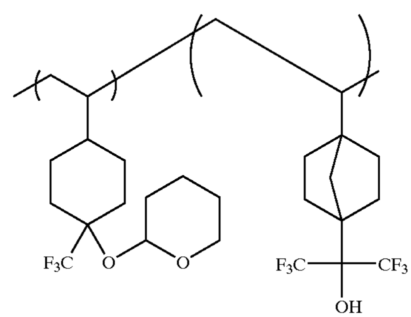

Example I-52

An oligomer 52 having a repeating unit represented by the following chemical formula was obtained by repeating the same procedures as described in Example I-51 except that a compound (x52) represented by the following chemical formula was substituted for the compound (BB) and that a compound (y52) represented by the following chemical formula was substituted for the compound (y51) employed therein. The average molecular weight of this oligomer 52 was about 3500.

(x52)

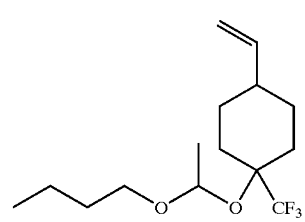

-continued (y52)

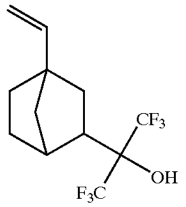

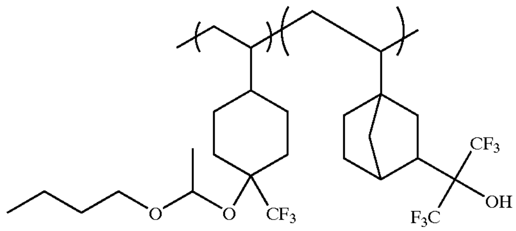

Example I-53

An oligomer 53 having a repeating unit represented by the following chemical formula was obtained by repeating the same procedures as described in Example I-51 except that a compound (x53) represented by the following chemical formula was substituted for the compound (BB) and that a compound (y53) represented by the following chemical formula was substituted for the compound (y51) employed therein. The average molecular weight of this oligomer 53 was found about 3500.

(x53)

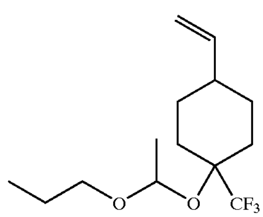

(y53)

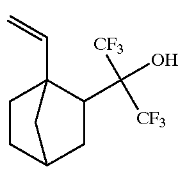

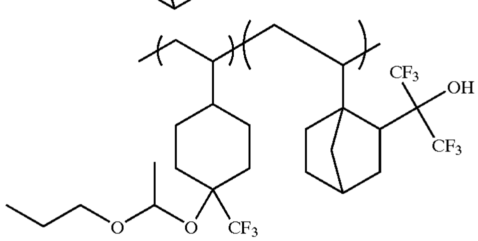

Example I-54

An oligomer 54 having a repeating unit represented by the following chemical formula was obtained by repeating the same procedures as described in Example I-51 except that a compound (x54) represented by the following chemical formula was substituted for the compound (BB) and that a compound (y54) represented by the following chemical formula was substituted for the compound (y51) employed therein. The average molecular weight of this oligomer 54 was found about 3500.

(x54)

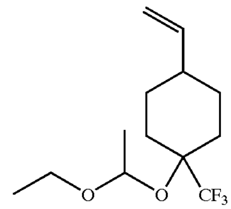

(y54)

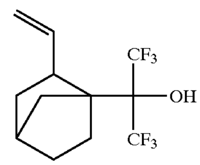

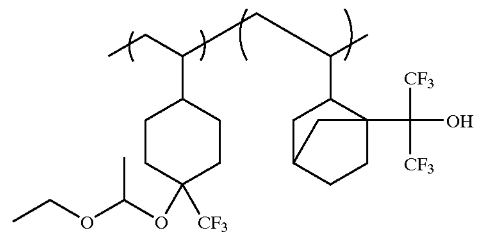

Example I-55

An oligomer 55 having a repeating unit represented by the following chemical formula was obtained by repeating the same procedures as described in Example I-51 except that a compound (x55) represented by the following chemical formula was substituted for the compound (BB) and that a compound (y55) represented by the following chemical formula was substituted for the compound (y51) employed therein. The average molecular weight of this oligomer 55 was about 3500.

(x55)

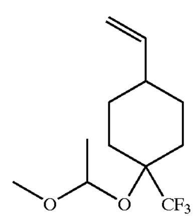

(y55)

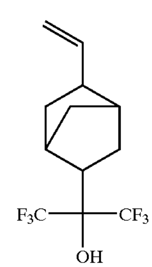

-continued

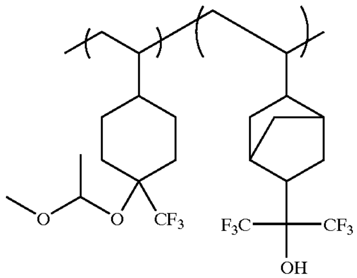

Example I-56

An oligomer 56 having a repeating unit represented by the following chemical formula was obtained by repeating the same procedures as described in Example I-51 except that the compound (BB') was substituted for the compound (BB) and that a compound (y56) represented by the following chemical formula was substituted for the compound (y51) employed therein. The average molecular weight of this oligomer 56 was about 4000.

(y56)

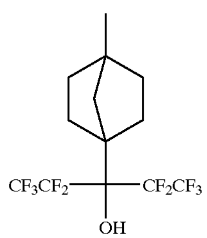

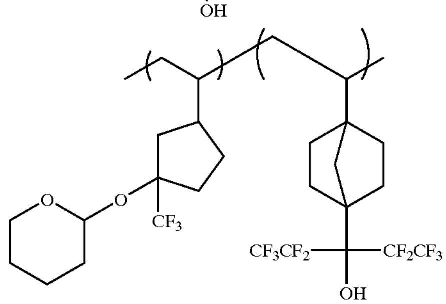

Example I-57

An oligomer 57 having a repeating unit represented by the following chemical formula was obtained by repeating the same procedures as described in Example I-51 except that the compound (CC') was substituted for the compound (BB) and that a compound (y57) represented by the following chemical formula was substituted for the compound (y51) employed therein. The average molecular weight of this oligomer 57 was about 3500.

(y57)

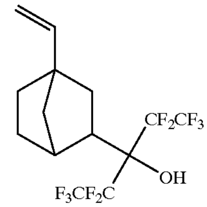

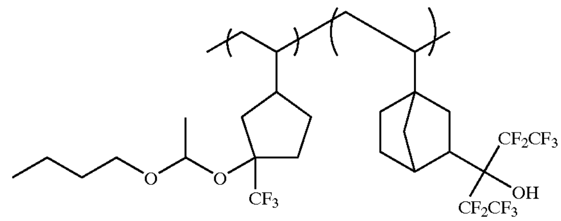

Example I-58

An oligomer 58 having a repeating unit represented by the following chemical formula was obtained by repeating the same procedures as described in Example I-51 except that the compound (DD') was substituted for the compound (BB) and that a compound (y58) represented by the following chemical formula was substituted for the compound (y51) employed therein. The average molecular weight of this oligomer 58 was about 3500.

(y58)

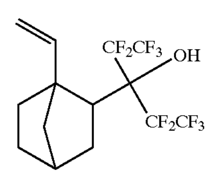

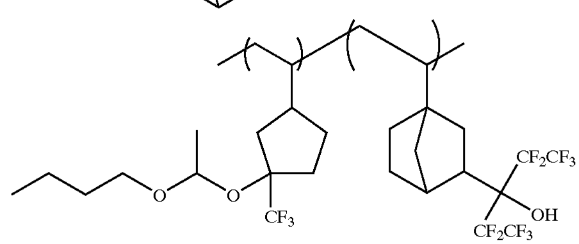

Example I-59

An oligomer 59 having a repeating unit represented by the following chemical formula was obtained by repeating the same procedures as described in Example I-51 except that the compound (EE') was substituted for the compound (BB) and that a compound (y59) represented by the following chemical formula was substituted for the compound (y51) employed therein. The average molecular weight of this oligomer 59 was about 3500.

(y59)

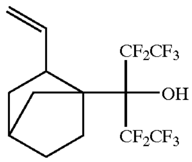

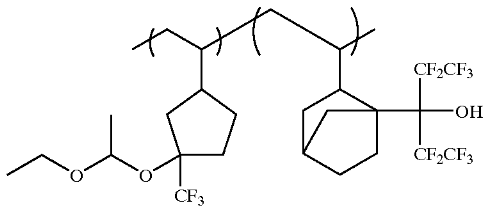

Example I-60

An oligomer 60 having a repeating unit represented by the following chemical formula was obtained by repeating the same procedures as described in Example I-51 except that the compound (FF') was substituted for the compound (BB) and that a compound (y60) represented by the following chemical formula was substituted for the compound (y51) employed therein. The average molecular weight of this oligomer 60 was about 3500.

(y60)

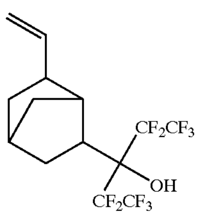

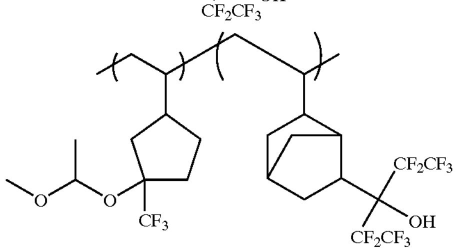

Example I-61

An oligomer 61 having a repeating unit represented by the following chemical formula was obtained by repeating the same procedures as described in Example I-51 except that a compound (x61) represented by the following chemical formula was substituted for the compound (BB) and that a compound (y61) represented by the following chemical formula was substituted for the compound (y51) employed therein. The average molecular weight of this oligomer 61 was about 4000.

(x61)

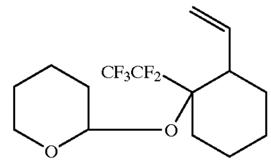

(y61)

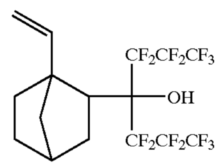

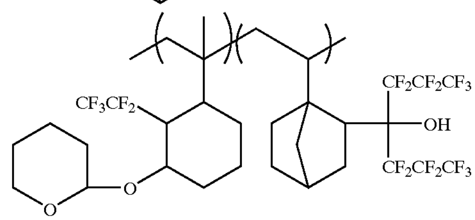

Example I-62

An oligomer 62 having a repeating unit represented by the following chemical formula was obtained by repeating the same procedures as described in Example I-51 except that a compound (x62) represented by the following chemical formula was substituted for the compound (BB) and that a compound (y62) represented by the following chemical formula was substituted for the compound (y51) employed therein. The average molecular weight of this oligomer 62 was about 3500.

(x62)

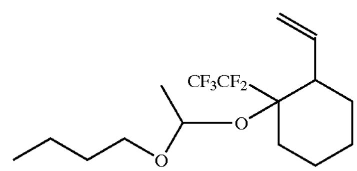

(y62)

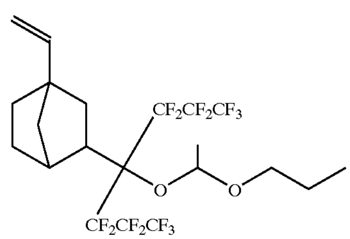

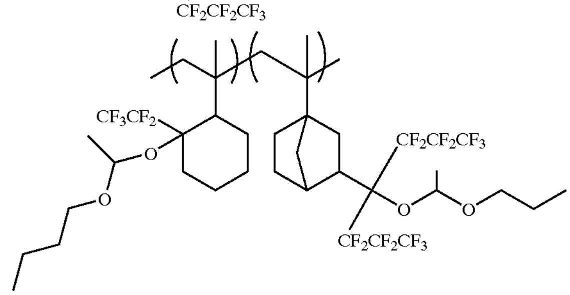

Example I-63

An oligomer 63 having a repeating unit represented by the following chemical formula was obtained by repeating the same procedures as described in Example I-51 except that a compound (x63) represented by the following chemical formula was substituted for the compound (BB) and that a compound (y63) represented by the following chemical formula was substituted for the compound (y51) employed therein. The average molecular weight of this oligomer 63 was about 3500.

(x63)

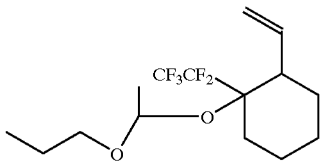

(y63)

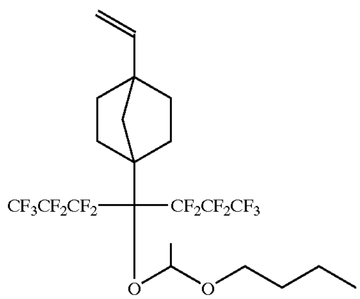

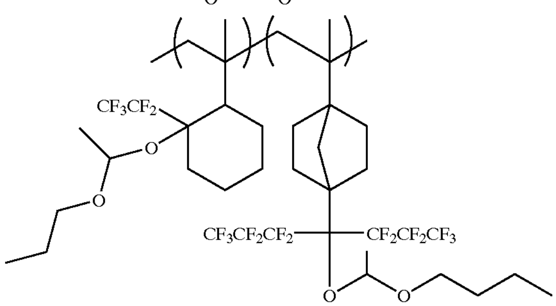

Example I-64

An oligomer 64 having a repeating unit represented by the following chemical formula was obtained by repeating the same procedures as described in Example I-51 except that a compound (x64) represented by the following chemical formula was substituted for the compound (BB) and that a compound (y64) represented by the following chemical formula was substituted for the compound (y51) employed therein. The average molecular weight of this oligomer 64 was about 3500.

(x64)

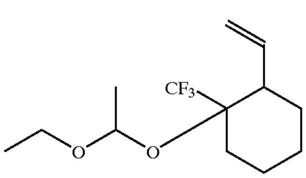

(y64)

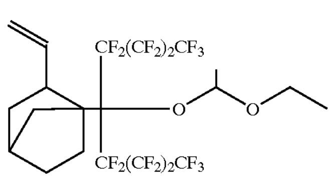

-continued

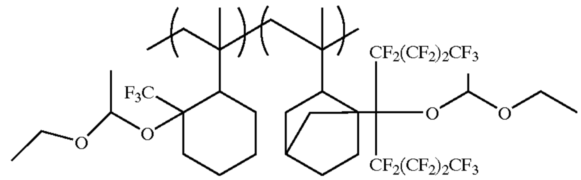

Example I-65

An oligomer 65 having a repeating unit represented by the following chemical formula was obtained by repeating the same procedures as described in Example I-51 except that a compound (x65) represented by the following chemical formula was substituted for the compound (BB) and that a compound (y65) represented by the following chemical formula was substituted for the compound (y51) employed therein. The average molecular weight of this oligomer 65 was about 3500.

(x65)

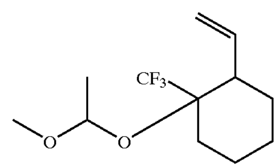

(y65)

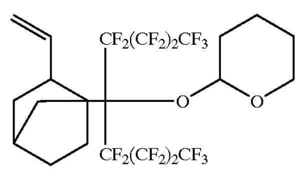

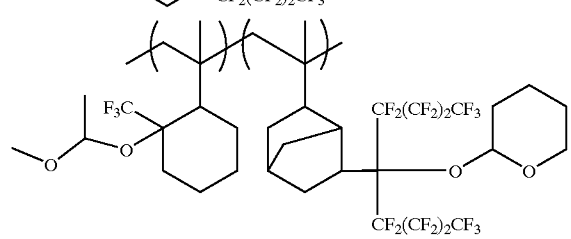

Example I-66

An oligomer 66 having a repeating unit represented by the following chemical formula was obtained by repeating the same procedures as described in Example I-51 except that a compound (x66) represented by the following chemical formula was substituted for the compound (BB) and that a compound (y66) represented by the following chemical formula was substituted for the compound (y51) employed therein. The average molecular weight of this oligomer 66 was about 4000.

(x66)

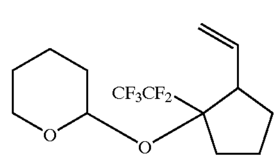

-continued (y66)

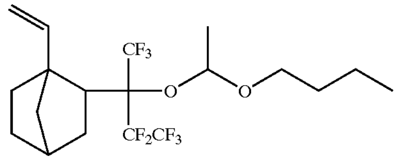

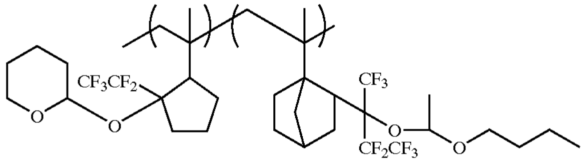

Example I-67

An oligomer 67 having a repeating unit represented by the following chemical formula was obtained by repeating the same procedures as described in Example I-51 except that a compound (x67) represented by the following chemical formula was substituted for the compound (BB) and that a compound (y67) represented by the following chemical formula was substituted for the compound (y51) employed therein. The average molecular weight of this oligomer 67 was about 3500.

(x67)

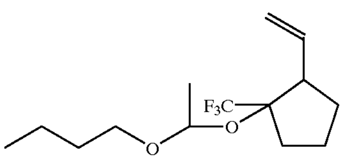

(y67)

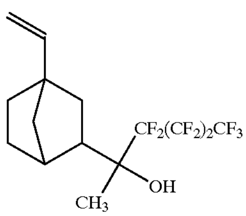

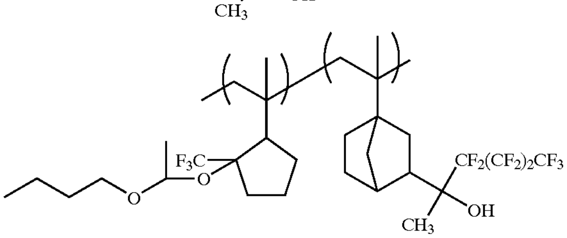

Example I-68

An oligomer 68 having a repeating unit represented by the following chemical formula was obtained by repeating the same procedures as described in Example I-51 except that a compound (x68) represented by the following chemical formula was substituted for the compound (BB) and that a compound (y68) represented by the following chemical formula was substituted for the compound (y51) employed therein. The average molecular weight of this oligomer 68 was about 3500.

(x68)

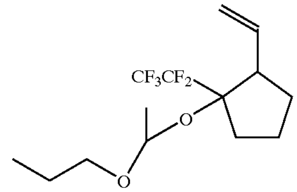

(y68)

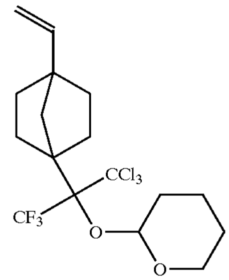

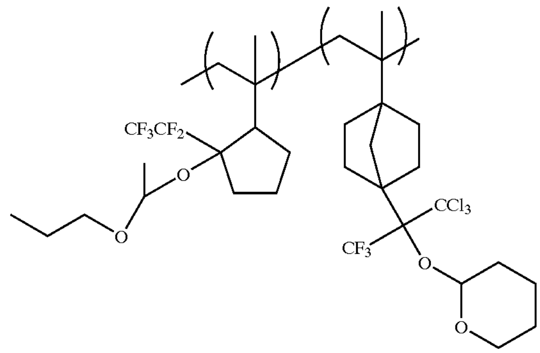

Example I-69

An oligomer 69 having a repeating unit represented by the following chemical formula was obtained by repeating the same procedures as described in Example I-51 except that a compound (x69) represented by the following chemical formula was substituted for the compound (BB) and that a compound (y69) represented by the following chemical formula was substituted for the compound (y51) employed therein. The average molecular weight of this oligomer 69 was about 3500.

(x69)

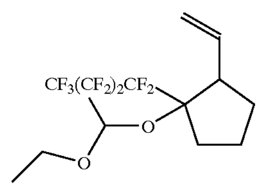

(y69)

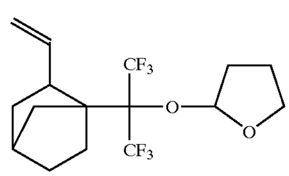

-continued

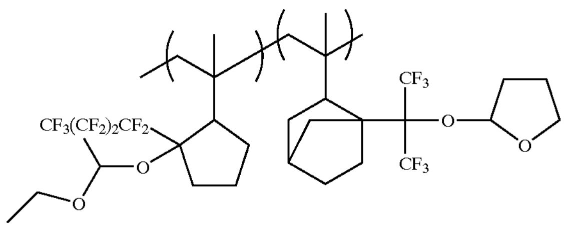

Example I-70

An oligomer 70 having a repeating unit represented by the following chemical formula was obtained by repeating the same procedures as described in Example I-51 except that a compound (x70) represented by the following chemical formula was substituted for the compound (BB) and that a compound (y70) represented by the following chemical formula was substituted for the compound (y51) employed therein. The average molecular weight of this oligomer 70 was about 3500.

(x70)

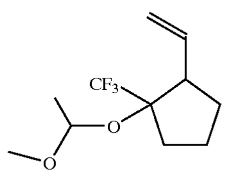

(x71)

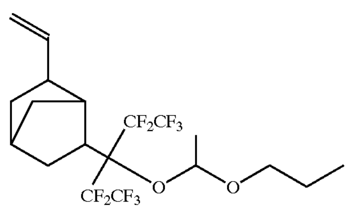

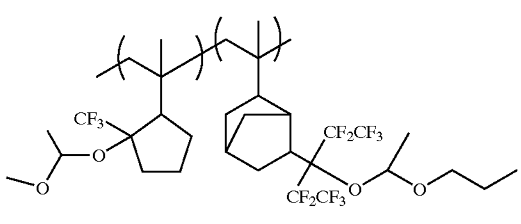

Example I-71

0.05 mol of a compound (x71) represented by the following chemical formula and 0.05 mol of a compound (y71) represented by the following chemical formula were mixed with 60 g of toluene to obtain a solution, to which 0.3 g of methylarmoxane and a toluene solution of ethyl bisindium zirconium dichloride were added, and reacted for one hour at a temperature of 30° C. Thereafter, ethyl alcohol was added to the reaction mixture to terminate the polymerization reaction thereof. The sediment produced therein was recovered through the filteration thereof in a nitrogen gas atmosphere, washed several times with ethyl alcohol, and dried in vacuo, thus obtaining an oligomer 71 having a repeating unit represented by the following chemical formula. The average molecular weight of this oligomer 71 was about 4000.

(x71)

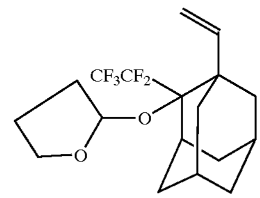

(y71)

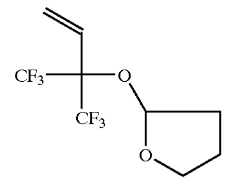

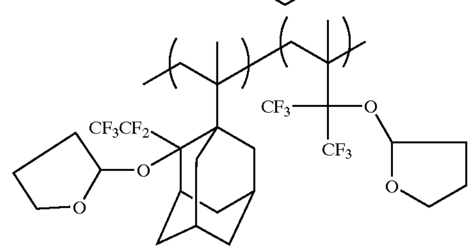

Example I-72

An oligomer 72 having a repeating unit represented by the following chemical formula was obtained by repeating the same procedures as described in Example I-71 except that a compound (x72) represented by the following chemical formula was substituted for the compound (x71) and that a compound (y72) represented by the following chemical formula was substituted for the compound (y71) employed therein. The average molecular weight of this oligomer 72 was about 3500.

(x72)

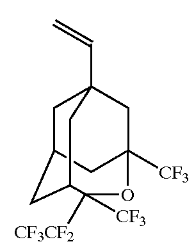

(y72)

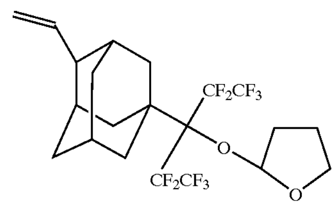

-continued

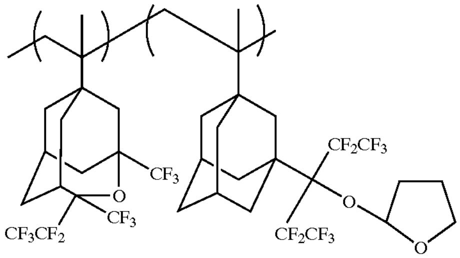

Example I-73

An oligomer 73 having a repeating unit represented by the following chemical formula was obtained by repeating the same procedures as described in Example I-71 except that a compound (x73) represented by the following chemical formula was substituted for the compound (x71) and that a compound (y73) represented by the following chemical formula was substituted for the compound (y71) employed therein. The average molecular weight of this oligomer 73 was about 3500.

(x73)

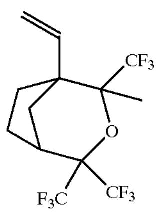

(y73)

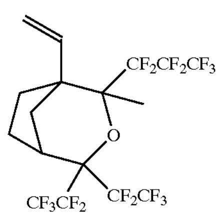

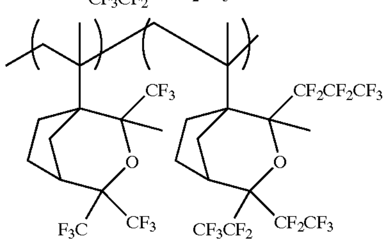

Example I-74

An oligomer 74 having a repeating unit represented by the following chemical formula was obtained by repeating the same procedures as described in Example I-71 except that a compound (x74) represented by the following chemical formula was substituted for the compound (x71) and that a compound (y74) represented by the following chemical formula was substituted for the compound (y71) employed therein. The average molecular weight of this oligomer 74 was about 3500.

(x74)

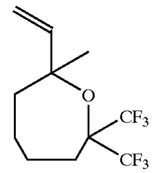

(y74)

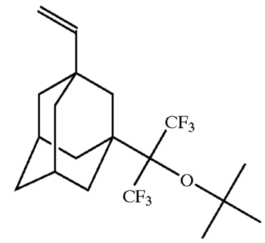

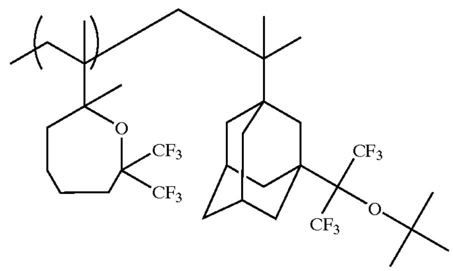

Example I-75

An oligomer 75 having a repeating unit represented by the following chemical formula was obtained by repeating the same procedures as described in Example I-71 except that a compound (x75) represented by the following chemical formula was substituted for the compound (x71) and that a compound (y75) represented by the following chemical formula was substituted for the compound (y71) employed therein. The average molecular weight of this oligomer 75 was about 3500.

(x75)

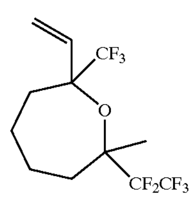

(y75)

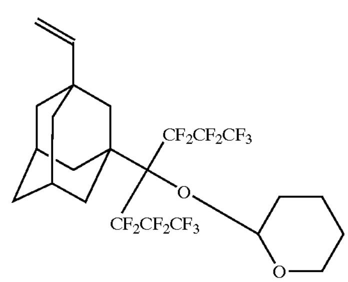

-continued

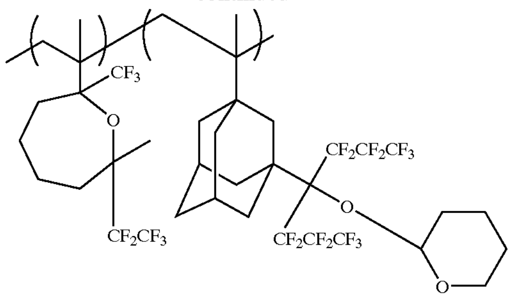

Example I-76

An oligomer 76 having a repeating unit represented by the following chemical formula was obtained by repeating the same procedures as described in Example I-71 except that a compound (x76) represented by the following chemical formula was substituted for the compound (x71) and that a compound (y76) represented by the following chemical formula was substituted for the compound (y71) employed therein. The average molecular weight of this oligomer 76 was about 4000.

(x76)

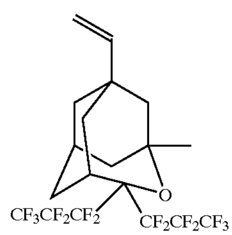

(y76)

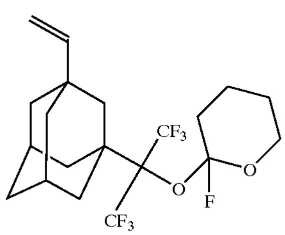

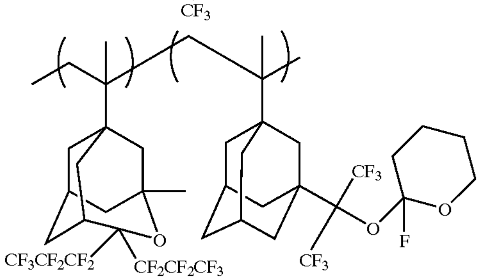

Example I-77

An oligomer 77 having a repeating unit represented by the following chemical formula was obtained by repeating the same procedures as described in Example I-71 except that a compound (x77) represented by the following chemical formula was substituted for the compound (x71) and that a compound (y77) represented by the following chemical formula was substituted for the compound (y71) employed therein. The average molecular weight of this oligomer 77 was about 3500.

(x77)

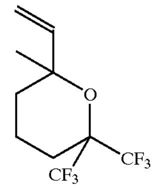

(y77)

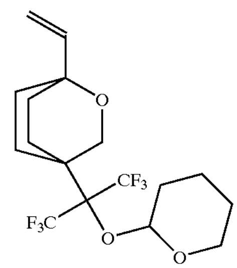

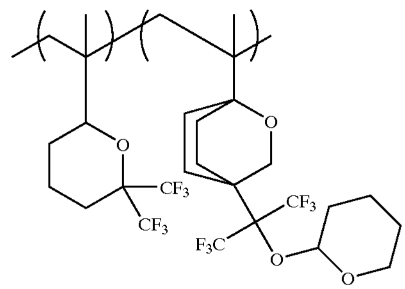

Example I-78

An oligomer 78 having a repeating unit represented by the following chemical formula was obtained by repeating the same procedures as described in Example I-71 except that a compound (x78) represented by the following chemical formula was substituted for the compound (x71) and that a compound (y78) represented by the following chemical formula was substituted for the compound (y71) employed therein. The average molecular weight of this oligomer 78 was about 3500.

(x78)

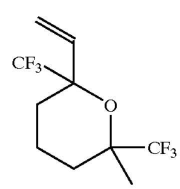

(y78)

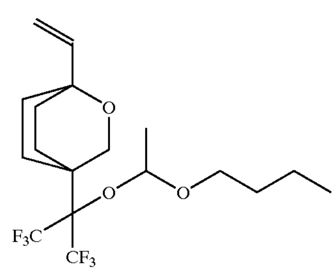

-continued

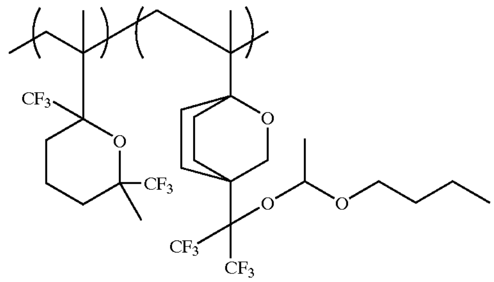

Example I-79

An oligomer 79 having a repeating unit represented by the following chemical formula was obtained by repeating the same procedures as described in Example I-71 except that a compound (x79) represented by the following chemical formula was substituted for the compound (x71) and that a compound (y79) represented by the following chemical formula was substituted for the compound (y71) employed therein. The average molecular weight of this oligomer 79 was about 3500.

(x79)

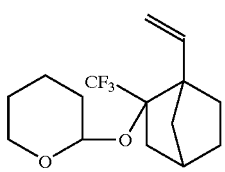

(y79)

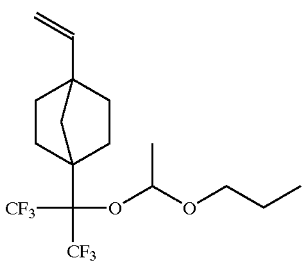

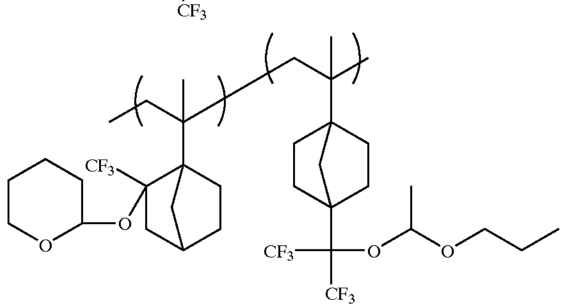

Example I-80

An oligomer 80 having a repeating unit represented by the following chemical formula was obtained by repeating the same procedures as described in Example I-71 except that a compound (x80) represented by the following chemical formula was substituted for the compound (x71) and that a compound (y80) represented by the following chemical formula was substituted for the compound (y71) employed therein. The average molecular weight of this oligomer 80 was about 3500.

(x80)

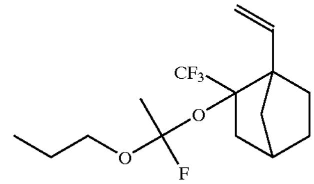

(y80)

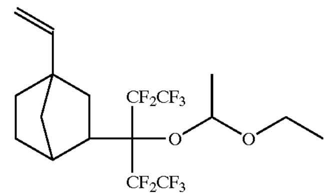

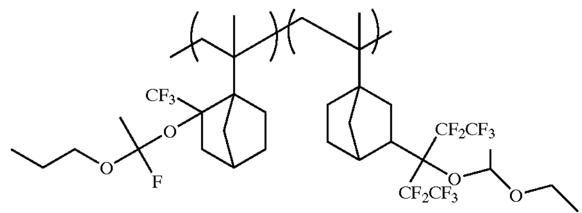

Example I-81

An oligomer 81 having a repeating unit represented by the following chemical formula was obtained by repeating the same procedures as described in Example I-71 except that a compound (x81) represented by the following chemical formula was substituted for the compound (x71) and that a compound (y81) represented by the following chemical formula was substituted for the compound (y71) employed therein. The average molecular weight of this oligomer 81 was about 4000.

(x81)

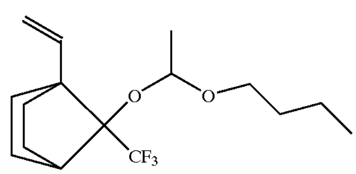

(y81)

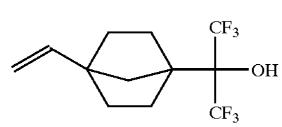

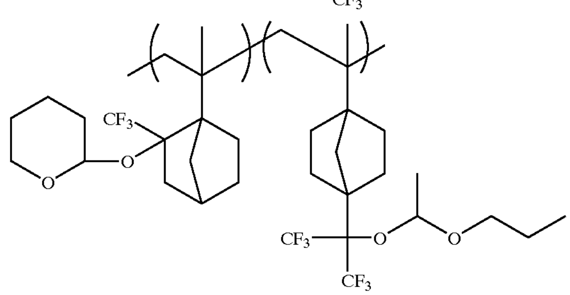

Example I-82

An oligomer 82 having a repeating unit represented by the following chemical formula was obtained by repeating the same procedures as described in Example I-71 except that a compound (x82) represented by the following chemical formula was substituted for the compound (x71) and that a compound (y82) represented by the following chemical formula was substituted for the compound (y71) employed therein. The average molecular weight of this oligomer 82 was about 3500.

(x82)

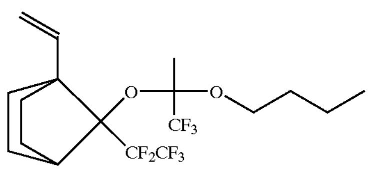

(y82)

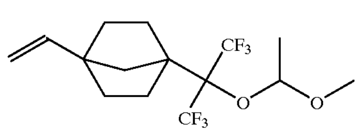

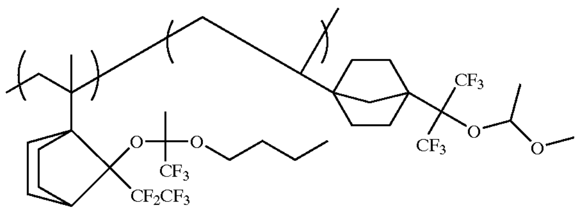

Example I-83

An oligomer 83 having a repeating unit represented by the following chemical formula was obtained by repeating the same procedures as described in Example I-71 except that a compound (x83) represented by the following chemical formula was substituted for the compound (x71) and that a compound (y83) represented by the following chemical formula was substituted for the compound (y71) employed therein. The average molecular weight of this oligomer 83 was about 3500.

(x83)

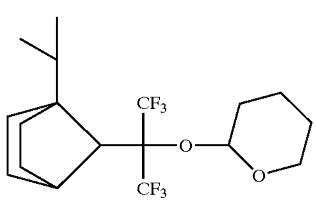

(y83)

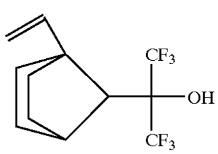

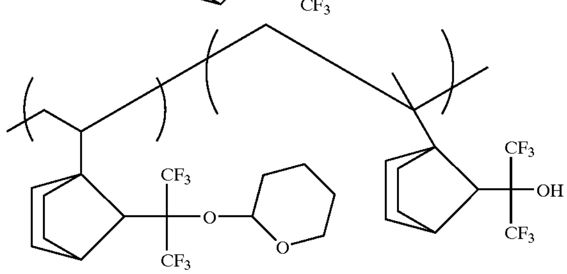

Example I-84

As starting materials, 0.04 mol of a compound (x84) represented by the following chemical formula, 0.03 mol of a compound (y84) represented by the following chemical formula and 0.03 mol of maleic anhydride were prepared, and they were mixed with 20 g of butyl acetate to obtain a solution. To this solution was added 2 g of dimethyl-2,2-azobisisobutylate, and resultant mixture was heated for 6 hours at a temperature of 70° C., thereby allowing a reaction to take place therein. Then, the reaction mixture was dropped into a mixed solution of hexane/2-propanol to obtain an oligomer 84 represented by the following chemical formula. The average molecular weight of this oligomer 84 was about 3500.

(x84)

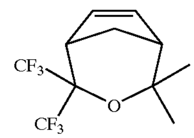

(y84)

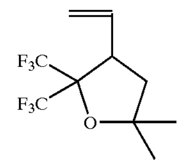

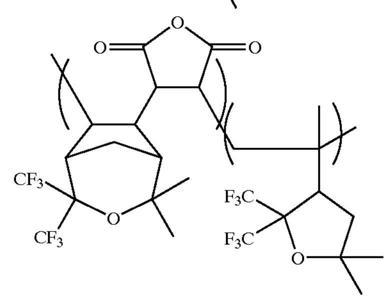

Example I-85

As starting materials, 0.04 mol of a compound (x85) represented by the following chemical formula, 0.03 mol of a compound (y85) represented by the following chemical formula and 0.03 mol of a compound (z85) represented by the following chemical formula were prepared.

(x85)

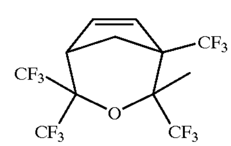

(y85)

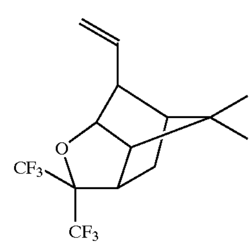

(z85)

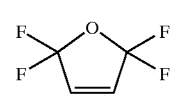

These compounds were then mixed with 60 g of toluene to obtain a solution, to which 0.3 g of methylarmoxane and a toluene solution of ethyl bisindium zirconium dichloride were added, and reacted for one hour at a temperature of 30° C. Thereafter, ethyl alcohol was added to the reaction mixture to terminate the polymerization reaction thereof. The sediment produced therein was recovered through the filteration thereof in a nitrogen gas atmosphere, washed several times with ethyl alcohol, and dried in vacuo, thus obtaining an oligomer 85 having a repeating unit represented by the following chemical formula. The average molecular weight of this oligomer 85 was about 4000.

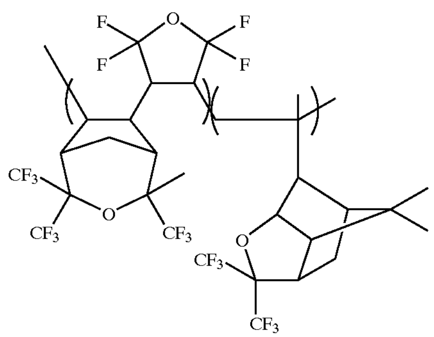

Example I-86

As starting materials, 0.04 mol of a compound (x86) represented by the following chemical formula, 0.03 mol of a compound (y86) represented by the following chemical formula and 0.03 mol of a compound (z86) represented by the following chemical formula were prepared.

(x86)

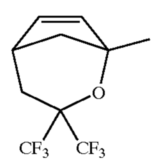

(y86)

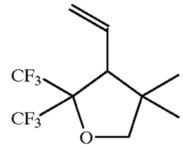

(z86)

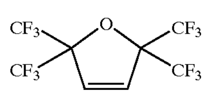

An oligomer 86 having a repeating unit represented by the following chemical formula was obtained by repeating the same procedures as described in Example I-85 except that the aforementioned compounds were substituted for the compounds (x85), (y85) and (z85) employed therein. The average molecular weight of this oligomer 86 was about 4000.

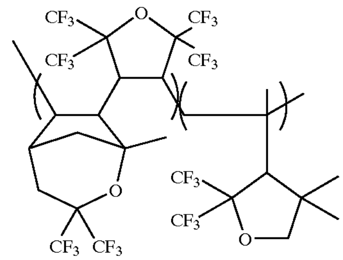

Example I-87

As starting materials, 0.04 mol of a compound (x87) represented by the following chemical formula, 0.03 mol of a compound (y87) represented by the following chemical formula and 0.03 mol of maleic anhydride were prepared.

(x87)

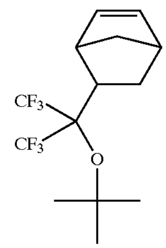

(y87)

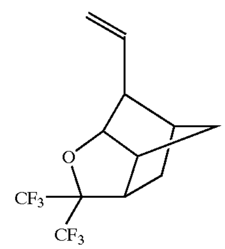

An oligomer 87 having a repeating unit represented by the following chemical formula was obtained by repeating the same procedures as described in Example I-84 except that the aforementioned compounds were substituted for the compounds employed in Example I-84. The average molecular weight of this oligomer 87 was about 3500.

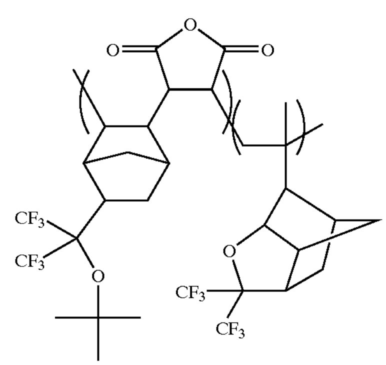

Example I-88

As starting materials, 0.04 mol of a compound (x88) represented by the following chemical formula, 0.03 mol of a compound (y88) represented by the following chemical formula and 0.03 mol of maleic anhydride were prepared.

(x88)

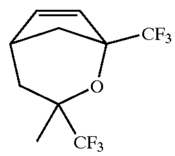

(y88)

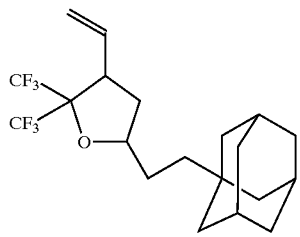

An oligomer 88 having a repeating unit represented by the following chemical formula was obtained by repeating the same procedures as described in Example I-84 except that the aforementioned compounds were substituted for the compounds employed in Example I-84. The average molecular weight of this oligomer 88 was about 3500.

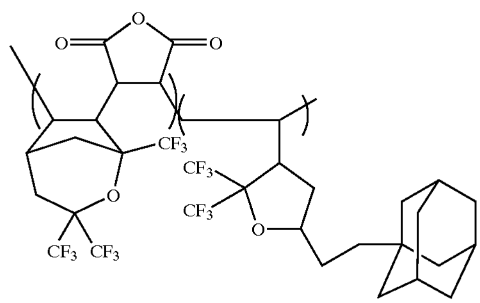

Example I-89

As starting materials, 0.03 mol of a compound (x89) represented by the following chemical formula, 0.04 mol of a compound (y89) represented by the following chemical formula and 0.03 mol of maleic anhydride were prepared.

(x89)

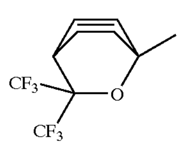

(y89)

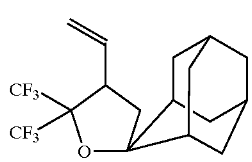

An oligomer 89 having a repeating unit represented by the following chemical formula was obtained by repeating the same procedures as described in Example I-84 except that the aforementioned compounds were substituted for the compounds employed in Example I-84. The average molecular weight of this oligomer 89 was about 3500.

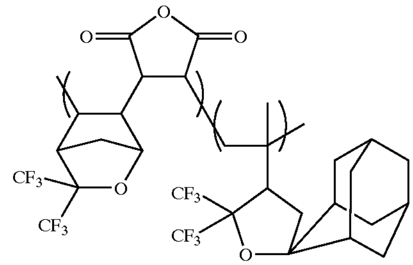

Example I-90

As starting materials, 0.03 mol of a compound (x90) represented by the following chemical formula, 0.04 mol of a compound (y90) represented by the following chemical formula and 0.03 mol of maleic anhydride were prepared.

(x90)

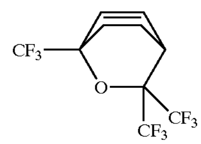

(y84)

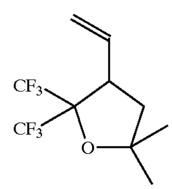

An oligomer 90 having a repeating unit represented by the following chemical formula was obtained by repeating the same procedures as described in Example I-84 except that the aforementioned compounds were substituted for the compounds employed in Example I-84. The average molecular weight of this oligomer 90 was about 3500.

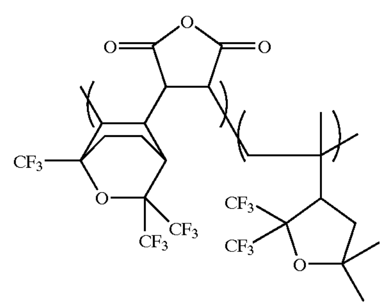

Example I-91

As starting materials, 0.04 mol of a compound (x91) represented by the following chemical formula, 0.03 mol of a compound (y91) represented by the following chemical formula and 0.03 mol of maleic anhydride were prepared.

(x91)

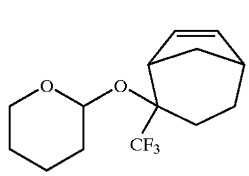

(y91)

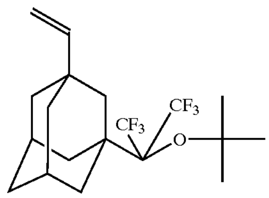

An oligomer 91 having a repeating unit represented by the following chemical formula was obtained by repeating the same procedures as described in Example I-84 except that the aforementioned compounds were substituted for the compounds employed in Example I-84. The average molecular weight of this oligomer 91 was about 4000.

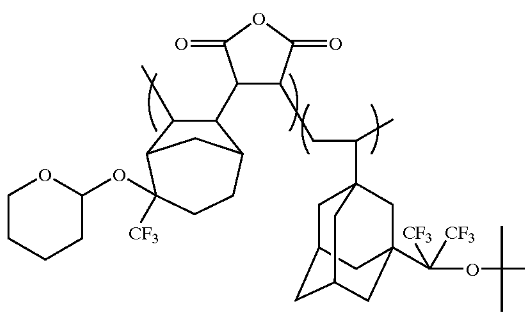

Example I-92

As starting materials, 0.05 mol of a compound (x92) represented by the following chemical formula and 0.05 mol of the compound (z86) represented by the aforementioned chemical formula were prepared.

(x92)

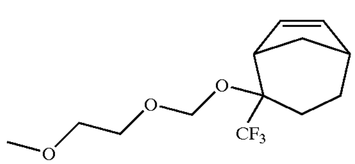

An oligomer 92 having a repeating unit represented by the following chemical formula was obtained by repeating the same procedures as described in Example I-85 except that the aforementioned compounds were substituted for the compounds employed in Example I-85. The average molecular weight of this oligomer 92 was about 3500.

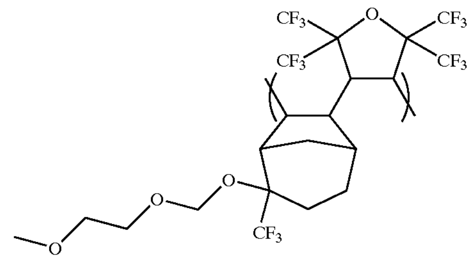

Example I-93

As starting materials, 0.05 mol of a compound (x93) represented by the following chemical formula and 0.05 mol of the compound (z85) represented by the aforementioned chemical formula were prepared.

(x93)

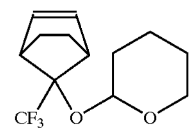

An oligomer 93 having a repeating unit represented by the following chemical formula was obtained by repeating the same procedures as described in Example I-85 except that the aforementioned compounds were substituted for the compounds employed in Example I-85. The average molecular weight of this oligomer 93 was about 3500.

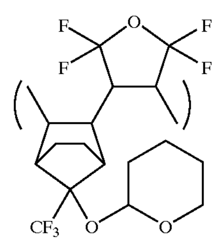

Example I-94

As starting materials, 0.05 mol of a compound (x94) represented by the following chemical formula and 0.05 mol of a compound (z94) represented by the following chemical formula were prepared.

(x94)

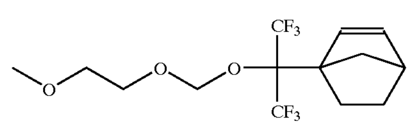

(z94)

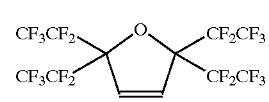

An oligomer 94 having a repeating unit represented by the following chemical formula was obtained by repeating the same procedures as described in Example I-85 except that the aforementioned compounds were substituted for the compounds employed in Example I-85. The average molecular weight of this oligomer 94 was about 3500.

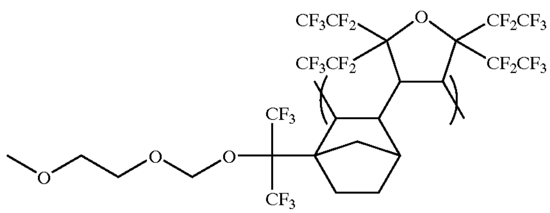

Example I-95

As starting materials, 0.05 mol of a compound (x95) represented by the following chemical formula and 0.05 mol of a compound (z95) represented by the following chemical formula were prepared.

(x95)

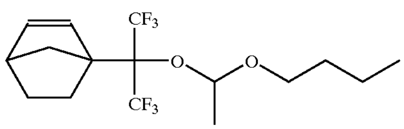

(z95)

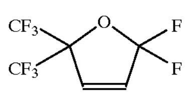

An oligomer 95 having a repeating unit represented by the following chemical formula was obtained by repeating the same procedures as described in Example I-85 except that the aforementioned compounds were substituted for the compounds employed in Example I-85. The average molecular weight of this oligomer 95 was about 3500.

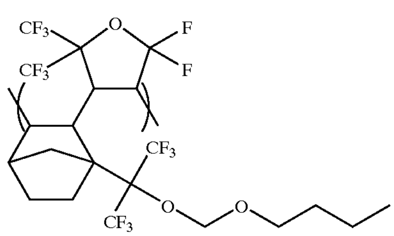

Example I-96

As starting materials, 0.04 mol of a compound (x96) represented by the following chemical formula, 0.03 mol of a compound (y96) represented by the following chemical formula and 0.03 mol of a compound (z96) represented by the following chemical formula were prepared.

(x96)

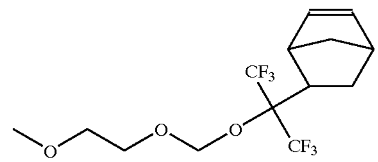

(y96)

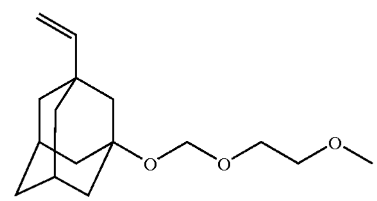

(z96)

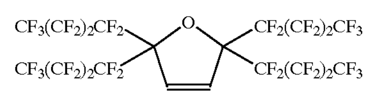

An oligomer 96 having a repeating unit represented by the following chemical formula was obtained by repeating the same procedures as described in Example I-85 except that the aforementioned compounds were substituted for the compounds employed in Example I-85. The average molecular weight of this oligomer 96 was about 4000.

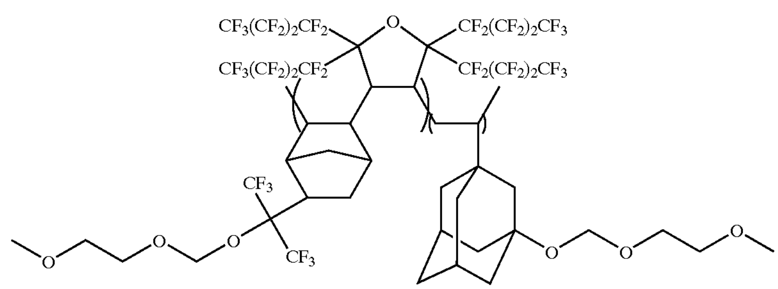

Example I-97

As starting materials, 0.04 mol of a compound (x97) represented by the following chemical formula, 0.03 mol of a compound (y97) represented by the following chemical formula and 0.03 mol of maleic anhydride were prepared.

(x97)

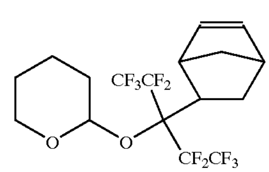

-continued (y97)

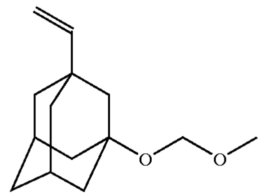

An oligomer 97 having a repeating unit represented by the following chemical formula was obtained by repeating the same procedures as described in Example I-84 except that the aforementioned compounds were substituted for the compounds employed in Example I-84. The average molecular weight of this oligomer 97 was about 3500.

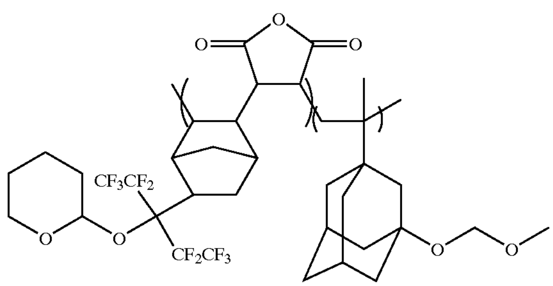

Example I-98

As starting materials, 0.05 mol of a compound (x98) represented by the following chemical formula and 0.05 mol of maleic anhydride were prepared.

(x98)

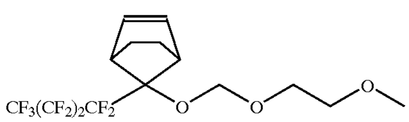

An oligomer 98 having a repeating unit represented by the following chemical formula was obtained by repeating the same procedures as described in Example I-84 except that the aforementioned compounds were substituted for the compounds employed in Example I-84. The average molecular weight of this oligomer 98 was about 3500.

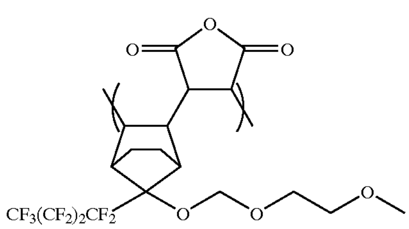

Example I-99

As starting materials, 0.05 mol of a compound (x99) represented by the following chemical formula and 0.05 mol of the compound (z86) represented by the aforementioned chemical formula were prepared.

(x99)

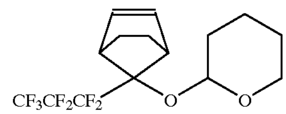

An oligomer 99 having a repeating unit represented by the following chemical formula was obtained by repeating the same procedures as described in Example I-85 except that the aforementioned compounds were substituted for the compounds employed in Example I-85. The average molecular weight of this oligomer 99 was about 3500.

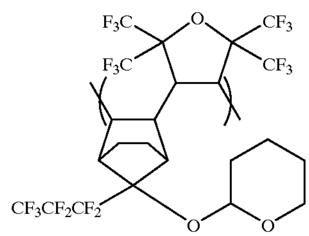

Example I-100

As starting materials, 0.04 mol of a compound (x100) represented by the following chemical formula, 0.03 mol of a compound (y100) represented by the following chemical formula and 0.03 mol of maleic anhydride were prepared.

(x100)

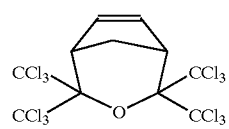

(y100)

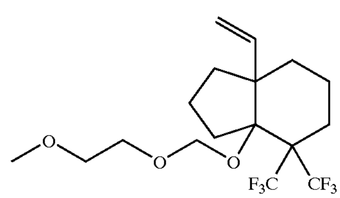

An oligomer 100 having a repeating unit represented by the following chemical formula was obtained by repeating the same procedures as described in Example I-84 except that the aforementioned compounds were substituted for the compounds employed in Example I-84. The average molecular weight of this oligomer 100 was about 3500.

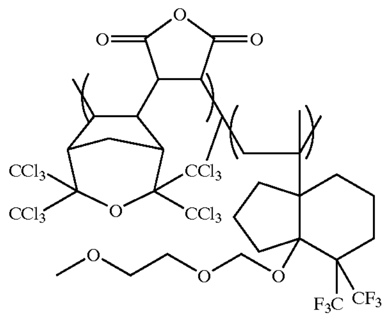

Example I-101

As starting materials, 0.04 mol of a compound (x101) represented by the following chemical formula, 0.03 mol of a compound (y101) represented by the following chemical formula and 0.03 mol of maleic anhydride were prepared.

(x101)

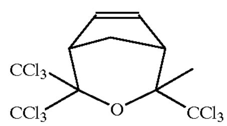

(y101)

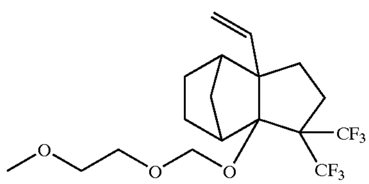

An oligomer 101 having a repeating unit represented by the following chemical formula was obtained by repeating the same procedures as described in Example I-84 except that the aforementioned compounds were substituted for the compounds employed in Example I-84. The average molecular weight of this oligomer 101 was about 4000.

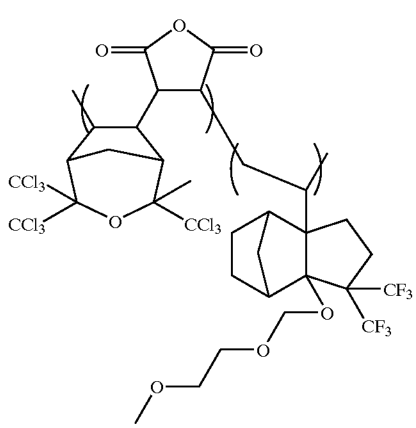

Example I-102

As starting materials, 0.04 mol of a compound (x102) represented by the following chemical formula, 0.03 mol of a compound (y102) represented by the following chemical formula and 0.03 mol of a compound (z102) represented by the following chemical formula were prepared.

(x102)

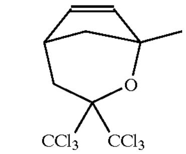

(y102)

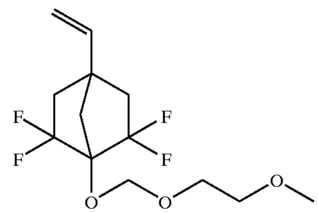

(z102)

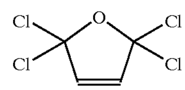

An oligomer 102 having a repeating unit represented by the following chemical formula was obtained by repeating the same procedures as described in Example I-85 except that the aforementioned compounds were substituted for the compounds employed in Example I-85. The average molecular weight of this oligomer 102 was about 3500.

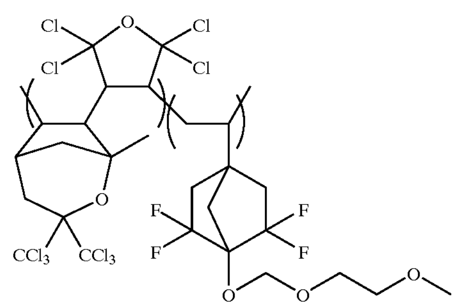

Example I-103

As starting materials, 0.04 mol of a compound (x103) represented by the following chemical formula, 0.03 mol of a compound (y103) represented by the following chemical formula and 0.03 mol of a compound (z103) represented by the following chemical formula were prepared.

(x103)

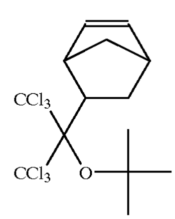

-continued (y103)

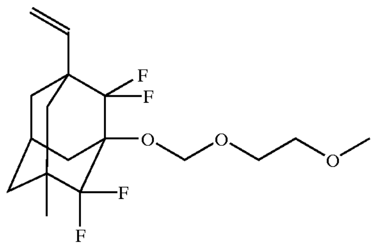

(z103)

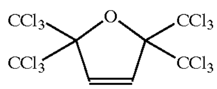

An oligomer 103 having a repeating unit represented by the following chemical formula was obtained by repeating the same procedures as described in Example I-85 except that the aforementioned compounds were substituted for the compounds employed in Example I-85. The average molecular weight of this oligomer 103 was about 3500.

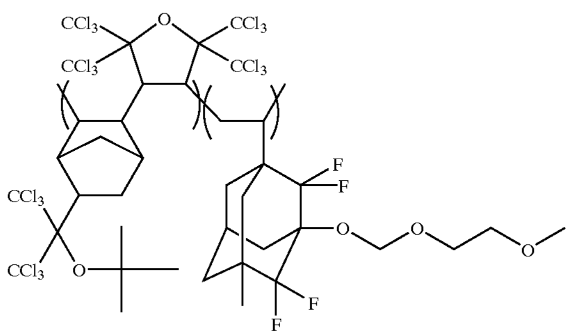

Example I-104

As starting materials, 0.04 mol of a compound (x104) represented by the following chemical formula, 0.03 mol of a compound (y104) represented by the following chemical formula and 0.03 mol of maleic anhydride were prepared.

(x104)

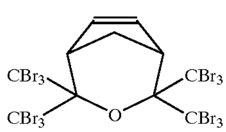

(y104)

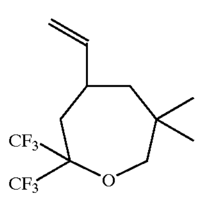

An oligomer 104 having a repeating unit represented by the following chemical formula was obtained by repeating the same procedures as described in Example I-84 except that the aforementioned compounds were substituted for the compounds employed in Example I-84. The average molecular weight of this oligomer 104 was about 3500.

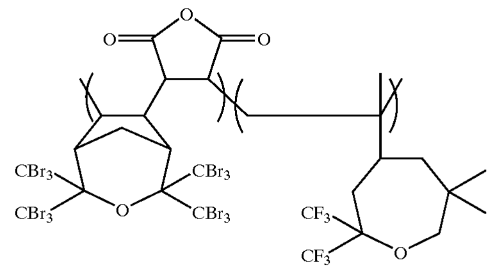

Example I-105

As starting materials, 0.04 mol of a compound (x105) represented by the following chemical formula, 0.03 mol of a compound (y105) represented by the following chemical formula and 0.03 mol of maleic anhydride were prepared.

(x105)

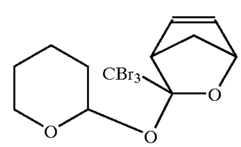

(y105)

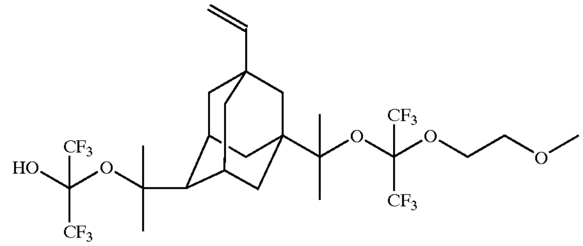

An oligomer 105 having a repeating unit represented by the following chemical formula was obtained by repeating the same procedures as described in Example I-84 except that the aforementioned compounds were substituted for the compounds employed in Example I-84. The average molecular weight of this oligomer 105 was about 3500.

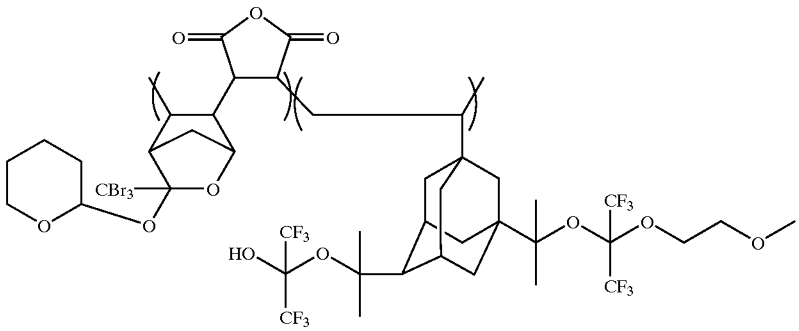

Example I-106

As starting materials, 0.05 mol of a compound (x106) represented by the following chemical formula and 0.05 mol of the compound (z85) represented by the aforementioned chemical formula were prepared.

(x106)

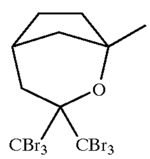

An oligomer 106 having a repeating unit represented by the following chemical formula was obtained by repeating the same procedures as described in Example I-85 except that the aforementioned compounds were substituted for the compounds employed in Example I-85. The average molecular weight of this oligomer 106 was about 4000.

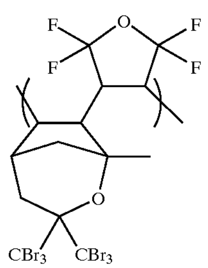

Example I-107

As starting materials, 0.05 mol of a compound (x107) represented by the following chemical formula and 0.05 mol of the compound (z86) represented by the aforementioned chemical formula were prepared.

(x107)

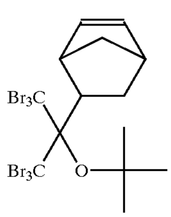

An oligomer 107 having a repeating unit represented by the following chemical formula was obtained by repeating the same procedures as described in Example I-85 except that the aforementioned compounds were substituted for the compounds employed in Example I-85. The average molecular weight of this oligomer 107 was about 3500.

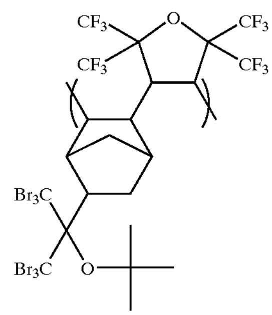

Example I-108

As starting materials, 0.05 mol of a compound (x108) represented by the following chemical formula and 0.05 mol of a compound (z108) represented by the following chemical formula were prepared.

(x108)

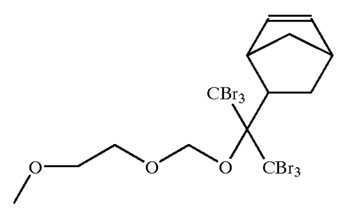

(z108)

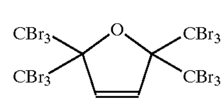

An oligomer 108 having a repeating unit represented by the following chemical formula was obtained by repeating the same procedures as described in Example I-85 except that the aforementioned compounds were substituted for the compounds employed in Example I-85. The average molecular weight of this oligomer 108 was about 3500.

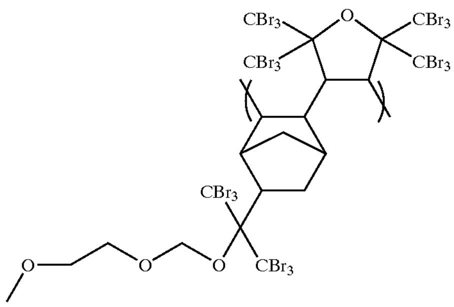

Example I-109

As starting materials, 0.05 mol of a compound (x109) represented by the following chemical formula and 0.05 mol of a compound (z109) represented by the following chemical formula were prepared.

(x109)

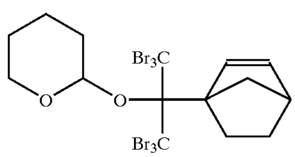

(z109)

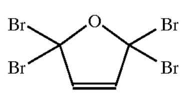

An oligomer 109 having a repeating unit represented by the following chemical formula was obtained by repeating the same procedures as described in Example I-85 except that the aforementioned compounds were substituted for the compounds employed in Example I-85. The average molecular weight of this oligomer 109 was about 3500.

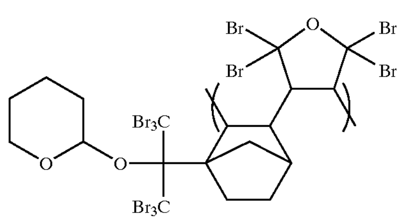

Example I-110

As starting materials, 0.05 mol of a compound (x110) represented by the following chemical formula and 0.05 mol of the compound (z102) represented by the aforementioned chemical formula were prepared.

(x110)

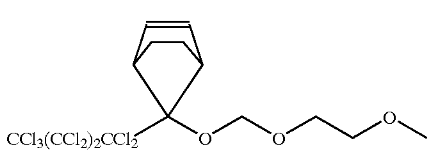

An oligomer 110 having a repeating unit represented by the following chemical formula was obtained by repeating the same procedures as described in Example I-85 except that the aforementioned compounds were substituted for the compounds employed in Example I-85. The average molecular weight of this oligomer 110 was about 3500.

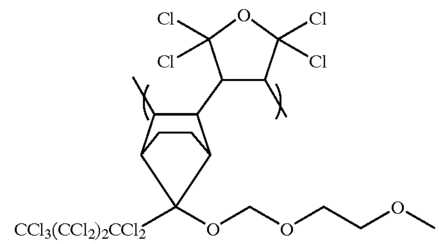

Example I-111

As starting materials, 0.05 mol of a compound (x111) represented by the following chemical formula and 0.05 mol of maleic anhydride were prepared.

(x111)

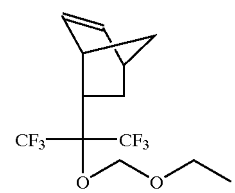

An oligomer 111 having a repeating unit represented by the following chemical formula was obtained by repeating the same procedures as described in Example I-84 except that the aforementioned compounds were substituted for the compounds employed in Example I-84. The average molecular weight of this oligomer 111 was about 4000.

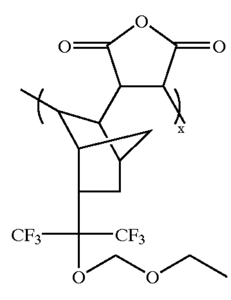

Example I-112

To a solution comprising 3 mL of dichloromethane and 0.5 mL of a compound (x112) represented by the following chemical formula were successively and quickly added 0.5 mL of a solution of 100 mM of (x112)-HCl in hexane which had been cooled in advance to 0° C., 0.5 mL of a solution of 2.5 mM of zinc chloride in ether, and acrylonitrile in a dry nitrogen gas atmosphere. The resultant mixed solution was sufficiently shaken and mingled to obtain a reaction mixture. 40 minutes later, 2 mL of cold methanol containing a minute amount of aqueous solution of ammonia was added to the reaction mixture to terminate the polymerization thereof. The reaction mixture where the polymerization thereof was terminated in this manner was transferred to a separating funnel by using 20 mL of hexane and washed three times with 50 mL of water. Thereafter, the organic phase thereof was recovered and dried in vacuo to distill out the solvents included therein, thereby obtaining polyvinyl polymer 112 having an average molecular weight of about 4000.

(x112)

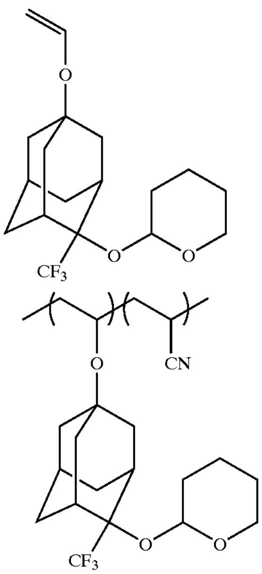

Example I-113

0.06 mol of a compound (x113) represented by the following chemical formula and 0.04 mol of acrylonitrile were mixed with 20 g of tetrahydrofran (THF) to obtain a solution. To this solution was added 2 g of azoisobutylnitrile (AIBN), and the resultant mixture was heated for 36 hours at a temperature of 60° C., thereby allowing a reaction to take place therein. Then, the reaction mixture was dropped into hexane to obtain a copolymer 113 having a repeating unit represented by the following chemical formula. The average molecular weight of this copolymer 113 was about 7000.

(x113)

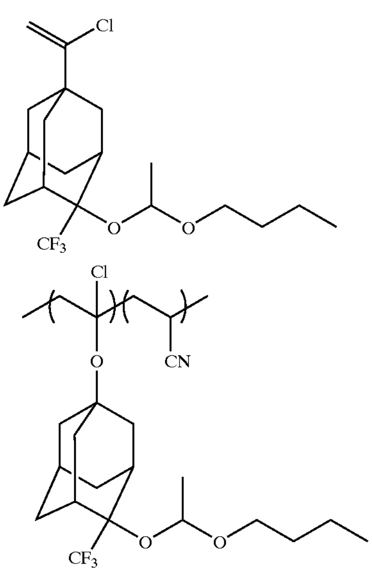

Example I-114

0.06 mol of a compound (x114) represented by the following chemical formula and 0.04 mol of acrylonitrile were mixed with 20 g of tetrahydrofran (THF) to obtain a solution. To this solution was added 2 g of azoisobutylnitrile (AIBN), and the resultant mixture was heated for 36 hours at a temperature of 60° C., thereby allowing a reaction to take place therein. Then, the reaction mixture was dropped into hexane to obtain a copolymer 114 having a repeating unit represented by the following chemical formula. The average molecular weight of this copolymer 114 was about 7000.

(x114)

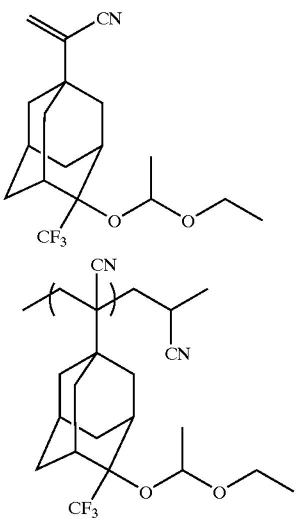

Example I-115

To a solution comprising 3 mL of dichloromethane and 0.5 mL of a compound (x115) represented by the following chemical formula were successively and quickly added 0.5 mL of a solution of 100 mM of (x115)-HCl in hexane which had been cooled in advance to 0° C., 0.5 mL of a solution of 2.5 mM of zinc chloride in ether, and acrylonitrile in a dry nitrogen gas atmosphere. The resultant mixed solution was sufficiently shaken and mingled to obtain a reaction mixture. 40 minutes later, 2 mL of cold methanol containing a minute amount of aqueous solution of ammonia was added to the reaction mixture to terminate the polymerization thereof. The reaction mixture where the polymerization thereof was terminated in this manner was transferred to a separating funnel by using 20 mL of hexane and washed three times with 50 mL of water. Thereafter, the organic phase thereof was recovered and dried in vacuo to distill out the solvents included therein, thereby obtaining polyvinyl polymer 115 having an average molecular weight of about 4000.

(x115)

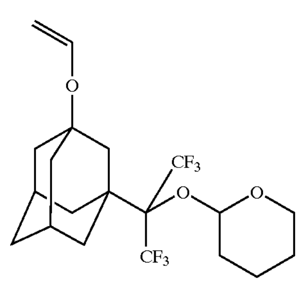

-continued

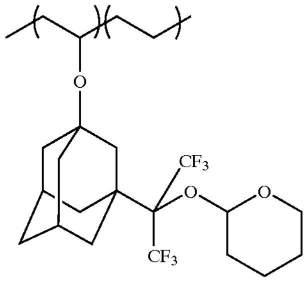

Example I-116

To a solution comprising 3 mL of dichloromethane and 0.5 mL of a compound (x116) represented by the following chemical formula were successively and quickly added 0.5 mL of a solution of 100 mM of (x116)-HCl in hexane which had been cooled in advance to 0° C., 0.5 mL of a solution of 2.5 mM of zinc chloride in ether, and acrylonitrile in a dry nitrogen gas atmosphere. The resultant mixed solution was sufficiently shaken and mingled to obtain a reaction mixture. 40 minutes later, 2 mL of cold methanol containing a minute amount of aqueous solution of ammonia was added to the reaction mixture to terminate the polymerization thereof. The reaction mixture where the polymerization thereof was terminated in this manner was transferred to a separating funnel by using 20 mL of hexane and washed three times with 50 mL of water. Thereafter, the organic phase thereof was recovered and dried in vacuo to distill out the solvents included therein, thereby obtaining polyvinyl polymer 116 having an average molecular weight of about 4000.

(x116)

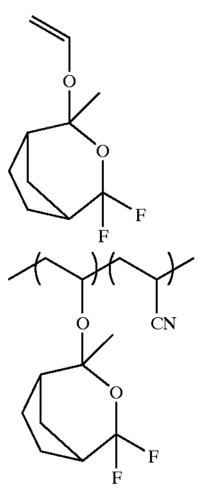

Example I-117

To a solution comprising 3 mL of dichloromethane and 0.5 mL of a compound (x117) represented by the following chemical formula were successively and quickly added 0.5 mL of a solution of 100 mM of (x117)-HCl in hexane which had been cooled in advance to 0° C., 0.5 mL of a solution of 2.5 mM of zinc chloride in ether, and acrylonitrile in a dry nitrogen gas atmosphere. The resultant mixed solution was sufficiently shaken and mingled to obtain a reaction mixture. 40 minutes later, 2 mL of cold methanol containing a minute amount of aqueous solution of ammonia was added to the reaction mixture to terminate the polymerization thereof. The reaction mixture where the polymerization thereof was terminated in this manner was transferred to a separating funnel by using 20 mL of hexane and washed three times with 50 mL of water. Thereafter, the organic phase thereof was recovered and dried in vacuo to distill out the solvents included therein, thereby obtaining polyvinyl polymer 117 having an average molecular weight of about 4000.

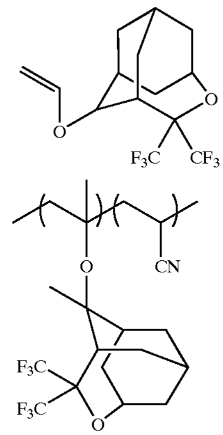

Example I-118

0.06 mol of a compound (x118) represented by the following chemical formula and 0.04 mol of acrylonitrile were mixed with 20 g of tetrahydrofran (THF) to obtain a solution. To this solution was added 2 g of azoisobutylnitrile (AIBN), and resultant mixture was heated for 36 hours at a temperature of 60° C., thereby allowing a reaction to take place therein. Then, the reaction mixture was dropped into hexane to obtain a copolymer 118 having a repeating unit represented by the following chemical formula. The average molecular weight of this copolymer 118 was about 7000.

(x118)

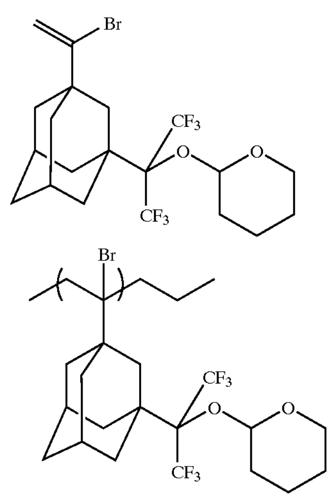

Example I-119

1 mmol of an aluminum porphyrin, 0.05 mol of a compound (x119) represented by the following chemical formula, and 24 mmol of methanol were mixed together to obtain a mixed solution. This mixed solution was left with stirring at room temperature for 48 hours. Then, volatile components in this mixed solution were distilled out of a flask to quantitatively obtain polypropylene oxide 119 having an average molecular weight of 3000.

(x119)

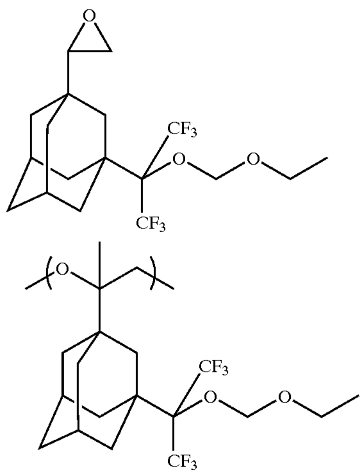

Example I-120

1 mmol of an aluminum porphyrin, 0.05 mol of a compound (x120) represented by the following chemical formula, and 24 mmol of methanol were mixed together to obtain a mixed solution. This mixed solution was left with stirring at room temperature for 48 hours. Then, volatile components in this mixed solution were distilled out of a flask to quantitatively obtain polypropylene oxide 120 having an average molecular weight of 3000.

(x120)

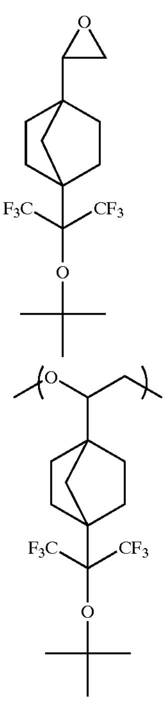

Example I-121

1 mmol of an aluminum porphyrin, 0.05 mol of a compound (x121) represented by the following chemical formula, and 24 mmol of methanol were mixed together to obtain a mixed solution. This mixed solution was left with stirring at room temperature for 48 hours. Then, volatile components in this mixed solution were distilled out of a flask to quantitatively obtain polypropylene oxide 121 having an average molecular weight of 3000.

(x121)

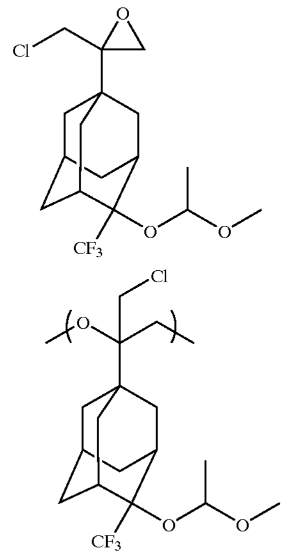

EXAMPLES II

The Synthesis of Polymer Compounds for Photoresist, Which are Formed of a Homopolymer Example II-1

2.1 g of the compound (B) and 0.4 g of azoisobutylonitrile functioning as a polymerization initiator were dissolved in 6 mL of toluene to obtain a solution.

This solution was frozen by using liquid nitrogen and subjected to a 20-minute deaeration three times, the resultant solution being subsequently permitted to rise in temperature up to room temperature. Then, under a nitrogen gas flow, the solution was heated for 16 hours using an oil bath heated to 70° C. Thereafter, 600 mL of methanol was added to the solution to terminate the reaction thereof. The reaction mixture was then permitted to reprecipitate and filtered. Then, the solvent included therein was distilled out in vacuo to obtain a homopolymer (BI).

Example II-2

A homopolymer (C1) was obtained by repeating the same procedures as described in Example II-1 except that the compound (C) was substituted for the compound (B) employed therein.

Example II-3

A homopolymer (D1) was obtained by repeating the same procedures as described in Example II-1 except that the compound (D) was substituted for the compound (B) employed therein.

Example II-4

A homopolymer (E1) was obtained by repeating the same procedures as described in Example II-1 except that the compound (E) was substituted for the compound (B) employed therein.

Example II-5

A homopolymer (F1) was obtained by repeating the same procedures as described in Example II-1 except that the compound (F) was substituted for the compound (B) employed therein.

Example II-6

A homopolymer (B'1) was obtained by repeating the same procedures as described in Example II-1 except that the compound (B') was substituted for the compound (B) employed therein.

Example II-7

A homopolymer (C'1) was obtained by repeating the same procedures as described in Example II-1 except that the compound (C') was substituted for the compound (B) employed therein.

Example II-8

A homopolymer (D'1) was obtained by repeating the same procedures as described in Example II-1 except that the compound (D') was substituted for the compound (B) employed therein.

Example II-9

A homopolymer (E'1) was obtained by repeating the same procedures as described in Example II-1 except that the compound (E') was substituted for the compound (B) employed therein.

Example II-10

A homopolymer (F'1) was obtained by repeating the same procedures as described in Example II-1 except that the compound (F') was substituted for the compound (B) employed therein.

Example II-11

A homopolymer (B"1) was obtained by repeating the same procedures as described in Example II-1 except that the compound (B") was substituted for the compound (B) employed therein.

Example II-12

A homopolymer (C"1) was obtained by repeating the same procedures as described in Example II-1 except that the compound (C") was substituted for the compound (B) employed therein.

Example II-13

A homopolymer (D"1) was obtained by repeating the same procedures as described in Example II-1 except that the compound (D") was substituted for the compound (B) employed therein.

Example II-14

A homopolymer (E"1) was obtained by repeating the same procedures as described in Example II-1 except that the compound (E") was substituted for the compound (B) employed therein.

Example II-15

A homopolymer (F"1) was obtained by repeating the same procedures as described in Example II-1 except that the compound (F") was substituted for the compound (B) employed therein.

Example II-16

A homopolymer (B"'1) was obtained by repeating the same procedures as described in Example II-1 except that the compound (B"') was substituted for the compound (B) employed therein.

Example II-17

A homopolymer (C"'1) was obtained by repeating the same procedures as described in Example II-1 except that the compound (C"') was substituted for the compound (B) employed therein.

Example II-18

A homopolymer (D"'1) was obtained by repeating the same procedures as described in Example II-1 except that the compound (D"') was substituted for the compound (B) employed therein.

Example II-19

A homopolymer (E"'1) was obtained by repeating the same procedures as described in Example II-1 except that the compound (E"') was substituted for the compound (B) employed therein.

Example II-20

A homopolymer (F"'1) was obtained by repeating the same procedures as described in Example II-1 except that the compound (F"') was substituted for the compound (B) employed therein.

Example II-21

A homopolymer (Mf1) was obtained by repeating the same procedures as described in Example II-1 except that the compound (Mf) was substituted for the compound (B) employed therein.

Example II-22

A homopolymer (Nf1) was obtained by repeating the same procedures as described in Example II-1 except that the compound (Nf) was substituted for the compound (B) employed therein.

Example II-23

A homopolymer (Of1) was obtained by repeating the same procedures as described in Example II-1 except that the compound (Of) was substituted for the compound (B) employed therein.

Example II-24

A homopolymer (Pf1) was obtained by repeating the same procedures as described in Example II-1 except that the compound (Pf) was substituted for the compound (B) employed therein.

Example II-25

A homopolymer (BB1) was obtained by repeating the same procedures as described in Example II-1 except that the compound (BB) was substituted for the compound (B) employed therein.

Example II-26

A homopolymer (CC1) was obtained by repeating the same procedures as described in Example II-1 except that the compound (CC) was substituted for the compound (B) employed therein.

Example II-27

A homopolymer (DD1) was obtained by repeating the same procedures as described in Example II-1 except that the compound (DD) was substituted for the compound (B) employed therein.

Example II-28

A homopolymer (EE1) was obtained by repeating the same procedures as described in Example II-1 except that the compound (EE) was substituted for the compound (B) employed therein.

Example II-29

A homopolymer (FF1) was obtained by repeating the same procedures as described in Example II-1 except that the compound (FF) was substituted for the compound (B) employed therein.

Example II-30

A homopolymer (BB'1) was obtained by repeating the same procedures as described in Example II-1 except that the compound (BB') was substituted for the compound (B) employed therein.

Example II-31

A homopolymer (CC'1) was obtained by repeating the same procedures as described in Example II-1 except that the compound (CC') was substituted for the compound (B) employed therein.

Example II-32

A homopolymer (DD'1) was obtained by repeating the same procedures as described in Example II-1 except that the compound (DD') was substituted for the compound (B) employed therein.

Example II-33

A homopolymer (EE'1) was obtained by repeating the same procedures as described in Example II-1 except that the compound (EE') was substituted for the compound (B) employed therein.

Example II-34

A homopolymer (FF'1) was obtained by repeating the same procedures as described in Example II-1 except that the compound (FF') was substituted for the compound (B) employed therein.

Example II-35

A homopolymer (BB"1) was obtained by repeating the same procedures as described in Example II-1 except that the compound (BB") was substituted for the compound (B) employed therein.

Example II-36

A homopolymer (CC"1) was obtained by repeating the same procedures as described in Example II-1 except that the compound (CC") was substituted for the compound (B) employed therein.

Example II-37

A homopolymer (DD"1) was obtained by repeating the same procedures as described in Example II-1 except that the compound (DD") was substituted for the compound (B) employed therein.

Example II-38

A homopolymer (EE"1) was obtained by repeating the same procedures as described in Example II-1 except that the compound (EE") was substituted for the compound (B) employed therein.

Example II-39

A homopolymer (FF"1) was obtained by repeating the same procedures as described in Example II-1 except that the compound (FF") was substituted for the compound (B) employed therein.

Example II-40

A homopolymer (BB"'1) was obtained by repeating the same procedures as described in Example II-1 except that the compound (BB"') was substituted for the compound (B) employed therein.

Example II-41

A homopolymer (CC"'1) was obtained by repeating the same procedures as described in Example II-1 except that the compound (CC"') was substituted for the compound (B) employed therein.

Example II-42

A homopolymer (DD"'1) was obtained by repeating the same procedures as described in Example II-1 except that the compound (DD"') was substituted for the compound (B) employed therein.

Example II-43

A homopolymer (EE"'1) was obtained by repeating the same procedures as described in Example II-1 except that the compound (EE"') was substituted for the compound (B) employed therein.

Example II-44

A homopolymer (FF"'1) was obtained by repeating the same procedures as described in Example II-1 except that the compound (FF"') was substituted for the compound (B) employed therein.

Example II-45

A homopolymer (H1) was obtained by repeating the same procedures as described in Example II-1 except that the compound (H) was substituted for the compound (B) employed therein.

Example II-46

A homopolymer (I1) was obtained by repeating the same procedures as described in Example II-1 except that the compound (I) was substituted for the compound (B) employed therein.

Example II-47

A homopolymer (J1) was obtained by repeating the same procedures as described in Example II-1 except that the compound (J) was substituted for the compound (B) employed therein.

Example II-48

A homopolymer (K1) was obtained by repeating the same procedures as described in Example II-1 except that the compound (K) was substituted for the compound (B) employed therein.

Example II-49

A homopolymer (L1) was obtained by repeating the same procedures as described in Example II-1 except that the compound (L) was substituted for the compound (B) employed therein.

Example II-50

A homopolymer (H'1) was obtained by repeating the same procedures as described in Example II-1 except that the compound (H') was substituted for the compound (B) employed therein.

Example II-51

A homopolymer (I'1) was obtained by repeating the same procedures as described in Example II-1 except that the compound (I') was substituted for the compound (B) employed therein.

Example II-52

A homopolymer (J'1) was obtained by repeating the same procedures as described in Example II-1 except that the compound (J') was substituted for the compound (B) employed therein.

Example II-53

A homopolymer (K'1) was obtained by repeating the same procedures as described in Example II-1 except that the compound (K') was substituted for the compound (B) employed therein.

Example II-54

A homopolymer (L'1) was obtained by repeating the same procedures as described in Example II-1 except that the compound (L') was substituted for the compound (B) employed therein.

Example II-55

A homopolymer (H"1) was obtained by repeating the same procedures as described in Example II-1 except that the compound (H") was substituted for the compound (B) employed therein.

Example II-56

A homopolymer (I"1) was obtained by repeating the same procedures as described in Example II-1 except that the compound (I") was substituted for the compound (B) employed therein.

Example II-57

A homopolymer (J"1) was obtained by repeating the same procedures as described in Example II-1 except that the compound (J") was substituted for the compound (B) employed therein.

Example II-58

A homopolymer (K"1) was obtained by repeating the same procedures as described in Example II-1 except that the compound (K") was substituted for the compound (B) employed therein.

Example II-59

A homopolymer (L"1) was obtained by repeating the same procedures as described in Example II-1 except that the compound (L") was substituted for the compound (B) employed therein.

Example II-60

A homopolymer (H'"1) was obtained by repeating the same procedures as described in Example II-1 except that the compound (H'") was substituted for the compound (B) employed therein.

Example II-61

A homopolymer (I'"1) was obtained by repeating the same procedures as described in Example II-1 except that the compound (I'") was substituted for the compound (B) employed therein.

Example II-62

A homopolymer (J'"1) was obtained by repeating the same procedures as described in Example II-1 except that the compound (J'") was substituted for the compound (B) employed therein.

Example II-63

A homopolymer (K'"1) was obtained by repeating the same procedures as described in Example II-1 except that the compound (K'") was substituted for the compound (B) employed therein.

Example II-64

A homopolymer (L'"1) was obtained by repeating the same procedures as described in Example II-1 except that the compound (L'") was substituted for the compound (B) employed therein.

Example II-65

A homopolymer (MMf1) was obtained by repeating the same procedures as described in Example II-1 except that the compound (MMf) was substituted for the compound (B) employed therein.

Example II-66

A homopolymer (NNf1) was obtained by repeating the same procedures as described in Example II-1 except that the compound (NNf) was substituted for the compound (B) employed therein.

Example II-67

A homopolymer (OOf1) was obtained by repeating the same procedures as described in Example II-1 except that the compound (OOf) was substituted for the compound (B) employed therein.

Example II-68

A homopolymer (PPf1) was obtained by repeating the same procedures as described in Example II-1 except that the compound (PPf) was substituted for the compound (B) employed therein.

Each of the aforementioned homopolymers was formed into a PGMEA solution, and each of the solutions was coated on the surface of $MgF_2$ wafer to a thickness of 1 μm, thereby forming a resin layer. Each of the resin layers was investigated with respect to the transparency thereof to $F_2$ excimer laser beam (157 nm). The results thus obtained are summarized in the following Tables 2 to 4.

A photo-acid generating agent was incorporated in each of the homopolymers to prepare various varnish of the photo-sensitive resin compositions (resists) of the present invention. Then, the varnishes of these resists were respectively spin-coated on the surface of silicon wafer to form a resist film having a thickness of 0.3 μm. Then, each of the resist films was subjected to an exposure of a predetermined pattern by using an $F_2$ excimer laser beam 157 nm in wavelength. Thereafter, each of the resist films was subjected to a baking treatment for 2 minutes at a temperature of 110° C. and then, to a dipping treatment using a 2.38 wt % aqueous solution of tetramethyl ammonium hydroxide (TMAH) to selectively dissolve and remove the exposure portions of the resist film, thus forming a positive resist pattern, respectively. The sensitivity and resolution of each of the resist films as well as the photo-acid generating agents employed in this case are summarized in Tables 2 to 4.

Further, each of the resists comprising these homopolymers was measured with respect to the rate of the etching using $CF_4$ plasma to evaluate the dry etching resistance of each of the resists. The results obtained are summarized in Tables 2 to 4 wherein the dry etching resistance is indicated as a relative value based on the etching resistance of polymethyl methacrylate.

COMPARATIVE EXAMPLE 1

In place of the homopolymer (B1), novolac resin and polymethyl methacrylate were respectively formed into a PGMEA solution thereof, the resultant PGMEA solutions being defined as Comparative Example 1 and Comparative Example 2, respectively.

The solutions of Comparative Examples 1 and 2 were respectively coated on the surface of $MgF_2$ wafer to a thickness of 1 μm to form a resist film, and the transparency of the resist film to an $F_2$ excimer laser beam was investigated, the results thus obtained being summarized in the following Table 4.

TABLE 2

| Homopolymer | Transmissivity (1 μm) | Etching resistance (relative vaule) | Photo-acid generating agent (Midori Kagaku Co.) | Sensitivity (mJ/cm$^2$) | Resolution (nm) |
|---|---|---|---|---|---|
| B1 | 43% | 0.9 | TPS-105(1%) | 5 | 70 |
| C1 | 53% | 0.9 | NAT-105(1%) | 4 | 70 |
| D1 | 47% | 0.9 | NAT-103(1%) | 6 | 60 |
| E1 | 51% | 0.9 | NAI-105(1%) | 3 | 50 |
| F1 | 62% | 0.9 | TPS-109(1%) | 2 | 60 |
| B'1 | 51% | 0.9 | TPS-105(1%) | 6 | 50 |
| C'1 | 69% | 0.9 | TPS-105(1%) | 2 | 50 |
| D'1 | 62% | 0.9 | TPS-109(1%) | 3 | 60 |
| E'1 | 48% | 0.9 | TPS-109(1%) | 3 | 70 |
| F'1 | 45% | 0.9 | NAT-103(1%) | 2 | 70 |
| B"1 | 51% | 0.9 | NAT-105(1%) | 4 | 70 |
| C"1 | 69% | 0.9 | NAT-105(1%) | 4 | 70 |
| D"1 | 62% | 0.9 | NAI-105(1%) | 3 | 80 |
| E"1 | 48% | 0.9 | TPS-109(1%) | 3 | 60 |
| F"1 | 45% | 0.9 | TPS-109(1%) | 5 | 70 |
| B'"1 | 51% | 0.9 | TPS-105(1%) | 2 | 60 |
| C'"1 | 69% | 0.9 | TPS-109(1%) | 3 | 80 |
| D'"1 | 62% | 0.9 | NAT-105(1%) | 3 | 70 |
| E'"1 | 48% | 0.9 | NAI-105(1%) | 4 | 60 |
| F'"1 | 45% | 0.9 | NAI-105(1%) | 2 | 60 |
| Mf1 | 69% | 0.9 | NAT-103(1%) | 2 | 70 |
| Nf1 | 62% | 0.9 | TPS-109(1%) | 3 | 50 |
| Of1 | 48% | 0.9 | TPS-105(1%) | 2 | 70 |
| Pf1 | 45% | 0.9 | NAT-103(1%) | 3 | 60 |

TABLE 3

| Homopolymer | Transmissivity (1 μm) | Etching resistance (relative vaule) | Photo-acid generating agent (Midori Kagaku Co.) | Sensitivity (mJ/cm$^2$) | Resolution (nm) |
|---|---|---|---|---|---|
| BB1 | 43% | 0.9 | TPS-105(1%) | 1 | 50 |
| CC1 | 53% | 0.9 | TPS-105(1%) | 2 | 50 |
| DD1 | 47% | 0.9 | TPS-109(1%) | 1 | 50 |

TABLE 3-continued

| Homopolymer | Transmissivity (1 μm) | Etching resistance (relative vaule) | Photo-acid generating agent (Midori Kagaku Co.) | Sensitivity (mJ/cm²) | Resolution (nm) |
|---|---|---|---|---|---|
| EE1 | 51% | 0.9 | TPS-109(1%) | 1 | 50 |
| FF1 | 62% | 0.9 | NAT-103(1%) | 3 | 60 |
| BB'1 | 51% | 0.9 | NAT-103(1%) | 3 | 60 |
| CC'1 | 69% | 0.9 | NAT-103(1%) | 4 | 50 |
| DD'1 | 62% | 0.9 | NAT-105(1%) | 4 | 60 |
| EE'1 | 48% | 0.9 | NAT-105(1%) | 3 | 70 |
| FF'1 | 45% | 0.9 | NAT-105(1%) | 3 | 80 |
| BB"1 | 51% | 0.9 | NAI-105(1%) | 3 | 70 |
| CC"1 | 69% | 0.9 | NAI-105(1%) | 4 | 70 |
| DD"1 | 62% | 0.9 | TPS-105(1%) | 1 | 50 |
| EE"1 | 48% | 0.9 | TPS-109(1%) | 1 | 50 |
| FF"1 | 45% | 0.9 | TPS-105(1%) | 2 | 50 |
| BB'"1 | 51% | 0.9 | TPS-109(1%) | 1 | 50 |
| CC'"1 | 69% | 0.9 | TPS-105(1%) | 2 | 50 |
| DD'"1 | 62% | 0.9 | TPS-105(1%) | 2 | 60 |
| EE'"1 | 48% | 0.9 | TPS-105(1%) | 2 | 70 |
| FF'"1 | 45% | 0.9 | TPS-109(1%) | 2 | 70 |

TABLE 4

| Homopolymer | Transmissivity (1 μm) | Etching resistance (relative vaule) | Photo-acid generating agent (Midori Kagaku Co.) | Sensitivity (mJ/cm²) | Resolution (nm) |
|---|---|---|---|---|---|
| H1 | 43% | 0.9 | TPS-105(1%) | 2 | 60 |
| I1 | 53% | 0.9 | TPS-105(1%) | 2 | 60 |
| J1 | 47% | 0.9 | TPS-109(1%) | 2 | 50 |
| K1 | 51% | 0.9 | NDS-105(1%) | 4 | 70 |
| L1 | 62% | 0.9 | DAM-301(1%) | 5 | 80 |
| H'1 | 51% | 0.9 | SI-105(1%) | 4 | 80 |
| I'1 | 69% | 0.9 | NDI-105(1%) | 3 | 90 |
| J'1 | 62% | 0.9 | EPI-105(1%) | 4 | 70 |
| K'1 | 48% | 0.9 | PI-105(1%) | 5 | 70 |
| L'1 | 45% | 0.9 | TPS-105(1%) | 2 | 50 |
| H"1 | 51% | 0.9 | TPS-109(1%) | 2 | 60 |
| I"1 | 69% | 0.9 | TPS-109(1%) | 1 | 60 |
| J"1 | 62% | 0.9 | TPS-105(1%) | 1 | 70 |
| K"1 | 48% | 0.9 | TPS-105(1%) | 2 | 50 |
| L"1 | 45% | 0.9 | TPS-105(1%) | 2 | 50 |
| H'"1 | 51% | 0.9 | NAT-105(1%) | 3 | 70 |
| I'"1 | 69% | 0.9 | NAT-105(1%) | 4 | 80 |
| J'"1 | 62% | 0.9 | TPS-105(1%) | 2 | 80 |
| K'"1 | 48% | 0.9 | TPS-105(1%) | 2 | 70 |
| L'"1 | 45% | 0.9 | TPA-105(1%) | 2 | 60 |
| MMf1 | 69% | 0.9 | NAT-103(1%) | 3 | 60 |
| NNf1 | 62% | 0.9 | NAT-103(1%) | 4 | 70 |
| OOf1 | 48% | 0.9 | NAT-105(1%) | 4 | 70 |
| PPf1 | 45% | 0.9 | NAI-105(1%) | 5 | 80 |
| Comparative Example 1 | $10^{-28}$% | 3.9 | — | — | — |
| Comparative Example 2 | 0.1% | 1 | — | — | — |

As shown in Tables 2 to 4, the polymer compounds for forming photoresist according to the present invention, and each polymer compound having an alicyclic skeleton and halogen atom, were all excellent in transmissivity to a laser beam 157 nm in wavelength. Whereas, the aforementioned novolac resin (Comparative Example 1) and PMMA (Comparative Example 2) were apparently very poor in transmissivity to a laser beam 157 nm in wavelength.

Furthermore, the photosensitive resin compositions according to the present invention wherein a photo-acid generating agent was incorporated in each of the aforementioned polymer compounds for photoresist were all high in sensitivity and capable of forming a pattern excellent in resolution. Moreover, the photosensitive resin compositions according to the present invention were all confirmed excellent in dry etching resistance.

(Synthesis of Comparative Acrylate Polymer)

By using AIBN (10 mol %) as an initiator, 0.6 mol of adamantly acrylate P and 0.4 mol of tetrahydropyranyl methacrylate were allowed to react with each other in THF for 40 hours to obtain a reaction mixture, which was then dropped into hexane to obtain the comparative acrylate polymer Q.

(Synthesis of Comparative Ester Oligomer)

0.05 mol of adamantane dicarbonyl chloride was dissolved in THF to obtain a solution, to which 0.05 mol of methane diol was added to obtain a mixed solution. While maintaining the temperature of the mixed solution at room temperature, 0.1 mol of a solution of triethyl amine in THF was gradually added dropwise to the mixed solution with stirring. Then, the resultant mixed solution was stirred for two hours and further stirred for two hours at room temperature, which was followed by the filteration of the reaction mixture. The filtrate was gradually dropped into water to obtain sediment, which was further allowed to reprecipitate by using a water-acetone-based solvent, thereby obtaining the comparative ester oligomer R.

(Preparation of Resists and Formation of Resist Patterns)

The polymer compounds obtained in the aforementioned Examples, a dissolution-inhibiting agent and a photo-acid generating agent selected from TPS-105, TPS-109 and NAI-105 (all, Midori Kagaku Co., Ltd.) were dissolved in cyclohexanone or PGMEA to prepare various varnish of the photosensitive resin compositions (resists) of the present invention.

TABLE 5

| Resist No. | Copolymer No. | Photo-acid generating agent (Midori Kagaku Co.) | Solubility inhibitor |
|---|---|---|---|
| 1 | 1 | TPS-109(1%) | — |
| 2 | 2 | NAI-105(1%) | — |
| 3 | 3 | TPS-105(1%) | bis t-butoxycarbonyl cyclohexane |
| 4 | 4 | TPS-109(1%) | tetrahydropyranyl cyclohexylcaroxylate |
| 5 | 5 | NAI-105(1%) | tetrahydropyranyl adamantylcaroxylate |
| 6 | 6 | TPS-105(1%) | t-butyl adamantylcaroxylate |
| 7 | 7 | TPS-109(1%) | methoxyethoxybutyl adamantylcaroxylate |
| 8 | 8 | NAI-105(1%) | butoxyethyl adamantylcaroxylate |
| 9 | 9 | TPS-105(1%) | methoxyethoxymethyl adamantylcaroxylate |
| 10 | 10 | TPS-109(1%) | tetrahydropyranyl norbornylcaroxylate |
| 11 | 11 | NAI-105(1%) | t-butyl norbornylcaroxylate |
| 12 | 12 | TPS-105(1%) | butoxyethyl norbornylcaroxylate |
| 13 | 13 | TPS-109(1%) | methoxyethoxyethyl norbornylcaroxylate |
| 14 | 14 | NAI-105(1%) | methoxyethyl norbornylcaroxylate |
| 15 | 15 | TPS-105(1%) | tetrahydrofuranyl norbornylcaroxylate |
| 16 | 16 | TPS-109(1%) | bis t-butoxycarbonyl adamantane |
| 17 | 17 | NAT-105(1%) | bis t-butoxycarbonyl norbornane |
| 18 | 18 | TPS-105(1%) | bistetrahydropyranyloxycarbonyl adamantane |
| 19 | 19 | TPS-109(1%) | bistetrahydropyranyloxycarbonyl norbornane |
| 20 | 20 | NAI-105(1%) | bistetrahydropyranyloxycarbonyl cyclohexane |
| 21 | 21 | TPS-105(1%) | bistetrahydropyranyloxycarbonyl cyclopentane |
| 22 | 22 | TPS-109(1%) | bistetrahydroalanyloxycarbonyl adamantane |
| 23 | 23 | NAI-105(1%) | bistetrahydroalanyloxycarbonyl norbornane |
| 24 | 24 | TPS-105(1%) | bistetrahydroalanyloxycarbonyl cyclohexane |
| 25 | 25 | TPS-109(1%) | Bistetrahydroalanyloxycarbonyl cyclopentane |

TABLE 6

| Resist No. | Copolymer No. | Photo-acid generating agent (Midori Kagaku Co.) | Solubility inhibitor |
|---|---|---|---|
| 26 | 26 | TPS-109(1%) | — |
| 27 | 27 | NAI-105(1%) | t-butoxycarbonyl phenol |
| 28 | 28 | TPS-105(1%) | t-butoxycarbonyl methylphenol |
| 29 | 29 | TPS-109(1%) | tetrahydropyranyloxycarbonyl methylphenol |
| 30 | 30 | NAI-105(1%) | tetrahydrofranyloxycarbonyl methylphenol |
| 31 | 31 | TPS-105(1%) | methoxyethoxymethoxycarbonyl methylphenol |
| 32 | 32 | TPS-109(1%) | methoxyethoxycarbonyl methylphenol |
| 33 | 33 | NAI-105(1%) | bis t-butoxylcarbonyl naphthol |
| 34 | 34 | TPS-105(1%) | t-butyl cholate |
| 35 | 35 | TPS-109(1%) | tetrahydropyranyl cholate |
| 36 | 36 | NAI-105(1%) | Tetrahydrofuranyl cholate |
| 37 | 37 | TPS-105(1%) | butoxyethyl cholate |
| 38 | 38 | TPS-109(1%) | methoxyethylmethyl cholate |
| 39 | 39 | NAI-105(1%) | propyloxyethyl cholate |
| 40 | 40 | TPS-105(1%) | ethoxyethyl cholate |
| 41 | 41 | TPS-109(1%) | methoxyethyl cholate |
| 42 | 42 | NAT-105(1%) | geraniol |
| 43 | 43 | TPS-105(1%) | — |
| 44 | 44 | TPS-109(1%) | — |
| 45 | 45 | NAI-105(1%) | — |
| 46 | 46 | TPS-105(1%) | — |
| 47 | 47 | TPS-109(1%) | — |
| 48 | 48 | NAI-105(1%) | — |
| 49 | 49 | TPS-105(1%) | — |
| 50 | 50 | TPS-109(1%) | — |

TABLE 7

| Resist No. | Copolymer No. | Photo-acid generating agent (Midori Kagaku Co.) | Solubility inhibitor |
|---|---|---|---|
| 51 | 51 | NAI-105(1%) | — |
| 52 | 52 | TPS-105(1%) | — |
| 53 | 53 | TPS-109(1%) | — |
| 54 | 54 | NAI-105(1%) | — |
| 55 | 55 | TPS-105(1%) | — |
| 56 | 56 | TPS-109(1%) | — |
| 57 | 57 | NAI-105(1%) | — |
| 58 | 58 | TPS-105(1%) | — |
| 59 | 59 | TPS-109(1%) | — |
| 60 | 60 | NAI-105(1%) | — |
| 61 | 61 | TPS-105(1%) | — |
| 62 | 62 | TPS-109(1%) | — |
| 63 | 63 | NAI-105(1%) | — |
| 64 | 64 | TPS-105(1%) | — |
| 65 | 65 | TPS-109(1%) | — |
| 66 | 66 | NAI-105(1%) | — |
| 67 | 67 | TPS-105(1%) | — |
| 68 | 68 | TPS-109(1%) | — |
| 69 | 79 | NAI-105(1%) | — |
| 70 | 70 | TPS-105(1%) | — |
| 71 | 71 | TPS-109(1%) | — |
| 72 | 72 | NAI-105(1%) | — |
| 73 | 73 | TPS-105(1%) | — |
| 74 | 74 | TPS-109(1%) | — |
| 75 | 75 | TPS-105(1%) | — |

TABLE 8

| Resist No. | Copolymer No. | Photo-acid generating agent (Midori Kagaku Co.) | Solubility inhibitor |
|---|---|---|---|
| 76 | 76 | TPS-105(1%) | — |
| 77 | 77 | TPS-109(1%) | — |
| 78 | 78 | NAI-105(1%) | — |
| 79 | 79 | TPS-105(1%) | — |
| 80 | 80 | TPS-109(1%) | — |
| 81 | 81 | NAI-105(1%) | — |
| 82 | 82 | TPS-105(1%) | — |
| 83 | 83 | TPS-109(1%) | — |
| 84 | 84 | NAI-105(1%) | — |
| 85 | 85 | TPS-105(1%) | — |
| 86 | 86 | TPS-109(1%) | — |
| 87 | 87 | NAI-105(1%) | — |
| 88 | 88 | TPS-105(1%) | — |
| 89 | 89 | TPS-109(1%) | — |
| 90 | 90 | NAT-105(1%) | — |
| 91 | 91 | TPS-105(1%) | — |
| 92 | 92 | TPS-109(1%) | — |
| 93 | 93 | NAI-105(1%) | — |
| 94 | 94 | TPS-105(1%) | — |
| 95 | 95 | TPS-109(1%) | — |
| 96 | 96 | NAI-105(1%) | — |
| 97 | 97 | TPS-105(1%) | — |
| 98 | 98 | TPS-109(1%) | — |
| 99 | 99 | NAI-105(1%) | — |
| 100 | 100 | NAI-105(1%) | — |

TABLE 9

| Resist No. | Copolymer No. | Photo-acid generating agent (Midori Kagaku Co.) | Solubility inhibitor |
|---|---|---|---|
| 101 | 101 | TPS-105 (1%) | — |
| 102 | 102 | TPS-109 (1%) | — |
| 103 | 103 | NAI-105 (1%) | — |
| 104 | 104 | TPS-105 (1%) | — |
| 105 | 105 | TPS-109 (1%) | — |
| 106 | 106 | NAI-105 (1%) | — |
| 107 | 107 | TPS-105 (1%) | — |
| 108 | 108 | TPS-109 (1%) | — |
| 109 | 109 | NAI-105 (1%) | — |
| 110 | 110 | TPS-105 (1%) | — |
| 111 | 111 | TPS-105 (1%) | — |
| 112 | 112 | TPS-109 (1%) | — |
| 113 | 113 | NAI-105 (1%) | — |
| 114 | 114 | TPS-105 (1%) | — |
| 115 | 115 | TPS-109 (1%) | — |
| 116 | 116 | NAI-105 (1%) | — |
| 117 | 117 | TPS-105 (1%) | — |
| 118 | 118 | TPS-109 (1%) | — |
| 119 | 119 | NAI-105 (1%) | — |
| 120 | 120 | TPS-105 (1%) | — |
| 121 | 121 | TPS-105 (1%) | — |

On the other hand, TPS-105 was incorporated as a photo-acid generating agent into each of the aforementioned comparative polymers according to the prescription shown in the following Table 10 to prepare the varnishes of Comparative Examples 3 and 4.

TABLE 10

| | Polymers | Photo-acid generating agent (Midori Kagaku Co., Ltd.) |
|---|---|---|
| Comp. Ex. 3 | Comparative Polymer R | TPS-105 (1%) |
| Comp. Ex. 4 | Comparative Oligomer Q | TPS-105 (1%) |

Then, each varnish of these resists was spin-coated on the surface of a silicon wafer to form a resin film having a thickness of 0.3 $\mu$m. Then, each of the resist films was subjected to an exposure of a predetermined pattern by using an $F_2$ excimer laser beam 157 nm in wavelength. Thereafter, each of the resist films was subjected to a baking treatment for 2 minutes at a temperature of 110° C. and then, to a dipping treatment using a 2.38 wt % aqueous solution of tetramethyl ammonium hydroxide (TMAH) to selectively dissolve and remove the exposure portions of the resist film, thus forming a positive resist pattern, respectively. The sensitivity and resolution of each of the resist films are summarized in Tables 11 to 15.

TABLE 11

| Resist No. | Resolution (nm) | Sensitivity ($mJ/cm^2$) |
|---|---|---|
| 1 | 70 | 2 |
| 2 | 70 | 2 |
| 3 | 60 | 1 |
| 4 | 70 | 1 |
| 5 | 70 | 2 |
| 6 | 80 | 1 |
| 7 | 90 | 1 |

TABLE 11-continued

| Resist No. | Resolution (nm) | Sensitivity (mJ/cm$^2$) |
|---|---|---|
| 8 | 60 | 2 |
| 9 | 70 | 1 |
| 10 | 70 | 1 |
| 11 | 90 | 2 |
| 12 | 70 | 1 |
| 13 | 50 | 3 |
| 14 | 80 | 2 |
| 15 | 60 | 2 |
| 16 | 70 | 1 |
| 17 | 60 | 3 |
| 18 | 80 | 3 |
| 19 | 70 | 2 |
| 20 | 60 | 1 |
| 21 | 80 | 1 |
| 22 | 70 | 2 |
| 23 | 80 | 2 |
| 24 | 60 | 2 |
| 25 | 70 | 3 |

TABLE 12

| Resist No. | Resolution (nm) | Sensitivity (mJ/cm$^2$) |
|---|---|---|
| 26 | 70 | 2 |
| 27 | 70 | 1 |
| 28 | 60 | 1 |
| 29 | 70 | 2 |
| 30 | 70 | 2 |
| 31 | 80 | 4 |
| 32 | 90 | 5 |
| 33 | 60 | 3 |
| 34 | 70 | 2 |
| 35 | 70 | 1 |
| 36 | 90 | 2 |
| 37 | 70 | 2 |
| 38 | 50 | 1 |
| 39 | 80 | 1 |
| 40 | 60 | 3 |
| 41 | 70 | 2 |
| 42 | 60 | 1 |
| 43 | 80 | 1 |
| 44 | 70 | 2 |
| 45 | 60 | 3 |
| 46 | 80 | 2 |
| 47 | 70 | 1 |
| 48 | 80 | 2 |
| 49 | 60 | 1 |
| 50 | 70 | 1 |

TABLE 13

| Resist No. | Resolution (nm) | Sensitivity (mJ/cm$^2$) |
|---|---|---|
| 51 | 70 | 1 |
| 52 | 60 | 2 |
| 53 | 80 | 2 |
| 54 | 60 | 3 |
| 55 | 70 | 3 |
| 56 | 60 | 2 |
| 57 | 70 | 2 |
| 58 | 60 | 3 |
| 69 | 80 | 4 |
| 60 | 60 | 3 |
| 61 | 70 | 2 |
| 62 | 80 | 3 |
| 63 | 60 | 2 |
| 64 | 70 | 2 |
| 65 | 80 | 2 |
| 66 | 70 | 1 |

TABLE 13-continued

| Resist No. | Resolution (nm) | Sensitivity (mJ/cm$^2$) |
|---|---|---|
| 67 | 80 | 3 |
| 68 | 70 | 3 |
| 69 | 60 | 3 |
| 70 | 70 | 1 |
| 71 | 60 | 1 |
| 72 | 60 | 1 |
| 73 | 60 | 2 |
| 74 | 70 | 4 |
| 75 | 60 | 3 |

TABLE 14

| Resist No. | Resolution (nm) | Sensitivity (mJ/cm$^2$) |
|---|---|---|
| 76 | 70 | 2 |
| 77 | 60 | 2 |
| 78 | 80 | 3 |
| 79 | 70 | 3 |
| 80 | 60 | 5 |
| 81 | 70 | 4 |
| 82 | 60 | 2 |
| 83 | 60 | 1 |
| 84 | 60 | 1 |
| 85 | 70 | 3 |
| 86 | 60 | 3 |
| 87 | 80 | 1 |
| 88 | 70 | 1 |
| 89 | 80 | 2 |
| 90 | 60 | 2 |
| 91 | 70 | 3 |
| 92 | 80 | 2 |
| 93 | 60 | 4 |
| 94 | 70 | 2 |
| 95 | 60 | 3 |
| 96 | 60 | 1 |
| 97 | 60 | 1 |
| 98 | 70 | 2 |
| 99 | 60 | 2 |
| 100 | 60 | 3 |

TABLE 15

| Resist No. | Resolution (nm) | Sensitivity (mJ/cm$^2$) |
|---|---|---|
| 101 | 70 | 3 |
| 102 | 60 | 2 |
| 103 | 60 | 4 |
| 104 | 60 | 3 |
| 105 | 70 | 3 |
| 106 | 60 | 1 |
| 107 | 80 | 1 |
| 108 | 70 | 1 |
| 109 | 80 | 2 |
| 110 | 60 | 2 |
| 111 | 70 | 3 |
| 112 | 60 | 2 |
| 113 | 60 | 4 |
| 114 | 60 | 3 |
| 115 | 70 | 3 |
| 116 | 60 | 1 |
| 117 | 80 | 1 |
| 118 | 70 | 1 |
| 119 | 80 | 2 |
| 120 | 60 | 2 |
| 121 | 70 | 2 |

As shown in Tables 11 to 15, the resists according to the present invention were all capable of forming a resist pattern with high sensitivity and excellent resolution, and were also excellent in transparency to the light of 157 nm in wavelength as well as in alkali-developing properties. On the other hand, the resists of Comparative Examples 3 and 4 were incapable of forming a resist pattern with excellent resolution. Furthermore, the resist patterns formed by using the resists of Comparative Examples were accompanied with the problem that they were liable to be easily peeled away from the surface of the substrate.

Then, these resists were exposed to $CF_4$ plasma so as to measure the etching rate thereof, thus investigating the dry etching resistance thereof. In this case, the dry etching resistance of all of these resists was evaluated in comparison with the etching rate of the resist where polyhydroxystyrene resin was employed as a base resin and which was defined as 1.0. As a result, the etching rate of Comparative Example 3 was 1.0–1.3 in general, and the etching rate of Comparative Example 4 was 1.4–1.6 in general, thus indicating undesirable values. Whereas, the etching rate of the resists according to the present invention was all confined within the range of 0.9 to 1.2, thus confirming high dry etching resistance of all of the resists of the present invention.

Additionally, polymers (CP-1), (CP-2) and (CP-3) represented by the following chemical formulas were prepared as comparative polymers, and the properties thereof were studied.

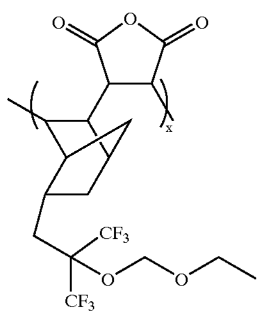

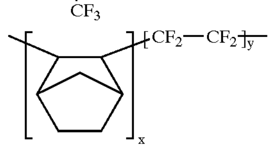

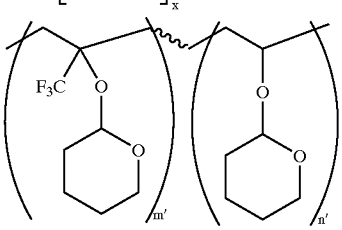

In the case of the polymer (CP-1), the main chain thereof includes an alicyclic moiety, and the carbon atom to which trifluoromethyl group is linked is bonded, not directly but through a methylene group, to this alicyclic moiety. As a result, the alicyclic moiety is spaced away from the fluorine atom, thus forming a structure having an elongated side chain. Accordingly, the Tg of this polymer is expected to be low.

Since a post-exposure baking is required to be performed at a higher temperature than the Tg on the occasion of forming a pattern, it may become impossible to perform the formation of pattern if the Tg is too low. Therefore, the Tg of polymer is required to be high to some degree.

On the other hand, the polymer (CP-2) is formed of a copolymer consisting of a monomer containing an alicyclic moiety and a monomer containing fluorine atom. Namely, the alicyclic moiety and the fluorine atom are respectively included in separate monomers. Therefore, since the alicyclic skeleton is not provided with a polar group, the characteristics of the alicyclic skeleton, i.e. the hydrophobicity thereof would be prominently manifested, thus the coating properties of the varnish of the resist having the aforementioned polymer incorporated therein is expected to be poor.

Further, in the case of the polymer (CP-3), since the alicyclic skeleton included therein is limited to one constituted by five carbon atoms, the dry etching resistance of the varnish of the resist having the aforementioned polymer incorporated therein is expected to be poor.

By contrast, since the polymer compound for photoresist according to the present invention is high in Tg, the soft baking (post-exposure heating) can be performed without raising any problems, and therefore, the polymer compound for photoresist according to the present invention is advantageous in this respect. Moreover, the photosensitive resin composition according to the present invention is excellent in coating properties and high in dry etching resistance. As already explained above, it is possible, through the employment of the photosensitive resin composition according to the present invention, to form a resist pattern with high sensitivity and excellent resolution.

The homopolymer of a chlorovinyl compound, a bromovinyl compound, a fluorovinyl compound or a cyanovinyl compound as well as the copolymer comprising any of these compounds can be synthesized, for instance, by radical polymerization employing azoisobutylonitrile, etc. The homopolymer of a hydrocarbon compound or a diene-based compound as well as the copolymer comprising any of these compounds can be synthesized, for instance, by anionic polymerization employing alkyl lithium, etc. The homopolymer of a vinyl ether compound as well as the copolymer comprising the vinyl ether compound can be synthesized, for instance, by cationic polymerization employing zinc chloride, etc. The homopolymer of olefin as well as the copolymer comprising the olefin can be synthesized, for instance, by coordination polymerization employing a metallocene-type Ziegler-Natta catalyst such as Kaminsky catalyst, etc. The homopolymer of an epoxy compound, as well as the copolymer comprising the epoxy compound, can be synthesized, for instance, by ring-opening polymerization employing an aluminum porphyrin complex, etc.

Sulfonyl compounds, etc. can be fluorinated by using tetramethylsilyl trifluoromethane, diethylaminosulfur trifluoride, etc.

In this case, the compounds represented by the following general formula (3D), for example, would be produced as an intermediate. It is possible, from these compounds, to synthesize the polymer compound for photoresist of the present invention according to the aforementioned procedures.

(3D)

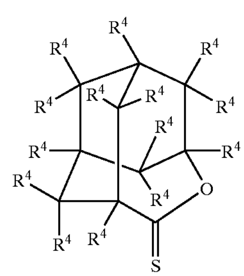

(wherein at least one of $R^{x3}$s is a fluorine atom or monovalent organic group comprising a fluorine atom, the residual $R^{x3}$s being the same or different and being individually a hydrogen atom or monovalent organic group; and $R^4$s may be the same or different and are individually a hydrogen atom or monovalent organic group; with the proviso that one or two of the $R^{x3}$s and the $R^4$s are formed of a bonding hand).

MONOMER-SYNTHESIZING EXAMPLE 1

12.4 g of 5-norbornene-2-methanol or a compound represented by the following chemical formula (NBOH) was placed in a tree-necked flask which was provided with a dropping funnel, a stirrer and a reflux condenser. Thereafter, 12 g of sodium bromide was added to the aforementioned compound to obtain a mixture.

(NBOH)

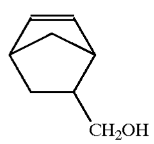

Thereafter, 6 g of sulfuric acid was added dropwise to the aforementioned mixture being stirred and reacted for 3 hours at a temperature of 90° C. As a result, methylnorbornene bromide or a compound represented by the following chemical formula (NBBr) was obtained at a yield of 83%.

(NBBr)

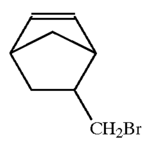

1.25 g of granular magnesium, and 80 mL of dry ether were placed in a tree-necked flask which was provided with a dropping funnel, a stirrer and a reflux condenser. Thereafter, 100 mL of a 0.5 mol/L solution of the aforementioned methylnorbornene bromide in dry ether was gradually added dropwise to the granular magnesium with stirring. After finishing the addition of all of the methylnorbornene bromide, 25 mL of a 2 mol/L solution of acetaldehyde fluoride in dry ether was slowly added thereto with stirring to obtain a reaction mixture.

After being refluxed for one hour, the resultant reaction mixture was poured into an aqueous solution of ammonium chloride with ice being intermingled therein. Thereafter, a norbornene derivative represented by the following chemical formula (NB-1) was obtained from the ether phase formed therein.

(NB-1)

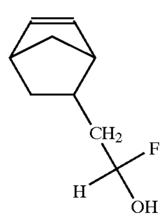

The compound obtained in this manner and represented by the chemical formula (NB-1) is featured in that the fluorine atom thereof is directly bonded to the α carbon of the active hydroxyl group.

MONOMER-SYNTHESIZING EXAMPLE 2

Thionyl chloride was added to a solution of the aforementioned norbornene derivative (NB-1) in ether, and the resultant solution was heated to obtain a chloride of the corresponding structure. Then, tertiary butyl alcohol was added dropwise to the aforementioned chloride to obtain an ester of a norbornene derivative represented by the following chemical formula (NB-1e).

(NB-1e)

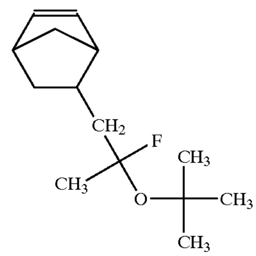

The compound obtained in this manner and represented by the chemical formula (NB-1e) is featured in that the fluorine atom thereof is directly bonded to the α carbon of the active hydroxyl group.

MONOMER-SYNTHESIZING EXAMPLE 3

A solution of a compound represented by the following chemical formula (NBPr) or 2-hydroxynorbornyl propene in acetnitrile was placed in a tree-necked flask provided with a dropping funnel, a stirrer and a reflux condenser. Thereafter, triphenylphosphine dibromide was added to the aforementioned solution to obtain a mixed solution.

(NBPr)

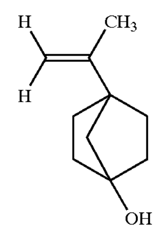

Thereafter, the mixed solution was stirred for 24 hours at room temperature to obtain norbornylpropene bromide represented by the following chemical formula (NBPrBr) at a yield of 76%.

(NBPrBr)

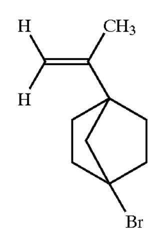

Granular magnesium was added to a solution of a mixture containing the norbornylpropene bromide obtained above and acetaldehyde fluoride in dry ether to obtain a norbornene derivative represented by the following chemical formula (NB-1d) by the same method as described in the aforementioned Monomer-synthesizing Example 1.

(NB-1d)

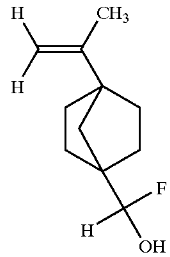

The compound obtained in this manner and represented by the chemical formula (NB-1d) is featured in that the fluorine atom thereof is directly bonded to the α carbon of the active hydroxyl group.

SYNTHESIZING EXAMPLE 195

As a starting material, a compound represented by the following chemical formula (NB-1) was prepared and dissolved in THF, thus forming a solution of the compound in THF. This compound was a norbornene derivative where one fluorine atom was directly bonded to the α carbon of the active hydroxyl group.

(NB-1)

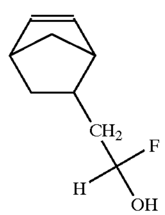

This solution was then frozen by using liquid nitrogen and subjected to a 20-minute deaeration three times, the resultant solution being subsequently permitted to polymerize in the presence of a transition metal catalyst. The reaction mixture was then reprecipitated by 2-propanol and filtered. Thereafter, the solvent included therein was distilled out in vacuo to obtain a homopolymer (BP-1) represented by the following chemical formula.

(BP-1)

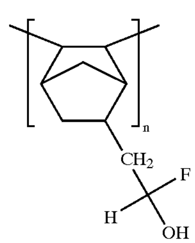

This homopolymer (BP-1) was formed into a PGMEA solution, which was then spin-coated on the surface of a silicon wafer to form a resin layer having a thickness of 3 μm. The resin layer was then-subjected to a paddling development by using a 2.38 wt % aqueous solution of tetramethylammonium hydroxide (TMAH). As a result, it was possible to form a preferable paddle and to dissolve the polymer layer within about one second. The solubility parameter of this homopolymer (BP-1) was 11.32 $(cal \cdot cm^3)^{1/2}$.

This compound was featured in that one fluorine atom was directly bonded to the α carbon, thereby optimizing not only the polarizability of the active hydroxyl group but also the solubility parameter.

SYNTHESIZING EXAMPLE 196

As a starting material, a compound represented by the following chemical formula (NB-1a) was prepared and dissolved in THF, thus forming a solution of the compound in THF. This compound was a norbornene derivative where a fluorine atom was not introduced therein.

(NB-1a)

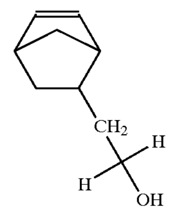

This solution was then frozen by using liquid nitrogen and subjected to a 20-minute deaeration three times, the resultant solution being subsequently permitted to polymerize in the presence of a transition metal catalyst. The reaction mixture was then reprecipitated by 2-propanol and filtered. Thereafter, the solvent included therein was distilled out in vacuo to obtain a homopolymer (BP-la) represented by the following chemical formula.

(BP-1a)

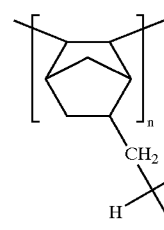

This homopolymer (BP-1a) was formed into a PGMEA solution, which was then spin-coated on the surface of a silicon wafer to form a resin layer having a thickness of 3 μm. The resin layer was then subjected to a paddling development by using a 2.38 wt % aqueous solution of tetramethylammonium hydroxide (TMAH) to form a preferable paddle. However, the thickness of the polymer layer after a 60-second development was 0.29 μm, indicating a little change in thickness. The solubility parameter of this homopolymer (BP-1a) was 11.57 $(cal \cdot cm^3)^{1/2}$.

Since this homopolymer (BP-1a) had no fluorine atom introduced therein, it was impossible to enhance the polarizability of the active hydroxyl group and to keep the value of the solubility parameter within a preferable range.

SYNTHESIZING EXAMPLE 197

As a starting material, a compound represented by the following chemical formula (NB-1b) was prepared and dissolved in THF, thus forming a solution of the compound in THF. This compound was a norbornene derivative which was featured in that fluorine atom was not introduced into the α carbon of the active hydroxyl group, and that six fluorine atoms in total were introduced into carbon atoms other than the a carbon.

(NB-1b)

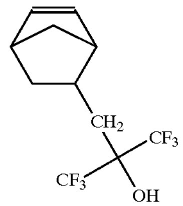

This THF solution was then frozen by using liquid nitrogen and subjected to a 20-minute deaeration three times, the resultant solution being subsequently permitted to polymerize in the presence of a transition metal catalyst. The reaction mixture was then reprecipitated by 2-propanol and filtered. Thereafter, the solvent included therein was distilled out in vacuo to obtain a homopolymer (BP-1b) represented by the following chemical formula.

[BP-1b]

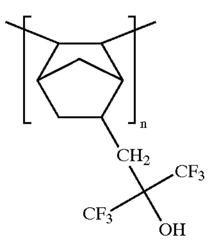

This homopolymer (BP-1b) was formed into a PGMEA solution, which was then spin-coated on the surface of a silicon wafer to form a resin layer having a thickness of 3 μm. The resin layer was then tried to perform the paddling development thereof by using a 2.38 wt % aqueous solution of tetramethylammonium hydroxide (TMAH). However, the developing solution generated a lot of cissing, thus failing to form the paddle. Further, although a region of the resin layer that had contacted the developing solution was caused to dissolve completely within one second, nonuniformity was prominently generated in the resin layer. The solubility parameter of this homopolymer (BP-1b) was 9.88 $(cal \cdot cm^3)^{1/2}$.

This homopolymer (NB-1b) was characterized in that a fluorine atom was not directly bonded to the a carbon and that six fluorine atoms in total were introduced therein as a trifluoromethyl group. Due to the effects of this characteristic, the hydrophilicity of the homopolymer was caused to deteriorate, thus minimizing the solubility parameter of this homopolymer. Since the alkaline developing solution was repelled by this homopolymer, it was difficult to enable the development to proceed uniformly, thus giving rise to a prominent nonuniform development.

Incidentally, this nonuniformity in development generated due to the repellency of the alkaline developing solution, as the development was performed by the paddling development in this example. However, this problem can be overcome by changing the developing method. For example, if a dipping development is adopted in this case, the problem of the repellency of alkaline developing solution can be overcome.

SYNTHESIZING EXAMPLE 198

As a starting material, a compound represented by the following chemical formula (NB-1c) was prepared and dissolved in THF, thus forming a solution of the compound in THF. This compound was a norbornene derivative where one fluorine atom was bonded to carbon atom other than the α carbon of the active hydroxyl group.

(NB-1c)

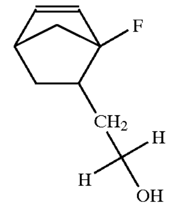

This solution was then frozen by using liquid nitrogen and subjected to a 20-minute deaeration three times, the resultant solution being subsequently permitted to polymerize in the presence of a transition metal catalyst. The reaction mixture was then reprecipitated by 2-propanol and filtered. Thereafter, the solvent included therein was distilled out in vacuo to obtain a homopolymer (BP-1c) represented by the following chemical formula.

(BP-1c)

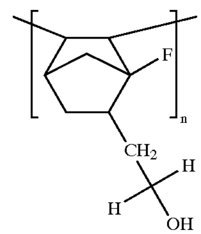

This homopolymer (BP-1c) was formed into a PGMEA solution, which was then spin-coated on the surface of a silicon wafer to form a resin layer having a thickness of 3 μm. The resin layer was then subjected to a paddling development by using a 2.38 wt % aqueous solution of tetramethylammonium hydroxide (TMAH). As a result, it was possible to form a preferable paddle. However, the film thickness of the polymer layer after a 60-second development was 0.29 μm, indicating a little change in film thickness. The solubility parameter of this homopolymer (BP-1c) was 10.38 $(cal \cdot cm^3)^{1/2}$.

In this homopolymer (BP-1c), although one fluorine atom was introduced therein, the site to which the fluorine atom was bonded was not of the α carbon. Therefore, it was impossible to sufficiently enhance the polarizability of the active hydroxyl group, and the value of solubility parameter was also low.

SYNTHESIZING EXAMPLE 199

As a starting material, a compound represented by the following chemical formula (NB-1d) and a compound represented by the following chemical formula (THPE-1) were prepared. The compound (NB-1d) was a norbornene derivative where one fluorine atom was directly bonded to the α carbon of the active hydroxyl group, while the compound (THPE-1) was tetrahydropyranyl ether of the compound (NB-1d).

(NB-1d)

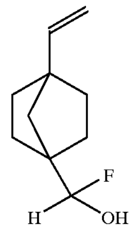

(THPE-1)

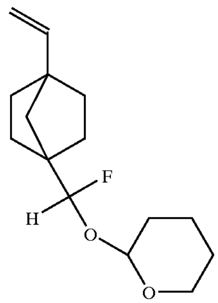

0.7 equivalent weight of the compound (NB-1d), 0.3 equivalent weight of the compound (THPE-1) and azoisobutylonitrile as a polymerization initiator were dissolved in THF, thus forming a THF solution.

This THF solution was then frozen by using liquid nitrogen and subjected to a 20-minute deaeration three times, the resultant solution being subsequently permitted to rise in temperature up to room temperature. Then, under a nitrogen gas flow, the solution was heated with stirring for 14 hours at a temperature of 80° C. The reaction mixture was then reprecipitated by methanol and filtered. Thereafter, the solvent included therein was distilled out in vacuo to obtain a copolymer (BP-2) represented by the following chemical formula.

(BP-2)

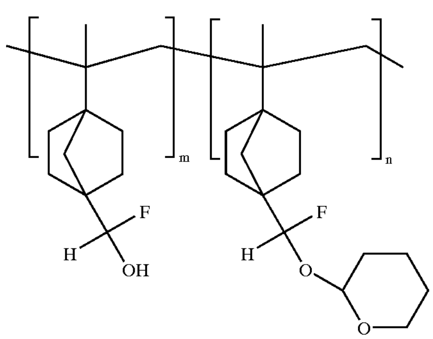

SYNTHESIZING EXAMPLE 200

As a starting material, a compound represented by the following chemical formula (NB-1e) and a compound represented by the following chemical formula (t-BuαFMA) were prepared. The compound (NB-1e) was a tert-butyl ether of a norbornene derivative where one fluorine atom was directly bonded to the α carbon of the active hydroxyl group, while the compound (t-BuαFMA) was tert-butyl α-trifluoromethylacrylate.

(NB-2)

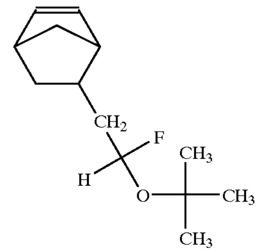

(t-Bua α FMA)

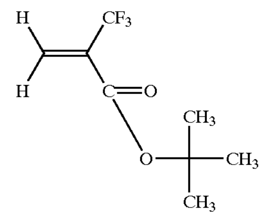

0.7 equivalent weight of the compound (NB-1e), 0.3 equivalent weight of the compound (t-BuαFMA) and azoisobutylonitrile as a polymerization initiator were dissolved in ethyl acetate, thus forming an ethyl acetate solution.

This ethyl acetate solution was then frozen by using liquid nitrogen and subjected to a 20-minute deaeration three times, the resultant solution being subsequently permitted to rise in temperature up to room temperature. Then, under a nitrogen gas flow, the solution was heated with stirring for 16 hours at a temperature of 70° C. The reaction mixture was then reprecipitated by methanol and filtered. Thereafter, the solvent included therein was distilled out in vacuo to obtain a copolymer (BP-3) represented by the following chemical formula.

(BP-3)

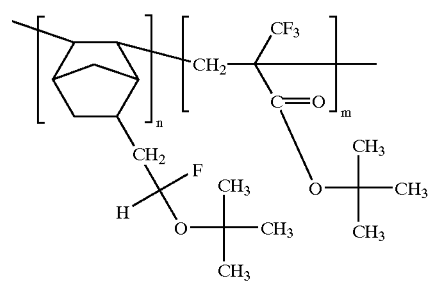

SYNTHESIZING EXAMPLE 201

As a starting material, a compound represented by the following chemical formula (NB-3) and a compound represented by the following chemical formula (THPE-3) were prepared. The compound (NB-3) was a norbornene derivative having no fluorine atom, while the compound (THPE-3) was tetrahydropyranyl ether of the compound (NB-3).

(NB-3)

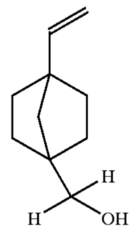

(THPE-3)

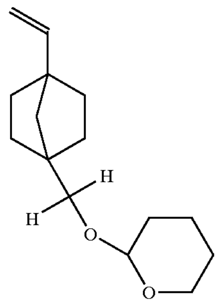

0.7 equivalent weight of the compound (NB-3), 0.3 equivalent weight of the compound (THPE-3) and azoisobutylonitrile as a polymerization initiator were dissolved in THF, thus forming a THF solution.

This THF solution was then frozen by using liquid nitrogen and subjected to a 20-minute deaeration three times, the resultant solution being subsequently permitted to rise in temperature up to room temperature. Then, under a nitrogen gas flow, the solution was heated with stirring for 14 hours at a temperature of 80° C. The reaction mixture was then reprecipitated by methanol and filtered. Thereafter, the solvent included therein was distilled out in vacuo to obtain a copolymer (CP-11) represented by the following chemical formula.

(CP-11)

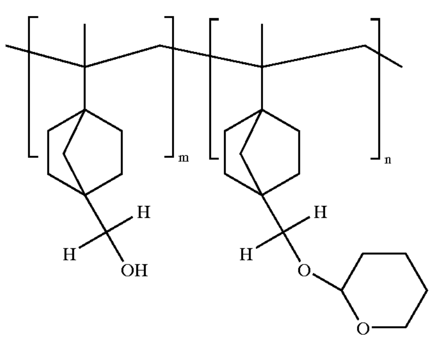

SYNTHESIZING EXAMPLE 202

As a starting material, a compound represented by the following chemical formula (NB-4) and the aforementioned compound (t-BuαFMA) were prepared. The compound (NB-4) was a tert-butyl ester of a norbornene derivative having, as a substituent group, hexafluoroalcohol, while the compound (t-BuαFMA) was tert-butyl α-trifluoromethylacrylate.

(NB-4)

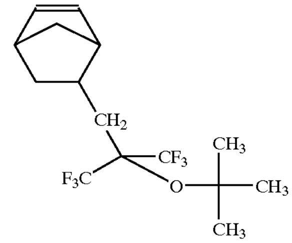

0.7 equivalent weight of the compound (NB-4), 0.3 equivalent weight of the compound (t-BuαFMA) and azoisobutylonitrile as a polymerization initiator were dissolved in ethyl acetate, thus forming an ethyl acetate solution.

This ethyl acetate solution was then frozen by using liquid nitrogen and subjected to a 20-minute deaeration three times, the resultant solution being subsequently polymerized in the presence of transition metal catalyst. The reaction mixture was then reprecipitated by 2-propanol and filtered. Thereafter, the solvent included therein was distilled out in vacuo to obtain a copolymer (CP-12) represented by the following chemical formula.

(CP-12)

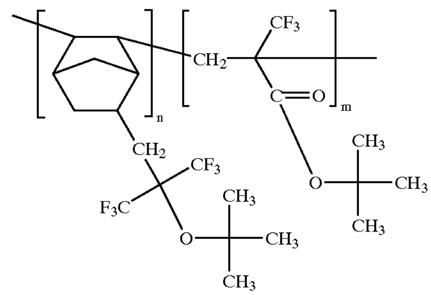

EXAMPLES III

The Preparation of Resists, and the Formation of Resist Patterns

Example III-1

100 parts by weight of the copolymer (BP-2) and 4 parts by weight of triphenylsulfonium triflate employed as a photo-acid generating agent were dissolved in PGMEA to prepare a solution of a photosensitive resin composition.

This solution was then coated on the surface of a silicon wafer by a spinner and dried for 60 seconds at a temperature of 115° C. to form a resist film having a thickness of 0.2 μm.

Then, this resist film was subjected to an exposure treatment by using a reduction exposure projector where an $F_2$ excimer laser (wavelength=157 nm) was employed as a light source. Thereafter, the resultant resist film was subjected to a post-exposure baking over a hot plate for 60 seconds at a temperature 115° C.

Subsequently, the resultant resist film was subjected to a paddling development treatment using a 2.38 wt % aqueous solution of tetramethyl ammonium hydroxide (TMAH).

On this occasion, the developing solution was prevented from being repelled by the surface of the resist film, thereby making it possible to form a paddle of the developing solution on the surface of the wafer. After this development treatment, the exposure portions of the resist film were selectively dissolved and removed to form a fine pattern. The resolution of this fine pattern thus obtained was 80 nm. Further, it was possible to uniformly develop all the regions that had been subjected to the exposure, without generating defective developments. Moreover, peel-off of the fine pattern was not observed at all.

In the copolymer (BP-2) employed herein, one fluorine atom was directly bonded to the α carbon atom. As a result, it was possible to optimize the polarizability of the active hydroxyl group as well as the solubility parameter, thus making it possible to form a fine pattern excellent in resolution.

Example III-2

100 parts by weight of the copolymer (BP-3) and 2 parts by weight of triphenylsulfonium triflate employed as a photo-acid generating agent were dissolved in ethyl lactate to prepare a solution of a photosensitive resin composition.

This solution was then coated on the surface of a silicon wafer by a spinner and dried for 60 seconds at a temperature of 130° C. to form a resist film having a thickness of 0.25 μm.

Then, this resist film was subjected to an exposure treatment by using a reduction exposure projector where an $F_2$ excimer laser (wavelength=157 nm) was employed as a light source. Thereafter, the resultant resist film was subjected to a post-exposure baking over a hot plate for 75 seconds at a temperature 130° C.

Subsequently, the resultant resist film was subjected to a paddling development treatment using a 2.38 wt % aqueous solution of tetramethyl ammonium hydroxide (TMAH).

On this occasion, the developing solution was prevented from being repelled by the surface of the resist film, thereby making it possible to form a paddle of the developing solution on the surface of the wafer. After this development treatment, the exposure portions of the resist film were selectively dissolved and removed to form a fine pattern. The resolution of this fine pattern thus obtained was 70 nm. Further, it was possible to uniformly develop all the regions that had been subjected to the exposure, without generating defective developments. Moreover, the peel-off of the refined pattern was not observed at all.

In the copolymer (BP-3) employed herein, one fluorine atom was directly bonded to the α carbon atom. As a result, it was possible to optimize the polarizability of the active hydroxyl group as well as the solubility parameter, thus making it possible to form a fine pattern excellent in resolution.

Example III-3

100 parts by weight of the copolymer (CP-2) and 2 parts by weight of triphenylsulfonium triflate employed as a photo-acid generating agent were dissolved in ethyl lactate to prepare a solution of a photosensitive resin composition.

This solution was then coated on the surface of a silicon wafer by a spinner and dried for 60 seconds at a temperature of 130° C. to form a resist film having a thickness of 0.25 μm.

Then, this resist film was subjected to an exposure treatment by using a reduction exposure projector where an $F_2$ excimer laser (wavelength=157 nm) was employed as a light source. Thereafter, the resultant resist film was subjected to a post-exposure baking over a hot plate for 75 seconds at a temperature 130° C.

Subsequently, the resultant resist film was subjected to a paddling development treatment using a 2.38 wt % aqueous solution of tetramethyl ammonium hydroxide (TMAH).

On this occasion, the developing solution was considerably repelled by the surface of the resist film, thereby making it impossible to form a paddle of the developing solution on the surface of the wafer. Although it was possible to selectively dissolve and remove the exposure portions of the resist film with which the developing solution was contacted and to form a fine pattern, it was impossible to prevent the fine pattern from being peeled off, thereby limiting the resolution of the fine pattern to at most 250 nm.

In the copolymer (CP-2) employed herein, a fluorine atom was not bonded directly to the α carbon atom, and six fluorine atoms in total were introduced therein as a trifluoromethyl group. Due to this, the hydrophilicity of the copolymer was caused to deteriorate, thus minimizing the solubility parameter of this copolymer. Since the alkaline developing solution was repelled by this copolymer, it was difficult to enable the development to proceed uniformly, thus giving rise to a prominent nonuniform development.

Incidentally, this nonuniformity in development was generated due to the repellency of alkaline developing solution as the development was performed herein by the paddling development. However, this problem can be overcome by changing the developing method. For example, if a dipping development is adopted in this case, the problem of the repellency of alkaline developing solution can be overcome, and the resolution can also be enhanced.

COMPARATIVE EXAMPLE III-1

100 parts by weight of the copolymer (CP-1) and 2 parts by weight of triphenylsulfonium triflate employed as a photo-acid generating agent were dissolved in PGMEA to prepare a solution of a photosensitive resin composition.

This solution was then coated on the surface of a silicon wafer by spinner and dried for 60 seconds at a temperature of 115° C. to form a resist film having a thickness of 0.18 μm.

Then, this resist film was subjected to an exposure treatment by using a reduction exposure projector where an $F_2$ excimer laser (wavelength=157 nm) was employed as a light source. Thereafter, the resultant resist film was subjected to a post-exposure baking over a hot plate for 60 seconds at a temperature 115° C.

Subsequently, the resultant resist film was subjected to a paddling development treatment using a 2.38 wt % aqueous solution of tetramethyl ammonium hydroxide (TMAH).

On this occasion, the developing solution was considerably repelled by the surface of the resist film, thereby making it impossible to form a paddle of the developing solution on the surface of the wafer. Although it was possible to selectively dissolve and remove the exposure portions of the resist film with which the developing solution was contacted and to form a fined pattern, it was impossible to prevent the fine pattern from being peeled off, thereby limiting the resolution of the fine pattern to at most 200 nm.

In the copolymer (CP-1) employed herein, a fluorine atom was not introduced therein. Due to this, it was impossible to enhance the polarizability of hydroxyl group, thus reducing the solubility parameter of this copolymer. Therefore, it was impossible to form a fine pattern excellent in resolution.

Then, by using the aforementioned synthesizing method, the compounds represented by the following general formulas (E1), (E2) and (E3) were synthesized.

(E1)

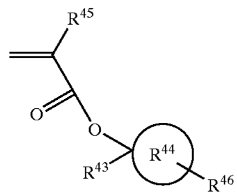

(E2)

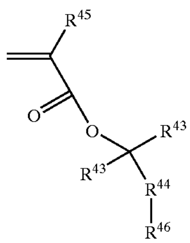

(E3)

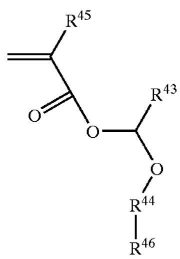

More specifically, as shown in the following Table 16, substituent groups $R^{43}$, $R^{44}$, $R^{45}$ and $R^{46}$ were respectively introduced into each of the compounds, thus synthesizing compounds F1, F2, F3, F4 and F5.

TABLE 16

| Formula | $R^{43}$ | $R^{44}$ | $R^{45}$ | $R^{46}$ |
|---|---|---|---|---|
| F1 (E1) | $CH_3$ | 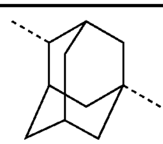 | $CF_3$ | H |
| F2 (E2) | $CH_3$ | 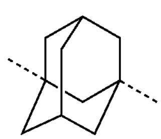 | Cl | OH |
| F3 (E1) | H | 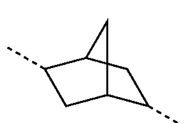 | Cl | H |
| F4 (E2) | $CH_3$ | 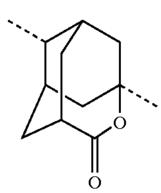 | F | H |

TABLE 16-continued

| Formula | $R^{43}$ | $R^{44}$ | $R^{45}$ | $R^{46}$ |
|---|---|---|---|---|
| F5 (E3) | $CH_3$ | 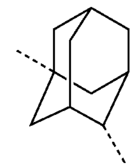 | F | =O |

By using the compounds thus obtained and the compounds represented by the following general formulas (G1) and (G2), and by following the formulations shown in the following Table 17, the polymers (H1) to (H5) were synthesized by radical copolymerization (catalyst: 5% by weight, neat, 60° C., 40 hours).

G1

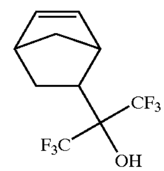

G2

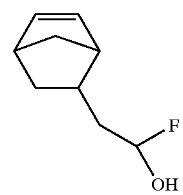

TABLE 17

| Polymer | Component 1 (content) | Component 2 (content) | Component 3 (content) | Molecular weight (Mw) |
|---|---|---|---|---|
| H1 | F1(60) | G2(30) | 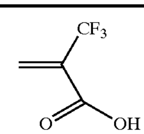 (10) | 7800 |
| H2 | F2(65) | G1(35) | — | 8200 |
| H3 | F3(60) | G2(30) | 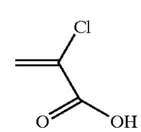 (10) | 12300 |
| H4 | F4(65) | G1(35) | — | 10200 |
| H5 | F5(65) | G1(35) | — | 9700 |

In the chemical formula (G2), the fluorine atom is directly bonded to the α carbon. Therefore, the polymers (H1) and (H3) which were formed through the employment of the compound represented by this chemical formula (G2) as a raw material were enabled to increase the acidity of hydroxyl group and to remarkably enhance the solubility thereof to an alkaline developing solution.

Then, 1% by weight of triphenylsulfonium triflate was added as a photo-acid generating agent to each of the polymers (H1) to (H5) and dissolved therein, the resultant solutions being filtered to prepare resists (RR1) to (RR5).

Thereafter, each of these resists was spin-coated on the surface of a silicon wafer to form a resist film having a thickness of 0.25 μm. Then, the surface of each resist film was subjected to an exposure of a predetermined pattern by using an $F_2$ excimer laser (wavelength=157 nm) as a light source. Thereafter, each of the resultant resist films was subjected to a baking treatment for 1 to 1.5 minutes at a temperature 110 to 130° C. Subsequently, each of the resultant resist films was subjected to a paddling development treatment for one minute using a 2.38 wt % aqueous solution of tetramethyl ammonium hydroxide (TMAH). Incidentally, in the development of the resists (RR1) and (RR3) which were expected to be high in solubility to an alkaline developing solution, a 0.23 wt % aqueous solution of tetramethyl ammonium hydroxide was employed.

As a result of this developing treatment, it was possible to selectively dissolve and remove the exposure regions of each of the resist films to obtain a positive resist pattern. The sensitivity and resolution of these resist films on this occasion are shown in the following Table 18.

Further, each of these resists was measured with respect to the etching rate thereof in the employment of $CF_4$ plasma to evaluate the dry etching resistance of each of the resists. The results obtained are summarized in Table 18 wherein the evaluation of the dry etching resistance is indicated as a relative value based on the etching rate (which was defined as 1.0) of the resist where polyhydroxystyrene resin was employed as a base resin.

TABLE 18

| Resists number | Sensitivity ($mJ/cm^2$) | Resolution (μm) | Dry etching resistance (based on PHS) |
|---|---|---|---|
| RR1 | 5 | 0.17 | 0.8 |
| RR2 | 7 | 0.15 | 0.9 |
| RR3 | 5 | 0.15 | 0.8 |
| RR4 | 8 | 0.15 | 0.9 |
| RR5 | 12 | 0.15 | 0.9 |

As shown in Table 18, the resists according to the present invention were all capable of forming a resist pattern with high sensitivity and excellent resolution, and were also excellent in transparency to the light of 157 nm in wavelength as well as in alkali-developing properties. Additionally, the resists according to the present invention were all excellent in dry etching resistance. In particular, the resists (RR1) and (RR3) comprising a polymer having a structure where a fluorine atom was directly bonded to the α carbon indicated a very high sensitivity, i.e. 5 $mJ/cm^2$ and were also especially excellent in solubility to the developing solution.

Next, the method of manufacturing an electronic component by using a photosensitive composition according to the present invention will be explained with reference to the drawings.

Figure 5A:
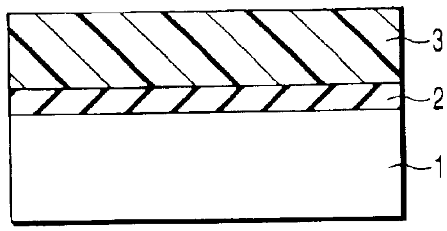
FIGS. 5A to 5C respectively show a cross-sectional view illustrating in step-wise the process of manufacturing an electronic component by using a photosensitive resin composition according to one embodiment of the present invention.
Figure 5B:
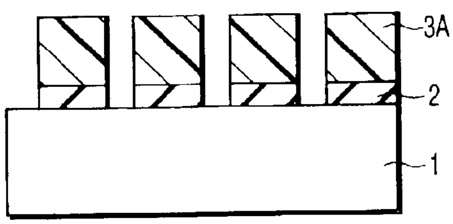
Figure 5C:
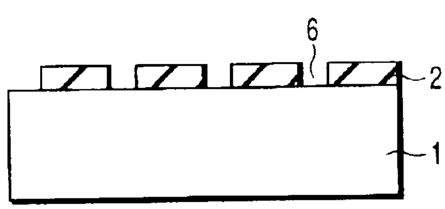

FIGS. 5A to 5C respectively show a cross-sectional view illustrating in step-wise the process of manufacturing an electronic component by using a photosensitive resin composition according to one embodiment of the present invention.

First of all, as shown in FIG. 5A, a silicon oxide film 2 having a thickness of about 0.8 μm was formed as an etching film (a film to be etched, the same hereinafter) on the surface of a silicon semiconductor substrate 1 by of a CVD method.

Then, a resist film 3 comprising the same composition as that of the resist 69 and having a film thickness of about 0.3 μm was deposited on the surface of the silicon oxide film 2. Incidentally, the aforementioned semiconductor substrate 1 was constructed such that semiconductor elements, such as a MOSFET or diode (not shown) were formed therein in advance.

To this resist film, an $F_2$ excimer laser having a wavelength of 157 nm was irradiated to perform the exposure of a predetermined pattern. The resultant resist film was subjected to a baking treatment for 2 minutes at a temperature of 110° C. and then treated with a 2.38 wt % aqueous solution of tetramethyl ammonium hydroxide (TMAH) to selectively dissolve and remove the exposure regions of the resist film to obtain a positive resist pattern 3A. Thereafter, by using this resist pattern 3A as a mask, the silicon oxide film 2 (or etching film) was selectively etched by an RIE method employing $CF_4$ gas, thereby transcribing the pattern as shown in FIG. 5B.

Finally, the resist pattern 3A was ashed and removed in an atmosphere of $O_2$ plasma to obtain a silicon oxide film 2 provided with minute openings 6 as shown in FIG. 5C. Incidentally, the diameter of each of the openings 6 formed in the silicon oxide film 2 was about 0.32 μm, and the nonuniformity of film thickness was limited at most to 2%.

Further, it was found that even when the photosensitive resin composition to be employed for the formation of the resist film 3 was altered, it was possible to transcribe a fine pattern onto the silicon oxide film 2 in the same manner as described above.

This photosensitive resin composition was prepared by incorporating 2 parts by weight of trifluorosulfonyl triflate as a photo-acid generating agent into 100 parts by weight of the aforementioned copolymer (BP-3). By using this resin composition in the same manner as described above, a resist film 3 having a film thickness of about 0.25 μm was deposited on the surface of the silicon oxide film 2, as shown in FIG. 5A.

Then, this resist film 3 was subjected to a patterning exposure in the same manner as described above and subsequently to a baking treatment for 80 seconds at a temperature of 130° C. The resultant resist film 3 was then treated with a 2.38 wt % aqueous solution of tetramethyl ammonium hydroxide (TMAH) to selectively dissolve and remove the exposure regions of the resist film 3 to obtain a positive resist pattern 3A. Thereafter, by using this resist pattern 3A as a mask, the silicon oxide film 2 was selectively etched in the same manner as described above, thereby transcribing the pattern as shown in FIG. 5B.

Finally, the resist pattern 3A was removed by the same procedures to obtain a silicon oxide film 2 provided with minute openings 6 as shown in FIG. 5C. Incidentally, the diameter of each of the openings 6 formed in the silicon oxide film 2 was confined within the range of about 0.28 to 0.30 μm, and the non-uniformity of film thickness was limited at most to 2%.

The photosensitive resin composition according to the present invention can be preferably employed in the patterning of the wirings to be employed in an electronic component.

Figure 6A:
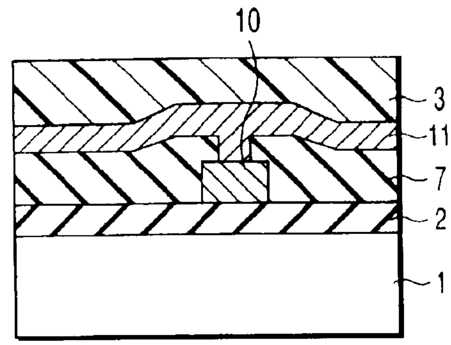
FIGS. 6A to 6C respectively show a cross-sectional view illustrating in step-wise the process of manufacturing an electronic component by using a photosensitive resin composition according to another embodiment of the present invention.
Figure 6B:
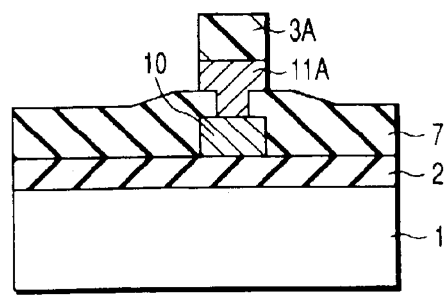
Figure 6C:
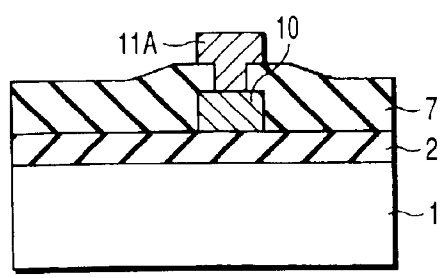

FIGS. 6A to 6C respectively show a cross-sectional view illustrating the steps wherein the present invention was applied to the formation of a 2-ply wiring structure.

First of all, as shown in FIG. 6A, a silicon oxide film 2 having a thickness of about 0.8 μm was formed on the surface of a silicon semiconductor substrate 1 by a CVD method. Incidentally, this semiconductor substrate 1 was constructed such that semiconductor elements, such as MOSFET or diode (not shown) were formed therein in advance. Then, a lower wiring 10 formed of Al—Si—Cu alloy and having a thickness of about 0.7 μm and an intermediate insulating layer 7 formed of $SiO_2$ and having a thickness of about 0.7 μm were successively formed on the surface of the silicon oxide film 2. Furthermore, an upper wiring layer 11 formed of Al—Si—Cu alloy and having a thickness of about 0.7 μm was deposited on these underlying layers. On this occasion, a step portion having a height of about 0.7 μm was created in this upper wiring layer. Additionally, a resist film 3 comprising the same composition as that of the resist 70 and having a thickness of about 0.3 μm was formed on the surface of the upper wiring layer 11.

To this resist film, an $F_2$ excimer laser having a wavelength of 157 nm was irradiated to perform the exposure of a predetermined pattern. The resultant resist film was subjected to a baking treatment for 2 minutes at a temperature of 110° C. and then treated with a 2.38 wt % aqueous solution of tetramethyl ammonium hydroxide (TMAH) to selectively dissolve and remove the exposure regions of the resist film to obtain a positive resist pattern 3A as shown in FIG. 6B. Thereafter, by using this resist pattern 3A as a mask, the upper wiring layer 11 was selectively etched by an RIE method employing a fluorine-based gas, such as $CF_4$ gas, thereby selectively etching away the upper wiring layer 11, thus forming an upper wiring 11A.

Finally, the resist pattern 3A was ashed and removed in an atmosphere of $O_2$ plasma to obtain a 2-ply wiring as shown in FIG. 6C.

Even if the present invention is applied to the formation of the 2-ply wiring structure as described above, it is possible to improve the shrinkage factor and strength of resist pattern. The upper wiring 11A formed in this manner was hardly influenced by the step portion (about 0.7 μm) developed by the lower wiring film, etc., so that the dimensional error was ±0.05 μm as against the design dimension of 0.6 μm. It will be clearly recognized, through the comparison of this magnitude of error with the conventional dimensional error of ±0.1 μm, that it is possible, through the employment of the present invention, to form a wiring with very high precision.

Further, when the upper wiring was formed according to the present invention under the conditions wherein the intervals between wirings were set to 0.4 μm and the line width thereof was set to 0.6 μm, the generation of defective wiring, such as the disconnection of wiring, short-circuit, etc. was not recognized at all.

Figure 7A:
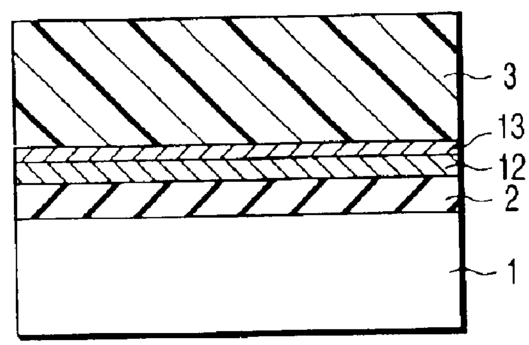
FIGS. 7A to 7D respectively show a cross-sectional view illustrating in step-wise the process of manufacturing an electronic component by using a photosensitive resin composition according to a further embodiment of the present invention.
Figure 7B:
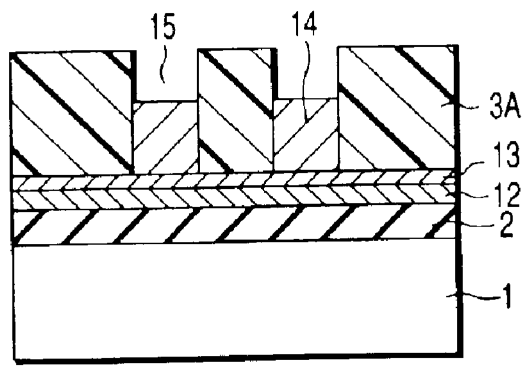
Figure 7C:
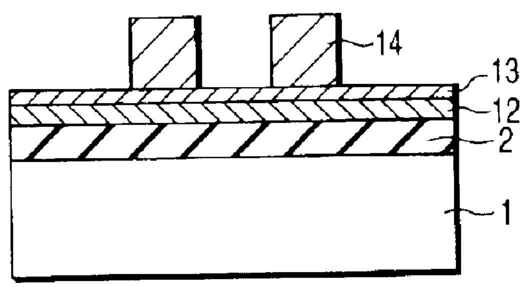

FIGS. 7A to 7C respectively show a cross-sectional view illustrating the steps wherein the present invention was applied to the formation of an Al wiring.

First of all, as shown in FIG. 7A, a silicon oxide film 2 having a thickness of about 0.8 μm was formed on the surface of a semiconductor substrate 1 by a CVD method. Incidentally, this semiconductor substrate 1 was constructed such that semiconductor elements, such as MOSFET or diode (not shown) were formed therein in advance. Then, by a sputtering method, a titanium-containing tungsten (Ti—W) film 12 having a thickness of about 0.2 μm and a gold (Au) film 13 having a thickness of about 0.1 μm were successively formed on the surface of the silicon oxide film 2. Additionally, a resist film 3 comprising the same composition as that of the resist 93 and having a thickness of about 0.3 μm was formed on the surface of the Au film 13.

To this resist film 13, an $F_2$ excimer laser having a wavelength of 157 nm was irradiated to perform the exposure of a predetermined pattern. The resultant resist film was subjected to a baking treatment for 2 minutes at a temperature of 110° C. and then treated with a 2.38 wt % aqueous solution of tetramethyl ammonium hydroxide (TMAH) to selectively dissolve and remove the exposure regions of the resist film to obtain a positive resist pattern 3A. Thereafter, using this resist pattern 3A as a mask, a groove 15 was formed. Then, electrolytic plating was performed by using, as an electrode, the Ti—W film 12 and the Au film 13 which were exposed at the bottom portion of this groove 15. As a result, an Au-plating film 14 having a thickness of about 1 μm was formed in the groove 15 as shown in FIG. 7B.

Then, the resist pattern 3A was ashed and removed in an atmosphere of $O_2$ plasma, thus enabling the Au-plating film 14 to protrude from the Au film 13 as shown in FIG. 7C.

Figure 7D:
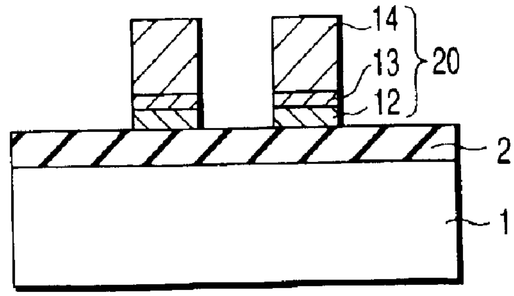

Finally, the exposed portions of Au film 13 were removed by ion trimming, and then, the exposed portions of the Ti—W film 12 were removed by using a fluorine-based gas, thereby forming an Au wiring 20 as shown in FIG. 7D.

It was possible, through the employment of the present invention, to form the resist film 3 at a temperature of not higher than 150° C. Therefore, since it was possible to prevent the generation of peeling between the Au film 13 and the resist film 3, the generation of defective wiring, such as the disconnection of wiring, short-circuit, etc. was not recognized at all on the occasion of forming an Au wiring having a line width of 0.7 μm.

As explained above in detail, it is possible, according to the present invention, to provide a polymer compound for photoresist, which is excellent in transparency to a short wavelength beam of 160 nm or less, in particular to fluorine laser beam, and to provide a monomer compound which can be employed as a raw material for synthesizing the aforementioned polymer compound for photoresist. Further, according to the present invention, it is also possible to provide a photosensitive resin composition which is excellent in transparency to a short wavelength beam of 160 nm or less, in particular to fluorine laser beam, and also excellent in dry etching resistance, and which is capable of forming a resist pattern excellent in adhesion and resolution in the alkaline development of the resist pattern. Furthermore, it is possible, according to the present invention, to provide a method of forming a pattern by using the aforementioned photosensitive resin composition, and to provide a method of manufacturing electronic components by the aforementioned pattern-forming method.

Although the photosensitive resin composition of the present invention is especially effective in the formation of a pattern where a fluorine laser beam is utilized, the photosensitive resin composition of the present invention is also sufficiently useful in the formation of a pattern where an i-beam, deep UV beam, KrF excimer laser beam, ArF excimer laser beam, electronic beam or X-rays is employed. Therefore, this photosensitive resin composition is very effective as it is employed in the photolithographic technique of the manufacturing process of a semiconductor device, and therefore, the present invention is very valuable from an industrial viewpoint.

What is claimed is:

1. A polymer compound for photoresist wherein said polymer compound is formed of a polymer compound having at least one skeleton represented by the following general formula (1), general formula (2A) or general formula (2B):

(1)

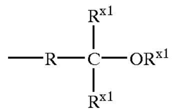

wherein R is an alicyclic skeleton; and at least one of $R^{x1}$s is an electron-withdrawing group, the residual $R^{x1}$s being the same or different and being individually a monovalent organic group selected from the group consisting of a methyl group, an ethyl group, an isopropyl group, an n-butyl group, an s-butyl group, a t-butyl group, an isobutyl group and a pentyl group; with the proviso that R may contain a heteroatom, and that R and $R^{x1}$ may be combined to form a ring;

(2A)

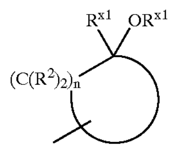

(2B)

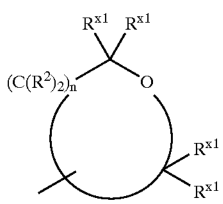

wherein at least one of $R^{x1}$s is an electron-withdrawing group, the residual $R^{x1}$s being the same or different and being individually a hydrogen atom or monovalent organic group; $R^2$s may be the same or different and are individually a hydrogen atom or monovalent organic group; and n is an integer ranging from 2 to 25; with the proviso that at least two carbon atoms selected from carbon atoms constituting $R^2$ and carbon atoms to which said $R^2$s are connected may be combined to form a condensed ring.

2. A photosensitive resin composition comprising the polymer compound for photoresist claimed in claim 1; and a photo-acid generating agent.

3. A method of forming a pattern comprising:

forming a resin layer comprising the photosensitive resin composition claimed in claim 2 above a surface of a substrate;

applying a patterned exposure to a predetermined region of said resin layer by $F_2$ laser;

heat-treating said resin layer that has been subjected to said patterned exposure; and subjecting the heat-treated resin layer to a developing process using an aqueous alkaline solution to selectively dissolve and remove exposure portions or unexposure portions, thereby forming the pattern.

4. A method of manufacturing electronic components comprising:

forming a resin layer comprising the photosensitive resin composition claimed in claim 2 above a surface of a substrate;

applying a patterned exposure to a predetermined region of said resin layer by $F_2$ laser;

heat-treating said resin layer that has been subjected to said patterned exposure;

subjecting the heat-treated resin layer to a developing process using an aqueous alkaline solution to selectively dissolve and remove exposure portions or unexposure portions, thereby forming a resist pattern; and etching said substrate by using the resist pattern as an etching mask.

5. A polymer compound for photoresist wherein said polymer compound is formed of a polymer compound having at least one skeleton represented by the following general formula (3A), general formula (3B), general formula (3C) or general formula (3D):

(3A)

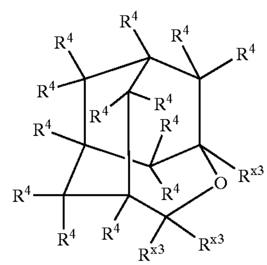

(3B)

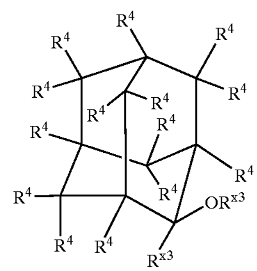

(3C)

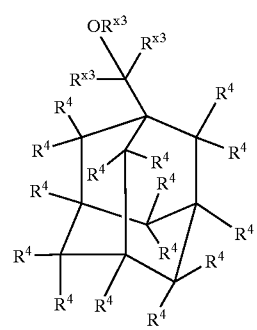

(3D)

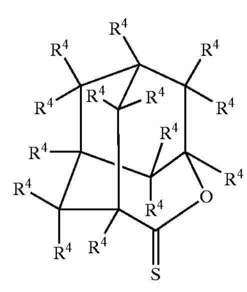

wherein at least one of $R^{x3}$s is a fluorine atom or monovalent organic group containing a fluorine atom, the residual $R^{x3}$s being the same or different and being individually a hydrogen atom or monovalent organic group; and $R^4$s may be the same or different and are individually a hydrogen atom or monovalent organic group; with the proviso that one or two of said $R^{x3}$ and said $R^4$ are respectively a coupling hand.

6. A polymer compound for photoresist wherein said polymer compound is formed of a polymer compound having at least one skeleton represented by the following general formulas (4A), (4B), (4C), (4E), (4F), (4G) and (4H):

(4A)

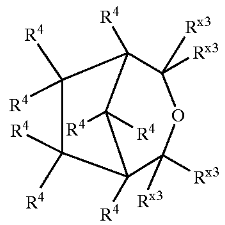

(4B)

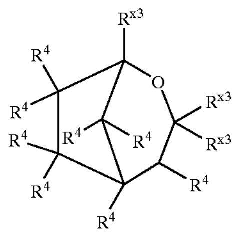

(4C)

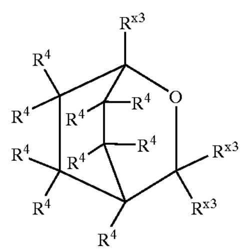

(4D)

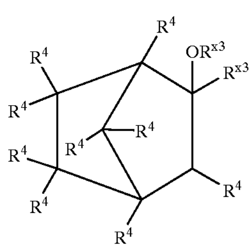

(4E)

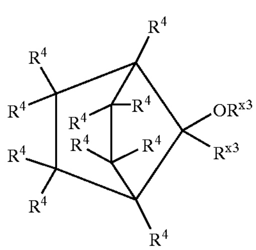

(4F)

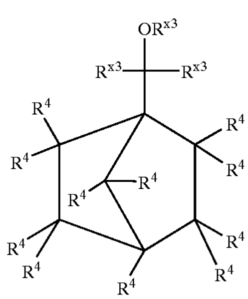

-continued (4G)

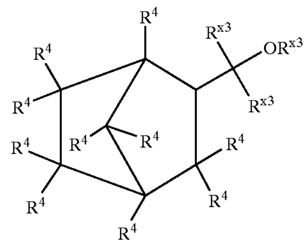

(4H)

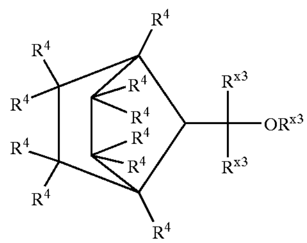

wherein at least one of $R^{x3}$s is a fluorine atom or monovalent organic group containing a fluorine atom, the residual $R^{x3}$s being the same or different and being individually a hydrogen atom or monovalent organic group; and $R^4$s may be the same or different and are individually a hydrogen atom or monovalent organic group; with the proviso that one or two of said $R^{x3}$ and said $R^4$ are respectively a coupling hand.

7. A polymer compound for photoresist wherein said polymer compound is formed of a polymer compound having a repeating unit represented by the following general formula (u-1):

(u-1)

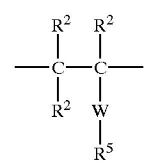

wherein $R^2$s may be the same or different and are individually a hydrogen atom, halogen atom or monovalent organic group; $R^5$ is a group represented by any one of the following general formulas (2A), (2B) and (2C); and W is a single bond or a coupling group:

(2A)

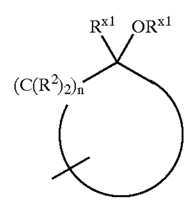

(2B)

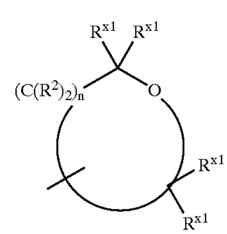

-continued (2C)

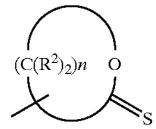

wherein R is an alicyclic skeleton; at least one of $R^{x1}$s is a halogen atom or monovalent organic group containing a halogen atom, the residual $R^{x1}$s being the same or different and being individually a hydrogen atom or monovalent organic group; $R^2$s may be the same or different and are individually a hydrogen atom or monovalent organic group; n is an integer ranging from 2 to 25; and in is an integer ranging from 0 to 3; with the proviso that R may contain a heteroatom, and that at least two carbon atoms selected from carbon atoms constituting R, $R^2$ and $R^{x1}$, and carbon atoms to which said R, $R^2$ and $R^{x1}$ are connected may be combined to form a condensed ring.

8. A polymer compound for photoresist wherein said polymer compound is formed of a polymer compound having at least one repeating unit represented by the following general formulas (u-2a) and (u-2c):

(u-2a)

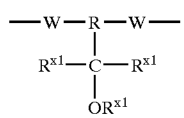

(u-2c)

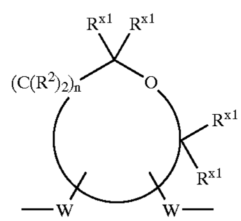

wherein R is an alicyclic skeleton; at least one of $R^{x1}$s is a halogen atom or monovalent organic group containing a halogen atom, the residual $R^{x1}$s being the same or different and being individually a hydrogen atom or monovalent organic group; $R^2$s may be the same or different and are individually a hydrogen atom or monovalent organic group; Ws may be the same or different and are individually a single bond or a coupling group; and n is an integer ranging from 2 to 25; with the proviso that R may contain a heteroatom, and that at least two carbon atoms selected from carbon atoms constituting R, $R^2$ and $R^{x1}$, and carbon atoms to which said R, $R^2$ and $R^{x1}$ are connected may be combined to form a condensed ring.

9. A polymer compound for photoresist wherein said polymer compound is formed of a polymer compound having at least one repeating unit represented by the following general formulas (u-3a), (u-3b) and (u-3c):

(u-3a)

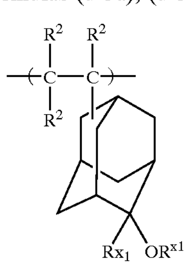

-continued (u-3b)

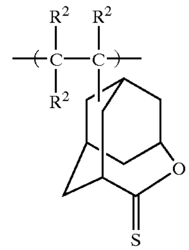

(u-3c)

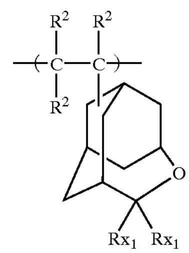

wherein at least one of $R^{x1}$s is a halogen atom, monovalent organic group containing a halogen atom, hydrogen atom or monovalent organic group; and $R^2$s may be the same or different and are individually a hydrogen atom or monovalent organic group.

10. A photosensitive resin composition comprising a polymer compound for photoresist, and a photo-acid generating agent; wherein said polymer compound is formed of a polymer compound having at least one repeating unit represented by the following general formula (u-1), any one of the following general formulas (u-2a), (u-2b) and (u-2c), or any one of the following general formulas (u-3a), (u-3b) and (u-3c):

(u-1)

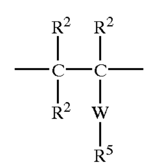

wherein $R^2$s may be the same or different and are individually a hydrogen atom, halogen atom or monovalent organic group; $R^5$ is a group represented by any one of the following general formulas (2A), (2B) or (2C); and W is a single bond or a coupling group;

(2A)

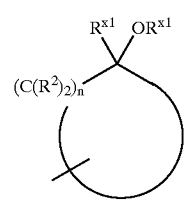

-continued (2B)

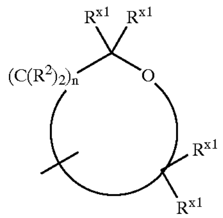

(2C)

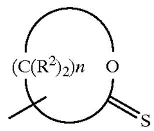

wherein R is an alicyclic skeleton; at least one of $R^{x1}$s is a halogen atom or monovalent organic group containing a halogen atom, the residual $R^{x1}$s being the same or different and being individually a hydrogen atom or monovalent organic group; $R^2$s may be the same or different and are individually a hydrogen atom or monovalent organic group; n is an integer ranging from 2 to 25; and m is an integer ranging from 0 to 3; with the proviso that R may contain a heteroatom, and that at least two carbon atoms selected from carbon atoms constituting R, $R^2$ and $R^{x1}$, and carbon atoms to which said R, $R^2$ and $R^{x1}$ are connected may be combined to form a condensed ring;

(u-2a)

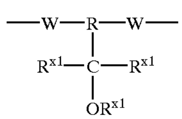

(u-2b)

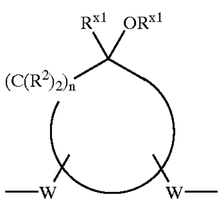

(u-2c)

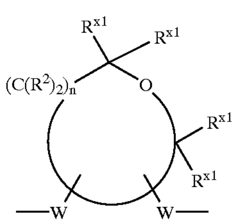

wherein R is an alicyclic skeleton; at least one of $R^{x1}$s is a halogen atom or monovalent organic group containing a halogen atom, the residual $R^{x1}$s being the same or different and being individually a hydrogen atom or monovalent organic group; $R^2$s may be the same or different and are individually a hydrogen atom or monovalent organic group; Ws may be the same or different and are individually a single bond or a coupling group; and n is an integer ranging from 2 to 25; with the proviso that R may contain a heteroatom, and that at least two carbon atoms selected from carbon atoms constituting R, $R^2$ and $R^{x1}$, and carbon atoms to which said R, $R^2$ and $R^{x1}$ are connected may be combined to form a condensed ring;

(u-3a)

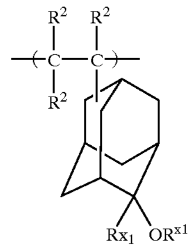

(u-3b)

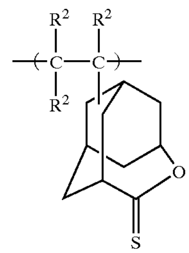

(u-3c)

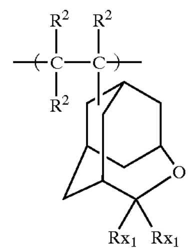

wherein at least one of $R^{x1}$s is a halogen atom, monovalent organic group containing a halogen atom, hydrogen atom or monovalent organic group; and $R^2$s may be the same or different and are individually a hydrogen atom or monovalent organic group.

11. A polymer compound for photoresist wherein said polymer compound is formed of a polymer compound having at least one skeleton represented by the following general formula (11), general formula (12A) or general formula (12B):

(11)

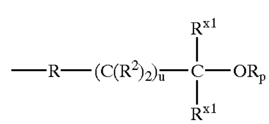

wherein R is an alicyclic skeleton; at least one of $R_F$s is a fluorine atom, the residual $R_F$s being the same or different and being individually a hydrogen atom or monovalent organic group; $R_p$ is a hydrogen atom or monovalent organic group; $R^2$s may be the same or different and are individually a hydrogen atom or monovalent organic group; and u is 0 or an integer not less than 1; with the proviso that R may contain a heteroatom, and that R, $R_F$ and $R^2$ may be combined with each other to form a ring;

(12A)

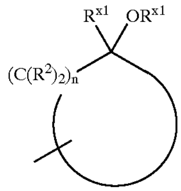

(12B)

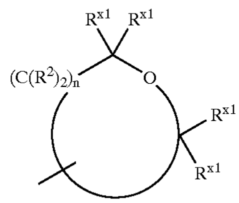

wherein at least one of $R_F$s is a fluorine atom, the residual $R_F$s being the same or different and being individually a hydrogen atom or monovalent organic group; $R_p$ is a hydrogen atom or monovalent organic group; $R^2$s may be the same or different and are individually a hydrogen atom or monovalent organic group; and n is an integer ranging from 2 to 25; with the proviso that at least two carbon atoms selected from carbon atoms constituting $R^2$ and carbon atoms to which said $R^2$s are connected may be combined to form a condensed ring.

12. A photosensitive resin composition comprising the polymer compound for photoresist claimed in claim 11; and a photo-acid generating agent.

13. A method of forming a pattern comprising:

forming a resin layer comprising the photosensitive resin composition claimed in claim 12 above a surface of a substrate;

applying a patterned exposure to a predetermined region of said resin layer by $F_2$ laser;

heat-treating said resin layer that has been subjected to said patterned exposure; and subjecting the heat-treated resin layer to a developing process using an aqueous alkaline solution to selectively dissolve and remove exposure portions or unexposure portions, thereby forming the pattern.

14. A method of manufacturing electronic components comprising:

forming a resin layer comprising the photosensitive resin composition claimed in claim 12 above a surface of a substrate;

applying a patterned exposure to a predetermined region of said resin layer by $F_2$ laser;

heat-treating said resin layer that has been subjected to said patterned exposure;

subjecting the heat-treated resin layer to a developing process using an aqueous alkaline solution to selectively dissolve and remove exposure portions or unexposure portions, thereby forming a resist pattern; and etching said substrate by using the resist pattern as an etching mask.

15. A monomer compound for forming a polymer for photoresist through a polymerization thereof characterized in that said monomer compound has a skeleton represented by the following general formula (m-1), general formula (m-2a), general formula (m-2b), general formula (m-3b) or general formula (m-3c):

(m-1)

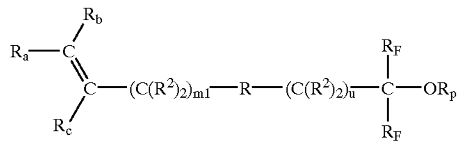

wherein R is an alicyclic skeleton; at least one of $R_F$s is a fluorine atom, the residual $R_F$s being the same or different and being individually a hydrogen atom or monovalent organic group; $R_p$ is a hydrogen atom or monovalent organic group; $R^2$s may be the same or different and are individually a hydrogen atom or monovalent organic group; $R_a$, $R_b$ and $R_c$ may be the same or different and are individually a hydrogen atom, halogen atom or monovalent organic group; and ml and u are 0 or an integer not less than 1; with the proviso that R may contain a heteroatom, and that some of R, $R_F$, $R_a$, $R_b$, $R_c$ and $R^2$ may be combined with each other to form a ring;

(m-2a)

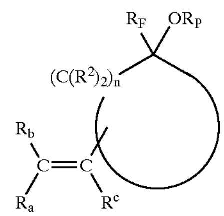

(m-2b)

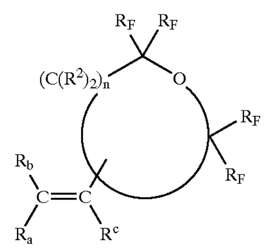

wherein at least one of $R_F$s is a fluorine atom, the residual $R_F$s being the same or different and being individually a hydrogen atom or monovalent organic group; $R_p$ is a hydrogen atom or monovalent organic group; $R^2$s may be the same or different and are individually a hydrogen atom or monovalent organic group; $R_a$, $R_b$ and $R_c$ may be the same or different and are individually a hydrogen atom, halogen atom or monovalent organic group; and n is an integer ranging from 2 to 25; with the proviso that at least two carbon atoms selected from carbon atoms constituting $R_F$, $R_a$, $R_b$, $R_c$ and $R_2$, and carbon atoms to which $R^2$s are connected may be combined with each other to form a condensed ring;

(m-3b)

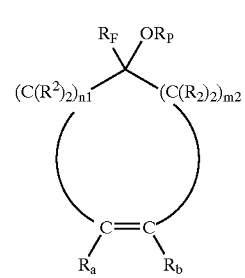

-continued (m-3c)

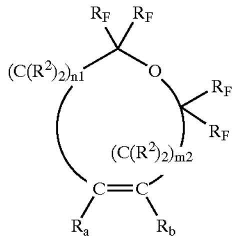

wherein R' is an alicyclic skeleton having at least one double bond in the structure thereof; at least one of $R_F$s is a fluorine atom, the residual $R_F$s being the same or different and being individually a hydrogen atom or monovalent organic group; $R_p$ is a hydrogen atom or monovalent organic group; $R^2$s may be the same or different and are individually a hydrogen atom or monovalent organic group; $R_a$ and $R_b$ may be the same or different and are individually a hydrogen atom, halogen atom or monovalent organic group; and u is 0 or an integer of not less than 1; m2 and n1 are an integer ranging from 0 to 25; with the proviso that R may contain a heteroatom and that at least two carbon atoms selected from carbon atoms constituting R', $R_a$, $R_b$, $R^2$ and $R_F$, and carbon atoms to which R', $R_a$, $R_b$, $R^2$ and $R_F$ are connected may be combined with each other to form a condensed ring.

* * * * *